(12) United States Patent
Boesch et al.

(10) Patent No.: US 10,725,124 B2
(45) Date of Patent: Jul. 28, 2020

(54) DNV MAGNETIC FIELD DETECTOR

(71) Applicant: LOCKHEED MARTIN CORPORATION, Besthesda, MD (US)

(72) Inventors: Brian P. Boesch, Reston, VA (US); Gregory Scott Bruce, Abington, PA (US); Jeff D. Cammerata, Medford Lakes, NJ (US); David Nelson Coar, Cherry Hill, NJ (US); Laird Nicholas Egan, Philadelphia, PA (US); Bryan Neal Fisk, Madison, AL (US); Wilbur Lew, Mount Laurel, NJ (US); Arul Manickam, Mount Laurel, NJ (US); Stephen Michael Sekelsky, Princeton, NJ (US); John B. Stetson, Jr., New Hope, NJ (US); Peter G. Kaup, Marlton, NJ (US); Julie Lynne Miller, Auberry, CA (US); Jon C. Russo, Cherry Hill, NJ (US); Emanuel Solomon Stockman, Philadelphia, PA (US); Thomas J. Meyer, Corfu, NY (US); James Michael Krause, Saint Michael, MN (US); James P. Mabry, McLean, VA (US); Elton Pepa, Dumfries, VA (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 312 days.

(21) Appl. No.: 15/912,461

(22) Filed: Mar. 5, 2018

(65) Prior Publication Data

US 2018/0196111 A1    Jul. 12, 2018

Related U.S. Application Data

(63) Continuation of application No. 15/179,957, filed on Jun. 10, 2016, now Pat. No. 9,910,105, which is a
(Continued)

(51) Int. Cl.
*G01R 33/032* (2006.01)
*G05D 1/00* (2006.01)
(Continued)

(52) U.S. Cl.
CPC .......... *G01R 33/032* (2013.01); *G01C 21/00* (2013.01); *G05D 1/0088* (2013.01); *G05D 1/101* (2013.01); *B64C 2201/141* (2013.01)

(58) Field of Classification Search
CPC ...... G01R 33/032; G01R 33/26; G01R 33/35; G01R 33/44; G01R 33/48; G01R 33/02;
(Continued)

(56) References Cited

U.S. PATENT DOCUMENTS 2,746,027 A    5/1956   Murray
3,359,812 A    12/1967  Everitt
(Continued)

FOREIGN PATENT DOCUMENTS

CN    105738845 A    7/2016
CN    106257602      12/2016
(Continued)

OTHER PUBLICATIONS

International Search Report and Written Opinion for PCT Appl. Ser. No. PCT/US2018/041411 dated Feb. 8, 2019, 13 pages.
(Continued)

*Primary Examiner* — Jermele M Hollington
*Assistant Examiner* — Taqi R Nasir
(74) *Attorney, Agent, or Firm* — Foley & Lardner LLP

(57) ABSTRACT

A system for magnetic detection includes a nitrogen vacancy (NV) diamond material comprising a plurality of NV centers, a radio frequency (RF) excitation source configured to provide RF excitation to the NV diamond material, an optical excitation source configured to provide optical excitation to the NV diamond material, an optical detector
(Continued)

configured to receive an optical signal emitted by the NV diamond material, and a controller. The optical signal is based on hyperfine states of the NV diamond material. The controller is configured to detect a gradient of the optical signal based on the hyperfine states emitted by the NV diamond material.

20 Claims, 57 Drawing Sheets

Related U.S. Application Data continuation-in-part of application No. 15/003,336, filed on Jan. 21, 2016, now abandoned, and a continuation-in-part of application No. 15/003,667, filed on Jan. 21, 2016, now Pat. No. 9,614,589, and a continuation-in-part of application No. 15/003,292, filed on Jan. 21, 2016, now Pat. No. 10,006,973, and a continuation-in-part of application No. 15/003,062, filed on Jan. 21, 2016, now abandoned, and a continuation-in-part of application No. 15/003,309, filed on Jan. 21, 2016, now Pat. No. 10,520,558, and a continuation-in-part of application No. 15/003,088, filed on Jan. 21, 2016, now Pat. No. 9,845,153, and a continuation-in-part of application No. 15/003,209, filed on Jan. 21, 2016, now Pat. No. 10,088,336, and a continuation-in-part of application No. 15/003,281, filed on Jan. 21, 2016, now Pat. No. 9,817,081, and a continuation-in-part of application No. 15/003,634, filed on Jan. 21, 2016, now Pat. No. 9,823,313, and a continuation-in-part of application No. 15/003,718, filed on Jan. 21, 2016, now Pat. No. 9,541,610, and a continuation-in-part of application No. 15/003,177, filed on Jan. 21, 2016, now abandoned, and a continuation-in-part of application No. 15/003,590, filed on Jan. 21, 2016, now Pat. No. 9,557,391, and a continuation-in-part of application No. 15/003,256, filed on Jan. 21, 2016, now Pat. No. 9,835,693, and a continuation-in-part of application No. 15/003,558, filed on Jan. 21, 2016, now Pat. No. 9,829,545, and a continuation-in-part of application No. 15/003,797, filed on Jan. 21, 2016, now Pat. No. 9,910,104, and a continuation-in-part of application No. 15/003,193, filed on Jan. 21, 2016, now abandoned, and a continuation-in-part of application No. 15/003,145, filed on Jan. 21, 2016, now Pat. No. 10,088,452, and a continuation-in-part of application No. 15/003,206, filed on Jan. 21, 2016, now Pat. No. 9,824,597, and a continuation-in-part of application No. 15/003,298, filed on Jan. 21, 2016, now Pat. No. 9,551,763, and a continuation-in-part of application No. 15/003,396, filed on Jan. 21, 2016, now abandoned, and a continuation-in-part of application No. 15/003,617, filed on Jan. 21, 2016, now abandoned, and a continuation-in-part of application No. 15/003,577, filed on Jan. 21, 2016, now abandoned, and a continuation-in-part of application No. 15/003,519, filed on Jan. 21, 2016, now Pat. No. 10,120,039, and a continuation-in-part of application No. 15/003,670, filed on Jan. 21, 2016, now Pat. No. 10,338,162, and a continuation-in-part of application No. 15/003,678, filed on Jan. 21, 2016, now abandoned, and a continuation-in-part of application No. 15/003,652, filed on Jan. 21, 2016, and a continuation-in-part of application No. 15/003,704, filed on Jan. 21, 2016, now Pat. No. 10,241,158, and a continuation-in-part of application No. 15/003,176, filed on Jan. 21, 2016, now Pat. No. 10,012,704, and a continuation-in-part of application No. 14/866,730, filed on Sep. 25, 2015, now Pat. No. 10,168,393, and a continuation-in-part of application No. 14/680,877, filed on Apr. 7, 2015, now Pat. No. 9,590,601, and a continuation-in-part of application No. 14/676,740, filed on Apr. 1, 2015, now Pat. No. 9,853,837, and a continuation-in-part of application No. 14/659,498, filed on Mar. 16, 2015, now Pat. No. 9,638,821.

(60) Provisional application No. 62/277,657, filed on Jan. 12, 2016, provisional application No. 62/261,643, filed on Dec. 1, 2015, provisional application No. 62/258,003, filed on Nov. 20, 2015, provisional application No. 62/257,988, filed on Nov. 20, 2015, provisional application No. 62/250,874, filed on Nov. 4, 2015, provisional application No. 62/214,792, filed on Sep. 4, 2015, provisional application No. 62/196,288, filed on Jul. 23, 2015, provisional application No. 62/190,209, filed on Jul. 8, 2015, provisional application No. 62/190,218, filed on Jul. 8, 2015, provisional application No. 62/112,709, filed on Feb. 4, 2015, provisional application No. 62/112,071, filed on Feb. 4, 2015, provisional application No. 62/109,551, filed on Jan. 29, 2015, provisional application No. 62/109,006, filed on Jan. 28, 2015, provisional application No. 62/107,289, filed on Jan. 23, 2015, provisional application No. 62/055,607, filed on Sep. 25, 2014, provisional application No. 61/975,997, filed on Apr. 7, 2014, provisional application No. 61/976,009, filed on Apr. 7, 2014, provisional application No. 61/955,918, filed on Mar. 20, 2014.

(51) Int. Cl.
  *G05D 1/10* (2006.01)
  *G01C 21/00* (2006.01)

(58) Field of Classification Search
  CPC ......... B82Y 25/00; B82Y 30/00; B82Y 35/00; G01C 21/00; G05D 1/0088; G05D 1/101; B64C 2201/141
  USPC ... 324/66–67, 160–180, 71.1–157, 425–470, 324/200–263, 750.01–764.01; 702/1–199; 73/37–65.09
  See application file for complete search history.

(56) References Cited

U.S. PATENT DOCUMENTS

| | | | |
|---|---|---|---|
| 3,389,333 A | 6/1968 | Wolff et al. | |
| 3,490,032 A | 1/1970 | Zurflueh | |
| 3,514,723 A | 5/1970 | Cutler | |
| 3,518,531 A | 6/1970 | Huggett | |
| 3,621,380 A | 11/1971 | Barlow, Jr. | |
| 3,745,452 A | 7/1973 | Osburn et al. | |
| 3,899,758 A | 8/1975 | Maier et al. | |
| 4,025,873 A | 5/1977 | Chilluffo | |
| 4,047,805 A | 9/1977 | Sekimura | |
| 4,078,247 A | 3/1978 | Albrecht | |
| 4,084,215 A | 4/1978 | Willenbrock | |
| 4,322,769 A | 3/1982 | Cooper | |
| 4,329,173 A | 5/1982 | Culling | |
| 4,359,673 A | 11/1982 | Bross et al. | |
| 4,368,430 A | 1/1983 | Dale et al. | |
| 4,410,926 A | 10/1983 | Hafner et al. | |
| 4,437,533 A | 3/1984 | Bierkarre et al. | |
| 4,514,083 A | 4/1985 | Fukuoka | |
| 4,588,993 A | 5/1986 | Babij et al. | |

(56) References Cited

U.S. PATENT DOCUMENTS

| | | |
|---|---|---|
| 4,636,612 A | 1/1987 | Cullen |
| 4,638,324 A | 1/1987 | Hannan |
| 4,675,522 A | 6/1987 | Arunkumar |
| 4,768,962 A | 9/1988 | Kupfer et al. |
| 4,818,990 A | 4/1989 | Fernandes |
| 4,820,986 A | 4/1989 | Mansfield et al. |
| 4,945,305 A | 7/1990 | Blood |
| 4,958,328 A | 9/1990 | Stubblefield |
| 4,982,158 A | 1/1991 | Nakata et al. |
| 5,019,721 A | 5/1991 | Martens et al. |
| 5,038,103 A | 8/1991 | Scarzello et al. |
| 5,113,136 A | 5/1992 | Hayashi et al. |
| 5,134,369 A | 7/1992 | Lo et al. |
| 5,189,368 A | 2/1993 | Chase |
| 5,200,855 A | 4/1993 | Meredith et al. |
| 5,210,650 A | 5/1993 | O'Brien et al. |
| 5,245,347 A | 9/1993 | Bonta et al. |
| 5,252,912 A | 10/1993 | Merritt et al. |
| 5,301,096 A | 4/1994 | Klontz et al. |
| 5,384,109 A | 1/1995 | Klaveness et al. |
| 5,396,802 A | 3/1995 | Moss |
| 5,420,549 A | 5/1995 | Prestage |
| 5,425,179 A | 6/1995 | Nickel et al. |
| 5,427,915 A | 6/1995 | Ribi et al. |
| 5,548,279 A | 8/1996 | Gaines |
| 5,568,516 A | 10/1996 | Strohallen et al. |
| 5,586,069 A | 12/1996 | Dockser |
| 5,597,762 A | 1/1997 | Popovici et al. |
| 5,638,472 A | 6/1997 | Van Delden |
| 5,694,375 A | 12/1997 | Woodall |
| 5,719,497 A | 2/1998 | Veeser et al. |
| 5,731,996 A | 3/1998 | Gilbert |
| 5,764,061 A | 6/1998 | Asakawa et al. |
| 5,818,352 A | 10/1998 | McClure |
| 5,846,708 A | 12/1998 | Hollis et al. |
| 5,888,925 A | 3/1999 | Smith et al. |
| 5,894,220 A | 4/1999 | Wellstood et al. |
| 5,907,420 A | 5/1999 | Chraplyvy et al. |
| 5,907,907 A | 6/1999 | Ohtomo et al. |
| 5,915,061 A | 6/1999 | Vanoli |
| 5,995,696 A | 11/1999 | Miyagi et al. |
| 6,042,249 A | 3/2000 | Spangenberg |
| 6,057,684 A | 5/2000 | Murakami et al. |
| 6,064,210 A | 5/2000 | Sinclair |
| 6,121,053 A | 9/2000 | Kolber et al. |
| 6,124,862 A | 9/2000 | Boyken et al. |
| 6,130,753 A | 10/2000 | Hopkins et al. |
| 6,144,204 A | 11/2000 | Sementchenko |
| 6,195,231 B1 | 2/2001 | Sedlmayr et al. |
| 6,215,303 B1 | 4/2001 | Weinstock et al. |
| 6,262,574 B1 | 7/2001 | Cho et al. |
| 6,360,173 B1 | 3/2002 | Fullerton |
| 6,398,155 B1 | 6/2002 | Hepner et al. |
| 6,433,944 B1 | 8/2002 | Nagao et al. |
| 6,437,563 B1 | 8/2002 | Simmonds et al. |
| 6,472,651 B1 | 10/2002 | Ukai |
| 6,472,869 B1 | 10/2002 | Upschulte et al. |
| 6,504,365 B2 | 1/2003 | Kitamura |
| 6,518,747 B2 | 2/2003 | Sager et al. |
| 6,542,242 B1 | 4/2003 | Yost et al. |
| 6,621,377 B2 | 9/2003 | Osadchy et al. |
| 6,621,578 B1 | 9/2003 | Mizoguchi |
| 6,636,146 B1 | 10/2003 | Wehoski |
| 6,686,696 B2 | 2/2004 | Mearini et al. |
| 6,690,162 B1 | 2/2004 | Schopohl et al. |
| 6,765,487 B1 | 7/2004 | Holmes et al. |
| 6,788,722 B1 | 9/2004 | Kennedy et al. |
| 6,809,829 B1 | 10/2004 | Takata et al. |
| 7,118,657 B2 | 10/2006 | Golovchenko et al. |
| 7,221,164 B1 | 5/2007 | Barringer |
| 7,277,161 B2 | 10/2007 | Claus |
| 7,305,869 B1 | 12/2007 | Berman et al. |
| 7,307,416 B2 | 12/2007 | Islam et al. |
| 7,342,399 B1 | 3/2008 | Wiegert |
| RE40,343 E | 5/2008 | Anderson |
| 7,400,142 B2 | 7/2008 | Greelish |
| 7,413,011 B1 | 8/2008 | Chee et al. |
| 7,427,525 B2 | 9/2008 | Santori et al. |
| 7,448,548 B1 | 11/2008 | Compton |
| 7,471,805 B2 | 12/2008 | Goldberg |
| 7,474,090 B2 | 1/2009 | Islam et al. |
| 7,543,780 B1 | 6/2009 | Marshall et al. |
| 7,546,000 B2 | 6/2009 | Spillane et al. |
| 7,570,050 B2 * | 8/2009 | Sugiura ............ G01R 33/56375 324/307 |
| 7,608,820 B1 | 10/2009 | Berman et al. |
| 7,705,599 B2 | 4/2010 | Strack et al. |
| 7,741,936 B1 | 6/2010 | Weller et al. |
| 7,805,030 B2 | 9/2010 | Bratkovski et al. |
| 7,868,702 B2 | 1/2011 | Ohnishi |
| 7,889,484 B2 | 2/2011 | Choi |
| 7,916,489 B2 | 3/2011 | Okuya |
| 7,932,718 B1 | 4/2011 | Wiegert |
| 7,983,812 B2 | 7/2011 | Potter |
| 8,022,693 B2 | 9/2011 | Meyersweissflog |
| 8,120,351 B2 | 2/2012 | Rettig et al. |
| 8,120,355 B1 | 2/2012 | Stetson |
| 8,124,296 B1 | 2/2012 | Fischel |
| 8,138,756 B2 | 3/2012 | Barclay et al. |
| 8,193,808 B2 | 6/2012 | Fu et al. |
| 8,294,306 B2 | 10/2012 | Kumar et al. |
| 8,310,251 B2 | 11/2012 | Orazem |
| 8,311,767 B1 | 11/2012 | Stetson |
| 8,334,690 B2 | 12/2012 | Kitching et al. |
| 8,415,640 B2 | 4/2013 | Babinec et al. |
| 8,471,137 B2 | 6/2013 | Adair et al. |
| 8,480,653 B2 | 7/2013 | Birchard et al. |
| 8,525,516 B2 | 9/2013 | Le Prado et al. |
| 8,547,090 B2 | 10/2013 | Lukin et al. |
| 8,574,536 B2 | 11/2013 | Boudou et al. |
| 8,575,929 B1 | 11/2013 | Wiegert |
| 8,686,377 B2 | 4/2014 | Twitchen et al. |
| 8,704,546 B2 | 4/2014 | Konstantinov |
| 8,758,509 B2 | 6/2014 | Twitchen et al. |
| 8,803,513 B2 | 8/2014 | Hosek et al. |
| 8,854,839 B2 | 10/2014 | Cheng et al. |
| 8,885,301 B1 | 11/2014 | Heidmann |
| 8,913,900 B2 | 12/2014 | Lukin et al. |
| 8,933,594 B2 | 1/2015 | Kurs |
| 8,947,080 B2 | 2/2015 | Lukin et al. |
| 8,963,488 B2 | 2/2015 | Campanella et al. |
| 9,103,873 B1 | 8/2015 | Martens et al. |
| 9,157,859 B2 | 10/2015 | Walsworth et al. |
| 9,245,551 B2 | 1/2016 | El Hallak et al. |
| 9,249,526 B2 | 2/2016 | Twitchen et al. |
| 9,270,387 B2 | 2/2016 | Wolfe et al. |
| 9,291,508 B1 | 3/2016 | Biederman et al. |
| 9,317,811 B2 | 4/2016 | Scarsbrook |
| 9,369,182 B2 | 6/2016 | Kurs et al. |
| 9,442,205 B2 | 9/2016 | Geiser et al. |
| 9,541,610 B2 | 1/2017 | Kaup et al. |
| 9,551,763 B1 | 1/2017 | Hahn et al. |
| 9,557,391 B2 | 1/2017 | Egan et al. |
| 9,570,793 B2 | 2/2017 | Borodulin |
| 9,590,601 B2 | 3/2017 | Krause et al. |
| 9,614,589 B1 | 4/2017 | Russo et al. |
| 9,632,045 B2 | 4/2017 | Englund et al. |
| 9,645,223 B2 | 5/2017 | Megdal et al. |
| 9,680,338 B2 | 6/2017 | Malpas et al. |
| 9,689,679 B2 | 6/2017 | Budker et al. |
| 9,720,055 B1 | 8/2017 | Hahn et al. |
| 9,778,329 B2 | 10/2017 | Heidmann |
| 9,779,769 B2 | 10/2017 | Heidmann |
| 9,891,297 B2 | 2/2018 | Sushkov et al. |
| 2002/0144093 A1 | 10/2002 | Inoue et al. |
| 2002/0167306 A1 | 11/2002 | Zalunardo et al. |
| 2003/0058346 A1 | 3/2003 | Bechtel et al. |
| 2003/0076229 A1 | 4/2003 | Blanpain et al. |
| 2003/0094942 A1 | 5/2003 | Friend et al. |
| 2003/0098455 A1 | 5/2003 | Amin et al. |
| 2003/0235136 A1 | 12/2003 | Akselrod et al. |
| 2004/0013180 A1 | 1/2004 | Giannakis et al. |
| 2004/0022179 A1 | 2/2004 | Giannakis et al. |
| 2004/0042150 A1 | 3/2004 | Swinbanks et al. |

(56) References Cited

U.S. PATENT DOCUMENTS

| | | |
|---|---|---|
| 2004/0081033 A1 | 4/2004 | Arieli et al. |
| 2004/0095133 A1 | 5/2004 | Nikitin et al. |
| 2004/0109328 A1 | 6/2004 | Dahl et al. |
| 2004/0247145 A1 | 12/2004 | Luo et al. |
| 2005/0031840 A1 | 2/2005 | Swift et al. |
| 2005/0068249 A1 | 3/2005 | Du Toit et al. |
| 2005/0099177 A1 | 5/2005 | Greelish |
| 2005/0112594 A1 | 5/2005 | Grossman |
| 2005/0126905 A1 | 6/2005 | Golovchenko et al. |
| 2005/0130601 A1 | 6/2005 | Palermo et al. |
| 2005/0134257 A1 | 6/2005 | Etherington et al. |
| 2005/0138330 A1 | 6/2005 | Owens et al. |
| 2005/0146327 A1 | 7/2005 | Jaka |
| 2006/0012385 A1 | 1/2006 | Tsao et al. |
| 2006/0054789 A1 | 3/2006 | Miyamoto et al. |
| 2006/0055584 A1 | 3/2006 | Waite et al. |
| 2006/0062084 A1* | 3/2006 | Drew ............... G01V 1/008 367/68 |
| 2006/0071709 A1 | 4/2006 | Maloberti et al. |
| 2006/0245078 A1 | 11/2006 | Kawamura |
| 2006/0247847 A1 | 11/2006 | Carter et al. |
| 2006/0255801 A1* | 11/2006 | Ikeda ............... G01R 33/54 324/307 |
| 2006/0291771 A1 | 12/2006 | Braunisch et al. |
| 2007/0004371 A1 | 1/2007 | Okanobu |
| 2007/0120563 A1 | 5/2007 | Kawabata et al. |
| 2007/0247147 A1 | 10/2007 | Xiang et al. |
| 2007/0273877 A1 | 11/2007 | Kawano et al. |
| 2008/0016677 A1 | 1/2008 | Creighton, IV |
| 2008/0048640 A1 | 2/2008 | Hull et al. |
| 2008/0078233 A1 | 4/2008 | Larson et al. |
| 2008/0089367 A1 | 4/2008 | Srinivasan et al. |
| 2008/0204004 A1 | 8/2008 | Anderson |
| 2008/0217516 A1 | 9/2008 | Suzuki et al. |
| 2008/0239265 A1 | 10/2008 | Den Boef |
| 2008/0253264 A1 | 10/2008 | Nagatomi et al. |
| 2008/0265895 A1 | 10/2008 | Strack et al. |
| 2008/0266050 A1 | 10/2008 | Crouse et al. |
| 2008/0279047 A1 | 11/2008 | An et al. |
| 2008/0299904 A1 | 12/2008 | Yi et al. |
| 2009/0001979 A1 | 1/2009 | Kawabata |
| 2009/0015262 A1 | 1/2009 | Strack et al. |
| 2009/0042592 A1 | 2/2009 | Cho et al. |
| 2009/0058697 A1 | 3/2009 | Aas et al. |
| 2009/0060790 A1 | 3/2009 | Okaguchi et al. |
| 2009/0079417 A1 | 3/2009 | Mort et al. |
| 2009/0079426 A1 | 3/2009 | Anderson |
| 2009/0132100 A1 | 5/2009 | Shibata |
| 2009/0157331 A1 | 6/2009 | Van Netten |
| 2009/0161264 A1 | 6/2009 | Meyersweissflog |
| 2009/0195244 A1* | 8/2009 | Mouget ............... G01V 3/28 324/221 |
| 2009/0222208 A1 | 9/2009 | Speck |
| 2009/0243616 A1 | 10/2009 | Loehken et al. |
| 2009/0244857 A1 | 10/2009 | Tanaka |
| 2009/0277702 A1 | 11/2009 | Kanada et al. |
| 2009/0310650 A1 | 12/2009 | Chester et al. |
| 2010/0004802 A1 | 1/2010 | Bodin et al. |
| 2010/0015438 A1 | 1/2010 | Williams et al. |
| 2010/0015918 A1 | 1/2010 | Liu et al. |
| 2010/0045269 A1 | 2/2010 | Lafranchise et al. |
| 2010/0071904 A1 | 3/2010 | Burns et al. |
| 2010/0102809 A1 | 4/2010 | May |
| 2010/0102820 A1 | 4/2010 | Martinez et al. |
| 2010/0134922 A1 | 6/2010 | Yamada et al. |
| 2010/0157305 A1 | 6/2010 | Henderson |
| 2010/0188081 A1 | 7/2010 | Lammegger |
| 2010/0237149 A1 | 9/2010 | Olmstead |
| 2010/0271016 A1 | 10/2010 | Barclay et al. |
| 2010/0271032 A1 | 10/2010 | Helwig |
| 2010/0277121 A1 | 11/2010 | Hall et al. |
| 2010/0308813 A1 | 12/2010 | Lukin et al. |
| 2010/0315079 A1 | 12/2010 | Lukin et al. |
| 2010/0321117 A1 | 12/2010 | Gan |
| 2010/0326042 A1 | 12/2010 | McLean et al. |
| 2011/0031969 A1 | 2/2011 | Kitching et al. |
| 2011/0034393 A1 | 2/2011 | Justen et al. |
| 2011/0059704 A1 | 3/2011 | Norimatsu et al. |
| 2011/0062957 A1 | 3/2011 | Fu et al. |
| 2011/0062967 A1 | 3/2011 | Mohaupt |
| 2011/0066379 A1 | 3/2011 | Mes |
| 2011/0120890 A1 | 5/2011 | MacPherson et al. |
| 2011/0127999 A1 | 6/2011 | Lott et al. |
| 2011/0165862 A1 | 7/2011 | Yu et al. |
| 2011/0175604 A1 | 7/2011 | Polzer et al. |
| 2011/0176563 A1 | 7/2011 | Friel et al. |
| 2011/0243267 A1 | 10/2011 | Won et al. |
| 2011/0270078 A1 | 11/2011 | Wagenaar et al. |
| 2011/0279120 A1 | 11/2011 | Sudow et al. |
| 2011/0315988 A1 | 12/2011 | Yu et al. |
| 2012/0016538 A1 | 1/2012 | Waite et al. |
| 2012/0019242 A1 | 1/2012 | Hollenberg et al. |
| 2012/0037803 A1 | 2/2012 | Strickland |
| 2012/0044014 A1 | 2/2012 | Stratakos et al. |
| 2012/0051996 A1 | 3/2012 | Scarsbrook et al. |
| 2012/0063505 A1 | 3/2012 | Okamura et al. |
| 2012/0087449 A1 | 4/2012 | Ling et al. |
| 2012/0089299 A1 | 4/2012 | Breed |
| 2012/0140219 A1 | 6/2012 | Cleary |
| 2012/0181020 A1* | 7/2012 | Barron ............... B01J 13/02 166/250.1 |
| 2012/0194068 A1 | 8/2012 | Cheng et al. |
| 2012/0203086 A1 | 8/2012 | Rorabaugh et al. |
| 2012/0232838 A1 | 9/2012 | Kemppi et al. |
| 2012/0235633 A1 | 9/2012 | Kesler et al. |
| 2012/0235634 A1 | 9/2012 | Hall et al. |
| 2012/0245885 A1 | 9/2012 | Kimishima |
| 2012/0257683 A1 | 10/2012 | Schwager et al. |
| 2012/0281843 A1 | 11/2012 | Christensen et al. |
| 2012/0326793 A1 | 12/2012 | Gan |
| 2013/0043863 A1 | 2/2013 | Ausserlechner et al. |
| 2013/0070252 A1 | 3/2013 | Feth |
| 2013/0093424 A1 | 4/2013 | Blank et al. |
| 2013/0107253 A1 | 5/2013 | Santori |
| 2013/0127518 A1 | 5/2013 | Nakao |
| 2013/0179074 A1 | 7/2013 | Haverinen |
| 2013/0215712 A1 | 8/2013 | Geiser et al. |
| 2013/0223805 A1 | 8/2013 | Ouyang et al. |
| 2013/0265042 A1 | 10/2013 | Kawabata et al. |
| 2013/0265782 A1 | 10/2013 | Barrena et al. |
| 2013/0270991 A1 | 10/2013 | Twitchen et al. |
| 2013/0279319 A1 | 10/2013 | Matozaki et al. |
| 2013/0292472 A1 | 11/2013 | Guha |
| 2014/0012505 A1 | 1/2014 | Smith et al. |
| 2014/0015522 A1 | 1/2014 | Widmer et al. |
| 2014/0037932 A1 | 2/2014 | Twitchen et al. |
| 2014/0044208 A1 | 2/2014 | Woodsum |
| 2014/0061510 A1 | 3/2014 | Twitchen et al. |
| 2014/0070622 A1 | 3/2014 | Keeling et al. |
| 2014/0072008 A1 | 3/2014 | Faraon et al. |
| 2014/0077231 A1 | 3/2014 | Twitchen et al. |
| 2014/0081592 A1 | 3/2014 | Bellusci et al. |
| 2014/0104008 A1 | 4/2014 | Gan |
| 2014/0126334 A1 | 5/2014 | Megdal et al. |
| 2014/0139322 A1 | 5/2014 | Wang et al. |
| 2014/0153363 A1 | 6/2014 | Juhasz et al. |
| 2014/0154792 A1 | 6/2014 | Moynihan et al. |
| 2014/0159652 A1 | 6/2014 | Hall et al. |
| 2014/0166904 A1 | 6/2014 | Walsworth et al. |
| 2014/0167759 A1* | 6/2014 | Pines ............... G01N 24/081 324/322 |
| 2014/0168174 A1 | 6/2014 | Idzik et al. |
| 2014/0180627 A1 | 6/2014 | Naguib et al. |
| 2014/0191139 A1 | 7/2014 | Englund |
| 2014/0191752 A1 | 7/2014 | Walsworth et al. |
| 2014/0197831 A1 | 7/2014 | Walsworth |
| 2014/0198463 A1 | 7/2014 | Klein |
| 2014/0210473 A1 | 7/2014 | Campbell et al. |
| 2014/0215985 A1 | 8/2014 | Pollklas |
| 2014/0225606 A1 | 8/2014 | Endo et al. |
| 2014/0247094 A1 | 9/2014 | Englund et al. |
| 2014/0264723 A1 | 9/2014 | Liang et al. |
| 2014/0265555 A1 | 9/2014 | Hall et al. |
| 2014/0272119 A1 | 9/2014 | Kushalappa et al. |

(56) References Cited

U.S. PATENT DOCUMENTS

| | | |
|---|---|---|
| 2014/0273826 A1 | 9/2014 | Want et al. |
| 2014/0291490 A1 | 10/2014 | Hanson et al. |
| 2014/0297067 A1 | 10/2014 | Malay |
| 2014/0306707 A1 | 10/2014 | Walsworth et al. |
| 2014/0327439 A1 | 11/2014 | Cappellaro et al. |
| 2014/0335339 A1 | 11/2014 | Dhillon et al. |
| 2014/0340085 A1 | 11/2014 | Cappellaro et al. |
| 2014/0368191 A1 | 12/2014 | Goroshevskiy et al. |
| 2015/0001422 A1 | 1/2015 | Englund et al. |
| 2015/0009746 A1 | 1/2015 | Kucsko et al. |
| 2015/0015247 A1 | 1/2015 | Goodwill et al. |
| 2015/0018018 A1 | 1/2015 | Shen et al. |
| 2015/0022404 A1 | 1/2015 | Chen et al. |
| 2015/0048822 A1 | 2/2015 | Walsworth et al. |
| 2015/0054355 A1 | 2/2015 | Ben-Shalom et al. |
| 2015/0061590 A1 | 3/2015 | Widmer et al. |
| 2015/0061670 A1 | 3/2015 | Fordham et al. |
| 2015/0090033 A1 | 4/2015 | Budker et al. |
| 2015/0128431 A1 | 5/2015 | Kuo |
| 2015/0137793 A1 | 5/2015 | Englund et al. |
| 2015/0153151 A1 | 6/2015 | Kochanski |
| 2015/0192532 A1 | 7/2015 | Clevenson et al. |
| 2015/0192596 A1 | 7/2015 | Englund et al. |
| 2015/0225052 A1 | 8/2015 | Cordell |
| 2015/0235661 A1 | 8/2015 | Heidmann |
| 2015/0253355 A1 | 9/2015 | Grinolds et al. |
| 2015/0268373 A1 | 9/2015 | Meyer |
| 2015/0269957 A1 | 9/2015 | El Hallak et al. |
| 2015/0276897 A1 | 10/2015 | Leussler et al. |
| 2015/0288352 A1 | 10/2015 | Krause et al. |
| 2015/0299894 A1 | 10/2015 | Markham et al. |
| 2015/0303333 A1 | 10/2015 | Yu et al. |
| 2015/0314870 A1 | 11/2015 | Davies |
| 2015/0326030 A1 | 11/2015 | Malpas et al. |
| 2015/0326410 A1 | 11/2015 | Krause et al. |
| 2015/0354985 A1 | 12/2015 | Judkins et al. |
| 2015/0358026 A1 | 12/2015 | Gan |
| 2015/0374250 A1 | 12/2015 | Hatano et al. |
| 2015/0377865 A1 | 12/2015 | Acosta et al. |
| 2015/0377987 A1 | 12/2015 | Menon et al. |
| 2016/0018269 A1 | 1/2016 | Maurer et al. |
| 2016/0031339 A1 | 2/2016 | Geo |
| 2016/0036529 A1 | 2/2016 | Griffith et al. |
| 2016/0052789 A1 | 2/2016 | Gaathon et al. |
| 2016/0054402 A1 | 2/2016 | Meriles |
| 2016/0061914 A1 | 3/2016 | Jelezko |
| 2016/0071532 A9 | 3/2016 | Heidmann |
| 2016/0077167 A1 | 3/2016 | Heidmann |
| 2016/0097702 A1 | 4/2016 | Zhao et al. |
| 2016/0113507 A1 | 4/2016 | Reza et al. |
| 2016/0131723 A1 | 5/2016 | Nagasaka |
| 2016/0139048 A1 | 5/2016 | Heidmann |
| 2016/0146904 A1 | 5/2016 | Stetson, Jr. et al. |
| 2016/0161429 A1 | 6/2016 | Englund et al. |
| 2016/0161583 A1 | 6/2016 | Meriles et al. |
| 2016/0174867 A1 | 6/2016 | Hatano |
| 2016/0214714 A1 | 7/2016 | Sekelsky |
| 2016/0216304 A1 | 7/2016 | Sekelsky |
| 2016/0216340 A1 | 7/2016 | Egan et al. |
| 2016/0216341 A1 | 7/2016 | Boesch et al. |
| 2016/0221441 A1 | 8/2016 | Hall et al. |
| 2016/0223621 A1 | 8/2016 | Kaup et al. |
| 2016/0231394 A1 | 8/2016 | Manickam et al. |
| 2016/0266220 A1 | 9/2016 | Sushkov et al. |
| 2016/0282427 A1 | 9/2016 | Heidmann |
| 2016/0291191 A1 | 10/2016 | Fukushima et al. |
| 2016/0313408 A1 | 10/2016 | Hatano et al. |
| 2016/0348277 A1 | 12/2016 | Markham et al. |
| 2016/0356863 A1 | 12/2016 | Boesch et al. |
| 2017/0010214 A1 | 1/2017 | Osawa et al. |
| 2017/0010334 A1 | 1/2017 | Krause et al. |
| 2017/0010338 A1 | 1/2017 | Bayat et al. |
| 2017/0010594 A1 | 1/2017 | Kottapalli et al. |
| 2017/0023487 A1 | 1/2017 | Boesch |
| 2017/0030982 A1 | 2/2017 | Jeske et al. |
| 2017/0038314 A1 | 2/2017 | Suyama et al. |
| 2017/0038411 A1 | 2/2017 | Yacobi et al. |
| 2017/0068012 A1 | 3/2017 | Fisk |
| 2017/0074660 A1 | 3/2017 | Gann et al. |
| 2017/0075020 A1 | 3/2017 | Gann et al. |
| 2017/0075205 A1 | 3/2017 | Kriman et al. |
| 2017/0077665 A1 | 3/2017 | Liu et al. |
| 2017/0104426 A1 | 4/2017 | Mills |
| 2017/0138735 A1 | 5/2017 | Cappellaro et al. |
| 2017/0139017 A1 | 5/2017 | Egan et al. |
| 2017/0146615 A1 | 5/2017 | Wolf et al. |
| 2017/0199156 A1 | 7/2017 | Villani et al. |
| 2017/0205526 A1 | 7/2017 | Meyer |
| 2017/0207823 A1 | 7/2017 | Russo et al. |
| 2017/0211947 A1 | 7/2017 | Fisk |
| 2017/0212046 A1 | 7/2017 | Cammerata |
| 2017/0212177 A1 | 7/2017 | Coar et al. |
| 2017/0212178 A1 | 7/2017 | Hahn et al. |
| 2017/0212179 A1 | 7/2017 | Hahn et al. |
| 2017/0212180 A1 | 7/2017 | Hahn et al. |
| 2017/0212181 A1 | 7/2017 | Coar et al. |
| 2017/0212182 A1 | 7/2017 | Hahn et al. |
| 2017/0212183 A1 | 7/2017 | Egan et al. |
| 2017/0212184 A1 | 7/2017 | Coar et al. |
| 2017/0212185 A1 | 7/2017 | Hahn et al. |
| 2017/0212186 A1 | 7/2017 | Hahn et al. |
| 2017/0212187 A1 | 7/2017 | Hahn et al. |
| 2017/0212190 A1 | 7/2017 | Reynolds et al. |
| 2017/0212258 A1 | 7/2017 | Fisk |
| 2017/0261629 A1 | 9/2017 | Gunnarsson et al. |
| 2017/0343617 A1 | 11/2017 | Manickam et al. |
| 2017/0343619 A1 | 11/2017 | Manickam et al. |
| 2017/0343620 A1 | 11/2017 | Hahn et al. |
| 2017/0343621 A1 | 11/2017 | Hahn et al. |
| 2017/0343695 A1 | 11/2017 | Stetson et al. |
| 2018/0136291 A1 | 5/2018 | Pham et al. |
| 2018/0275209 A1 | 9/2018 | Mandeville et al. |
| 2018/0275212 A1 | 9/2018 | Hahn et al. |
| 2018/0275224 A1 | 9/2018 | Manickam et al. |
| 2018/0275225 A1 | 9/2018 | Hahn |
| 2018/0348393 A1 | 12/2018 | Hansen et al. |
| 2019/0018085 A1 | 1/2019 | Wu et al. |

FOREIGN PATENT DOCUMENTS

| | | |
|---|---|---|
| DE | 69608006 T2 | 2/2001 |
| DE | 19600241 C2 | 8/2002 |
| DE | 10228536 A1 | 1/2003 |
| EP | 0 161 940 B1 | 12/1990 |
| EP | 0 718 642 | 6/1996 |
| EP | 0 726 458 | 8/1996 |
| EP | 1 505 627 | 2/2005 |
| EP | 1 685 597 | 8/2006 |
| EP | 1 990 313 | 11/2008 |
| EP | 2 163 392 | 3/2010 |
| EP | 2 495 166 A1 | 9/2012 |
| EP | 2 587 232 A1 | 5/2013 |
| EP | 2 705 179 | 3/2014 |
| EP | 2 707 523 | 3/2014 |
| EP | 2 745 360 | 6/2014 |
| EP | 2 769 417 | 8/2014 |
| EP | 2 790 031 | 10/2014 |
| EP | 2 837 930 A1 | 2/2015 |
| EP | 2 907 792 | 8/2015 |
| GB | 2 423 366 A | 8/2006 |
| GB | 2 433 737 | 7/2007 |
| GB | 2 482 596 | 2/2012 |
| GB | 2 483 767 | 3/2012 |
| GB | 2 486 794 | 6/2012 |
| GB | 2 490 589 | 11/2012 |
| GB | 2 491 936 | 12/2012 |
| GB | 2 493 236 | 1/2013 |
| GB | 2 495 632 A | 4/2013 |
| GB | 2 497 660 | 6/2013 |
| GB | 2 510 053 A | 7/2014 |
| GB | 2 515 226 | 12/2014 |
| GB | 2 522 309 | 7/2015 |
| GB | 2 526 639 | 12/2015 |
| JP | 3782147 B2 | 6/2006 |

(56) References Cited

FOREIGN PATENT DOCUMENTS

| | | |
|---|---|---|
| JP | 4800896 B2 | 10/2011 |
| JP | 2012-103171 | 5/2012 |
| JP | 2012-110489 | 6/2012 |
| JP | 2012-121748 | 6/2012 |
| JP | 2013-028497 | 2/2013 |
| JP | 5476206 B2 | 4/2014 |
| JP | 5522606 B2 | 6/2014 |
| JP | 5536056 B2 | 7/2014 |
| JP | 5601183 B2 | 10/2014 |
| JP | 2014-215985 | 11/2014 |
| JP | 2014-216596 | 11/2014 |
| JP | 2015-518562 A | 7/2015 |
| JP | 5764059 B2 | 8/2015 |
| JP | 2015-167176 | 9/2015 |
| JP | 2015-529328 | 10/2015 |
| JP | 5828036 B2 | 12/2015 |
| JP | 5831947 B2 | 12/2015 |
| WO | WO-87/04028 A1 | 7/1987 |
| WO | WO-88/04032 A1 | 6/1988 |
| WO | WO-95/33972 A1 | 12/1995 |
| WO | WO-2009/073736 | 6/2009 |
| WO | WO-2011/046403 A2 | 4/2011 |
| WO | WO-2011/153339 A1 | 12/2011 |
| WO | WO-2012/016977 A2 | 2/2012 |
| WO | WO-2012/084750 | 6/2012 |
| WO | WO-2013/027074 | 2/2013 |
| WO | WO-2013/059404 A1 | 4/2013 |
| WO | WO-2013/066446 A1 | 5/2013 |
| WO | WO-2013/066448 | 5/2013 |
| WO | WO-2013/093136 A1 | 6/2013 |
| WO | WO-2013/188732 A1 | 12/2013 |
| WO | WO-2013/190329 A1 | 12/2013 |
| WO | WO-2014/011286 A2 | 1/2014 |
| WO | WO-2014/099110 A2 | 6/2014 |
| WO | WO-2014/135544 A1 | 9/2014 |
| WO | WO-2014/135547 A1 | 9/2014 |
| WO | WO-2014/166883 A1 | 10/2014 |
| WO | WO-2014/210486 A1 | 12/2014 |
| WO | WO-2015/015172 A1 | 2/2015 |
| WO | WO-2015/142945 | 9/2015 |
| WO | WO-2015/157110 A1 | 10/2015 |
| WO | WO-2015/157290 A1 | 10/2015 |
| WO | WO-2015/158383 A1 | 10/2015 |
| WO | WO-2015/193156 A1 | 12/2015 |
| WO | WO-2016/075226 A1 | 5/2016 |
| WO | WO-2016/118756 A1 | 7/2016 |
| WO | WO-2016/118791 A1 | 7/2016 |
| WO | WO-2016/122965 A1 | 8/2016 |
| WO | WO-2016/122966 A1 | 8/2016 |
| WO | WO-2016/126435 A1 | 8/2016 |
| WO | WO-2016/126436 A1 | 8/2016 |
| WO | WO-2016/190909 A2 | 12/2016 |
| WO | WO-2017/007513 A1 | 1/2017 |
| WO | WO-2017/007514 A1 | 1/2017 |
| WO | WO-2017/014807 A1 | 1/2017 |
| WO | WO-2017/039747 A1 | 3/2017 |
| WO | WO-2017/095454 A1 | 6/2017 |
| WO | WO-2017/127079 A1 | 7/2017 |
| WO | WO-2017/127080 A1 | 7/2017 |
| WO | WO-2017/127081 A1 | 7/2017 |
| WO | WO-2017/127085 A1 | 7/2017 |
| WO | WO-2017/127090 A1 | 7/2017 |
| WO | WO-2017/127091 A1 | 7/2017 |
| WO | WO-2017/127093 A1 | 7/2017 |
| WO | WO-2017/127094 A1 | 7/2017 |
| WO | WO-2017/127095 A1 | 7/2017 |
| WO | WO-2017/127096 A1 | 7/2017 |
| WO | WO-2017/127097 A1 | 7/2017 |
| WO | WO-2017/127098 A1 | 7/2017 |

OTHER PUBLICATIONS

Rosskopf, "Advanced quantum sensing using nitrogen vacancy centers in diamond", Dissertation, p. 91 (12 pages), XP055500261, DOI: 10.3929/ethz-b-000168296 Retrieved from the Internet: URL: https://epo.summon.serialsolutions.com/2.0.0/Link/0/elvHCXMw Y2BQsUxJMUsOMJTWNQWwlomqZYWuoIJ5qa6qaagq5BSjEz MLUG7kSOdTULczYPcTXwQHUXQqkrUWXXQ_a21WpJRpZu kC26gWBhZmjEzsAJbAuaWkH1HrEqAZSIojWVyZkkqUoXhJsj A44106S3EwJSaJ8Lg5AidcFcoLAV6qDRXoRiOfDwvXaEUTA JzV1E-
MEIVyIIKTQYWeAmJIJLB5ppCZpwCMRmCCSRFIMHVzDXH201X (retr.

Schonfeld, "Optical readout of single spins for quantum computing and magnetic sensing", Dissertation, Fachbereich Physlk der Freien Universitat Berlin, May 1, 2011, 21 Pages (relevant pages only), XP055143403. Retrieved from the Internet: URL: http://www.diss. fu-berlin.de/diss/servlets/MCRFileNodeServIeUFU Diss derivate_000000012199/DIssertatIon_Slmon-choenfela PublIcVersion-2.pdfJsessionid-89A943688E59.

U.S. Final Office Action for U.S. Appl. No. 15/003,396 dated Mar. 22, 2019, 13 pages.

U.S. Final Office Action for U.S. Appl. No. 15/382,045 dated Apr. 26, 2019, 16 pages.

U.S. Final Office Action for U.S. Appl. No. 15/443,422 dated Mar. 7, 2019, 17 pages.

U.S. Non-Final Office Action for U.S. Appl. No. 15/003,193 dated Apr. 11, 2019, 7 pages.

U.S. Non-Final Office Action for U.S. Appl. No. 15/003,309 dated Feb. 13, 2019, 16 pages.

U.S. Non-Final Office Action for U.S. Appl. No. 15/003,617 dated Feb. 26, 2019, 10 pages.

U.S. Non-Final Office Action for U.S. Appl. No. 15/372,201 dated Apr. 2, 2019, 10 pages.

U.S. Non-Final Office Action for U.S. Appl. No. 15/419,832 dated Feb. 8, 2019, 12 pages.

U.S. Non-Final Office Action for U.S. Appl. No. 15/440,194 dated Feb. 15, 2019, 21 pages.

U.S. Non-Final Office Action for U.S. Appl. No. 15/446,373 dated Apr. 19, 2019, 8 pages.

U.S. Non-Final Office Action for U.S. Appl. No. 15/468,314 dated Mar. 28, 2019, 17 pages.

U.S. Non-Final Office Action for U.S. Appl. No. 15/468,410 dated Apr. 11, 2019, 15 pages.

U.S. Non-Final Office Action for U.S. Appl. No. 15/468,559 dated Apr. 11, 2019, 12 pages.

U.S. Non-Final Office Action for U.S. Appl. No. 15/469,374 dated Feb. 28, 2019, 14 pages.

U.S. Notice of Allowance for U.S. Appl. No. 15/003,617 dated Apr. 30, 2019, 9 pages.

U.S. Notice of Allowance for U.S. Appl. No. 15/207,457 dated Mar. 6, 2019, 16 pages.

U.S. Notice of Allowance for U.S. Appl. No. 15/376,244 dated Feb. 21, 2019, 7 pages.

U.S. Notice of Allowance for U.S. Appl. No. 15/380,419 dated Feb. 26, 2019, 5 pages.

U.S. Notice of Allowance for U.S. Appl. No. 15/400,794 dated Apr. 25, 2019, 5 pages.

U.S. Notice of Allowance for U.S. Appl. No. 15/437,038 dated Mar. 21, 2019, 13 pages.

U.S. Notice of Allowance for U.S. Appl. No. 15/437,222 dated Mar. 25, 2019, 11 pages.

U.S. Notice of Allowance for U.S. Appl. No. 15/468,282 dated Feb. 19, 2019, 8 pages.

U.S. Notice of Allowance for U.S. Appl. No. 15/468,56 dated Apr. 22, 2019, 8 pages.

U.S. Notice of Allowance for U.S. Appl. No. 15/468,582 dated Mar. 21, 2019, 13 pages.

U.S. Notice of Allowance for U.S. Appl. No. 15/468,951 dated Mar. 28, 2019, 8 pages.

European Extended Search Report for Appl. Ser. No. 16740794.9 dated Nov. 12, 2018, 12 pages.

Halbach et al., "Design of Permanent Multipole Magnets with Oriented Rare Earth Cobalt Material", Nuclear Instruments and

(56) References Cited

OTHER PUBLICATIONS

Methods, North Holland Publishing Co., Amsterdam, NL., vol. 169, Jan. 1, 1980, pp. 1-5, XP001032085, DOI: 10.1016/0029-554X(80)90094-4.
Hodges et al., "Time-keeping with electron spin states in diamond", Dept. of Electrical Engineering and Dept. of Applied Physics and Applied Mathematics, Columbia University, New York, New York 10027, Aug. 30, 2011, 13 pages.
Hodges et al., Appendix, "Time-keeping with electron spin states in diamond", Dept. of Electrical Engineering and Dept. of Applied Physics and Applied Mathematics, Columbia University, New York, New York 10027, Aug. 27, 2012, 46 pages.
International Search Report and Written Opinion for PCT Appl. Ser. No. PCT/US2018/041527 dated Feb. 4, 2019, 22 pages.
U.S. Ex Parte Quayle Action for U.S. Appl. No. 15/468,641 dated Nov. 28, 2018, 11 pages.
U.S. Non-Final Office Action for U.S. Appl. No. 15/003,177 dated Jan. 14, 2019, 15 pages.
U.S. Non-Final Office Action for U.S. Appl. No. 15/003,670 dated Nov. 27, 2018, 14 pages.
U.S. Non-Final Office Action for U.S. Appl. No. 15/382,045 dated Dec. 31, 2018, 16 pages.
U.S. Non-Final Office Action for U.S. Appl. No. 15/400,794 dated Jan. 10, 2019, 6 pages.
U.S. Non-Final Office Action for U.S. Appl. No. 15/468,356 dated Jan. 2, 2019, 10 pages.
U.S. Non-Final Office Action for U.S. Appl. No. 15/468,951 dated Dec. 13, 2018, 9 pages.
U.S. Notice of Allowance for U.S. Appl. No. 15/003,670 dated Feb. 1, 2019, 7 pages.
U.S. Notice of Allowance for U.S. Appl. No. 15/350,303 dated Dec. 26, 2018, 10 pages.
U.S. Notice of Allowance for U.S. Appl. No. 15/450,504 dated Dec. 13, 2018, 7 pages.
U.S. Notice of Allowance for U.S. Appl. No. 15/454,162 dated Jan. 17, 2019, 8 pages.
U.S. Notice of Allowance for U.S. Appl. No. 15/468,397 dated Dec. 12, 2018, 5 pages.
U.S. Notice of Allowance for U.S. Appl. No. 15/468,641 dated Feb. 7, 2019, 10 pages.
U.S. Notice of Allowance for U.S. Appl. No. 15/479,256 dated Feb. 4, 2019, 7 pages.
Teeling-Smith et al., "Electron Paramagnetic Resonance of a Single NV Nanodiamond Attached to an Individual Biomolecule", Biophysical Journal 110, May 10, 2016, pp. 2044-2052.
UK Office Action dated Jun. 8, 2018, from related application No. GB1617438.5, 3 pages.
U.S. Final Office Action dated Jul. 26, 2018 from related U.S. Appl. No. 15/003,177, 14 pages.
U.S. Non-Final Office Action dated Aug. 6, 2018 from related U.S. Appl. No. 15/376,244, 28 pages.
U.S. Non-Final Office Action dated Aug. 9, 2018 from related U.S. Appl. No. 15/003,309, 22 pages.
U.S. Non-Final Office Action dated Jul. 20, 2018 from related U.S. Appl. No. 15/350,303, 13 pages.
U.S. Non-Final Office Action dated Jul. 26, 2018 from related U.S. Appl. No. 15/380,419, 11 pages.
U.S. Non-Final Office Action dated Jul. 3, 2018 from related U.S. Appl. No. 15/003,396, 19 pages.
U.S. Notice of Allowance dated Jul. 18, 2018 from related U.S. Appl. No. 15/468,386, 12 pages.
U.S. Notice of Allowance dated Jul. 6, 2018 from related U.S. Appl. No. 15/672,953, 11 pages.
U.S. Notice of Allowance dated Jun. 27, 2018 from related U.S. Appl. No. 15/003,519, 21 pages.
U.S. Notice of Allowance dated May 15, 2018 from related U.S. Appl. No. 15/003,209, 7 pages.
U.S. Notice of Allowance dated May 16, 2018, from related U.S. Appl. No. 15/003,145, 8 pages.
U.S. Office Action dated Jun. 19, 2018, from related U.S. Appl. No. 15/450,504, 12 pages.
European Extended Search Report for Appl. Ser. No. 16743879.5 dated Sep. 11, 2018, 11 pages.
European Extended Search Report for Appl. Ser. No. 16800410.9 dated Oct. 12, 2018, 11 pages.
Fenglian Niu, "Crack Detection of Power Line Based on Metal Magnetic Memory Non-destructive", Telkomnika Indonesian Journal of Electrical Engineering, vol. 12, No. 11, Nov. 1, 2014, pp. 7764-7771.
U.S. Final Office Action for U.S. Appl. No. 15/380,691 dated Sep. 21, 2018, 12 pages.
U.S. Final Office Action for U.S. Appl. No. 15/479,256 dated Sep. 10, 2018, 20 pages.
U.S. Non-Final Office Action for U.S. Appl. No. 15/443,422 dated Oct. 2, 2018, 16 pages.
U.S. Non-Final Office Action for U.S. Appl. No. 15/446,373 dated Oct. 1, 2018, 13 pages.
U.S. Non-Final Office Action for U.S. Appl. No. 15/454,162 dated Sep. 10, 2018, 13 pages.
U.S. Non-Final Office Action for U.S. Appl. No. 15/468,282 dated Oct. 10, 2018, 12 pages.
U.S. Non-Final Office Action for U.S. Appl. No. 15/372,201 dated Oct. 15, 2018, 12 pages.
U.S. Non-Final Office Action for U.S. Appl. No. 15/468,274 dated Oct. 26, 2018, 11 pages.
U.S. Notice of Allowance U.S. Appl. No. 14/866,730 dated Aug. 15, 2018, 9 pages.
U.S. Notice of Allowance for U.S. Appl. No. 15/468,289 dated Oct. 17, 2018, 12 pages.
U.S. Notice of Allowance for U.S. Appl. No. 15/003,704 dated Nov. 2, 2018, 19 pages.
U.S. Office Action for U.S. Appl. No. 15/468,397 dated Sep. 13, 2018, 7 pages.
International Search Report and Written Opinion for PCT Appl. Ser. No. PCT/US2019/022097 dated May 15, 2019, 13 pages.
U.S. Final Office Action for U.S. Appl. No. 15/003,309 dated May 23, 2019, 8 pages.
U.S. Non-Final Office Action for U.S. Appl. No. 15/468,274 dated May 14, 2019, 15 pages.
U.S. Non-Final Office Action for U.S. Appl. No. 15/468,303 dated Jun. 25, 2019, 14 pages.
U.S. Notice of Allowance for U.S. Appl. No. 15/419,832 dated Jun. 24, 2019, 5 pages.
U.S. Notice of Allowance for U.S. Appl. No. 15/443,422 dated Jul. 23, 2019, 10 pages.
U.S. Notice of Allowance for U.S. Appl. No. 15/469,374 dated Jun. 20, 2019, 5 pages.
"Diamond Sensors, Detectors, and Quantum Devices' in Patent Application Approval Process," Chemicals & Chemistry, pp. 1-6, (Feb. 28, 2014), 6 pages.
"Findings from University of Stuttgart in physics reported," Science Letter, (Jul. 7, 2009), 2 pages.
"New Findings on Nitrogen from Ecole Normale Superieure Summarized (Magnetic imaging with an ensemble of nitrogen vacancy-centers in diamond)," Physics Week, pp. 1-2, (Jul. 21, 2015), 2 pages.
"Patent Issued for Diamond Sensors, Detectors, and Quantum Devices (USPTO 9249526)," Journal of Engineering, pp. 1-5 (Feb. 15, 2016), 5 pages.
"Researchers Submit Patent Application, 'Diamond Sensors, Detectors, and Quantum Devices', for Approval," Chemicals & Chemistry, pp. 1-7, (Apr. 11, 2014), 7 pages.
Acosta et al., "Broadband magnetometry by infrared-absorption detection of nitrogen-vacancy ensembles in diamond," Appl. Phys. Letters 97: 174104 (Oct. 29, 2010), 4 pages.
Acosta et al., "Diamonds with a high density of nitrogen-vacancy centers for magnetometry applications," Physical Review B 80(115202): 1-15 (Sep. 9, 2009), 15 pages.
Acosta et al., "Nitrogen-vacancy centers: physics and applications," MRS Bulletin 38(2): 127-130 (Feb. 2013), 4 pages.

(56) References Cited

OTHER PUBLICATIONS

Acosta, "Optical Magnetometry with Nitrogen-Vacancy Centers in Diamond," University of California Berkeley, (Spring 2011), 118 pages.
Aiello et al., "Composite-pulse magnetometry with a solid-state quantum sensor," Nature Communications 4(1419): 1-6 (Jan. 29, 2013), 6 pages.
Alam, "Solid-state 13C magic angle spinning NMR spectroscopy characterization of particle size structural variations in synthetic nanodiamonds," Materials Chemistry and Physics 85(2-3): 310-315 (Jun. 15, 2004), 6 pages.
Albrecht et al., "Coupling of nitrogen vacancy centres in nanodiamonds by means of phonons," New Journal of Physics 15(083014): 1-26 (Aug. 6, 2013), 27 pages.
Appel et al., "Nanoscale microwave imaging with a single electron spin in diamond," New Journal of Physics 17(112001): 1-6 (Nov. 3, 2015), 7 pages.
Arai et al., "Fourier magnetic imaging with nanoscale resolution and compressed sensing speed-up using electronic spins in diamond," Nature Nanotechnology 10: 859-864 (Aug. 10, 2015), 7 pages.
Aslam et al., "Single spin optically detected magnetic resonance with 60-90 GHz (E-band) microwave resonators," Review of Scientific Instruments 86(064704): 1-8 (Jun. 22, 2015), 9 pages.
Awschalom et al., "Diamond age of spintronics," Scientific American 297: 84-91 (Oct. 2007), 8 pages.
Babamoradi et al., "Correlation between entanglement and spin density in nitrogen-vacancy center of diamond," European Physical Journal D 65: 597-603 (Dec. 1, 2011), 7 pages.
Babunts et al., "Diagnostics of NV defect structure orientation in diamond using optically detected magnetic resonance with a modulated magnetic field," Technical Physics Letters 41(6): 583-586 (Jun. 2015; first published online Jul. 14, 2015), 4 pages.
Babunts et al., "Temperature-scanned magnetic resonance and the evidence of two-way transfer of a nitrogen nuclear spin hyperfine interaction in coupled NV-N pairs in diamond," JETP Letters 95(8): 429432 (Jun. 27, 2012), 4 pages.
Bagguley et al., "Zeeman effect of acceptor states in semiconducting diamond," Journal of the Physical Society of Japan 21(Supplement): 244-248 (1966), 7 pages.
Balasubramanian et al., "Nanoscale imaging magnetometry with diamond spins under ambient conditions," Nature 455: 648-651 (Oct. 2, 2008), 5 pages.
Balmer et al., "Chemical Vapour deposition synthetic diamond: materials technology and applications," J. of Physics: Condensed Matter 21(36): 1-51 (Aug. 19, 2009), 51 pages.
Baranov et al., "Enormously High Concentrations of Fluorescent Nitrogen-Vacancy Centers Fabricated by Sintering of Detonation Nanodiamonds," Small 7(11): 1533-1537 (Jun. 6, 2011; first published online Apr. 26, 2011), 5 pages.
Barfuss et al., "Strong mechanical driving of a single electron spin," Nature Physics 11: 820-824 (Aug. 3, 2015), 6 pages.
Barry et al., "Optical magnetic detection of single-neuron action potentials using quantum defects in diamond," as submitted to Quantum Physics on Feb. 2, 2016, 23 pages.
Bennett et al., "CVD Diamond for High Power Laser Applications," SPIE 8603, High-Power Laser Materials Processing: Lasers, Beam Delivery, Diagnostics, and Applications II, 860307 (Feb. 22, 2013), 10 pages.
Berman & Chernobrod, "Single-spin microscope with sub-nanoscale resolution based on optically detected magnetic resonance," SPIE 7608, Quantum Sensing and Nanophotonic Devices VII, 76080Y (Jan. 23, 2010), 4 pages.
Berman et al. "Measurement of single electron and nuclear spin states based on optically detected magnetic resonance," J. Physics: Conf. Series 38: 167-170 (2006), 5 pages.
Blakley et al., "Room-temperature magnetic gradiometry with fiber-coupled nitrogen-vacancy centers in diamond," Optics Letters 40(16): 3727-3730 (Aug. 5, 2015), 4 pages.
Bourgeois, et al., "Photoelectric detection of electron spin resonance of nitrogen-vacancy centres in diamond," Nature Communications 6(8577): 1-8 (Oct. 21, 2015), 8 pages.
Brenneis, et al. "Ultrafast electronic readout of diamond nitrogen-vacancy centres coupled to graphene." Nature nanotechnology 10.2 (2015): 135-139.
Bucher et al, "High Resolution Magnetic Resonance Spectroscopy Using Solid-State Spins", May 25, 2017, downloaded from https://arxiv.org/ (arXiv.org > quant-ph > arXiv:1705.08887) on May 25, 2017, pp. 1-24.
Budker & Kimball, "Optical Magnetometry," Cambridge Press, (2013), 11 pages.
Budker & Romalis, "Optical Magnetometry," Nature Physics 3: 227-243 (Apr. 2007), 8 pages.
Bui et al., "Noninvasive Fault Monitoring of Electrical Machines by Solving the Steady-State Magnetic Inverse Problem," in IEEE Transactions on Magnetics, vol. 44, No. 6, pp. 1050-1053, Jun. 24, 2008.
Casanova, et al., "Effect of magnetic field on phosphorus centre in diamond," Physica Status Solidi A 186(2): 291-295 (Jul. 30, 2001), 6 pages.
Castelletto, et al., "Frontiers in diffraction unlimited optical methods for spin manipulation, magnetic field sensing and imaging using diamond nitrogen vacancy defects," Nanophotonics 1(2): 139-153 (Nov. 2012), 15 pages.
Chadebec et al., "Rotor fault detection of electrical machines by low frequency magnetic stray field analysis," 2005 5th IEEE International Symposium on Diagnostics for Electric Machines, Power Electronics and Drives, Vienna, 2005, submitted Mar. 22, 2006, pp. 1-6.
Chapman, et al., "Anomalous saturation effects due to optical spin depolarization in nitrogen-vacancy centers in diamond nanocrystals," Physical Review B 86(045204): 1-8 (Jul. 10, 2012), 8 pages.
Chavez, et al. "Detecting Arctic oil spills with NMR: a feasibility study." Near Surface Geophysics 13.4 (Feb. 2015): 409-416.
Chen et al., "Vector magnetic field sensing by a single nitrogen vacancy center in diamond," EPL 101(67003): 1-5 (Mar. 2013), 6 pages.
Chernobrod et al., "Improving the sensitivity of frequency modulation spectroscopy using nanomechanical cantilevers," Applied Physics Letters 85(17): 3896-3898 (Oct. 25, 2004), 3 pages.
Chernobrod et al., "Spin Microscope Based on Optically Detected Magnetic Resonance," Journal of Applied Physics 97(014903): 1-3, (2005; first published online Dec. 10, 2004), 4 pages.
Childress et al., "Coherent dynamics of coupled electron and nuclear spin qubits in diamond," Science 314(5797): 281-285 (Oct. 13, 2006), 6 pages.
Chipaux et al., "Magnetic imaging with an ensemble of nitrogen vacancy-centers in diamond," European Physical Journal D 69(166): 1-10 (Jul. 2, 2015), 10 pages.
Chipaux et al., "Nitrogen vacancies (NV) centers in diamond for magnetic sensors and quantum sensing," SPIE 9370, Quantum Sensing and Nanophotonic Devices XII, 93701V (Feb. 8, 2015), 6 pages.
Chipaux, et al., "Wide bandwidth instantaneous radio frequency spectrum analyzer based on nitrogen vacancy centers in diamond," Applied Physics Letters 107(233502): 1-5 (2015), 6 pages.
Clevenson et al., "Broadband magnetometry and temperature sensing with a light-trapping diamond waveguide," Nature Physics 11: 393-397 (May 2015; first published online Apr. 6, 2015), 6 pages.
Constable, "Geomagnetic Spectrum, Temporal." In Encyclopedia of Geomagnetism and Paleomagnetism, pp. 353-355, Springer: Dordrecht, Netherlands (2007), 3 pages.
Cooper et al., "Time-resolved magnetic sensing with electronic spins in diamond," Nature Communications 5:3141: 1-7 (Jan. 24, 2014), 7 pages.
Creedon et al., "Strong coupling between P1 diamond impurity centers and a three-dimensional lumped photonic microwave cavity," Physical Review B 91(140408R): 1-5 (Apr. 24, 2015), 5 pages.
Dale, et al. "Medical applications of diamond magnetometry: commercial viability." arXiv preprint arXiv:1705.01994 (May 8, 2017), pp. 1-7.

(56) References Cited

OTHER PUBLICATIONS

Davies, "Current problems in diamond: towards a quantitative understanding," Physica B 273-274: 1513 (Dec. 15, 1999), 9 pages.
De Lange et al., "Single-Spin Magnetometry with Multipulse Sensing Sequences," Physical Review Letters 106(080802): 1-4 (Feb. 24, 2011), 4 pages.
Degen, "Scanning magnetic field microscope with a diamond single-spin sensor," Applied Physics Letters 92(243111): 1-3 (Jun. 17, 2008), 3 pages.
Delacroix et al., "Design, manufacturing, and performance analysis of mid-infrared achromatic half-wave plates with diamond subwavelength gratings," Applied Optics 51(24): 5897-5902 (Aug. 16, 2012), 6 pages.
Denatale et al., "Fabrication and characterization of diamond moth eye antireflective surfaces on Ge," J. of Applied Physics 71: 1388-1393 (Mar. 1992), 8 pages.
Dobrovitski et al., "Quantum Control over Single Spins in Diamond," Annual Review of Condensed Matter Physics 4: 23-50 (Apr. 2013), 30 pages.
Doherty et al., "The nitrogen-vacancy colour centre in diamond," Physics Reports 528: 1-45 (Jul. 1, 2013), 45 pages.
Doherty et al., "Theory of the ground-state spin of the NV- center in diamond," Physical Review B 85(205203): 1-21 (May 3, 2012), 21 pages.
Doi et al., "Pure negatively charged state of the NV center in n-type diamond," Physical Review B 93(081203): 1-6 (Feb. 3, 2016), 6 pages.
Drake et al., "Influence of magnetic field alignment and defect concentration on nitrogen-vacancy polarization in diamond," New Journal of Physics 18(013011): 1-8 (Jan. 2016; first published on Dec. 24, 2015), 9 pages.
Dreau et al., "Avoiding power broadening in optically detected magnetic resonance of single NV defects for enhanced dc magnetic field sensitivity," Physical Review B 84(195204): 1-8 (Nov. 23, 2011), 8 pages.
Dreau et al., "High-resolution spectroscopy of single NV defects coupled with nearby 13C nuclear spins in diamond," Physical Review B 85(134107): 1-7 (Apr. 20, 2012), 7 pages.
Dumeige et al., "Magnetometry with nitrogen-vacancy ensembles in diamond based on infrared absorption in a doubly resonant optical cavity," Physical Review B 87(155202): 1-9 (Apr. 8, 2013), 9 pages.
Epstein et al., "Anisotropic interactions of a single spin and dark-spin spectroscopy in diamond," Nature Physics 1:94-98 (Nov. 2005), 5 pages.
Fallah et al., "Multi-sensor approach in vessel magnetic wake imaging," Wave Motion 51(1): 60-76 (Jan. 2014), retrieved from http://www.sciencedirect.com/science/article/pii/S0165212513001133 (Aug. 21, 2016).
Fedotov et al., "High-resolution magnetic field imaging with a nitrogen-vacancy diamond sensor integrated with a photonic-crystal fiber," Optics Letters 41(3): 472-475 (Feb. 1, 2016; published Jan. 25, 2016), 4 pages.
Fedotov et al., "Photonic-crystal-fiber-coupled photoluminescence interrogation of nitrogen vacancies in diamond nanoparticles," Laser Physics Letters 9(2): 151-154 (Feb. 2012; first published online Dec. 2, 2011), 5 pages.
Feng & Wei, "A steady-state spectral method to fit microwave absorptions of NV centers in diamonds: application to sensitive magnetic field sensing," Measurement Science & Technology 25(105102): 1-6 (Oct. 2014; first published online Aug. 29, 2014), 7 pages.
Fologea, et al. "Detecting single stranded DNA with a solid state nanopore." Nano Letters 5.10 (Aug. 15, 2005): 1905-1909.
Freitas, et al., "Solid-State Nuclear Magnetic Resonance (NMR) Methods Applied to the Study of Carbon Materials," Chemistry and Physics of Carbon, vol. 31 (2012), 45 pages.
Froidurot et al., "Magnetic discretion of naval propulsion machines," in IEEE Transactions on Magnetics, vol. 38, No. 2, pp. 1185-1188, Mar. 2002.
Gaebel, et al. "Room-temperature coherent coupling of single spins in diamond." Nature Physics 2.6 (May 28, 2006): 408-413.
GB Examination Report from United Kingdom application No. GB 1618202.4 dated Jan. 10, 2017.
Geiselmann et al., "Fast optical modulation of the fluorescence from a single nitrogen-vacancy centre," Nature Physics 9: 785-789 (Dec. 2013; first published online Oct. 13, 2013), 5 pages.
Gombert & Blasi, "The Moth-Eye Effect-From Fundamentals to Commercial Exploitation," Functional Properties of Bio-Inspired Surfaces: 79-102, (Nov. 2009), 26 pages.
Gong et al., "Generation of Nitrogen-Vacancy Center Pairs in Bulk Diamond by Molecular Nitrogen Implantation," Chinese Physics Letters 33(2)(026105): 1-4 (Feb. 2016), 5 pages.
Gould et al., "An imaging magnetometer for bio-sensing based on nitrogen-vacancy centers in diamond," SPIE 8933, Frontiers in Biological Detection: From Nanosensors to Systems VI, 89330L (Mar. 18, 2014), 8 pages.
Gould et al., "Room-temperature detection of a single 19 nm superparamagnetic nanoparticle with an imaging magnetometer," Applied Physics Letters 105(072406): 1-4 (Aug. 19, 2014), 5 pages.
Gruber et al., "Scanning confocal optical microscopy and magnetic resonance on single defect centers," Science 276(5321): 2012-2014 (Jun. 27, 1997), 4 pages.
Haeberle et al., "Nanoscale nuclear magnetic imaging with chemical contrast," Nature Nanotechnology 10: 125-128 (Feb. 2015; first published online Jan. 5, 2015), 4 pages.
Haihua et al., "Design of wideband anti-reflective sub wavelength nanostructures," Infrared and Laser Engineering 40(2): 267-270 (Feb. 2011), 4 pages.
Hall et al., "Sensing of Fluctuating Nanoscale Magnetic Fields Using Nitrogen-Vacancy Centers in Diamond," Physical Review Letters 103(220802): 1-4 (Nov. 25, 2009), 4 pages.
Hanson et al., "Coherent Dynamics of a Single Spin Interacting with an Adjustable Spin Bath," Science 320(5874): 352-355 (Apr. 18, 2008), 5 pages.
Hanson et al., "Polarization and Readout of Coupled Single Spins in Diamond," Physical Review Letters 97(087601): 1-4 (Aug. 23, 2006), 4 pages.
Hanson et al., "Room-temperature manipulation and decoherence of a single spin in diamond," Physical Review 74(161203): 1-4 (Oct. 26, 2006), 4 pages.
Hanzawa et al., "Zeeman effect on the zero-phonon line of the NV center in synthetic diamond," Physica B 184(1-4): 137-140 (Feb. 1993), 4 pages.
Heerema, et al. "Graphene nanodevices for DNA sequencing." Nature nanotechnology 11.2 (Feb. 3, 2016): 127-136.
Hegyi & Yablonovitch, "Molecular imaging by optically detected electron spin resonance of nitrogen-vacancies in nanodiamonds," Nano Letters 13(3): 1173-1178 (Mar. 2013; first published online Feb. 6, 2013), 6 pages.
Hegyi & Yablonovitch, "Nanodiamond molecular imaging with enhanced contrast and expanded field of view," Journal of Biomedical Optics 19(1)(011015): 1-8 (Jan. 2014), 9 pages.
Hilser et al., "All-optical control of the spin state in the NV-center in diamond," Physical Review B 86(125204): 1-8 (Sep. 14, 2012), 8 pages.
Hobbs, "Study of the Environmental and Optical Durability of AR Microstructures in Sapphire, ALON, and Diamond," SPIE 7302, Window and Dome Technologies and Materials XI, 73020J (Apr. 27, 2009), 14 pages.
Huebener et al., "ODMR of NV centers in nano-diamonds covered with N©C60," Physica Status Solidi B 245(10): 2013-2017 (Oct. 2008; first published online Sep. 8, 2008), 5 page.
Huxter et al., "Vibrational and electronic dynamics of nitrogen-vacancy centres in diamond revealed by two-dimensional ultrafast spectroscopy," Nature Physics 9: 744-749 (Sep. 29, 2013), 6 pages.
IEEE Standards Association, "Part 11: Wireless LAN Medium Access Control (MAC) and Physical Layer (PHY) Specifications", IEEE Std 802.11 TM-2012, Mar. 29, 2012, pp. 1605, 16811686, 1694-1710 (27 total pages, including cover and publication pages).
International Search Report and Written Opinion from related PCT application PCT/US2017/035315 dated Aug. 24, 2017, 7 pages.

(56) References Cited

OTHER PUBLICATIONS

International Search Report and Written Opinion of the International Searching Authority dated Apr. 1, 2016 from related PCT application PCT/US2016/014384, 12 pages.
International Search Report and Written Opinion of the International Searching Authority dated Apr. 11, 2016 from related PCT application PCT/US2016/014376, 12 pages.
International Search Report and Written Opinion of the International Searching Authority dated Apr. 11, 2016 from related PCT application PCT/US2016/014388, 14 pages.
International Search Report and Written Opinion of the International Searching Authority dated Apr. 11, 2016 from related PCT application PCT/US2016/014395, 15 pages.
International Search Report and Written Opinion of the International Searching Authority dated Apr. 4, 2017 from related PCT application PCT/US16/68366, 9 pages.
International Search Report and Written Opinion of the International Searching Authority dated Feb. 15, 2017 from related PCT application PCT/US2016/014390, 20 pages.
International Search Report and Written opinion of the International Searching Authority dated Jul. 12, 2016, from related PCT application PCT/US2016/014287, 14 pages.
International Search Report and Written Opinion of the International Searching Authority dated Jul. 16, 2015, from related PCT application PCT/US2015/24723, 8 pages.
International Search Report and Written Opinion of the International Searching Authority dated Jul. 6, 2015, from related PCT application PCT/US2015/021093, 9 pages.
International Search Report and Written Opinion of the International Searching Authority dated Jul. 8, 2015, from related PCT application PCT/US2015/024265, 11 pages.
International Search Report and Written Opinion of the International Searching Authority dated Jun. 1, 2017, from related PCT application PCT/US17/21811, 9 pages.
International Search Report and Written Opinion of the International Searching Authority dated Jun. 1, 2017, in related PCT application PCT/US17/22279, 20 pages.
International Search Report and Written Opinion of the International Searching Authority dated Jun. 10, 2016 from related PCT application PCT/US2016/014290, 11 pages.
International Search Report and Written Opinion of the International Searching Authority dated Jun. 15, 2017, from related PCT application PCT/US2017/024175, 10 pages.
International Search Report and Written Opinion of the International Searching Authority dated Jun. 2, 2016, from related PCT application PCT/US2016/014386, 14 pages.
International Search Report and Written Opinion of the International Searching Authority dated Jun. 2, 2016, from related PCT application PCT/US2016/014387, 13 pages.
International Search Report and Written Opinion of the International Searching Authority dated Jun. 6, 2016, from related PCT application PCT/US2016/014291, 13 pages.
International Search Report and Written Opinion of the International Searching Authority dated Jun. 9, 2016 from related PCT application PCT/US2016/014333, 16 pages.
International Search Report and Written Opinion of the International Searching Authority dated Jun. 9, 2017, from related patent application PCT/US2017/024181, 13 pages.
International Search Report and Written Opinion of the International Searching Authority dated Jun. 9, 2017, from related PCT application PCT/US2017/024179, 9 pages.
International Search Report and Written Opinion of the International Searching Authority dated Mar. 13, 2017 from related PCT application PCT/US2016/68320, 10 pages.
International Search Report and Written Opinion of the International Searching Authority dated Mar. 24, 2016 from related PCT application PCT/US2016/014336, 17 pages.
International Search Report and Written Opinion of the International Searching Authority dated Mar. 24, 2016 from related PCT application PCT/US2016/014297, 15 pages.
International Search Report and Written Opinion of the International Searching Authority dated Mar. 24, 2016 from related PCT application PCT/US2016/014392, 8 pages.
International Search Report and Written Opinion of the International Searching Authority dated Mar. 2016 from related PCT application PCT/US2016/014403, 10 pages.
International Search Report and Written Opinion of the International Searching Authority dated Mar. 2016, from related PCT application PCT/US2016/014363, 8 pages.
International Search Report and Written Opinion of the International Searching Authority dated Mar. 25, 2016, from related PCT application PCT/US2016/014389, 19 pages.
International Search Report and Written Opinion of the International Searching Authority dated Mar. 27, 2017 from related PCT application PCT/US16/68344, 16 pages.
International Search Report and Written Opinion of the International Searching Authority dated Mar. 28, 2016, from related PCT application PCT/US2016/014380, 9 pages.
International Search Report and Written Opinion of the International Searching Authority dated Mar. 28, 2016, from related PCT application PCT/US2016/014394, 17 pages.
International Search Report and Written Opinion of the International Searching Authority dated Mar. 29, 2016 from related PCT application PCT/US2016/014325, 11 pages.
International Search Report and Written Opinion of the International Searching Authority dated Mar. 29, 2016 from related PCT application PCT/US2016/014330, 8 pages.
International Search Report and Written Opinion of the International Searching Authority dated Mar. 29, 2016, from related PCT application PCT/US2016/014328, 7 pages.
International Search Report and Written Opinion of the International Searching Authority dated Mar. 29, 2016, from related PCT application PCT/US2016/014385, 11 pages.
International Search Report and Written Opinion of the International Searching Authority dated Mar. 30, 2016 from related PCT application PCT/US2016/014298, 14 pages.
International Search Report and Written Opinion of the International Searching Authority dated Mar. 31, 2016 from related PCT application PCT/US2016/014375, 11 pages.
International Search Report and Written Opinion of the International Searching Authority dated Mar. 31, 2016 from related PCT application PCT/US2016/014396, 11 pages.
International Search Report and Written Opinion of the International Searching Authority dated Mar. 31, 2017 from related PCT application PCT/US2016/066566, 11 pages.
International Search Report and Written Opinion of the International Searching Authority dated May 10, 2017 from related PCT application PCT/US17/19411, 8 pages.
International Search Report and Written Opinion of the International Searching Authority dated May 18, 2017, from related PCT application PCT/US2017/021593, 10 pages.
International Search Report and Written Opinion of the International Searching Authority dated May 19, 2017, from related PCT application PCT/US17/18099, 16 pages.
International Search Report and Written Opinion of the International Searching Authority dated May 26, 2016, from related PCT application PCT/US2016/014331, 15 pages.
International Search Report and Written Opinion of the International Searching Authority dated May 3, 2017 from related PCT application PCT/US2017/018701, 8 pages.
International Search Report and Written Opinion of the International Searching Authority dated May 4, 2017 from related PCT application PCT/US2017/018709, 8 pages.
International Search Report and Written Opinion of the International Searching Authority dated May 8, 2017 from related PCT application PCT/US2017/17321, 17 pages.
International Search Report and Written Opinion of the International Searching Authority dated Sep. 13, 2016, from related PCT application PCT/US16/14377, 11 pages.
International Search Report and Written Opinion of the International Searching Authority dated Jul. 14, 2017, from related PCT application PCT/US2017/022118, 13 pages.

(56) References Cited

OTHER PUBLICATIONS

International Search Report and Written Opinion of the International Searching Authority dated Jul. 17, 2017, from related PCT application PCT/US2017/024177, 11 pages.
International Search Report and Written Opinion of the International Searching Authority dated Jul. 18, 2017, from related PCT application PCT/US2017/024167, 11 pages.
International Search Report and Written Opinion of the International Searching Authority dated Jul. 18, 2017, from related PCT application PCT/US2017/024173, 13 pages.
International Search Report and Written Opinion of the International Searching Authority dated Jul. 19, 2017, from related PCT application PCT/US2017/024171, 12 pages.
International Search Report and Written Opinion of the International Searching Authority dated Jun. 15, 2017, from related PCT application PCT/US2017/024182, 21 pages.
International Search Report and Written Opinion of the International Searching Authority dated Jun. 22, 2017, in related PCT application PCT/US2017/024180, 10 pages.
International Search Report and Written Opinion of the International Searching Authority dated Jun. 5, 2017, from related PCT application PCT/US2017/024169, 11 pages.
International Search Report and Written Opinion of the International Searching Authority dated Jun. 5, 2017, from related PCT application PCT/US2017/024174, 8 pages.
International Search Report and Written Opinion of the International Searching Authority dated Jun. 5, 2017, in related PCT application PCT/US2017/024168, 7 pages.
International Search Report and Written Opinion of the International Searching Authority dated Jun. 6, 2017, from related PCT application PCT/2017/024165, 9 pages.
International Search Report and Written Opinion of the International Searching Authority dated Jun. 6, 2017, from related PCT application PCT/US2017/024172, 9 pages.
Ivady et al., "Pressure and temperature dependence of the zero-field splitting in the ground state of NV centers in diamond: A first-principles study," Physical Review B 90(235205): 1-8 (Dec. 2014), 8 pages.
Jarmola et al., "Temperature- and Magnetic-Field-Dependent Longitudinal Spin Relaxation in Nitrogen-Vacancy Ensembles in Diamond," Physical Review Letters 108 (197601): 1-5 (May 2012), 5 pages.
Jensen et al., "Light narrowing of magnetic resonances in ensembles of nitrogen-vacancy centers in diamond," Physical Review B 87(014115): 1-10 (Jan. 2013), 10 pages.
Kailath, "Linear Systems," Prentice Hall, (1979), 6 pages.
Karlsson et al., "Diamond micro-optics: microlenses and antireflection structures surfaces for the infrared spectral region," Optics Express 11(5): 502-507 (Mar. 10, 2003), 6 pages.
Keyser "Enhancing nanopore sensing with DNA nanotechnology." Nature nanotechnology 11.2 (Feb. 2016): 106-108.
Khan & Hemmer, "Noise limitation in nano-scale imaging," Proceedings of SPIE vol. 5842: 302-305, (Dec. 2005), 7 pages.
Kim et al., "Electron spin resonance shift and linewidth broadening of nitrogen-vacancy centers in diamond as a function of electron irradiation dose," Applied Physics Letters 101(082410): 1-5 (Aug. 2012), 6 pages.
Kim et al., "Jahn-Teller Splitting and Zeeman Effect of Acceptors in Diamond," Physica B 273-274: 647-627 (Jul. 1999), 4 pages.
Kim et al., "Magnetospectroscopy of acceptors in 'blue' diamonds," Physica B 302-301: 88-100 (Aug. 2001), 13 pages.
Kim et al., "Zeeman effect of electronic Raman lines of accepters in elemental semiconductors: Boron in blue diamond," Physical Review B 62(12): 8038-8052 (Sep. 2000), 15 pages.
King et al., "Optical polarization of 13C nuclei in diamond through nitrogen vacancy centers," Physical Review B 81(073201): 1-4 (Feb. 2010), 4 pages.
Kok et al., "Materials Science: Qubits in the pink," Nature 444(2): 49 (Nov. 2006), 1 page.
Konenko et al., "Formation of antireflective surface structures on diamond films by laser patterning," Applied Physics A 68:99-102 (Jan. 1999), 4 pages.
Kraus et al., "Magnetic field and temperature sensing with atomic-scale spin defects in silicon carbide," Scientific Reports 4(5303): 1-8 (Jul. 2014), 8 pages.
Kwon et al., "Analysis of the far field of permanent-magnet motors and effects of geometric asymmetries and unbalance in magnet design," in IEEE Transactions on Magnetics, vol. 40, No. 2, pp. 435-442, Mar. 2004.
Lai et al., "Influence of a static magnetic field on the photoluminescence of an ensemble of nitrogen vacancy color centers in a diamond single-crystal," Applied Physics Letters 95, (Sep. 2009), 4 pages.
Lai et al., "Optically detected magnetic resonance of a single Nitrogen-Vacancy electronic spin in diamond nanocrystals," CLEO/EQEC, (Jun. 14-19, 2009), 1 page.
Laraoui et al., "Nitrogen-vacancy assisted magnetometry of paramagnetic centers in an individual diamond nanocrystal," Nano Letters 12: 3477-3482 (Jul. 2012), 6 pages.
Lazariev et al., "A nitrogen-vacancy spin based molecular structure microscope using multiplexed projection reconstruction," Scientific Reports 5(14130): 1-8 (Sep. 2015), 8 pages.
Le Sage et al., "Efficient photon detection from color centers in a diamond optical waveguide," Phys. Rev. B 85: 121202(R), pp. 121202-1-121202-4, (Mar. 23, 2012), 4 pages.
Lee et al., "Vector magnetometry based on S=3/2 electronic spins," Physical Review B 92 (115201): 1-7 (Sep. 2015), 7 pages.
Lesik et al., "Preferential orientation of NV defects in CVD diamond films grown on (113)-oriented substrates," Diamond and Related Materials 56: 47-53 (Jun. 2015), 7 pages.
Levchenko et al., "Inhomogeneous broadening of optically detected magnetic resonance of the ensembles of nitrogen-vacancy centers in diamond by interstitial carbon atoms," Applied Physics Letters 106, (Mar. 2015; published online Mar. 9, 2015), 6 pages.
Lindsay "The promises and challenges of solid-state sequencing." Nature nanotechnology 11.2 (Feb. 2016): 109-111.
Liu et al., "Electron spin studies of nitrogen vacancy centers in nanodiamonds," Acta Physica Sinica 62(16) 164208: 1-5 (Aug. 2013), 5 pages.
Liu et al., "Fiber-integrated diamond-based magnetometer," Applied Physics Letters 103(143105): 1-4 (Sep. 2013), 5 pages.
MacLaurin et al., "Nanoscale magnetometry through quantum control of nitrogen-vacancy centres in rotationally diffusing nanodiamonds," New Journal of Physics 15, (Jan. 2013), 16 pages.
MacQuarie et al., "Mechanical spin control of nitrogen-vacancy centers in diamond," Retrieved from http://www.arxiv.org/pdf/1306.6356.pdf, pp. 1-8, (Jun. 2013), 8 pages.
Macs et al., "Diamond as a magnetic field calibration probe," Journal of Physics D: Applied Physics 37, (Apr. 2004; published Mar. 17, 2004), 6 pages.
Maertz et al., "Vector magnetic field microscopy using nitrogen vacancy centers in diamond", Applied Physics Letters 96, No. 9, Mar. 1, 2010, pp. 092504-1-092504-3.
Maletinsky et al., "A robust scanning diamond sensor for nanoscale imaging with single nitrogen-vacancy centres," Nature Nanotechnology 7: 320-324, (May 2012; published Apr. 15, 2012), 5 pages.
Mamin et al., "Multipulse Double-Quantum Magnetometry with Near-Surface Nitrogen-Vacancy Centers," Physical Review Letters 13(030803): 1-5 (Jul. 2014), 5 pages.
Mamin et al., "Nanoscale Nuclear Magnetic Resonance with a Nitrogen-Vacancy Spin Sensor," Science 339, (Feb. 2013), 5 pages.
Manson et al., "GR transitions in diamond: magnetic field measurements," Journal of Physics C Solid St. Phys 13: L1005-L1009, (Nov. 1980), 6 pages.
Massachusetts Institute of Technology, "Wide-Field Imaging Using Nitrogen Vacancies," in Patent Application Approval Process, Physics Week: 1-5, (Jan. 20, 2015), 5 pages.
Matlashov, et al. "SQUIDs for magnetic resonance imaging at ultra-low magnetic field." PIERS online 5.5 (2009): 466-470.
Matlashov, et al. "SQUIDs vs. induction coils for ultra-low field nuclear magnetic resonance: experimental and simulation comparison." IEEE Transactions on Applied Superconductivity 21.3 (Jan. 1, 2012): 465-468.

(56) References Cited

OTHER PUBLICATIONS

Matsuda et al., "Development of a plastic diamond anvil cell for high pressure magneto-photoluminescence in pulsed high magnetic fields," International Journal of Modern Physics B 18(2729), (Nov. 2004), 7 pages.
Maze et al., "Nanoscale magnetic sensing using spin qubits in diamond," Proc. SPIE 7225, Advanced Optical Concepts in Quantum Computing, Memory, and Communication II, 722509 (Feb. 2, 2009) 8 pages.
Maze et al., "Nanoscale magnetic sensing with an individual electronic spin in diamond," Nature Physics 455: 644-647 (Oct. 2, 2008), 5 pages.
Meijer et al., "Generation of single color centers by focused nitrogen implantation," Applied Physics Letters 87(261909): 1-3 (Dec. 2005), 4 pages.
Michaelovich et al., "Polarization Dependencies of the Nitrogen-Vacancy Center." Undergraduate Project Report, Ben-Gurion University, Aug. 2015, pp. 1-9.
Millot et al., "High-field Zeeman and Paschen-Back effects at high pressure in oriented ruby," Physical Review B 78 (155125): 1-7 (Oct. 2008), 7 pages.
Moessle, et al. "SQUID-detected magnetic resonance imaging in microtesla fields." Annu. Rev. Biomed. Eng. 9 (May 23, 2008): 389-413.
Moriyama et al., "Importance of electron-electron interactions and Zeeman splitting in single-wall carbon nanotube quantum dots," Physica E 26: 473-476 (Feb. 2005), 4 pages.
Mrozek et al., "Circularly polarized microwaves for magnetic resonance study in the GHz range: Application to nitrogen-vacancy in diamonds," Applied Physics Letters, pp. 1-4 (Jul. 2015), 4 pages.
Nagl et al., "Improving surface and defect center chemistry of fluorescent nanodiamonds for imaging purposes-a review," Analytical and Bioanalaytical Chemistry 407: 7521-7536 (Oct. 2015; published online Jul. 29, 2015), 16 pages.
Neumann et al., "Excited-state spectroscopy of single NV defects in diamond using optically detected magnetic resonance," New Journal of Physics 11(013017): 1-10, (Jan. 2009), 11 pages.
Nizovtsev & Kilin, "Optically Detected Magnetic Resonance Spectra of the 14NV-13C Spin Systems in Diamond: Analytical Theory and Experiment," Doklady of the National Academy of Sciences of Belarus, (2013), 27 pages with English machine translation.
Nizovtsev et al., "Modeling fluorescence of single nitrogen-vacancy defect centers in diamond," Physica B—Condensed Matter, 608-611 (Dec. 2001), 4 pages.
Nizovtsev et al., "Theoretical study of hyperfine interactions and optically detected magnetic resonance spectra by simulation of the C-291(NV)H-(172) diamond cluster hosting nitrogen-vacancy center," New Journal of Physics 16(083014): 1-21 (Aug. 2014), 22 pages.
Nobauer et al., "Smooth optimal quantum control for robust solid state spin magnetometry," Retrieved from http://www.arxiv.org/abs/1412.5051, pp. 1-12, (Dec. 2014), 12 pages.
Nowodzinski et al., "Nitrogen-Vacancy centers in diamond for current imaging at the redistributive layer level of Integrated Circuits," Microelectronics Reliability 55: 1549-1553 (Aug. 2015), 5 pages.
Nusran et al., "Optimizing phase-estimation algorithms for diamond spin magnetometry," Physical Review B 90(024422): 1-12 (Jul. 2014), 12 pages.
Ohashi et al., "Negatively Charged Nitrogen-Vacancy Centers in a 5 nm Thin 12C Diamond Film," Nano Letters 13: 4733-4738 (Oct. 2013), 6 pages.
Pelliccione, et al., Two-dimensional nanoscale imaging of gadolinium spins via scanning probe relaxometry with a single spin in diamond, Phys. Rev. Applied 2.5, (Sep. 8, 2014): 054014 pp. 1-17.
Plakhotnik et al., "Super-Paramagnetic Particles Chemically Bound to Luminescent Diamond : Single Nanocrystals Probed with Optically Detected Magnetic Resonance," Journal of Physical Chemistry C 119: 20119-20124 (Aug. 2015), 6 pages.

Polatomic. "AN/ASQ-233A Digital Magnetic Anomaly Detective Set." Retrieved May 9, 2016, from http://polatomic.com/images/DMAD_Data_Sheet_09-2009.pdf (2009), 1 page.
Poole, "What is GMSK Modulation—Gaussian Minimum Shift Keying." Radio-Electronics, retrieved from https://web.archive.org/web/20150403045840/http://www.radio-electronics.com/info/rf-technology-design/pm-phase-modulation/what-is-gmsk-gaussian-minimum-shift-keyingtutorial.php (Apr. 3, 2015), 4 pages.
Qiu et al., "Low-field NMR Measurement Procedure when Squid Detection is Used," IEEE/CSC & ESAS European Superconductivity News Forum, No. 5, Jul. 2008.
Qiu, et al. "SQUID-detected NMR in Earth's magnetic field." Journal of Physics: Conference Series. vol. 97. No. 1. IOP Publishing, Mar. 2008, pp. 1-7.
Rabeau et al., "Implantation of labelled single nitrogen vacancy centers in diamond using 15N," Applied Physics Letters 88, (Jan. 2006), 4 pages.
Ramsey, et al., "Phase Shifts in the Molecular Beam Method of Separated Oscillating Fields", Physical Review, vol. 84, No. 3, Nov. 1, 1951, pp. 506-507.
Ranjbar et al., "Many-electron states of nitrogen-vacancy centers in diamond and spin density calculations," Physical Review B 84(165212): 1-6 (Oct. 2011), 6 pages.
Reynhardt, "Spin-lattice relaxation of spin-1/2 nuclei in solids containing diluted paramagnetic impurity centers. I. Zeeman polarization of nuclear spin system," Concepts in Magnetic Resonance Part A, pp. 20-35, (Sep. 2003), 16 pages.
Rogers et al., "Singlet levels of the NV(-) centre in diamond," New Journal of Physics 17, (Jan. 2015), 13 pages.
Rondin et al., "Magnetometry with nitrogen-vacancy defects in diamond," Reports on Progress in Physics 77(056503) 1-26 (May 2014), 27 pages.
Rondin et al., "Nanoscale magnetic field mapping with a single spin scanning probe magnetometer," Applied Physics Letters 100, (Apr. 2012), 5 pages.
Sarkar et al., "Magnetic properties of graphite oxide and reduced graphene oxide," Physica E 64: 7882 (Nov. 2014), 5 pages.
Scheuer et al., "Accelerated 2D magnetic resonance spectroscopy of single spins using matrix completion," Scientific Reports 5(17728): 1-8 (Dec. 2015), 8 pages.
Schirhagl et al., "Nitrogen-vacancy centers in diamond: Nanoscale sensors for physics and biology," Annual Review of Physical Chemistry 65: 83-105 (Jan. 2014), 26 pages.
Schoenfeld & Harneit, "Real time magnetic field sensing and imaging using a single spin in diamond," Physical Review Letters 106(030802): 1-4 (Jan. 2011), 4 pages.
Sedov et al., "Si-doped nano- and microcrystalline diamond films with controlled bright photoluminescence of silicon-vacancy color centers," Diamond and Related Materials 56: 23-28 (Jun. 2015; available online Apr. 18, 2015), 6 pages.
Shames et al., "Magnetic resonance tracking of fluorescent nanodiamond fabrication," Journal of Physics D: Applied Physics 48(155302): 1-13 (Apr. 2015; published Mar. 20, 2015), 14 pages.
Shao et al., "Diamond Color Center Based Fm Microwave Demodulator," in Conference on Lasers and Electro-Optics, OSA Technical Digest (online) (Optical Society of America), paper JTh2A.136, (Jun. 5- 10, 2016), 2 pages.
Sheinker et al., "Localization in 3-D Using Beacons of Low Frequency Magnetic Field." IEEE Transactions on Instrumentation and Measurement 62(12): 3194-3201 (Dec. 2013), 8 pages.
Simanovskaia et al., "Sidebands in optically detected magnetic resonance signals of nitrogen vacancy centers in diamond," Physical Review B 87(224106): 1-11 (Jun. 2013), 11 pages.
Sotoma et al., "Effective production of fluorescent nanodiamonds containing negatively-charged nitrogen-vacancy centers by ion irradiation," Diamond and Related Materials 49: 33-38 (Oct. 2014), 6 pages.
Soykal et al., "Quantum metrology with a single spin-3/2 defect in silicon carbide," Mesoscale and Nanoscale Physics (May 24, 2016), retrieved from https://arxiv.org/abs/1605.07628 (Sep. 22, 2016), 9 pages.

(56) References Cited

OTHER PUBLICATIONS

Steiner et al., "Universal enhancement of the optical readout fidelity of single electron spins at nitrogen-vacancy centers in diamond," Physical Review B 81(035205): 1-6 (Jan. 2010), 6 pages.
Steinert et al., "High-sensitivity magnetic imaging using an array of spins in diamond," Rev. Sci. Inst. 81(043705): 1-5 (Apr. 23, 2010), 5 pages.
Steinert et al., "Magnetic spin imaging under ambient conditions with sub-cellular resolution." Nature Comms 4:1607 (Mar. 19, 2013).
Stepanov et al., "High-frequency and high-field optically detected magnetic resonance of nitrogen-vacancy centers in diamond," Applied Physics Letters 106, (Feb. 2015), 5 pages.
Sternschulte et al., "Uniaxial stress and Zeeman splitting of the 1.681 eV optical center in a homoepitaxial CVD diamond film," Diamond and Related Materials 4: 1189-1192 (Sep. 1995), 4 pages.
Storteboom et al., "Lifetime investigation of single nitrogen vacancy centres in nanodiamonds," Optics Express 23(9): 11327-11333 (May 4, 2015; published Apr. 22, 2015), 7 pages.
Sushkov, et al. "All-optical sensing of a single-molecule electron spin." Nano letters 14.11 (Nov. 7, 2013): 6443-6448.
Tahara et al., "Quantifying selective alignment of ensemble nitrogen-vacancy centers in (111) diamond," Applied Physics Letters 107:193110 (Nov. 2015; published online Nov. 13, 2015), 5 pages.
Taylor et al., "High-sensitivity diamond magnetometer with nanoscale resolution," Nature Physics 4: 810-816 (Oct. 2008), 7 pages.
Teale, "Magnetometry with Ensembles of Nitrogen Vacancy Centers in Bulk Diamond," Master's Thesis, Massachusetts Institute of Technology Department of Electrical Engineering and Computer Science (Sep. 2015), 57 pages.
Terblanche et al., "13C spin-lattice relaxation in natural diamond: Zeeman relaxation at 4.7 T and 300 K due to fixed paramagnetic nitrogen defects," Solid State Nuclear Magnetic Resonance 20: 1-22 (Aug. 2001), 22 pages.
Terblanche et al., "13C spin-lattice relaxation in natural diamond: Zeeman relaxation in fields of 500 to 5000 G at 300 K due to fixed paramagnetic nitrogen defects," Solid State Nuclear Magnetic Resonance 19: 107-129 (May 2001), 23 pages.
Tetienne et al., "Magnetic-field-dependent photodynamics of single NV defects in diamond: an application to qualitative all-optical magnetic imaging," New Journal of Physics 14(103033): 1-5 (Oct. 2012), 16 pages.
Tetienne, et al. "Spin relaxometry of single nitrogen-vacancy defects in diamond nanocrystals for magnetic noise sensing." Physical Review B 87.23 (Apr. 3, 2013): 235436-1-235436-5.
Tong et al., "A hybrid-system approach for W state and cluster state generation," Optics Communication 310: 166-172, (Jan. 2014; available online Aug. 12, 2013), 7 pages.
Uhlen et al., "New diamond nanofabrication process for hard x-ray zone plates," J. of Vacuum Science & Tech. B 29(6) (06FG03): 1-4 (Nov./Dec. 2011), 4 pages.
UK Office Action dated Oct. 12, 2017 from related application 1618202.4, 4 pages.
U.S. Notice of Allowance dated Apr. 20, 2016, from related U.S. Appl. No. 15/003,718, 9 pages.
U.S. Notice of Allowance dated Aug. 11, 2017 from related U.S. Appl. No. 15/003,558, 5 pages.
U.S. Notice of Allowance dated Aug. 17, 2016, from related U.S. Appl. No. 15/003,718, 8 pages.
U.S. Notice of Allowance dated Dec. 13, 2016, from related U.S. Appl. No. 14/680,877, 8 pages.
U.S. Notice of Allowance dated Dec. 22, 2016, from related U.S. Appl. No. 14/659,498, 10 pages.
U.S. Notice of Allowance dated Feb. 14, 2017, from related U.S. Appl. No. 15/003,677, 8 pages.
U.S. Notice of Allowance dated Feb. 2, 2018, from U.S. Appl. No. 15/003,292, 8 pages.
U.S. Notice of Allowance dated Feb. 21, 2018, from related U.S. Appl. No. 15/003,176, 9 pages.
U.S. Notice of Allowance dated Jul. 18, 2017 from related U.S. Appl. No. 15/003,634, 6 pages.
U.S. Notice of Allowance dated Jul. 24, 2017 from related U.S. Appl. No. 15/003,088, 12 pages.
U.S. Notice of Allowance dated Jun. 20, 2017, from related U.S. Appl. No. 15/204,675, 9 pages.
U.S. Notice of Allowance dated Jun. 28, 2017 from related U.S. Appl. No. 15/003,256, 10 pages.
U.S. Notice of Allowance dated Jun. 8, 2017, from related U.S. Appl. No. 15/351,862, 7 pages.
U.S. Notice of Allowance dated Mar. 15, 2017, from related U.S. Appl. No. 15/351,862, 6 pages.
U.S. Notice of Allowance dated Mar. 29, 2016, from related U.S. Appl. No. 15/003,590, 11 pages.
U.S. Notice of Allowance dated May 26, 2017 from related U.S. Appl. No. 15/218,821, 7 pages.
U.S. Notice of Allowance dated Oct. 19, 2017, from related U.S. Appl. No. 15/179,957, 5 pages.
U.S. Notice of Allowance dated Oct. 23, 2017, from related U.S. Appl. No. 15/003,797, 6 pages.
U.S. Notice of Allowance dated Sep. 1, 2017, from related U.S. Appl. No. 14/676,740, 7 pages.
U.S. Notice of Allowance dated Sep. 14, 2017, from related U.S. Appl. No. 15/476,636, 10 pages.
U.S. Notice of Allowance dated Sep. 18, 2017, from related U.S. Appl. No. 15/003,206, 11 pages.
U.S. Notice of Allowance dated Sep. 26, 2017, from related U.S. Appl. No. 15/003,281, 7 pages.
U.S. Notice of Allowance dated Sep. 8, 2016, from related patent U.S. Appl. No. 15/003,298, 10 pages.
U.S. Office Action dated Apr. 17, 2017, from related U.S. Appl. No. 15/003,558, 12 pages.
U.S. Office Action dated Aug. 15, 2017 from related U.S. Appl. No. 15/003,281, 12 pages.
U.S. Office Action dated Aug. 24, 2016 from related U.S. Appl. No. 14/676,740, 19 pages.
U.S. Office Action dated Feb. 1, 2018, from related U.S. Appl. No. 15/003,577, 16 pages.
U.S. Office Action dated Feb. 10, 2017, from related U.S. Appl. No. 14/676,740, 20 pages.
U.S. Office Action dated Feb. 10, 2017, from related U.S. Appl. No. 15/003,088, 11 pages.
U.S. Office Action dated Feb. 16, 2017, from related U.S. Appl. No. 15/204,675, 7 pages.
U.S. Office Action dated Feb. 5, 2018, from related U.S. Appl. No. 15/450,504, 12 pages.
U.S. Office Action dated Jan. 25, 2018, from related U.S. Appl. No. 15/672,953, 28 pages.
U.S. Office Action dated Jan. 26, 2018, from related U.S. Appl. No. 15/003,678, 14 pages.
U.S. Office Action dated Jul. 27, 2017 from related U.S. Appl. No. 15/003,577, 15 pages.
U.S. Office Action dated Jul. 29, 2016 from related U.S. Appl. No. 14/680,877, 8 pages.
U.S. Office Action dated Jun. 1, 2017, from related U.S. Appl. No. 15/003,797, 29 pages.
U.S. Office Action dated Jun. 1, 2017, from related U.S. Appl. No. 15/179,957, 29 pages.
U.S. Office Action dated Jun. 12, 2017, from related U.S. Appl. No. 15/003,256, 9 pages.
U.S. Office Action dated Jun. 12, 2017, from related U.S. Appl. No. 15/003,336, 14 pages.
U.S. Office Action dated Jun. 16, 2017, from related U.S. Appl. No. 15/003,678, 15 pages.
U.S. Office Action dated Jun. 2, 2017, from related U.S. Appl. No. 15/476,636, 10 pages.
U.S. Office Action dated Mar. 1, 2017, from related U.S. Appl. No. 15/003,634, 7 pages.
U.S. Office Action dated Mar. 16, 2017, from related U.S. Appl. No. 15/218,821, 7 pages.
U.S. Office Action dated Mar. 27, 2018, from related U.S. Appl. No. 15/468,386, 21 pages.

(56) References Cited

OTHER PUBLICATIONS

U.S. Office Action dated Mar. 28, 2018, from related U.S. Appl. No. 15/003,177, 12 pages.
U.S. Office Action dated Mar. 5, 2018, from related U.S. Appl. No. 14/866,730, 14 pages.
U.S. Office Action dated Mar. 8, 2018, from related U.S. Appl. No. 15/380,691, 12 pages.
U.S. Office Action dated Mar. 8, 2018, from related U.S. Appl. No. 15/479,256, 30 pages.
U.S. Office Action dated May 13, 2016, from related U.S. Appl. No. 14/676,740, 15 pages.
U.S. Office Action dated May 22, 2017, from related U.S. Appl. No. 15/003,206, 12 pages.
U.S. Office Action dated May 6, 2016, from related U.S. Appl. No. 14/659,498.
U.S. Office Action dated Nov. 2, 2016, from related U.S. Appl. No. 15/003,256, 19 pages.
U.S. Office Action dated Nov. 24, 2017, from related U.S. Appl. No. 15/003,145, 14 pages.
U.S. Office Action dated Nov. 27, 2017, from U.S. Appl. No. 15/468,386, 28 pages.
U.S. Office Action dated Nov. 3, 2016, from related U.S. Appl. No. 15/204,675, 9 pages.
U.S. Office Action dated Oct. 14, 2016 from related U.S. Appl. No. 15/003,677, 13 pages.
U.S. Office Action dated Oct. 19, 2016, from related U.S. Appl. No. 15/218,821, 6 pages.
U.S. Office Action dated Sep. 27, 2017, from related U.S. Appl. No. 15/003,176, 8 pages.
U.S. Office Action dated Sep. 8, 2017, from related U.S. Appl. No. 15/003,292, 8 pages.
Vershovskii & Dmitriev, "Combined excitation of an optically detected magnetic resonance in nitrogen-vacancy centers in diamond for precision measurement of the components of a magnetic field vector," Technical Physics Letters 41(11): 1026-1029 (Nov. 2015), 4 pages.
Vershovskii & Dmitriev, "Micro-scale three-component quantum magnetometer based on nitrogen-vacancy color centers in diamond crystal," Technical Physics Letters 41(4): 393-396 (Apr. 2015), 4 pages.
Wahlstrom et al., "Modeling Magnetic Fields Using Gaussian Processes," 2013 IEEE International Conference on Acoustics, Speech, and Signal Processing, pp. 3522-3526 (May 26-31, 2013), 5 pages.
Wang et al., "Optimizing ultrasensitive single electron magnetometer based on nitrogen-vacancy center in diamond," Chinese Science Bulletin, 58(24): 2920-2923, (Aug. 2013), 4 pages.
Webber et al., "Ab initio thermodynamics calculation of the relative concentration of NV- and NV0 defects in diamond," Physical Review B 85,(014102): 1-7 (Jan. 2012), 7 pages.
Wegerich, "Similarity based modeling of time synchronous averaged vibration signals for machinery health monitoring," 2004 IEEE Aerospace Conference Proceedings (IEEE Cat. No. 04TH8720), 2004, pp. 3654-3662 vol. 6.
Wells, et al. "Assessing graphene nanopores for sequencing DNA." Nano letters 12.8 (Jul. 10, 2012): 4117-4123.
Widmann et al., "Coherent control of single spins in silicon carbide at room temperature," Nature Materials, 14: 164-168 (2015) (available online Dec. 1, 2014), 5 pages.
Wikipedia, "Continuous phase modulation", downloaded from https://web.archive.org/web/20151017015236/https://en.wikipedia.org/wiki/Continuous_phase_modulation on May 10, 2017, 3 pages.
Wikipedia, "Minimum-shift keying", downloaded from https://web.archive.org/web/20151017175828/https://en.wikipedia.org/wiki/Minimum-shift_keying on May 10, 2017, 2 pages.
Wolf et al., "Subpicotesla Diamond Magnetometry," Physical Review X 5(041001): 1-10 (Oct. 2015), 10 pages.
Wolfe et al., "Off-resonant manipulation of spins in diamond via precessing magnetization of a proximal ferromagnet," Physical Review B 89(180406): 1-5 (May 2014), 5 pages.
Wroble, "Performance Analysis of Magnetic Indoor Local Positioning System." Western Michigan University Master's Theses, Paper 609 (Jun. 2015), 42 pages.
Wysocki et al., "Modified Walsh-Hadamard sequences for DS CDMA wireless systems." Int. J. Adaptive Control and Signal Processing 16(8): 589-602 (Oct. 2002; first published online Sep. 23, 2002), 25 pages.
Xue & Liu, "Producing GHZ state of nitrogen-vacancy centers in cavity QED," Journal of Modern Optics 60(6-7), (Mar. 2013), 8 pages.
Yang & Gu, "Novel calibration techniques for high pulsed-magnetic fields using luminescence caused by photo," (with English machine translation), Journal of Huazhong University of Science and Technology, (Jun. 2007), 11 pages.
Yavkin et al., "Defects in Nanodiamonds: Application of High-Frequency cw and Pulse EPR, ODMR," Applied Magnetic Resonance, 45: 1035-1049 (Oct. 2014; published online Sep. 10, 2014), 15 pages.
Yu et al., "Bright fluorescent nanodiamonds: no photobleaching and low cytotoxicity," J. Am. Chem. Soc., 127: 17604-17605 (Nov. 25, 2005), 2 pages.
Zhang et al., "Laser-polarization-dependent and magnetically controlled optical bistability in diamond nitrogen-vacancy centers," Physics Letters A 377: 2621-2627 (Nov. 2013), 7 pages.
Zhang et al., "Laser-polarization-dependent spontaneous emission of the zero phonon line from single nitrogen-vacancy center in diamond," Chinese Physics B 24(3), (Apr. 2014), 13 pages.
Zhang et al., "Scalable quantum information transfer between nitrogen-vacancy-center ensembles," Annals of Physics, 355: 170-181 (Apr. 2015; available online Feb. 14, 2013), 12 pages.
Zhao et al., "Atomic-scale magnetometry of distant nuclear spin clusters via nitrogen-vacancy spin in diamond," Nature Nanotechnology, 5: 242-246 (Apr. 2011), 5 pages.

\* cited by examiner

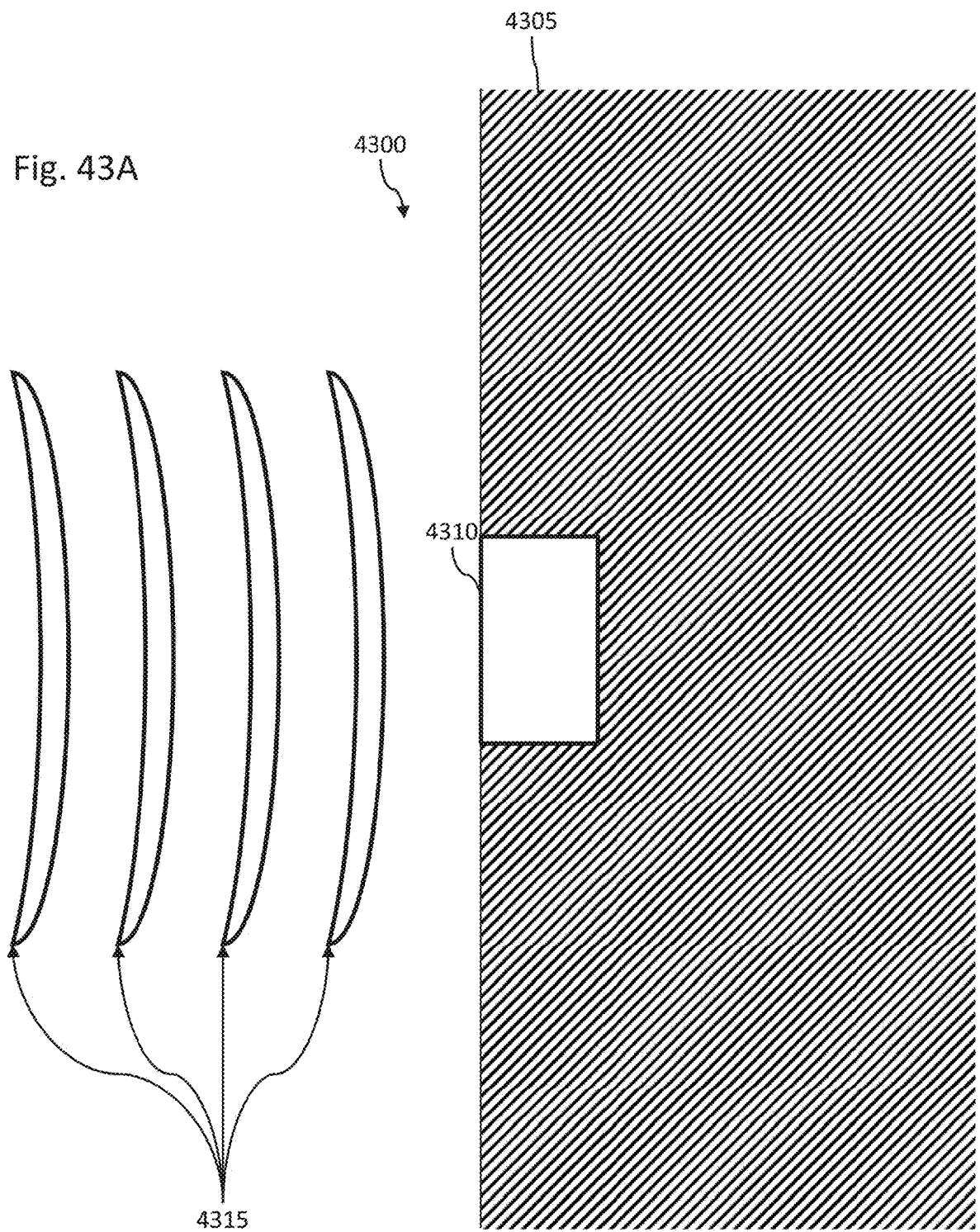

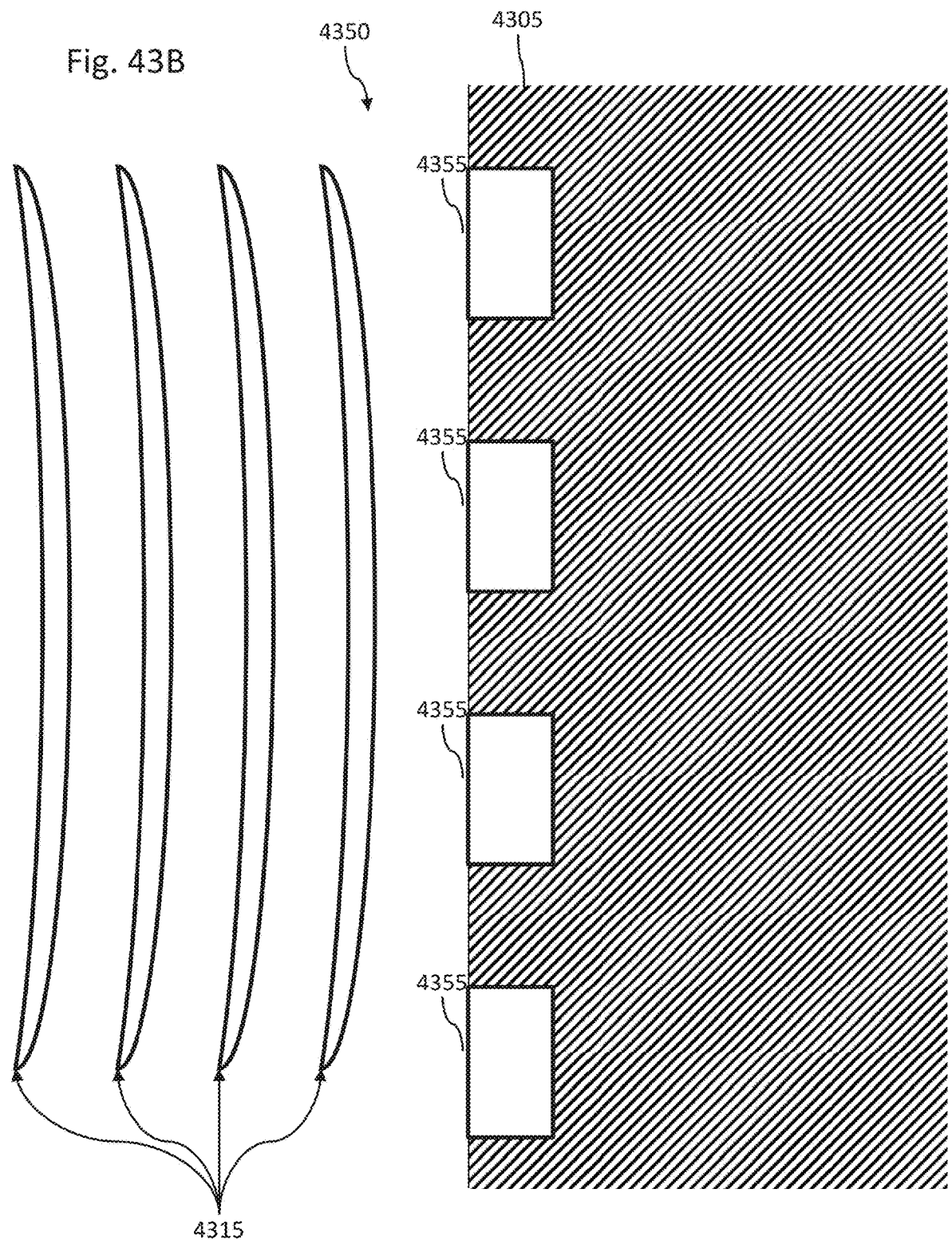

DNV MAGNETIC FIELD DETECTOR

CROSS-REFERENCE TO RELATED PATENT APPLICATIONS

This application is a continuation of co-pending U.S. patent application Ser. No. 15/179,957, filed Jun. 10, 2016, which is a continuation-in-part and claims the benefit of priority to co-pending U.S. patent application Ser. No. 15/003,797, filed Jan. 21, 2016, which made the following claims of the benefit of priority to and incorporation by reference in entirety:

"This application claims the benefit of priority from U.S. Provisional Patent Application No. 62/257,988, filed Nov. 20, 2015, which is incorporated herein by reference in its entirety. This application claims priority to U.S. Provisional Application No. 62/190,209, filed on Jul. 8, 2015, the entirety of which is incorporated herein by reference. The present application claims priority to U.S. Application No. 62/261,643, filed Dec. 1, 2015, which is incorporated by reference herein in its entirety. The present application claims the benefit of U.S. Provisional Application Nos. 62/109,006, filed Jan. 28, 2015, and 62/109,551, filed Jan. 29, 2015, each of which is incorporated by reference herein in its entirety. The present application claims the benefit of U.S. Provisional Application No. 62/214,792, filed Sep. 4, 2015, which is incorporated by reference herein in its entirety. This application claims the benefit of priority from U.S. Provisional Patent Application No. 62/258,003, filed Nov. 20, 2015, which is incorporated herein by reference in its entirety. This application claims the benefit of priority from U.S. Provisional Patent Application No. 62/190,218, filed Jul. 8, 2015, which is incorporated herein by reference in its entirety. This application claims the benefit of priority to U.S. Provisional Patent Application No. 62/107,289, filed Jan. 23, 2015, the entire contents of which are incorporated by reference herein in its entirety."

The present application is related to co-pending U.S. application Ser. No. 15/003,558, filed Jan. 21, 2016, titled "APPARATUS AND METHOD FOR HYPERSENSITIVITY DETECTION OF MAGNETIC FIELD," which is incorporated by reference herein in its entirety. The present application is related to co-pending U.S. application Ser. No. 15/003,062, filed Jan. 21, 2016, titled "IMPROVED LIGHT COLLECTION FROM DNV SENSORS," which is incorporated by reference herein in its entirety. The present application is related to co-pending U.S. application Ser. No. 15/003,652, filed Jan. 21, 2016, titled "PRECISION POSITION ENCODER/SENSOR USING NITROGEN VACANCY DIAMOND," which is incorporated by reference herein in its entirety. The present application is related to co-pending U.S. application Ser. No. 15/003,677, filed Jan. 21, 2016, titled "COMMUNICATION VIA A MAGNIO," which is incorporated by reference herein in its entirety. The present application is related to co-pending U.S. application Ser. No. 15/003,678, filed Jan. 21, 2016, titled "METHOD FOR RESOLVING NATURAL SENSOR AMBIGUITY FOR DNV DIRECTION FINDING APPLICATIONS," which is incorporated by reference herein in its entirety. The present application is related to co-pending U.S. application Ser. No. 15/003,177, filed Jan. 21, 2016, titled "HYDROPHONE," which is incorporated by reference herein in its entirety. The present application is related to co-pending U.S. application Ser. No. 15/003,206, filed Jan. 21, 2016, titled "MAGNETIC NAVIGATION METHODS AND SYSTEMS UTILIZING POWER GRID AND COMMUNICATION NETWORK," which is incorporated by reference herein in its entirety. The present application is related to co-pending U.S. application Ser. No. 15/003,193, filed Jan. 21, 2016, titled "RAPID HIGH-RESOLUTION MAGNETIC FIELD MEASUREMENTS FOR POWER LINE INSPECTION," which is incorporated by reference herein in its entirety. The present application is related to co-pending U.S. application Ser. No. 15/003,088, filed Jan. 21, 2016, titled "IN-SITU POWER CHARGING," which is incorporated by reference herein in its entirety. The present application is related to co-pending U.S. patent application Ser. No. 15/003,519, filed Jan. 21, 2016, titled "APPARATUS AND METHOD FOR CLOSED LOOP PROCESSING FOR A MAGNETIC DETECTION SYSTEM," which is incorporated by reference herein in its entirety. The present application is related to co-pending U.S. application Ser. No. 15/003,718, filed Jan. 21, 2016, titled "APPARATUS AND METHOD FOR RECOVERY OF THREE DIMENSIONAL MAGNETIC FIELD FROM A MAGNETIC DETECTION SYSTEM," which is incorporated by reference herein in its entirety. The present application is related to co-pending U.S. application Ser. No. 15/003,209, filed Jan. 21, 2016, titled "DIAMOND NITROGEN VACANCY SENSED FERRO-FLUID HYDROPHONE," which is incorporated by reference herein in its entirety. The present application is related to co-pending U.S. application Ser. No. 15/003,670, filed Jan. 21, 2016, titled "AC VECTOR MAGNETIC ANOMALY DETECTION WITH DIAMOND NITROGEN VACANCIES," which is incorporated by reference herein in its entirety. The present application is related to co-pending U.S. application Ser. No. 15/003,704, filed Jan. 21, 2016, titled "APPARATUS AND METHOD FOR ESTIMATING ABSOLUTE AXES' ORIENTATIONS FOR A MAGNETIC DETECTION SYSTEM," which is incorporated by reference herein in its entirety. The present application is related to co-pending U.S. application Ser. No. 15/003,590, filed Jan. 21, 2016, titled "APPARATUS AND METHOD FOR HIGH SENSITIVITY MAGNETOMETRY MEASUREMENT AND SIGNAL PROCESSING IN A MAGNETIC DETECTION SYSTEM," which is incorporated by reference herein in its entirety. The present application is related to co-pending U.S. application Ser. No. 15/003,176, filed Jan. 21, 2016, titled "MAGNETIC BAND-PASS FILTER," which is incorporated by reference herein in its entirety. The present application is related to co-pending U.S. application Ser. No. 15/003,145, filed Jan. 21, 2016, titled "DEFECT DETECTOR FOR CONDUCTIVE MATERIALS," which is incorporated by reference herein in its entirety. The present application is related to co-pending U.S. application Ser. No. 15/003,309, filed Jan. 21, 2016, titled "DIAMOND NITROGEN VACANCY SENSOR WITH DUAL RF SOURCES," which is incorporated by reference herein in its entirety. The present application is related to co-pending U.S. application Ser. No. 15/003,298, filed Jan. 21, 2016, titled "DIAMOND NITROGEN VACANCY SENSOR WITH COMMON RF AND MAGNETIC FIELDS GENERATOR," which is incorporated by reference herein in its entirety. The present application is related to co-pending U.S. application Ser. No. 15/003,292, filed Jan. 21, 2016, titled "MAGNETOMETER WITH A LIGHT EMITTING DIODE," which is incorporated by reference herein in its entirety. The present application is related to co-pending U.S. application Ser. No. 15/003,281, filed Jan. 21, 2016, titled "MAGNETOMETER WITH LIGHT PIPE," which is incorporated by reference herein in its entirety. The present application is related to co-pending U.S. application Ser. No. 15/003,634, filed Jan. 21, 2016, titled "DIAMOND NITROGEN VACANCY SENSOR WITH CIRCUITRY ON DIAMOND," which is incorporated by reference herein in its entirety. The present application is related to co-pending U.S. application Ser. No. 15/003,577, filed Jan. 21, 2016, titled "MEASUREMENT PARAMETERS FOR QC METROLOGY OF SYNTHETICALLY GENERATED DIAMOND WITH NV CENTERS," which is incorporated by reference herein in its entirety. The present application is related to co-pending U.S. application Ser. No. 15/003,256, filed Jan. 21, 2016, titled "HIGHER MAGNETIC SENSITIVITY THROUGH FLUORESCENCE MANIPULATION BY PHONON SPECTRUM CONTROL," which is incorporated by reference herein in its entirety. The present application is related to co-pending U.S. application Ser. No. 15/003,396, filed Jan. 21, 2016, titled "MAGNETIC WAKE DETECTOR," which is incorporated by reference herein in its entirety. The present application is related to co-pending U.S. application Ser. No. 15/003,617, filed Jan. 21, 2016, titled "GENERAL PURPOSE REMOVAL OF GEOMAGNETIC NOISE," which is incorporated by reference herein in its entirety. The present application is related to co-pending U.S. application Ser. No. 15/003,336, filed Jan. 21, 2016, titled "REDUCED INSTRUCTION SET CONTROLLER FOR DIAMOND NITROGEN VACANCY SENSOR," which is incorporated by reference herein in its entirety. The present application is related to co-pending U.S. application Ser. No. 14/676,740, filed Apr. 1, 2015, titled "HIGH BIT-RATE MAGNETIC COMMUNICATION," which is incorporated by reference herein in its entirety."

This application additionally claims the benefit of priority to co-pending U.S. application Ser. No. 14/866,730, filed Sep. 25, 2015, which claims the benefit of priority to and incorporates by reference U.S. Provisional Patent Application No. 62/055,607, filed Sep. 25, 2014, both of which are incorporated by reference herein in their entirety. This application claims the benefit of priority to co-pending U.S. patent application Ser. No. 14/680,877, filed Apr. 7, 2015, which claims the benefit of priority to and incorporates by reference U.S. Provisional Patent Application No. 61/975,997, filed Apr. 7, 2014, both of which are incorporated by reference herein in their entirety. This application claims the benefit of priority to co-pending U.S. application Ser. No. 14/659,498, filed Mar. 16, 2015, which claims the benefit of priority to and incorporates by reference U.S. Provisional Patent Application No. 61/955,918, filed Mar. 20, 2014, both of which are incorporated by reference herein in their entirety. This application claims the benefit of priority to co-pending U.S. application Ser. No. 14/676,740, filed Apr. 1, 2015, which claims the benefit of priority to and incorporates by reference U.S. Provisional Patent Application No. 61/976,009, filed Apr. 7, 2014, both of which are incorporated by reference herein in their entirety.

The present application additionally claims the benefit of priority to co-pending U.S. application Ser. No. 15/003,558, filed Jan. 21, 2016, which claims the benefit of priority to and incorporates by reference U.S. Provisional Patent Application No. 62/257,988, filed Nov. 20, 2015, both of which are incorporated by reference herein in their entirety. The present application claims the benefit of priority to co-pending U.S. application Ser. No. 15/003,062, filed Jan. 21, 2016, which claims the benefit of priority to and incorporates by reference U.S. Provisional Patent Application No. 62/196,288, filed Jul. 23, 2015, both of which are incorporated by reference herein in their entirety. The present application claims the benefit of priority to co-pending U.S. application Ser. No. 15/003,652, filed Jan. 21, 2016, which claims the benefit of priority to and incorporates by reference U.S. Provisional Application No. 62/190,209, filed on Jul. 8, 2015, both of which are incorporated by reference herein in their entirety. The present application claims the benefit of priority to co-pending U.S. application Ser. No. 15/003,677, filed Jan. 21, 2016, which claims the benefit of priority to and incorporates by reference U.S. Provisional Application No. 62/261,643, filed Dec. 1, 2015, both of which are incorporated by reference herein in their entirety. The present application claims the benefit of priority to co-pending U.S. application Ser. No. 15/003,678, filed Jan. 21, 2016, which is incorporated by reference herein in its entirety. The present application claims the benefit of priority to co-pending U.S. application Ser. No. 15/003,177, filed Jan. 21, 2016, which is incorporated by reference herein in its entirety. The present application claims the benefit of priority to co-pending U.S. application Ser. No. 15/003,206, filed Jan. 21, 2016, which claims the benefit of priority to and incorporates by reference U.S. Provisional Application No. 62/109,006, filed Jan. 28, 2015, and U.S. Provisional Application No. 62/109,551, filed Jan. 29, 2015, all of which are incorporated by reference herein in their entirety. The present application claims the benefit of priority to co-pending U.S. application Ser. No. 15/003,193, filed Jan. 21, 2016, which claims the benefit of priority to and incorporates by reference U.S. Provisional Application No. 62/109,006, filed Jan. 28, 2015, and U.S. Provisional Application No. 62/109,551, filed Jan. 29, 2015, all of which are incorporated by reference herein in their entirety. The present application claims the benefit of priority to co-pending U.S. application Ser. No. 15/003,088, filed Jan. 21, 2016, which is incorporated by reference herein in its entirety. The present application claims the benefit of priority to co-pending U.S. patent application Ser. No. 15/003,519, filed Jan. 21, 2016, which claims the benefit of priority to and incorporates by reference U.S. Provisional Patent Application No. 62/258,003, filed Nov. 20, 2015, both of which are incorporated by reference herein in their entirety. The present application claims the benefit of priority to co-pending U.S. application Ser. No. 15/003,718, filed Jan. 21, 2016, which claims the benefit of priority to and incorporates by reference U.S. Provisional Patent Application No. 62/112,071, filed Feb. 4, 2015, both of which are incorporated by reference herein in their entirety. The present application claims the benefit of priority to co-pending U.S. application Ser. No. 15/003,209, filed Jan. 21, 2016, which is incorporated by reference herein in its entirety. The present application claims the benefit of priority to co-pending U.S. application Ser. No. 15/003,670, filed Jan. 21, 2016, which is incorporated by reference herein in its entirety. The present application claims the benefit of priority to co-pending U.S. application Ser. No. 15/003,704, filed Jan. 21, 2016, which claims the benefit of priority to and incorporates by reference U.S. Provisional Patent Application No. 62/112,079, filed Feb. 4, 2015, both of which are incorporated by reference herein in their entirety. The present application claims the benefit of priority to co-pending U.S. application Ser. No. 15/003,590, filed Jan. 21, 2016, which claims the benefit of priority to and incorporates by reference U.S. Provisional Patent Application No. 62/107,289, filed Jan. 23, 2015, both of which are incorporated by reference herein in their entirety. The present application claims the benefit of priority to co-pending U.S. application Ser. No. 15/003,176, filed Jan. 21, 2016, which claims the benefit of priority to and incorporates by reference U.S. Provisional Patent Application No. 62/250,874, filed Nov. 4, 2015, both of which are incorporated by reference herein in their entirety. The present application claims the benefit of priority to co-pending U.S. application Ser. No. 15/003,145, filed Jan. 21, 2016, which claims the benefit of priority to and incorporates by reference U.S. Provisional Patent Application No. 62/277,657, filed Jan. 12, 2016, both of which are incorporated by reference herein in their entirety. The present application claims the benefit of priority to co-pending U.S. application Ser. No. 15/003,309, filed Jan. 21, 2016, which is incorporated by reference herein in its entirety. The present application claims the benefit of priority to co-pending U.S. application Ser. No. 15/003,298, filed Jan. 21, 2016, which is incorporated by reference herein in its entirety. The present application claims the benefit of priority to co-pending U.S. application Ser. No. 15/003,292, filed Jan. 21, 2016, which is incorporated by reference herein in its entirety. The present application claims the benefit of priority to co-pending U.S. application Ser. No. 15/003,281, filed Jan. 21, 2016, which is incorporated by reference herein in its entirety. The present application claims the benefit of priority to co-pending U.S. application Ser. No. 15/003,634, filed Jan. 21, 2016, which is incorporated by reference herein in its entirety. The present application claims the benefit of priority to co-pending U.S. application Ser. No. 15/003,577, filed Jan. 21, 2016, which is incorporated by reference herein in its entirety. The present application claims the benefit of priority to co-pending U.S. application Ser. No. 15/003,256, filed Jan. 21, 2016, which is incorporated by reference herein in its entirety. The present application claims the benefit of priority to co-pending U.S. application Ser. No. 15/003,396, filed Jan. 21, 2016, which claims the benefit of priority to and incorporates by reference U.S. Provisional Application No. 62/214,792, filed Sep. 4, 2015, both of which are incorporated by reference herein in their entirety. The present application claims the benefit of priority to co-pending U.S. application Ser. No. 15/003,617, filed Jan. 21, 2016, which claims the benefit of priority to and incorporates by reference U.S. Provisional Patent Application No. 62/190,218, filed Jul. 8, 2015, both of which are incorporated by reference herein in their entirety. The present application claims the benefit of priority to co-pending U.S. application Ser. No. 15/003,336, filed Jan. 21, 2016, which is incorporated by reference herein in its entirety.

FIELD

The present disclosure generally relates to magnetometers.

BACKGROUND

Atomic-sized nitrogen-vacancy (NV) centers in diamond lattices have been shown to have excellent sensitivity for magnetic field measurement and enable fabrication of small magnetic sensors that can readily replace existing-technology (e.g., Hall-effect, SERF, SQUID, or the like) systems and devices. Nitrogen vacancy diamond (DNV) magnetometers are able to sense extremely small magnetic field variations by changes in the diamond's red photoluminescence that relate, through the gradient of the luminescent function, to frequency and thereafter to magnetic field through the Zeeman effect.

BRIEF DESCRIPTION OF THE DRAWINGS

FIGS. 43A and 43B are diagrams illustrating hydrophone systems in accordance with illustrative embodiments.

DETAILED DESCRIPTION

Hypersensitivity Detection of Magnetic Field

Aspects of the disclosure relates to apparatuses and methods for elucidating hyperfine transition responses to determine an external magnetic field acting on a magnetic detection system. The hyperfine transition responses exhibit a steeper gradient than the gradient of aggregate Lorentzian responses measured in conventional systems, which can be up to three orders of magnitude larger. The steeper gradient exhibited by the hyperfine transition responses thus allow for a comparable increase in measurement sensitivity in a magnetic detection system. By utilizing the largest gradient of the hyperfine responses for measuring purposes, external magnetic fields may be detected more accurately, especially low magnitude and/or rapidly changing fields.

The NV Center, its Electronic Structure, and Optical and RF Interaction

Figure 1:
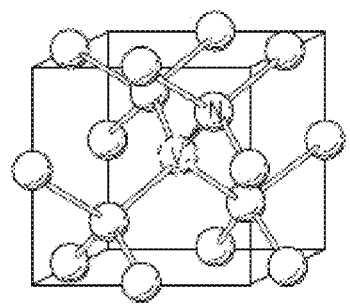
FIG. 1 illustrates one orientation of an NV center in a diamond lattice.

The NV center in a diamond comprises a substitutional nitrogen atom in a lattice site adjacent a carbon vacancy as shown in FIG. 1. The NV center may have four orientations, each corresponding to a different crystallographic orientation of the diamond lattice.

The NV center may exist in a neutral charge state or a negative charge state. Conventionally, the neutral charge state uses the nomenclature $NV^0$, while the negative charge state uses the nomenclature NV, which is adopted in this description.

The NV center has a number of electrons, including three unpaired electrons, each one from the vacancy to a respective of the three carbon atoms adjacent to the vacancy, and a pair of electrons between the nitrogen and the vacancy. The NV center, which is in the negatively charged state, also includes an extra electron.

Figure 2:
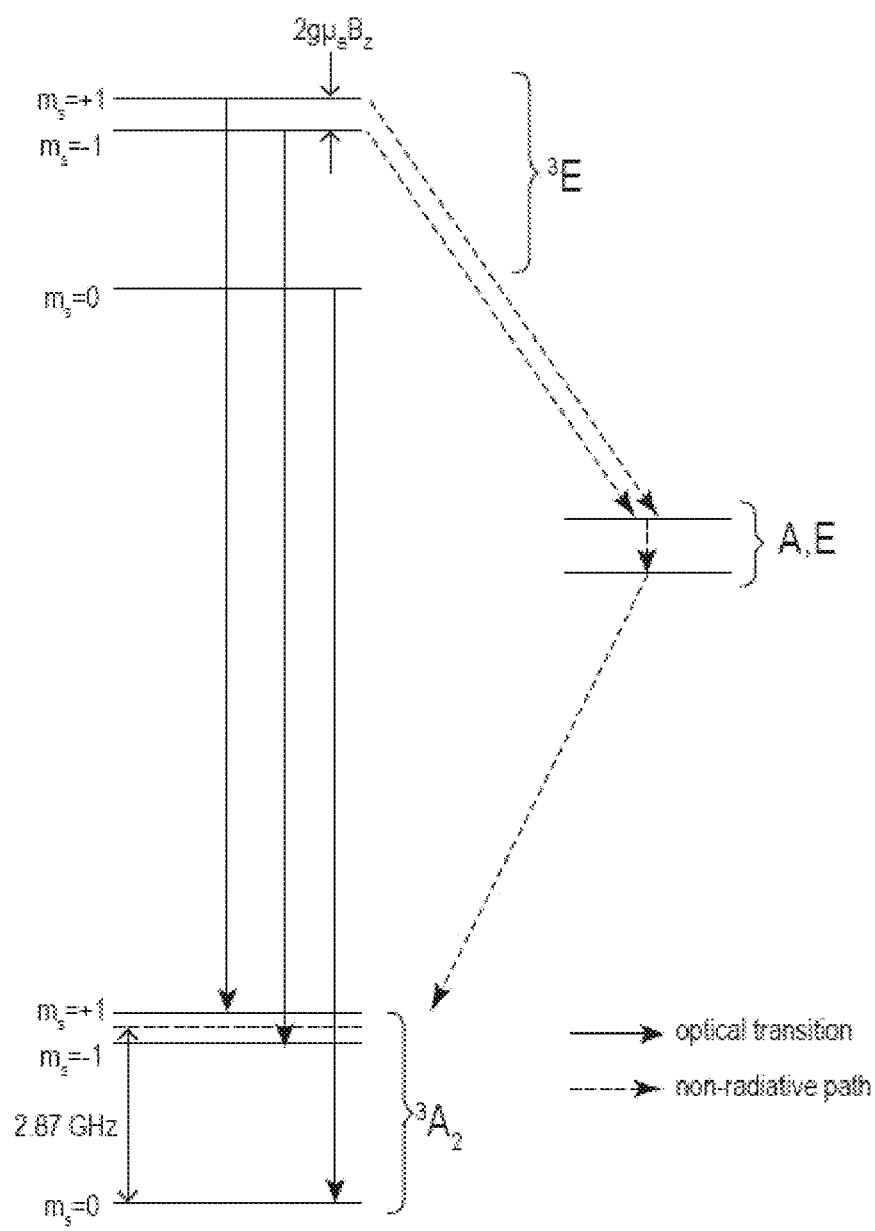
FIG. 2 is an energy level diagram showing energy levels of spin states for the NV center.

The NV center has rotational symmetry, and as shown in FIG. 2, has a ground state, which is a spin triplet with $^3A_2$ symmetry with one spin state $m_s=0$, and two further spin states $m_s=+1$, and $m_s=-1$. In the absence of an external magnetic field, the $m_s=\pm 1$ energy levels are offset from the $m_s=0$ due to spin-spin interactions, and the $m_s=\pm 1$ energy levels are degenerate, i.e., they have the same energy. The $m_s=0$ spin state energy level is split from the $m_s=\pm 1$ energy levels by an energy of 2.87 GHz for a zero external magnetic field.

Introducing an external magnetic field with a component along the NV axis lifts the degeneracy of the $m_s=\pm 1$ energy levels, splitting the energy levels $m_s=\pm 1$ by an amount $2g\mu_B Bz$, where g is the g-factor, $\mu_B$ is the Bohr magneton, and Bz is the component of the external magnetic field along the NV axis. This relationship is correct to a first order and inclusion of higher order corrections is straightforward matter and will not affect the computational and logic steps in the systems and methods described below.

The NV center electronic structure further includes an excited triplet state $^3E$ with corresponding $m_s=0$ and $m_s=\pm 1$ spin states. The optical transitions between the ground state $^3A_2$ and the excited triplet $^3E$ are predominantly spin conserving, meaning that the optical transitions are between initial and final states that have the same spin. For a direct transition between the excited triplet $^3E$ and the ground state $^3A_2$, a photon of red light is emitted with a photon energy corresponding to the energy difference between the energy levels of the transitions.

There is, however, an alternative non-radiative decay route from the triplet $^3E$ to the ground state $^3A_2$ via intermediate electron states, which are thought to be intermediate singlet states A, E with intermediate energy levels. Significantly, the transition rate from the $m_s=\pm 1$ spin states of the excited triplet $^3E$ to the intermediate energy levels is significantly greater than the transition rate from the $m_s=0$ spin state of the excited triplet $^3E$ to the intermediate energy levels. The transition from the singlet states A, E to the ground state triplet $^3A_2$ predominantly decays to the $m_s=0$ spin state over the $m_s=\pm 1$ spins states. These features of the decay from the excited triplet $^3E$ state via the intermediate singlet states A, E to the ground state triplet $^3A_2$ allows that if optical excitation is provided to the system, the optical excitation will eventually pump the NV center into the $m_s=0$ spin state of the ground state $^3A_2$. In this way, the population of the $m_s=0$ spin state of the ground state $^3A_2$ may be "reset" to a maximum polarization determined by the decay rates from the triplet $^3E$ to the intermediate singlet states.

Another feature of the decay is that the fluorescence intensity due to optically stimulating the excited triplet $^3E$ state is less for the $m_s=\pm 1$ states than for the $m_s=0$ spin state. This is so because the decay via the intermediate states does not result in a photon emitted in the fluorescence band, and because of the greater probability that the $m_s=\pm 1$ states of the excited triplet $^3E$ state will decay via the non-radiative decay path. The lower fluorescence intensity for the $m_s=\pm 1$ states than for the $m_s=0$ spin state allows the fluorescence intensity to be used to determine the spin state. As the population of the $m_s=\pm 1$ states increases relative to the $m_s=0$ spin, the overall fluorescence intensity will be reduced.

The NV Center, or Magneto-Optical Defect Center, Magnetic Sensor System

Figure 3:
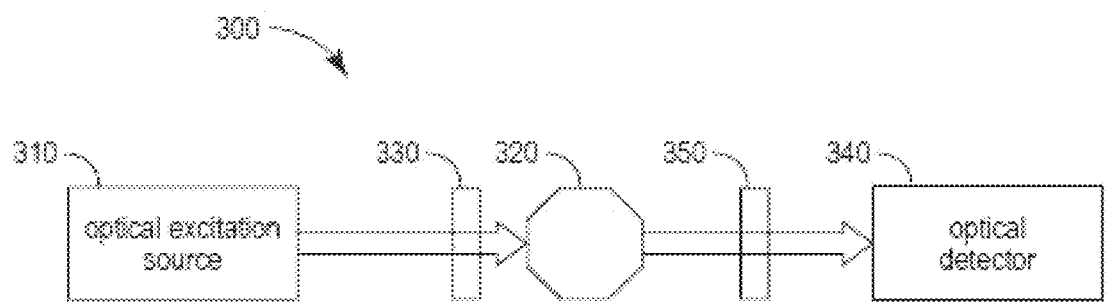
FIG. 3 is a schematic illustrating an NV center magnetic sensor system.

FIG. 3 is a schematic diagram illustrating a conventional NV center magnetic sensor system 300 that uses fluorescence intensity to distinguish the $m_s=\pm 1$ states, and to measure the magnetic field based on the energy difference between the $m_s=+1$ state and the $m_s=-1$ state. The system 300 includes an optical excitation source 310, which directs optical excitation to an NV diamond material 320 with NV centers. The system further includes an RF excitation source 330, which provides RF radiation to the NV diamond material 320. Light from the NV diamond may be directed through an optical filter 350 to an optical detector 340.

The RF excitation source 330 may be a microwave coil, for example. The RF excitation source 330, when emitting RF radiation with a photon energy resonant with the transition energy between ground $m_s=0$ spin state and the $m_s=+1$ spin state, excites a transition between those spin states. For such a resonance, the spin state cycles between ground $m_s=0$ spin state and the $m_s=+1$ spin state, reducing the population in the $m_s=0$ spin state and reducing the overall fluorescence at resonances. Similarly, resonance occurs between the $m_s=0$ spin state and the $m_s=-1$ spin state of the ground state when the photon energy of the RF radiation emitted by the RF excitation source is the difference in energies of the $m_s=0$ spin state and the $m_s=-1$ spin state, or between the $m_s=0$ spin state and the $m_s=+1$ spin state, there is a decrease in the fluorescence intensity.

The optical excitation source 310 may be a laser or a light emitting diode, for example, which emits light in the green, for example. The optical excitation source 310 induces fluorescence in the red, which corresponds to an electronic transition from the excited state to the ground state. Light from the NV diamond material 320 is directed through the optical filter 350 to filter out light in the excitation band (in the green, for example), and to pass light in the red fluorescence band, which in turn is detected by the detector 340. The optical excitation light source 310, in addition to exciting fluorescence in the diamond material 320, also serves to reset the population of the $m_s=0$ spin state of the ground state $^3A_2$ to a maximum polarization, or other desired polarization.

Figure 4:
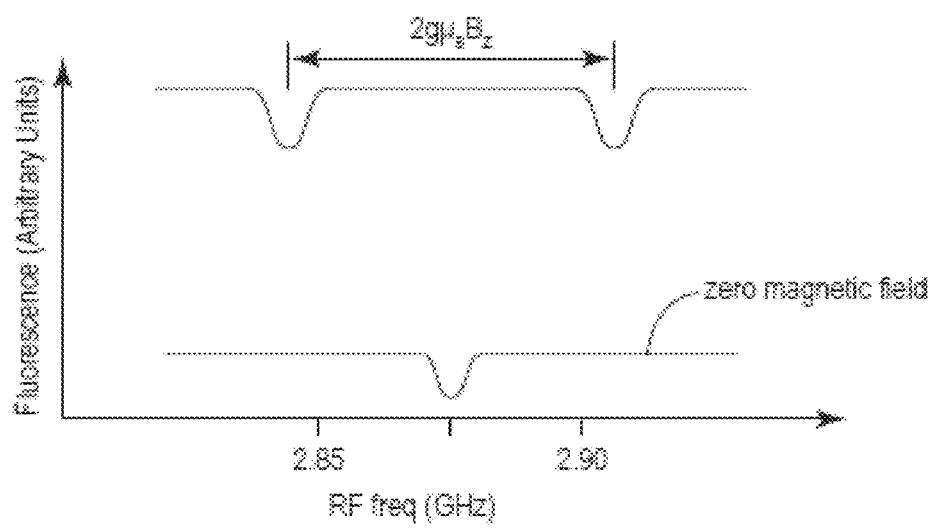
FIG. 4 is a graph illustrating a fluorescence as a function of an applied RF frequency of an NV center along a given direction for a zero magnetic field.

For continuous wave excitation, the optical excitation source 310 continuously pumps the NV centers, and the RF excitation source 330 sweeps across a frequency range that includes the zero splitting (when the $m_s=\pm 1$ spin states have the same energy) energy of 2.87 GHz. The fluorescence for an RF sweep corresponding to a diamond material 320 with NV centers aligned along a single direction is shown in FIG. 4 for different magnetic field components Bz along the NV axis, where the energy splitting between the $m_s=-1$ spin state and the $m_s=+1$ spin state increases with Bz. Thus, the component Bz may be determined. Optical excitation schemes other than continuous wave excitation are contemplated, such as excitation schemes involving pulsed optical excitation, and pulsed RF excitation. Examples of pulsed excitation schemes include Ramsey pulse sequence, and spin echo pulse sequence.

Figure 5:
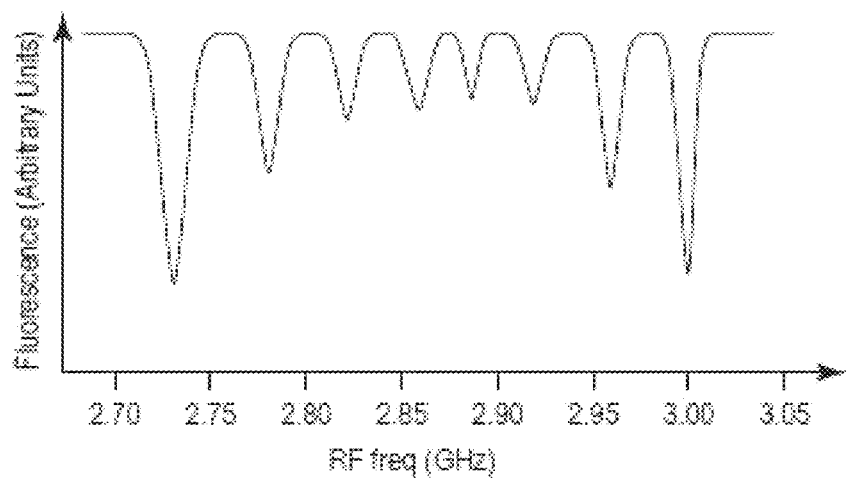
FIG. 5 is a graph illustrating the fluorescence as a function of an applied RF frequency for four different NV center orientations for a non-zero magnetic field.

In general, the diamond material 320 will have NV centers aligned along directions of four different orientation classes. FIG. 5 illustrates fluorescence as a function of RF frequency for the case where the diamond material 320 has NV centers aligned along directions of four different orientation classes. In this case, the component Bz along each of the different orientations may be determined. These results, along with the known orientation of crystallographic planes of a diamond lattice, allow not only the magnitude of the external magnetic field to be determined, but also the direction of the magnetic field.

While FIG. 3 illustrates an NV center magnetic sensor system 300 with NV diamond material 320 with a plurality of NV centers, in general, the magnetic sensor system may instead employ a different magneto-optical defect center material, with a plurality of magneto-optical defect centers. The electronic spin state energies of the magneto-optical defect centers shift with magnetic field, and the optical response, such as fluorescence, for the different spin states is not the same for all of the different spin states. In this way, the magnetic field may be determined based on optical excitation, and possibly RF excitation, in a corresponding way to that described above with NV diamond material.

Figure 6:
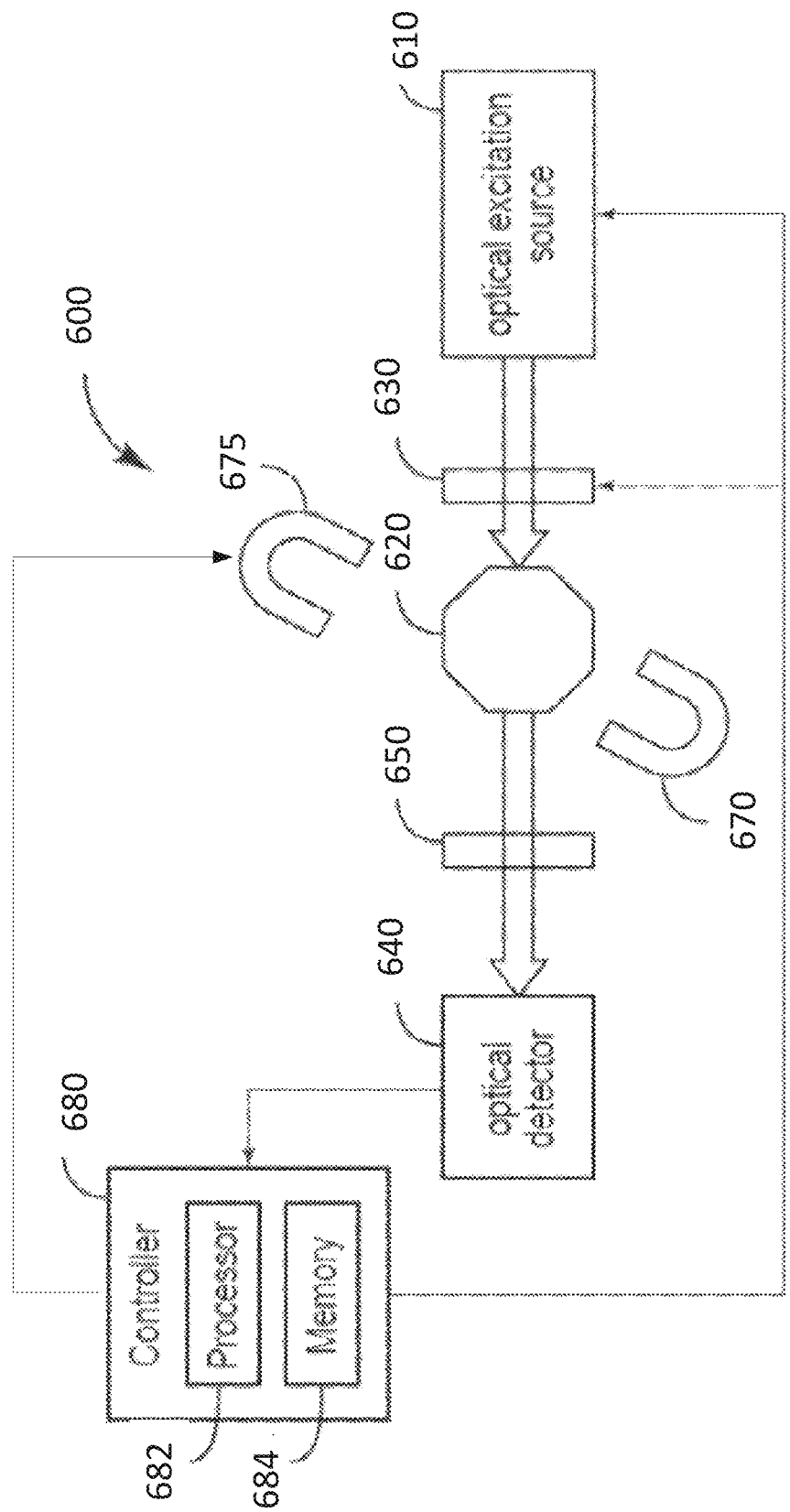
FIG. 6 is a schematic diagram illustrating a magnetic field detection system according to an embodiment of the present invention.

FIG. 6 is a schematic diagram of a system 600 for a magnetic field detection system according to an embodiment of the present invention. The system 600 includes an optical excitation source 610, which directs optical excitation to an NV diamond material 620 with NV centers, or another magneto-optical defect center material with magneto-optical defect centers. An RF excitation source 630 provides RF radiation to the NV diamond material 620.

As shown in FIG. 6, a first magnetic field generator 670 generates a magnetic field, which is detected at the NV diamond material 620. The first magnetic field generator 670 may be a permanent magnet positioned relative to the NV diamond material 620, which generates a known, uniform magnetic field (e.g., a bias or control magnetic field) to produce a desired fluorescence intensity response from the NV diamond material 620. In some embodiments, a second magnetic field generator 675 may be provided and positioned relative to the NV diamond material 620 to provide an additional bias or control magnetic field. The second magnetic field generator 675 may be configured to generate magnetic fields with orthogonal polarizations, for example. In this regard, the second magnetic field generator 675 may include one or more coils, such as a Helmholtz coils. The coils may be configured to provide relatively uniform magnetic fields at the NV diamond material 620 and each may generate a magnetic field having a direction that is orthogonal to the direction of the magnetic field generated by the other coils. For example, in a particular embodiment, the second magnetic field generator 675 may include three Helmholtz coils that are arranged to each generate a magnetic field having a direction orthogonal to the other direction of the magnetic field generated by the other two coils resulting in a three-axis magnetic field. In some embodiments, only the first magnetic field generator 670 may be provided to generate a bias or control magnetic field. Alternatively, only the second magnetic field generator 675 may be provided to generate the bias or control magnetic field. In yet other embodiments, the first and/or second magnetic field generators may be affixed to a pivot assembly (e.g., a gimbal assembly) that may be controlled to hold and position the first and/or second magnetic field generators to a predetermined and well-controlled set of orientations, thereby establishing the desired bias or control magnetic fields. In this case, the controller 680 may be configured to control the pivot assembly having the first and/or second magnetic field generators to position and hold the first and/or second magnetic field generators at the predetermined orientation.

The system 600 further includes a controller 680 arranged to receive a light detection or optical signal from the optical detector 640 and to control the optical excitation source 610, the RF excitation source 630, and the second magnetic field generator 675. The controller may be a single controller, or multiple controllers. For a controller including multiple controllers, each of the controllers may perform different functions, such as controlling different components of the system 600. The second magnetic field generator 675 may be controlled by the controller 680 via an amplifier 660, for example.

The RF excitation source 630 may be a microwave coil, for example. The RF excitation source 630 is controlled to emit RF radiation with a photon energy resonant with the transition energy between the ground $m_s=0$ spin state and the $m_s=\pm 1$ spin states as discussed above with respect to FIG. 3.

The optical excitation source 610 may be a laser or a light emitting diode, for example, which emits light in the green, for example. The optical excitation source 610 induces fluorescence in the red from the NV diamond material 620, where the fluorescence corresponds to an electronic transition from the excited state to the ground state. Light from the NV diamond material 620 is directed through the optical filter 650 to filter out light in the excitation band (in the green, for example), and to pass light in the red fluorescence band, which in turn is detected by the optical detector 640. The optical excitation light source 610, in addition to exciting fluorescence in the NV diamond material 620, also serves to reset the population of the $m_s=0$ spin state of the ground state $^3A_2$ to a maximum polarization, or other desired polarization.

The controller 680 is arranged to receive a light detection signal from the optical detector 640 and to control the optical excitation source 610, the RF excitation source 630, and the second magnetic field generator 675. The controller may include a processor 682 and a memory 684, in order to control the operation of the optical excitation source 610, the RF excitation source 630, and the second magnetic field generator 675. The memory 684, which may include a nontransitory computer readable medium, may store instructions to allow the operation of the optical excitation source 610, the RF excitation source 630, and the second magnetic field generator 675 to be controlled. That is, the controller 680 may be programmed to provide control.

Detection of Magnetic Field Changes

As discussed above, the interaction of the NV centers with an external magnetic field results in an energy splitting between the $m_s=-1$ spin state and the $m_s=+1$ spin state that increases with Bz as shown in FIG. 4, for example. The pair of frequency responses (also known as Lorentzian responses, profiles, or dips) due to the component of the external magnetic field along the given NV axis manifest as dips in intensity of the emitted red light from the NV centers as a function of RF carrier frequency. Accordingly, a pair of frequency responses for each of the four axes of the NV center diamond lattice result in an energy splitting between the $m_s=-1$ spin state and the $m_s=+1$ spin state that corresponds to the component of the external magnetic field along the axis for a total of eight Lorentzian profiles or dips, as shown in FIG. 5. When a bias magnetic field is applied to the NV diamond material (such as by the first and/or second magnetic field generators 670, 675 of FIG. 6), in addition to an unknown external magnetic field existing outside the system, the total incident magnetic field may thus be expressed as $B_t(t)=B_{bias}(t) B_{ext}(t)$, where $B_{bias}(t)$ represents the bias magnetic field applied to the NV diamond material and $B_{ext}(t)$ represents the unknown external magnetic field. This total incident magnetic field creates equal and linearly proportional shifts in the Lorentzian frequency profiles for a given NV axis between the $m_s=-1$ spin state and the $m_s=+1$ spin state relative to the starting carrier frequency (e.g., about 2.87 GHz).

Figure 7:
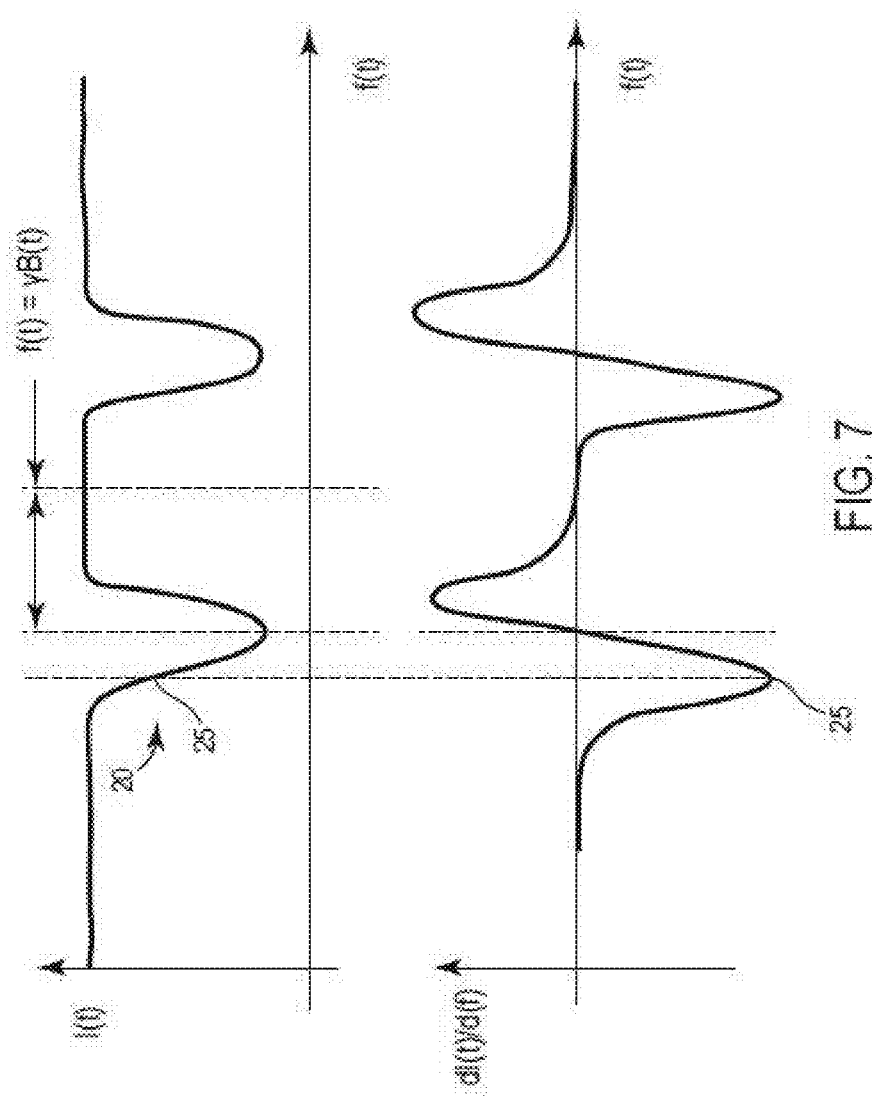
FIG. 7 is a graph illustrating a fluorescence as a function of an applied RF frequency for an NV center orientation in a non-zero magnetic field and a gradient of the fluorescence as a function of the applied RF frequency.

Because the applied bias magnetic field $B_{bias}(t)$ is already known and constant, a change or shift in the total incident magnetic field $B_t(t)$ will be due to a change in the external magnetic field $B_{ext}(t)$. To detect a change in the total incident magnetic field, the point of greatest sensitivity in measuring such a change will occur at the point where the frequency response is at its largest slope. For example, as shown in FIG. 7, an intensity response $I(t)$ as a function of an RF applied frequency f (t) for a given NV axis due to a magnetic field is shown in the top graph. The change in intensity $1(t)$ relative to the change in RF applied frequency, $$\frac{dI(t)}{df},$$

is plotted against the RF applied frequency f (t) as shown in the bottom graph. Point 25 represents the point of the greatest gradient of the Lorentzian dip 20. This point gives the greatest measurement sensitivity in detecting changes in the total incident magnetic field as it responds to the external magnetic field.

The Hyperfine Field

Figure 8:
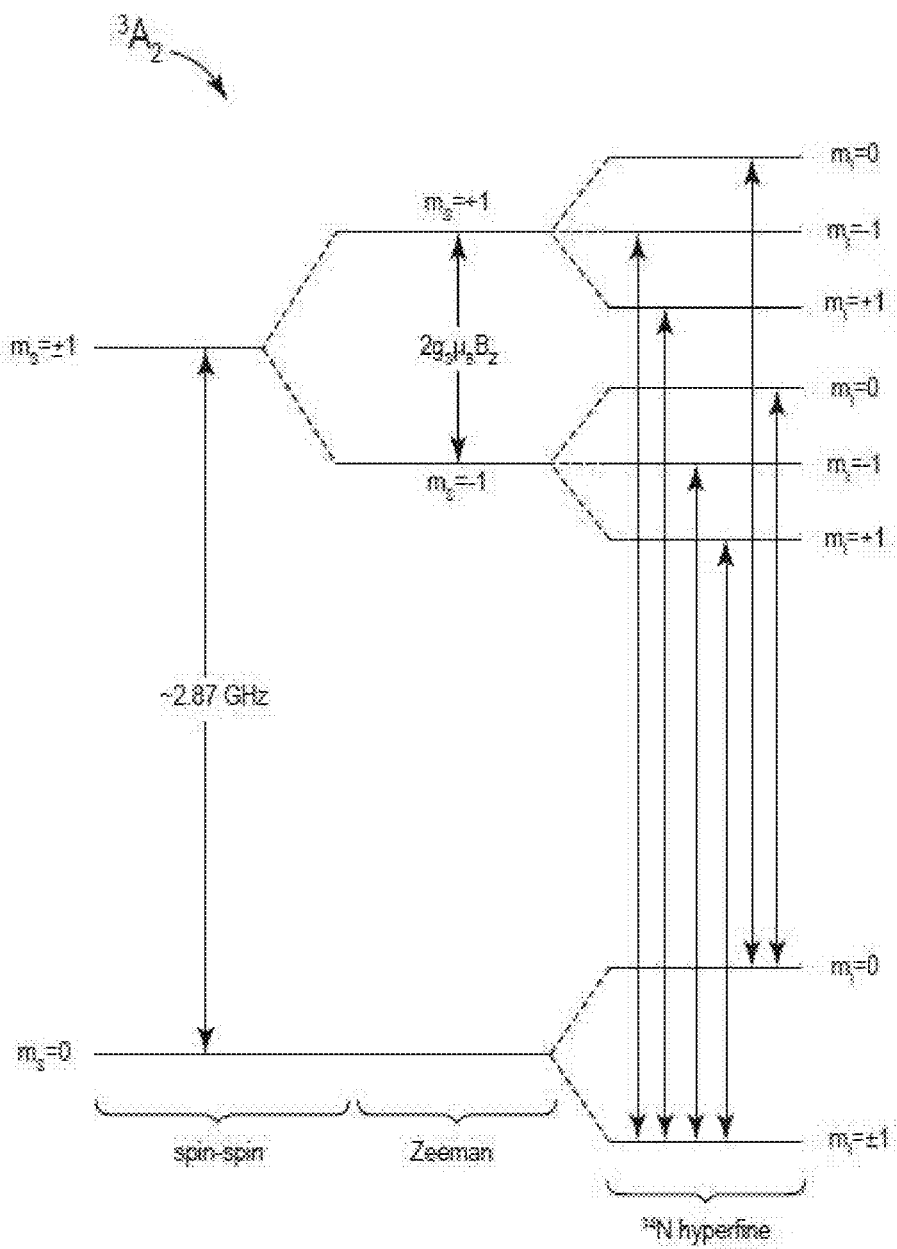
FIG. 8 is an energy level diagram showing a hyperfine structure of spin states for the NV center.

As discussed above and shown in the energy level diagram of FIG. 2, the ground state is split by about 2.87 GHz between the $m_s=0$ and $m_s=±1$ spin states due to their spin-spin interactions. In addition, due to the presence of a magnetic field, the $m_s=±1$ spin states split in proportion to the magnetic field along the given axis of the NV center, which manifests as the four-pair Lorentzian frequency response shown in FIG. 5. However, a hyperfine structure of the NV center exists due to the hyperfine coupling between the electronic spin states of the NV center and the nitrogen nucleus, which results in further energy splitting of the spin states. FIG. 8 shows the hyperfine structure of the ground state triplet $^3A_2$ of the NV center. Specifically, coupling to the nitrogen nucleus $^{14}N$ further splits the $m_s=±1$ spin states into three hyperfine transitions (labeled as $m_1$ spin states), each having different resonances. Accordingly, due to the hyperfine split for each of the $m_s=±1$ spin states, twenty-four different frequency responses may be produced (three level splits for each of the $m_s=±1$ spin states for each of the four NV center orientations).

Each of the three hyperfine transitions manifest within the width of one aggregate Lorentzian dip. With proper detection, the hyperfine transitions may be elucidated within a given Lorentzian response. To detect such hyperfine transitions, in particular embodiments, the NV diamond material 620 exhibits a high purity (e.g., low existence of lattice dislocations, broken bonds, or other elements beyond $^{14}N$) and does not have an excess concentration of NV centers. In addition, during operation of the system 600 in some embodiments, the RF excitation source 630 is operated on a low power setting in order to further resolve the hyperfine responses. In other embodiments, additional optical contrast for the hyperfine responses may be accomplished by increasing the concentration of NV negative-charge type centers, increasing the optical power density (e.g., in a range from about 20 to about 1000 mW/mm$^2$), and decreasing the RF power to the lowest magnitude that permits a sufficient hyperfine readout (e.g., about 1 to about 10 W/mm$^2$).

Figure 9:
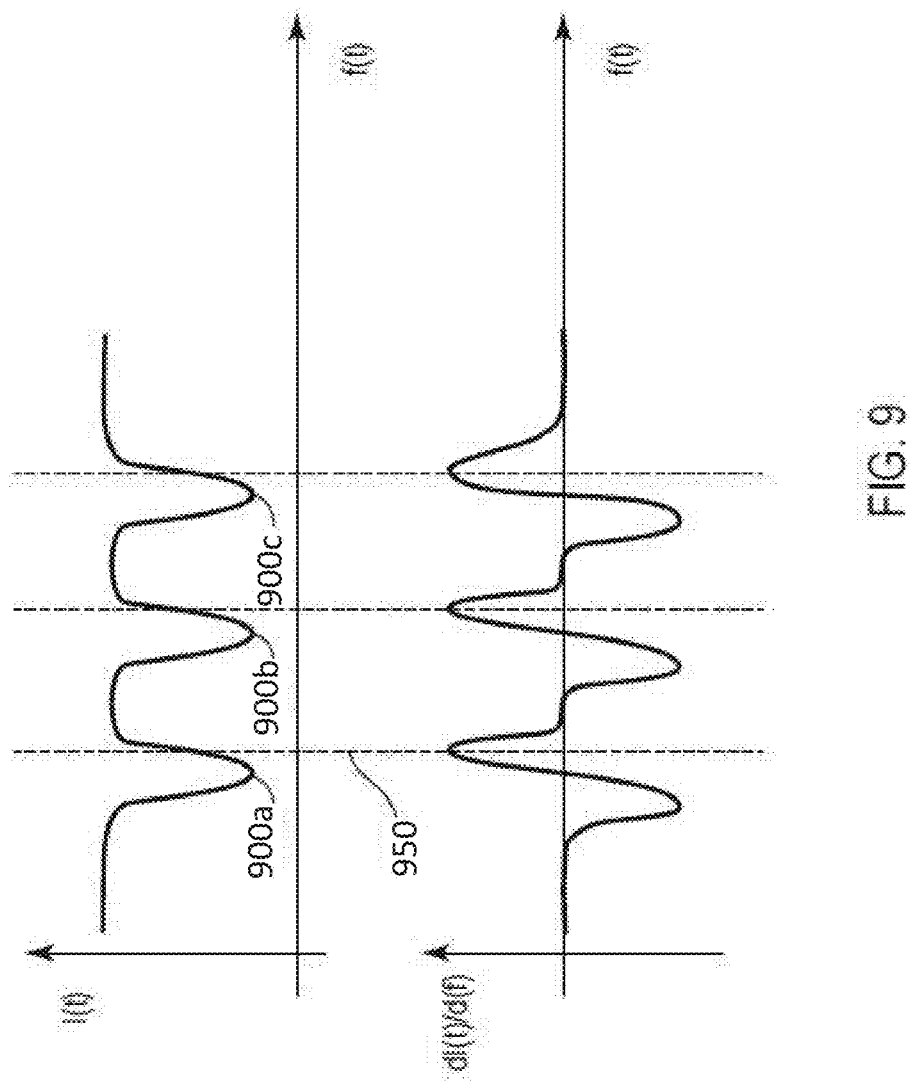
FIG. 9 is a graph illustrating a fluorescence as a function of an applied RF frequency for an NV center orientation in a non-zero magnetic field with hyperfine detection and a gradient of the fluorescence as a function of the applied RF frequency.

FIG. 9 shows an example of fluorescence intensity as a function of an applied RF frequency for an NV center with hyperfine detection. In the top graph, the intensity response I(t) as a function of an applied RF frequency f (t) for a given spin state (e.g., $m_s=-1$) along a given axis of the NV center due to an external magnetic field is shown. In addition, in the bottom graph, the gradient $$\frac{dI(t)}{df}$$

plotted against the applied RF frequency f (t) is shown. As seen in the figure, the three hyperfine transitions 200a-200c constitute a complete Lorenztian response 20 (e.g., corresponding to the Lorenztian response 20 in FIG. 7). The point of maximum slope may then be determined through the gradient of the fluorescence intensity as a function of the applied RF frequency, which occurs at the point 250 in FIG. 9. This point of maximum slope may then be tracked during the applied RF sweep to detect movement of the point of maximum slope along the frequency sweep. Like the point of maximum slope 25 for the aggregate Lorentzian response, the corresponding movement of the point 250 corresponds to changes in the total incident magnetic field $B_t(t)$, which because of the known and constant bias field $B_{bias}(t)$, allows for the detection of changes in the external magnetic field $B_{ext}(t)$.

However, as compared to point 25, point 250 exhibits a larger gradient than the aggregate Lorentzian gradient described above with regard to FIG. 7. In some embodiments, the gradient of point 250 may be up to 1000 times larger than the aggregate Lorentzian gradient of point 25. Due to this, the point 250 and its corresponding movement may be more easily detected by the measurement system resulting in improved sensitivity, especially in very low magnitude and/or very rapidly changing magnetic fields.

Improved Light Collection from DNV Sensors

In some aspects of the present technology, methods and configurations are disclosed for an efficient collection of fluorescence (e.g., red light) emitted by the nitrogen vacancies of a diamond of a DNV sensor. In some implementations, the subject technology can allow efficient collection of the emitted light of the diamond of the DNV sensor with a compact and low cost reflector. The reflector can focus the emitted light of the diamond of the DNV sensor to an optical or photo detector that can increase the amount of light detected from the diamond. In some implementations, such a configuration may detect virtually all light emitted by the diamond of the DNV sensor. In some aspects, the reflector may be shaped as a parabola, an ellipse, or other shapes that can convey the light emitted from a source to a focal point or focal area.

In some other implementations of the subject technology, the diamond of the DNV sensor may be machined or otherwise shaped to be a reflector itself. That is, the diamond with nitrogen vacancies may be shaped to form a parabolic reflector, ellipsoidal reflector or other shapes that can convey the light emitted from the nitrogen vacancies to a focal point or focal area. For example, the reflector can be mostly parabolic or ellipsoidal such that the light hits the photo detector at a 90 degree angle with some margin of error, e.g., 2 to 10 degrees.

The nitrogen vacancies of the diamond will fluoresce in response to excitation with green light and will emit red light in random directions. Because the red light measurements are shot noise limited, collecting as much emitted light as possible is desirable. In some current collection approaches using large optics, the collection efficiencies were in the range of 20%. Some implementations use a large aperture lens mounted close to the diamond or DNV sensor, which limits light collection to a fraction of the light emitted by the diamond or DNV sensor. Other implementations use a flat diamond and a number of photo detectors (e.g., four) positioned at the edges of the flat diamond. This arrangement of photo detectors may be able to capture more of the emitted light conducted to edges of the flat diamond due to internal reflection, but increases the number of photo detectors required and may not capture light emitted from the faces of the flat diamond. The DNV sensors discussed herein provide an alternative to increase the collection efficiency.

Figure 10:
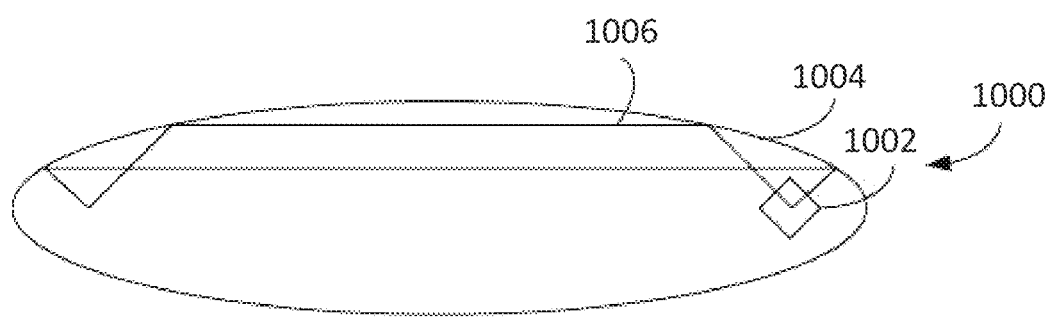
FIG. 10 is an overview of a reflector with a diamond having nitrogen vacancies.

FIG. 10 depicts an overview of an assembly 1000 with an example diamond 1002 having nitrogen vacancies and a reflector 1004 positioned about the diamond 1002 for a DNV light-collection apparatus. In the implementation shown, the reflector 1004 is positioned about the diamond 1002 to reflect a portion of the light emitted 1006 from the diamond 1002. The reflector 1004 is an elliptical or ellipsoidal reflector with the diamond 1002 positioned within a portion of the reflector 1004. In other implementations, as discussed in further detail herein, the reflector 1004 may be parabolic or any other geometric configuration to reflect light emitted from the diamond 1002. In some implementations, the reflector 1004 may be a monolithic reflector, a hollow reflector, or any other type of reflector to reflect light emitted from the diamond 1002. In the implementation shown, the diamond 1002 is positioned at a focus 1008 of the reflector 1004. Thus, when light 1006 is emitted from the diamond 1002, the light is reflected by the reflector 1004 toward another focus of the reflector 1004. As will be discussed in further detail herein, a photo detector may be positioned at the second focus to collect the reflected light.

Figure 11:
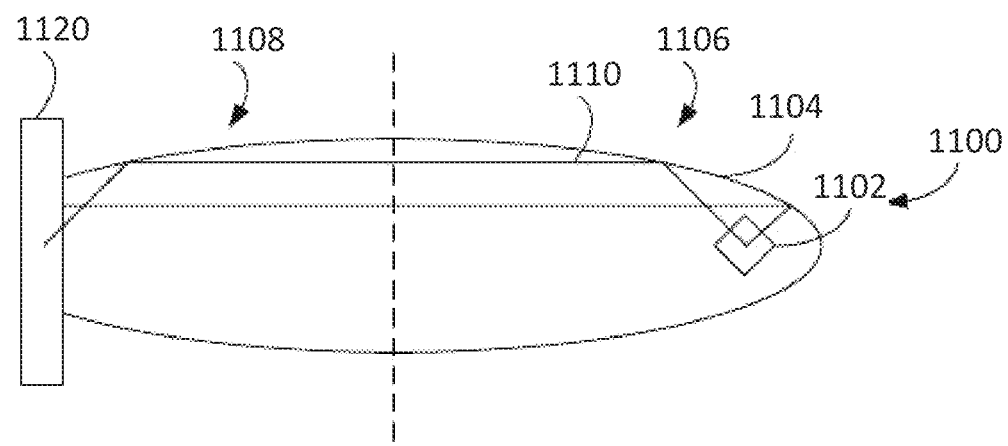
FIG. 11 is a side view of an ellipsoidal reflector with a diamond having nitrogen vacancies and a photo detector.

FIG. 11 depicts an assembly 1100 with an example diamond 1102 having nitrogen vacancies and an ellipsoidal reflector 1104 positioned about the diamond 1102 for a DNV light-collection apparatus. In some implementations, the ellipsoidal reflector 1104 can be a single monolithic component that can be considered to be divided into two portions, such as a reflector portion 1106 and a concentrator portion 1108. In other implementations, the ellipsoidal reflector 1104 may be divided into two components, such as the reflector portion 1106 and the concentrator portion 1108 that are coupled and/or otherwise positioned relative to each other. For instance, the reflector portion 1106 and the concentrator portion 1108 may be separate parabolic components that can be combined to form the ellipsoidal reflector 1104. In still further configurations, the ellipsoidal reflector 1104 may be composed of more than two components and can be coupled or otherwise positioned to form the ellipsoidal reflector 1104.

The diamond 1102 is positioned at a first focus of the ellipsoidal reflector 1104 for the reflector portion 1106. In some implementations, the diamond 1102 is positioned at the first focus using a mount for the diamond 1102. In other implementations, the diamond 1102 is positioned at the first focus using a borehole through the ellipsoidal reflector 1104. The borehole may be backfilled to seal the diamond 1102 in the ellipsoidal reflector 1104.

The ellipsoidal reflector 1104 may also include an opening to allow an excitation laser beam to excite the diamond 1102, such as a green excitation laser beam. The opening may be positioned at any location for the ellipsoidal reflector 1104. When the diamond 1102 is excited (e.g., by applying green light to the diamond 1102), then the reflector portion 1106 reflects the red light emitted 1110 from the diamond 1102 towards the concentrator portion 1108.

The concentrator portion 1108 directs the emitted light 1110 toward a second focus of the ellipsoidal reflector 1104. In the implementation shown, a photo detector 1120 is positioned to receive and measure the light from the concentrator portion 1108. In some implementations, the photo detector 1120 is positioned at the second focus to receive the redirected emitted light. In some implementations the photo detector 1120 is coupled and/or sealed to a portion of the ellipsoidal reflector 1104, such as to the concentrator portion 1108. In some implementations, the opening may be adjacent or proximate to the photo detector 1120, such as through the concentrator portion 1108. In other implementations, the opening may be opposite the photo detector 1120, such as through the reflector portion 1106. In still further configurations, the opening may be at any other angle and/or orientation relative to the photo detector 1120.

In some implementations, an optical filter, such as a red filter, may be applied to and/or positioned on the photo detector 1120 to filter out light except the relevant red light of interest. Thus, the ellipsoidal reflector 1104 is concatenated with a non-focusing concentrator that can capture the emitted light from a light source (e.g., from the nitrogen vacancies of the diamond of a DNV sensor) to a single photo detector. In some instances, the loss of emitted light can be limited to the light loss due to the mount for the diamond and/or the small entrance for the green stimulation laser beam.

The foregoing solution provides high light collection efficiency to collect the light emitted from the diamond 1102, while utilizing a reflector 1104 that may not require high precision refinements. Such a reflector 1104 may be a low cost solution to increase the light collection efficiency, such as using a reflective mirror component. In addition, the shape of the ellipsoidal reflector 1104 may separate the electronics of the photo detector 1120 from the diamond 1102, which may decrease the magnetic interaction between the electronics of the photo detector 1120 and the diamond 1102.

The elliptical reflector 1104 may, in some implementations, include a substrate with a dielectric mirror film or coating applied to reflect the emitted light 1110. The dielectric mirror film may be selected for the specific frequency of interest. In some implementations, the thickness of the dielectric mirror material may affect the specific frequency of interest. For instance, the substrate may possess a high clarity at a frequency of interest for the DNV sensor. The substrate may be made of a plastic, glass, diamond, quartz, and/or any other suitable material. The dielectric mirror film may be applied to the substrate such that the light emitted 1110 from the diamond 1102 is reflected within the ellipsoidal reflector 1104. In some implementations, the dielectric mirror film may only reflect red light such that other colors or wavelengths of light pass through the ellipsoidal reflector 1104. For instance, such a dielectric mirror film may permit transmission of green wavelength light, such as from an excitation laser beam, through the ellipsoidal reflector 1104 to the diamond 1102 to excite the diamond 1102.

In some aspects, such as for precision sensors, the separation between the diamond 1102 and the electronics of the photo detector 1120 can be extended, for example to several feet. In some implementations, the thin dielectric mirror film is used in the ellipsoidal reflector 1104 to allow an RF antenna to be located inside the ellipsoidal reflector 1104. In some applications, the antenna may instead be outside of the ellipsoidal reflector 1104.

Figure 12:
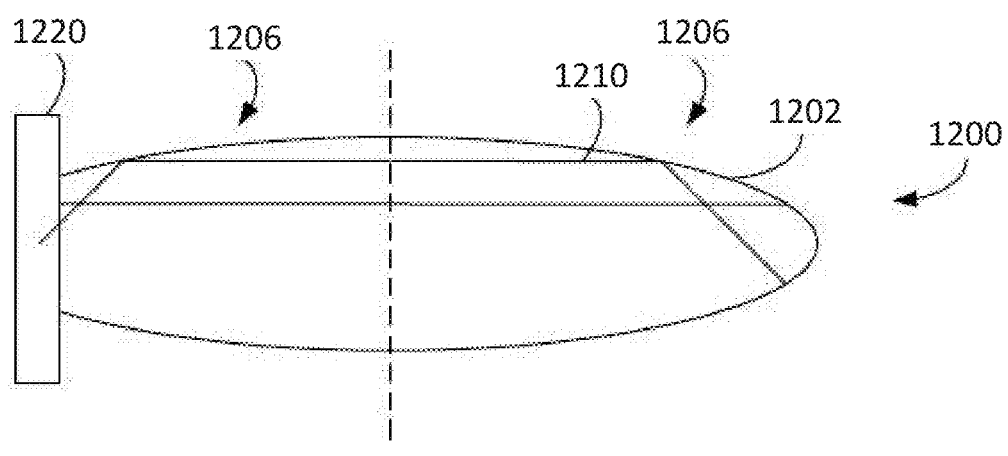
FIG. 12 is a side view of an ellipsoidal diamond having nitrogen vacancies and a photo detector.

FIG. 12 depicts an assembly 1200 with an example diamond 1202 having nitrogen vacancies that is formed or machined into a reflector configuration for a DNV light-collection apparatus. The diamond 1202 in the present configuration is formed or machined into an ellipsoidal reflector and is a monolithic component that can be considered to be divided into two portions, such as a reflector portion 1204 and a concentrator portion 1206.

The diamond 1202 may have a dielectric mirror film coated on or applied to the diamond 1202. The dielectric mirror film may be selected for the specific frequency of interest. In some implementations, the thickness of the dielectric mirror material may affect the specific frequency of interest. The dielectric mirror film may be applied such that the light emitted 1210 from the nitrogen vacancies within the diamond 1202 is reflected within the reflector portion 1204 and concentrator portion 1206 of the diamond 1202. In some implementations, the dielectric mirror film may only reflect red light such that other colors or wavelengths of light pass through the diamond 1202. For instance, such a dielectric mirror film may permit transmission of green wavelength light, such as from an excitation laser beam, through the dielectric mirror film to the nitrogen vacancies of the diamond 1202 to excite the nitrogen vacancies of the diamond 1202.

The reflector portion 1204 of the diamond 1202 may internally reflect the emitted light 1210 via the dielectric mirror film applied to the diamond 1202. Thus, the diamond 1202 internally reflects the red light emitted 1210 from the diamond 1202 towards the concentrator portion 1206. The concentrator portion 1206 also redirects the light emitted 1210 by the nitrogen vacancies of the diamond 1202 toward a focus of the concentrator portion 1206 of the diamond 1202. In the implementation shown, a photo detector 1220 is positioned to receive and measure the light from the concentrator portion 1206. In some implementations, the photo detector 1220 is positioned at the focus to receive the redirected emitted light 1210. In some implementations the photo detector 1220 is coupled and/or sealed to a portion of the diamond 1202, such as to the concentrator portion 1206.

In some implementations, an optical filter, such as a red filter, may be applied to and/or positioned on the photo detector 1220 to filter out light except the relevant red light of interest.

In some implementations, a portion of the diamond 1202 may be formed without nitrogen vacancies. That is, for instance, one or more layers for the diamond may be formed by chemical deposition without nitrogen vacancies. The one or more layers may be machined or formed for the concentrator portion such that the emitted light reflected by the reflector portion 1204 is not reabsorbed by nitrogen vacancies when travelling through the concentrator portion 1206 of the diamond 1202.

Figure 13:
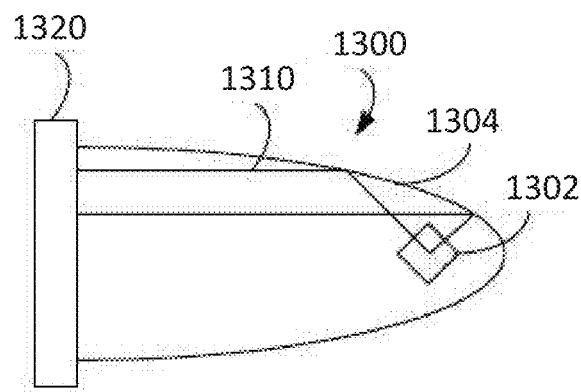
FIG. 13 is a side view of a parabolic reflector with a diamond having nitrogen vacancies and a photo detector.

FIG. 13 depicts an assembly 1300 with an example diamond 1302 having nitrogen vacancies and a parabolic reflector 1304 positioned about the diamond 1302 for a DNV light-collection apparatus. In some implementations, the parabolic reflector 1304 can be a single monolithic component. In some configurations, the parabolic reflector 1304 may be composed of more than two components and can be coupled or otherwise positioned to form the parabolic reflector 1304.

The diamond 1302 is positioned at a focus of the parabolic reflector 1304. In some implementations, the diamond 1302 is positioned at the focus using a mount for the diamond 1302. In other implementations, the diamond 1302 is positioned at the focus using a borehole through the parabolic reflector 1304. The borehole may be backfilled to seal the diamond 1302 in the parabolic reflector 1304.

The parabolic reflector 1304 may also include an opening to allow an excitation laser beam to excite the diamond 1302, such as a green excitation laser beam. The opening may be positioned at any location for the parabolic reflector 1304. When the diamond 1302 is excited (e.g., by applying green light to the diamond 1302), then the parabolic reflector 1304 reflects the red light emitted 1310 from the diamond 1302 towards a photo detector 1320. In the implementation shown, a photo detector 1320 is positioned to receive and measure the light from the parabolic reflector 1304. In some implementations the photo detector 1320 is coupled and/or sealed to a portion of the parabolic reflector 1304. In some implementations, the opening may be adjacent or proximate to the photo detector 1320. In other implementations, the opening may be opposite the photo detector 1320. In still further configurations, the opening may be at any other angle and/or orientation relative to the photo detector 1320.

In some implementations, an optical filter, such as a red filter, may be applied to and/or positioned on the photo detector 1320 to filter out light except the relevant red light of interest. Thus, the parabolic reflector 1304 is concatenated with a non-focusing concentrator that can capture the emitted light from a light source (e.g., from the nitrogen vacancies of the diamond of a DNV sensor) to a single photo detector. In some instances, the loss of emitted light can be limited to the light loss due to the mount for the diamond and/or the small entrance for the green stimulation laser beam.

The foregoing solution provides high light collection efficiency to collect the light emitted from the diamond 1302, while utilizing a parabolic reflector 1304 that may not require high precision refinements. Such a parabolic reflector 1304 may be a low cost solution to increase the light collection efficiency, such as using a reflective mirror component. In addition, the shape of the parabolic reflector 1304 may separate the electronics of the photo detector 1320 from the diamond 1302, which may decrease the magnetic interaction between the electronics of the photo detector 1320 and the diamond 1302.

The parabolic reflector 1304 may, in some implementations, include a substrate with a dielectric mirror film or coating applied to reflect the emitted light 1310. The dielectric mirror film may be selected for the specific frequency of interest. In some implementations, the thickness of the dielectric mirror material may affect the specific frequency of interest. For instance, the substrate may possess a high clarity at a frequency of interest for the DNV sensor. The substrate may be made of a plastic, glass, diamond, quartz, and/or any other suitable material. The dielectric mirror film may be applied to the substrate such that the light emitted 1310 from the diamond 1302 is reflected within the parabolic reflector 1304. In some implementations, the dielectric mirror film may only reflect red light such that other colors or wavelengths of light pass through the parabolic reflector 1304. For instance, such a dielectric mirror film may permit transmission of green wavelength light, such as from an excitation laser beam, through the parabolic reflector 1304 to the diamond 1302 to excite the diamond 1302.

In some aspects, such as for precision sensors, the separation between the diamond 1302 and the electronics of the photo detector 1320 can be extended, for example to several feet. In some implementations, the thin dielectric mirror film is used in the parabolic reflector 1304 to allow an RF antenna to be located inside the parabolic reflector 1304. In some applications, the antenna may instead be outside of the parabolic reflector 1304.

Figure 14:
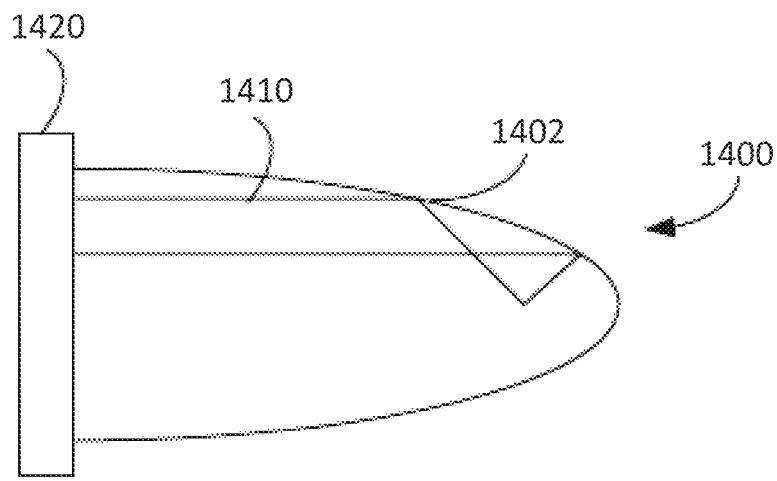
FIG. 14 is a side view of a parabolic diamond having nitrogen vacancies and a photo detector.

FIG. 14 depicts an assembly 1400 with an example diamond 1402 having nitrogen vacancies that is formed or machined into a reflector configuration for a DNV light-collection apparatus. The diamond 1402 in the present configuration is formed or machined into a parabolic reflector and is a monolithic component.

The diamond 1402 may have a dielectric mirror film coated on or applied to the diamond 1402. The dielectric mirror film may be selected for the specific frequency of interest. In some implementations, the thickness of the dielectric mirror material may affect the specific frequency of interest. The dielectric mirror film may be applied such that the light emitted 1410 from the nitrogen vacancies within the diamond 1402 is reflected within the diamond 1402. In some implementations, the dielectric mirror film may only reflect red light such that other colors or wavelengths of light pass through the diamond 1402. For instance, such a dielectric mirror film may permit transmission of green wavelength light, such as from an excitation laser beam, through the dielectric mirror film to the nitrogen vacancies of the diamond 1402 to excite the nitrogen vacancies of the diamond 1402.

The parabolic reflector configuration for the diamond 1402 may internally reflect the emitted light 1410 via the dielectric mirror film applied to the diamond 1402. Thus, the diamond 1402 internally reflects the red light emitted 1410 from the diamond 1402 a photo detector 1420 that is positioned to receive and measure the light emitted. In some implementations the photo detector 1420 is coupled and/or sealed to a portion of the diamond 1402.

In some implementations, an optical filter, such as a red filter, may be applied to and/or positioned on the photo detector 1420 to filter out light except the relevant red light of interest.

In some implementations, a portion of the diamond 1402 may be formed without nitrogen vacancies. That is, for instance, one or more layers for the diamond may be formed by chemical deposition without nitrogen vacancies. The one or more layers may be machined or formed near the junction for the photo detector 1420 such that the emitted light reflected by the parabolic reflector configuration of the diamond 1402 is not reabsorbed by nitrogen vacancies when travelling through the one or more layers of the diamond 1402.

Figure 15:
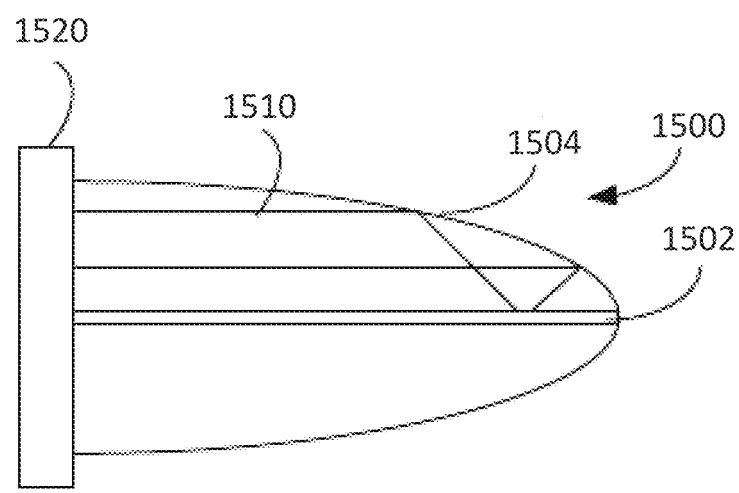
FIG. 15 is a side view of a parabolic reflector with a flat diamond having nitrogen vacancies inserted parallel to a major axis of the parabolic reflector and a photo detector.

FIG. 15 depicts another implementation of a parabolic reflector configuration for an assembly 1500 for a DNV sensor. An example thin diamond 1502 having nitrogen vacancies may be inserted into a portion of a parabolic reflector 1504 positioned about the diamond 1502 for a DNV light-collection apparatus. In some implementations, the parabolic reflector 1504 can be a single monolithic component that is split into two portions to insert the thin diamond 1502. In some other configurations, the parabolic reflector 1504 may be composed of more than two components and can be coupled or otherwise positioned to form the parabolic reflector 1504. In the implementation shown, the thin diamond 1502 is inserted parallel to (and in some instances along) an axis of symmetry the parabolic reflector 1504. In implementations utilizing an ellipsoidal reflector, the thin diamond 1502 may be inserted parallel to and/or along a major axis of the ellipsoidal reflector.

The parabolic reflector 1504 may also include an opening to allow an excitation laser beam to excite the diamond 1502, such as a green excitation laser beam. The opening may be positioned at any location for the parabolic reflector 1504. When the diamond 1502 is excited (e.g., by applying green light to the diamond 1502), then the parabolic reflector 1504 reflects the red light emitted 1510 from the diamond 1502 towards a photo detector 1520. In the implementation shown, a photo detector 1520 is positioned to receive and measure the light from the parabolic reflector 1504. In some implementations the photo detector 1520 is coupled and/or sealed to a portion of the parabolic reflector 1504. In some implementations, the opening may be adjacent or proximate to the photo detector 1520. In other implementations, the opening may be opposite the photo detector 1520. In still further configurations, the opening may be at any other angle and/or orientation relative to the photo detector 1520.

In some implementations, an optical filter, such as a red filter, may be applied to and/or positioned on the photo detector 1520 to filter out light except the relevant red light of interest. Thus, the parabolic reflector 1504 is concatenated with a non-focusing concentrator that can capture the emitted light from a light source (e.g., from the nitrogen vacancies of the diamond of a DNV sensor) to a single photo detector. In some instances, the loss of emitted light can be limited to the light loss due to the mount for the diamond and/or the small entrance for the green stimulation laser beam.

The foregoing solution provides high light collection efficiency to collect the light emitted from the diamond 1502, while utilizing a parabolic reflector 1504 that may not require high precision refinements. Such a parabolic reflector 1504 may be a low cost solution to increase the light collection efficiency, such as using a reflective mirror component. In addition, the shape of the parabolic reflector 1504 may separate the electronics of the photo detector 1520 from the diamond 1502, which may decrease the magnetic interaction between the electronics of the photo detector 1520 and the diamond 1502.

The parabolic reflector 1504 may, in some implementations, include a substrate with a dielectric mirror film or coating applied to reflect the emitted light 1510. The dielectric mirror film may be selected for the specific frequency of interest. In some implementations, the thickness of the dielectric mirror material may affect the specific frequency of interest. For instance, the substrate may possess a high clarity at a frequency of interest for the DNV sensor. The substrate may be made of a plastic, glass, diamond, quartz, and/or any other suitable material. The dielectric mirror film may be applied to the substrate such that the light emitted 1510 from the diamond 1502 is reflected within the parabolic reflector 1504. In some implementations, the dielectric mirror film may only reflect red light such that other colors or wavelengths of light pass through the parabolic reflector 1504. For instance, such a dielectric mirror film may permit transmission of green wavelength light, such as from an excitation laser beam, through the parabolic reflector 1504 to the diamond 1502 to excite the diamond 1502.

In some aspects, such as for precision sensors, the separation between the diamond 1502 and the electronics of the photo detector 1520 can be extended, for example to several feet. In some implementations, the thin dielectric mirror film is used in the parabolic reflector 1504 to allow an RF antenna to be located inside the parabolic reflector 1504. In some applications, the antenna may instead be outside of the parabolic reflector 1504.

Figure 16:
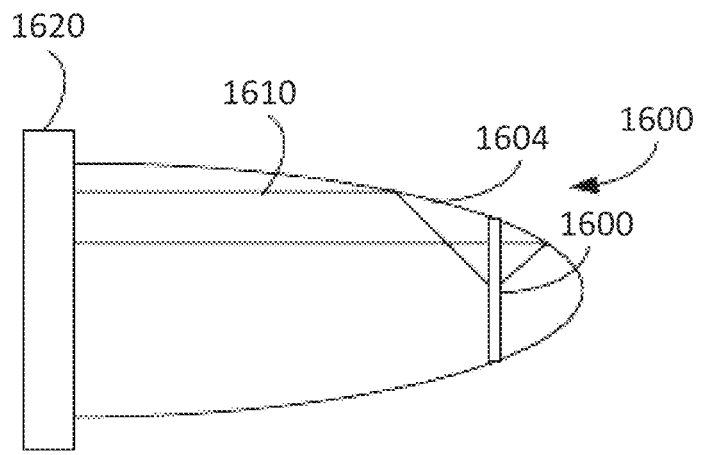
FIG. 16 is a side view of a parabolic reflector with a flat diamond having nitrogen vacancies inserted parallel to a minor axis of the parabolic reflector and a photo detector.

FIG. 16 depicts another implementation of a parabolic reflector configuration for an assembly 1600 for a DNV sensor. An example thin diamond 1602 having nitrogen vacancies may be inserted into a portion of a parabolic reflector 1604 positioned about the diamond 1602 for a DNV light-collection apparatus. In some implementations, the parabolic reflector 1604 can be a single monolithic component that is split into two portions to insert the thin diamond 1602. In some other configurations, the parabolic reflector 1604 may be composed of more than two components and can be coupled or otherwise positioned to form the parabolic reflector 1604. In the implementation shown, the thin diamond 1602 is inserted perpendicular to an axis of symmetry the parabolic reflector 1604. In implementations utilizing an ellipsoidal reflector, the thin diamond 1602 may be inserted parallel to and/or along a minor axis of the ellipsoidal reflector. In some implementations, the thin diamond 1602 is positioned at a focus of the parabolic reflector 1604.

The parabolic reflector 1604 may also include an opening to allow an excitation laser beam to excite the diamond 1602, such as a green excitation laser beam. The opening may be positioned at any location for the parabolic reflector 1604. When the diamond 1602 is excited (e.g., by applying green light to the diamond 1602), then the parabolic reflector 1604 reflects the red light emitted 1610 from the diamond 1602 towards a photo detector 1620. In the implementation shown, a photo detector 1620 is positioned to receive and measure the light from the parabolic reflector 1604. In some implementations the photo detector 1620 is coupled and/or sealed to a portion of the parabolic reflector 1604. In some implementations, the opening may be adjacent or proximate to the photo detector 1620. In other implementations, the opening may be opposite the photo detector 1620. In still further configurations, the opening may be at any other angle and/or orientation relative to the photo detector 1620.

In some implementations, an optical filter, such as a red filter, may be applied to and/or positioned on the photo detector 1620 to filter out light except the relevant red light of interest. Thus, the parabolic reflector 1604 is concatenated with a non-focusing concentrator that can capture the emitted light from a light source (e.g., from the nitrogen vacancies of the diamond of a DNV sensor) to a single photo detector. In some instances, the loss of emitted light can be limited to the light loss due to the mount for the diamond and/or the small entrance for the green stimulation laser beam.

The foregoing solution provides high light collection efficiency to collect the light emitted from the diamond 1602, while utilizing a parabolic reflector 1604 that may not require high precision refinements. Such a parabolic reflector 1604 may be a low cost solution to increase the light collection efficiency, such as using a reflective mirror component. In addition, the shape of the parabolic reflector 1604 may separate the electronics of the photo detector 1620 from the diamond 1602, which may decrease the magnetic interaction between the electronics of the photo detector 1620 and the diamond 1602.

The parabolic reflector 1604 may, in some implementations, include a substrate with a dielectric mirror film or coating applied to reflect the emitted light 1610. The dielectric mirror film may be selected for the specific frequency of interest. In some implementations, the thickness of the dielectric mirror material may affect the specific frequency of interest. For instance, the substrate may possess a high clarity at a frequency of interest for the DNV sensor. The substrate may be made of a plastic, glass, diamond, quartz, and/or any other suitable material. The dielectric mirror film may be applied to the substrate such that the light emitted 1610 from the diamond 1602 is reflected within the parabolic reflector 1604. In some implementations, the dielectric mirror film may only reflect red light such that other colors or wavelengths of light pass through the parabolic reflector 1604. For instance, such a dielectric mirror film may permit transmission of green wavelength light, such as from an excitation laser beam, through the parabolic reflector 1604 to the diamond 1602 to excite the diamond 1602.

In some aspects, such as for precision sensors, the separation between the diamond 1602 and the electronics of the photo detector 1620 can be extended, for example to several feet. In some implementations, the thin dielectric mirror film is used in the parabolic reflector 1604 to allow an RF antenna to be located inside the parabolic reflector 1604. In some applications, the antenna may instead be outside of the parabolic reflector 1604.

Figure 17:
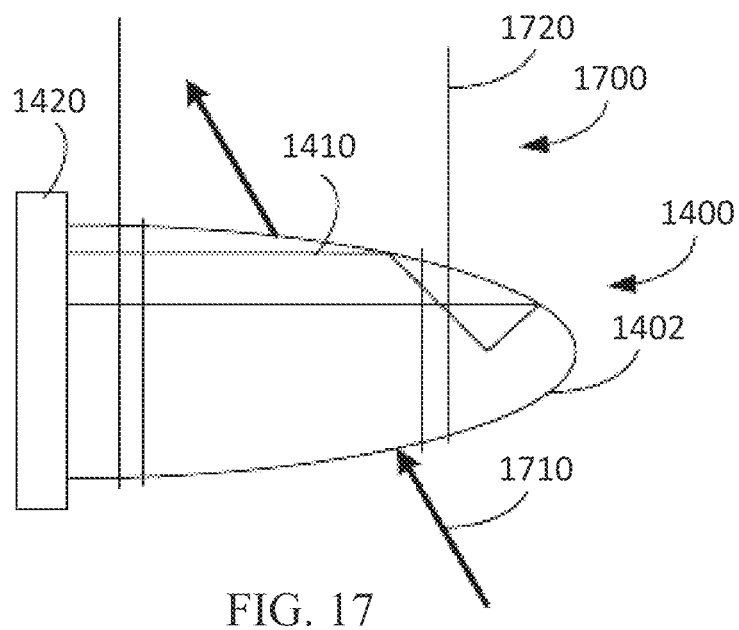
FIG. 17 is a side view of a sensor assembly with a parabolic diamond having nitrogen vacancies and a photo detector.

FIG. 17 depicts an assembly 1700 for a DNV sensor that incorporates the assembly 1400 of FIG. 15 where the diamond 1402 is formed or machined into a parabolic configuration. The assembly 1700 includes the photo detector 1420 coupled to and/or positioned to receive the emitted light 1410 from the diamond 1402. The diamond 1402 includes the dielectric mirror film applied to the diamond 1402 to reflect the emitted red light 1410 within the diamond 1402. In some implementations, the dielectric mirror film may only reflect red light such that other colors or wavelengths of light pass through the diamond 1402. For instance, such a dielectric mirror film may permit transmission of green wavelength light 1710, such as from an excitation laser beam, through the dielectric mirror film to the nitrogen vacancies of the diamond 1402 to excite the nitrogen vacancies of the diamond 1402. The assembly 1700 includes microwave coils about the diamond 1402 such that, if the diamond 1402 is irradiated with microwaves at a certain frequency, then the diamond will cease and/or reduce the emission of red light. A microwave off is performed for the DNV sensor prior to illumination of the diamond 1402 to emit the red light 1410. When the microwave frequency is moved to a different frequency, then the red light emitted is dimmed and the frequency is related to the strength of the magnetic field the DNV sensor is within.

In some implementations, the green light 1710 from the green laser may be applied through a fiber, rather than the free air, to the diamond 1402. In some implementations, the entire apparatus of FIG. 17 may be as compact as ~2 mm. The assembly of the subject technology may be used in a number of applications, for example, in all areas of magnetometry, where DNV magnetometers are employed.

Figure 18:
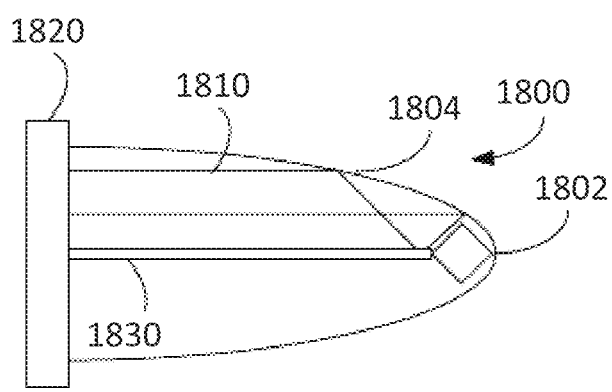
FIG. 18 is a side view of a sensor assembly with a waveguide provided within a parabolic reflector.

FIG. 18 depicts another implementation of a reflector configuration for an assembly 1800 for a DNV sensor that includes a waveguide 1830 positioned within the reflector to direct light to a diamond 1802 having nitrogen vacancies. An example diamond 1802 having nitrogen vacancies may be inserted into a portion of a reflector 1804 positioned about the diamond 1802 for a DNV light-collection apparatus. In some implementations, the reflector 1804 may be a parabolic reflector or an ellipsoidal reflector. The reflector 1804 can be a single monolithic component or can be a shell component with a fill, such as plastic or fiber optic material, or without a fill (e.g., empty). In the implementation shown, a waveguide 1830 is formed or inserted along an axis of symmetry of the parabolic reflector 1804. In other implementations, the waveguide 1830 is formed or inserted along a major axis of an ellipsoidal reflector 1804. The waveguide 1830 may be a fiber optic component and/or may simply be a material having a differing refractive index than the reflector 1804 and/or the fill within the reflector 1804.

The diamond 1802 is positioned at an end of the waveguide 1830 such that an excitation beam, such as green laser light, can be transmitted via the waveguide 1830 to the diamond 1802. When the diamond 1802 is excited (e.g., by applying green light to the diamond 1802), then the reflector 1804 reflects the red light emitted 1810 from the diamond 1802 towards a photo detector 1820. In the implementation shown, a photo detector 1820 is positioned to receive and measure the light from the reflector 1804. In some implementations the photo detector 1820 is coupled and/or sealed to a portion of the reflector 1804. In some implementations, an opening for transmitting the excitation beam is through the photo detector 1820 such that the excitation beam can be transmitted via the waveguide 1830 to the diamond 1802. In other implementations, an emitter to emit light to excite the nitrogen vacancy of the diamond 1802, such as the excitation beam, may be provided at a first end of the waveguide 1830 with the diamond 1802 at a second end of the waveguide 1830. In some implementations, the emitter may be formed and/or positioned within or at a center of the photo detector 1820 to generate and transmit the excitation beam along the waveguide 1830 to the diamond 1802. The photo detector 1820 and emitter may be positioned on a single substrate. Thus, a single chip can include both the photo detector 1820 and the emitter for the excitation beam such that both the illumination and collection can be provided on the single chip.

In some implementations, an optical filter, such as a red filter, may be applied to and/or positioned on the photo detector 1820 to filter out light except the relevant red light of interest. Thus, the reflector 1804 is concatenated with a non-focusing concentrator that can capture the emitted light from a light source (e.g., from the nitrogen vacancies of the diamond of a DNV sensor) to a single photo detector. In some instances, the loss of emitted light can be limited to the light loss due to the mount for the diamond and/or any emitted light that travels back down the waveguide 1830.

The foregoing solution provides high light collection efficiency to collect the light emitted from the diamond 1802, while utilizing a reflector 1804 that may not require high precision refinements. Such a reflector 1804 may be a low cost solution to increase the light collection efficiency, such as using a reflective mirror component. In addition, the shape of the parabolic reflector 1804 may separate the electronics of the photo detector 1820 and/or emitter from the diamond 1802, which may decrease the magnetic interaction between the electronics of the photo detector 1820 and/or emitter and the diamond 1802.

The reflector 1804 may, in some implementations, include a substrate with a dielectric mirror film or coating applied to reflect the emitted light 1810. The dielectric mirror film may be selected for the specific frequency of interest. In some implementations, the thickness of the dielectric mirror material may affect the specific frequency of interest. For instance, the substrate may possess a high clarity at a frequency of interest for the DNV sensor. The substrate may be made of a plastic, glass, diamond, quartz, and/or any other suitable material. The dielectric mirror film may be applied to the substrate such that the light emitted 1810 from the diamond 1802 is reflected within the reflector 1804. In some implementations, the dielectric mirror film may only reflect red light such that other colors or wavelengths of light pass through the reflector 1804.

In some aspects, such as for precision sensors, the separation between the diamond 1802 and the electronics of the photo detector 1820 can be extended, for example to several feet. In some implementations, the thin dielectric mirror film is used in the reflector 1804 to allow an RF antenna to be located inside the reflector 1804. In some applications, the antenna may instead be outside of the reflector 1804.

Figure 19:
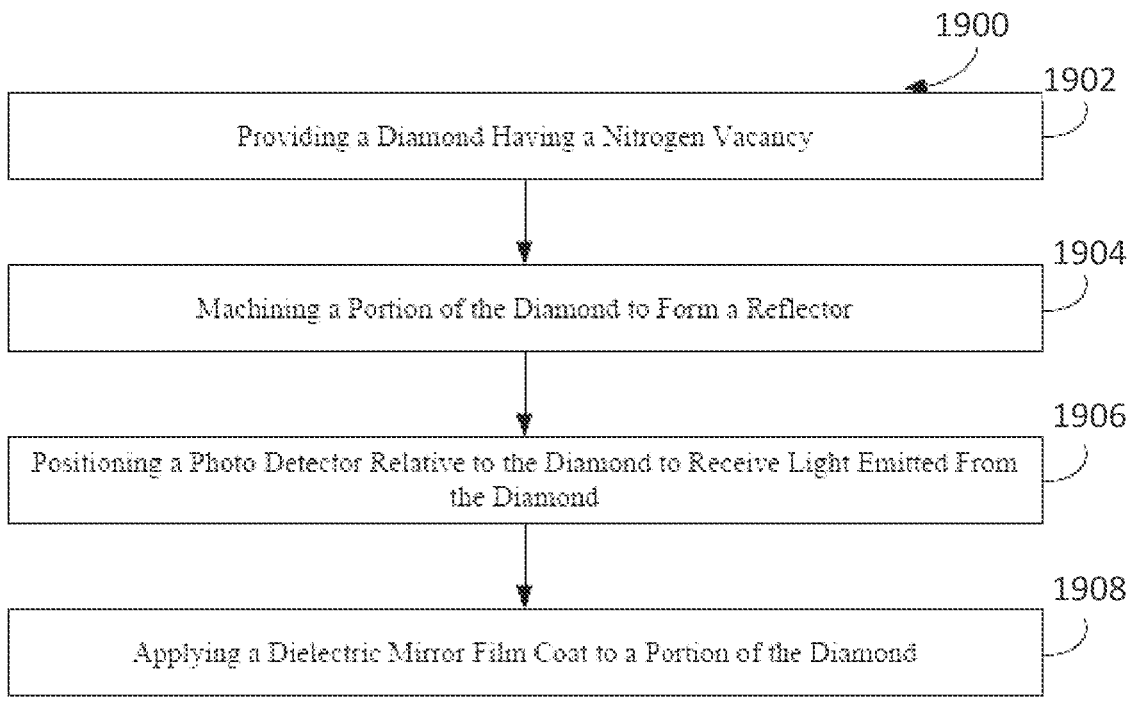
FIG. 19 is a process diagram for a method for constructing a DNV sensor.

FIG. 19 depicts an implementation of a process 1900 to form a DNV sensor. The process 1900 includes providing a diamond having a nitrogen vacancy (block 1902), machining a portion of the diamond to form a reflector (block 1904), positioning a photo detector relative to the diamond to receive light emitted from the diamond (block 1906), and/or applying a dielectric mirror film coat to a portion of the diamond (block 1908). In some implementations, the process 1900 may include simple providing a diamond having a nitrogen vacancy (block 1902) and applying a dielectric mirror film coat to a portion of the diamond (block 1908).

In some implementations, the machining of the diamond to form a reflector (block 1904) may machine a portion of the diamond to form a parabolic shape, an ellipsoidal shape, and/or any other suitable shape. In some implementations, a layer of the diamond may not have nitrogen vacancies.

Figure 20:
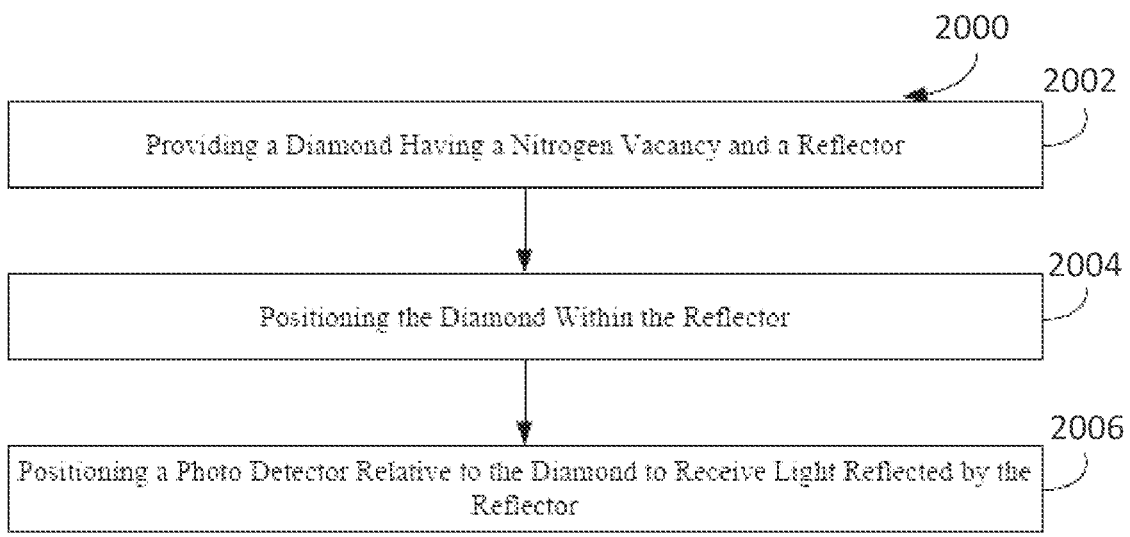
FIG. 20 is another process diagram for a method for constructing a DNV sensor.

FIG. 20 depicts another process 2000 to form a DNV sensor. The process 2000 includes providing a diamond having a nitrogen vacancy and a reflector (block 2002), positioning the diamond within the reflector such that the reflector reflects a portion of the light from the diamond (block 2004), and/or positioning a photo detector relative to the diamond to receive light emitted from the diamond (block 2006).

In some implementations, the reflector is monolithic and the diamond is positioned within a borehole of the monolithic reflector. In some implementations, the borehole may be backfilled. In some implementations, the reflector may be formed from two or more pieces and positioning the diamond within the reflector includes inserting the diamond between the two or more pieces. In some instances, the diamond may be substantially flat, such as in the configuration shown in FIGS. 15-16. The two or more pieces of the reflector may be parabolic in shape. The diamond may be positioned parallel to an axis of symmetry of the parabolic reflector or may be positioned perpendicular to the axis of symmetry. In other implementations, the two or more pieces of the reflector may be ellipsoidal in shape. The diamond may be positioned parallel to a major axis of the ellipsoidal reflector or may be positioned parallel to a minor axis of the ellipsoidal reflector. In some further implementations, positioning the diamond within the reflector may include casting the reflector about the diamond.

Figure 21:
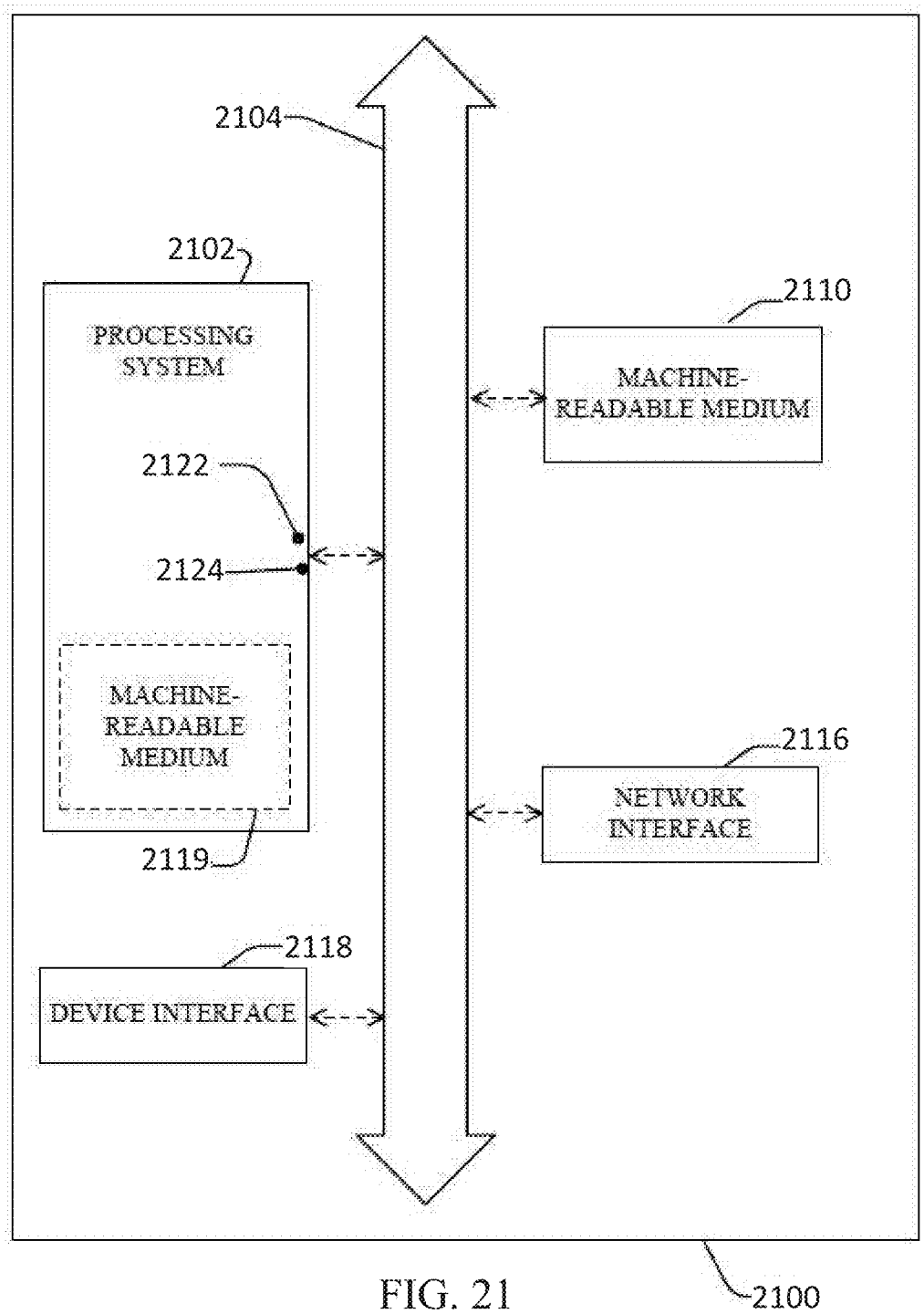
FIG. 21 is a block diagram depicting a general architecture for a computer system that may be employed to implement various elements of the systems and methods described and illustrated herein.

FIG. 21 is a diagram illustrating an example of a system 2100 for implementing some aspects of the subject technology. In some implementations, the system 2100 may be a processing system for processing the data output from a photo detector of the implementations describe in reference to FIGS. 11-19. The system 2100 includes a processing system 2102, which may include one or more processors or one or more processing systems. A processor can be one or more processors. The processing system 2102 may include a general-purpose processor or a specific-purpose processor for executing instructions and may further include a machine-readable medium 2119, such as a volatile or non-volatile memory, for storing data and/or instructions for software programs. The instructions, which may be stored in a machine-readable medium 2110 and/or 2119, may be executed by the processing system 2102 to control and manage access to the various networks, as well as provide other communication and processing functions. The instructions may also include instructions executed by the processing system 2102 for various user interface devices, such as a display 2112 and a keypad 2114. The processing system 2102 may include an input port 2122 and an output port 2124. Each of the input port 2122 and the output port 2124 may include one or more ports. The input port 2122 and the output port 2124 may be the same port (e.g., a bi-directional port) or may be different ports.

The processing system 2102 may be implemented using software, hardware, or a combination of both. By way of example, the processing system 2102 may be implemented with one or more processors. A processor may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable device that can perform calculations or other manipulations of information.

A machine-readable medium can be one or more machine-readable media. Software shall be construed broadly to mean instructions, data, or any combination thereof, whether referred to as software, firmware, middleware, microcode, hardware description language, or otherwise. Instructions may include code (e.g., in source code format, binary code format, executable code format, or any other suitable format of code).

Machine-readable media (e.g., 2119) may include storage integrated into a processing system such as might be the case with an ASIC. Machine-readable media (e.g., 2110) may also include storage external to a processing system, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device. Those skilled in the art will recognize how best to implement the described functionality for the processing system 2102. According to one aspect of the disclosure, a machine-readable medium is a computer-readable medium encoded or stored with instructions and is a computing element, which defines structural and functional interrelationships between the instructions and the rest of the system, which permit the instructions' functionality to be realized. Instructions may be executable, for example, by the processing system 2102 or one or more processors. Instructions can be, for example, a computer program including code for performing methods of the subject technology.

A network interface 2116 may be any type of interface to a network (e.g., an Internet network interface), and may reside between any of the components shown in FIG. 21 and coupled to the processor via the bus 2104.

A device interface 2118 may be any type of interface to a device and may reside between any of the components shown in FIG. 21. A device interface 2118 may, for example, be an interface to an external device (e.g., USB device) that plugs into a port (e.g., USB port) of the system 2100. In some implementations, the device interface 2118 may be an interface to the apparatus of FIGS. 10-18, where some or all of the analysis of the detected red light by the photo detector electronics is handled by the processing system 2102.

The foregoing description is provided to enable a person skilled in the art to practice the various configurations described herein. While the subject technology has been particularly described with reference to the various figures and configurations, it should be understood that these are for illustration purposes only and should not be taken as limiting the scope of the subject technology.

One or more of the above-described features and applications may be implemented as software processes that are specified as a set of instructions recorded on a computer readable storage medium (alternatively referred to as computer-readable media, machine-readable media, or machine-readable storage media). When these instructions are executed by one or more processing unit(s) (e.g., one or more processors, cores of processors, or other processing units), they cause the processing unit(s) to perform the actions indicated in the instructions. In one or more implementations, the computer readable media does not include carrier waves and electronic signals passing wirelessly or over wired connections, or any other ephemeral signals. For example, the computer readable media may be entirely restricted to tangible, physical objects that store information in a form that is readable by a computer. In one or more implementations, the computer readable media is non-transitory computer readable media, computer readable storage media, or non-transitory computer readable storage media.

In one or more implementations, a computer program product (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

While the above discussion primarily refers to microprocessor or multi-core processors that execute software, one or more implementations are performed by one or more integrated circuits, such as application specific integrated circuits (ASICs) or field programmable gate arrays (FPGAs). In one or more implementations, such integrated circuits execute instructions that are stored on the circuit itself.

In one or more implementations, the subject technology is directed to method and systems for an efficient collection of fluorescence (e.g., red light) emitted by the NV centers of a DNV sensor. In some aspects, the subject technology may be used in various markets, including for example and without limitation, advanced sensors and materials and structures.

Precision Position Encoder/Sensor Using Nitrogen Vacancy Diamond

A position sensor system may include a position sensor that includes a magnetic field sensor. The magnetic field sensor may be a DNV magnetic field sensor capable of resolving a magnetic field vector of the type described above. The high sensitivity of the DNV magnetic field sensor combined with an appropriate position encoder component is capable of resolving both a discrete position and a proportionally determined position between discrete positions. The position sensor system has a small size, light weight, and low power requirement.

Figure 22:
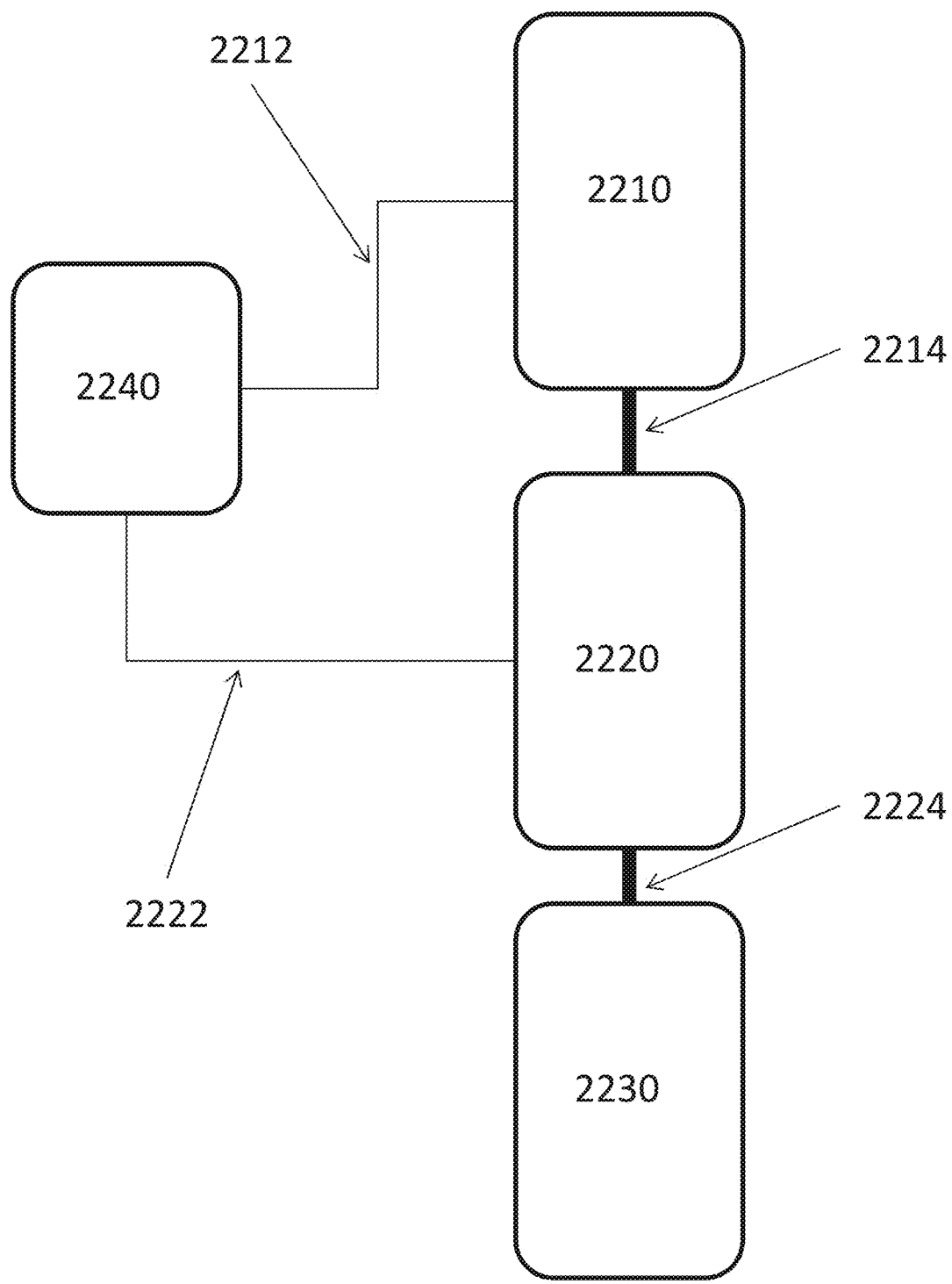
FIG. 22 is a schematic illustrating a position sensor system according to one embodiment.

As shown in FIG. 22, the position sensor 2220 may be part of a system that also includes an actuator 2210 and a sensor component 2230. The actuator 2210 may be connected to the position sensor 2220 by any appropriate attachment means 2214, such as a rod or shaft. The actuator may be any actuator that produces the desired motion, such as an electro-mechanical actuator. The position sensor 2220 may be connected to the sensor component 2230 by any appropriate attachment means 2224, such as a rod or shaft. A controller 2240 may be included in the system and connected to the position sensor 2220 and optionally the actuator 2210 by electronic interconnects 2222 and 2212, respectively. The controller may be configured to receive a measured position from the position sensor 2220 and activate or deactivate the actuator to position the sensor 2230 in a desired position. According to one embodiment the controller may be on the same substrate as the magnetic field sensor of the position sensor. The controller may include a processor and a memory.

Figure 23:
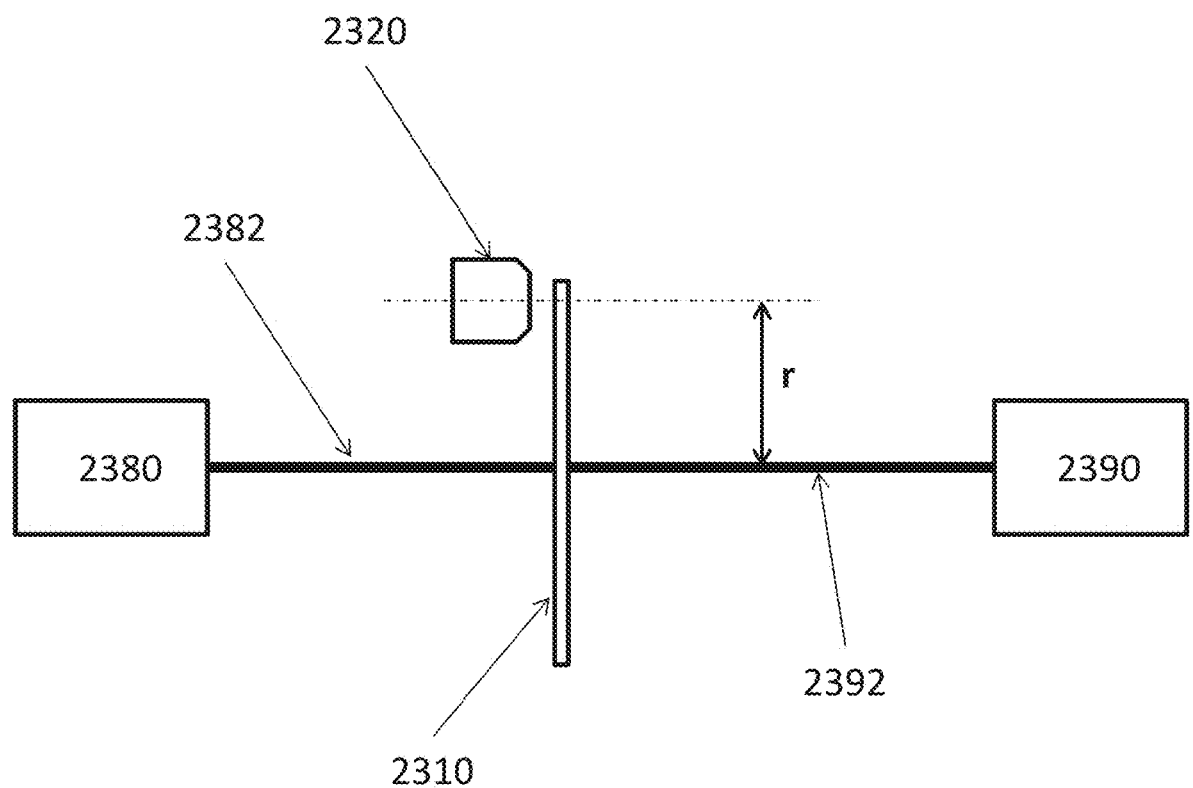
FIG. 23 is a schematic illustrating a position sensor system including a rotary position encoder.
Figure 24:
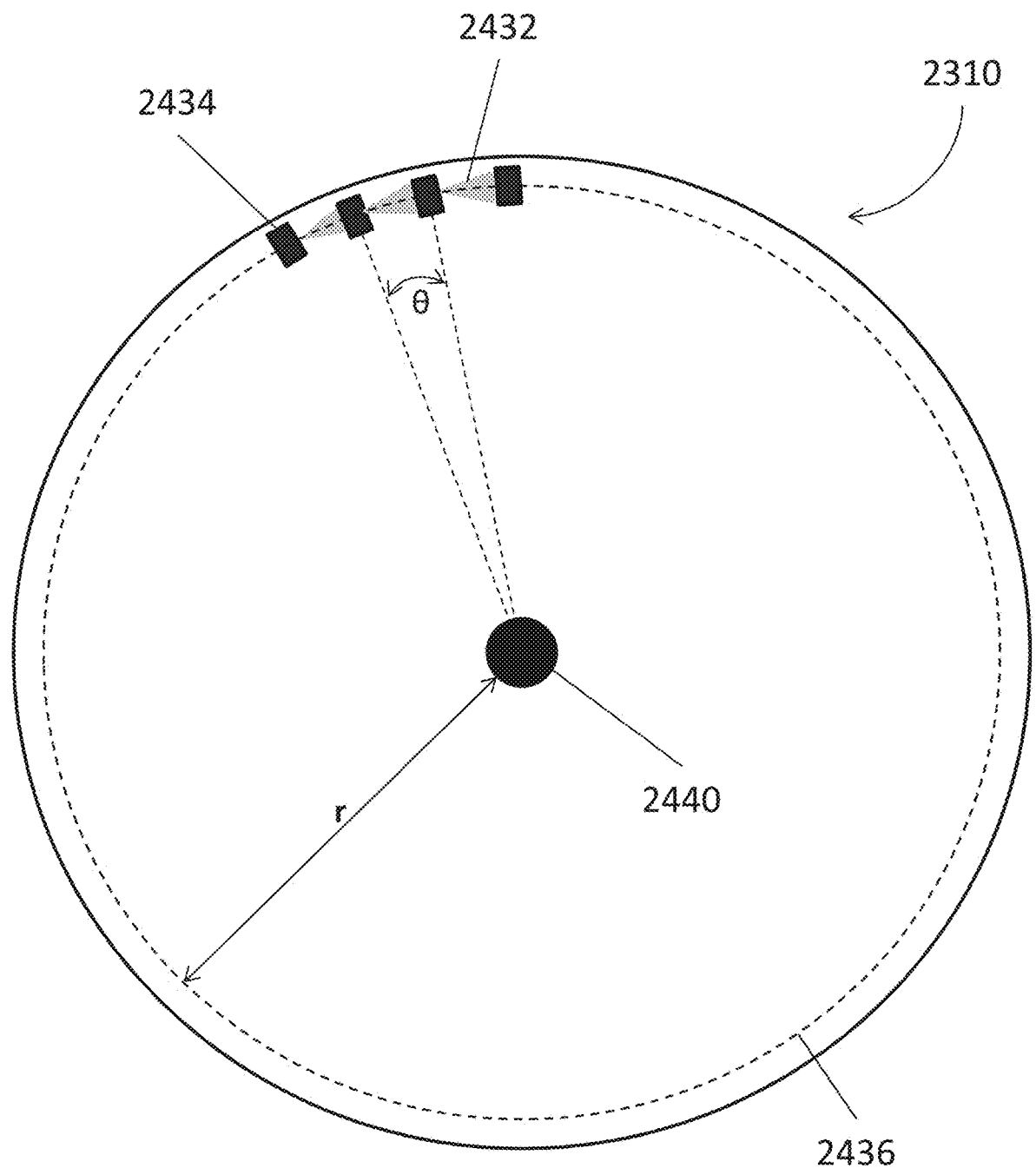
FIG. 24 is a schematic illustrating a top down view of a rotary position encoder.

The position sensor may be a rotary position sensor. FIG. 23 depicts a rotary position sensor system that includes a rotary actuator 2380 that is configured to produce a rotation of a sensor 2390. A rotary position encoder 2310 is connected to the rotary actuator 2380 by a connection means 2382, such as a rod or shaft. A connection means 2392 is also provided between the rotary position encoder 2310 and the sensor 2390. A position sensor head 2320 is located to measure the magnetic field of magnetic elements located on the rotary position encoder 2310. The position sensor head 2320 is aligned with magnetic elements located on the rotary position encoder 2310 at a distance, r, from the center of the rotary position encoder. A surface of the rotary position encoder 2310 that includes magnetic elements is shown in FIG. 24. The center 2440 of the rotary position encoder 2310 may be configured to attach to a connection means 2392, 2394 that connects the rotary position encoder 2310 to the actuator 2320 or the sensor 2390. Magnetic elements, such as uniform coarse magnetic elements 2434 and tapered fine magnetic elements 2432, may be disposed on the surface of the rotary position encoder 2310 along an arc 2436 at a distance, r, from the center of the rotary position encoder. The magnetic elements on the rotary position encoder 2310 may be located on only a portion of the arc, as shown in FIG. 24, or around an entirety of the arc forming a circle of magnetic elements.

The spacing between the magnetic elements on the rotary position encoder 2310 correlates to a discrete angular rotation, θ. The distance between magnetic elements associated with the discrete angular rotation, θ, increases as r increases. The sensitivity of the magnetic field sensors employed in the position sensor allows r to be reduced while maintaining a high degree of precision for the angular position of the rotary position encoder. The rotary position encoder may have an r on the order of mm, such as an r of 1 mm to about 30 mm, or about 5 mm to about 20 mm. The rotary position encoder allows for the measurement of a rotary position with a precision of 0.5 micro-radians.

Figure 25:
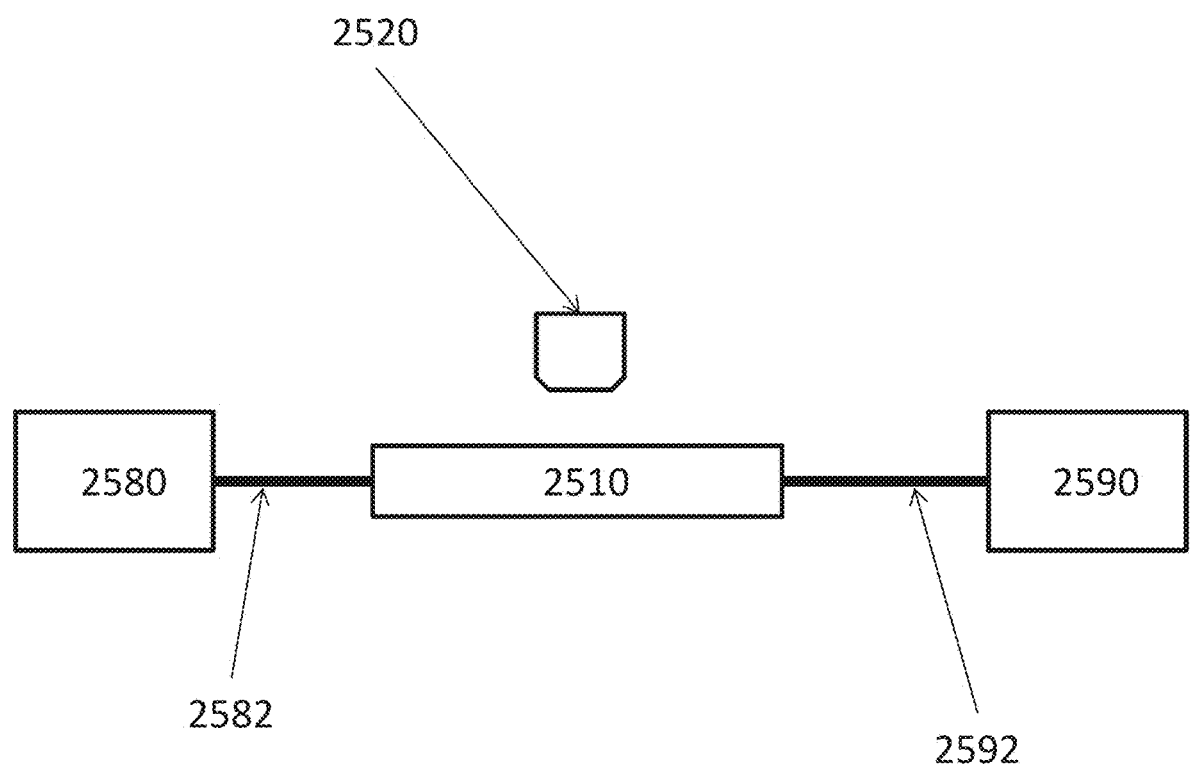
FIG. 25 is a schematic illustrating a position sensor system including a linear position encoder.

The position sensor may be a linear position sensor. As shown in FIG. 25, the linear position sensor system includes a linear actuator 2580 that is configured to produce linear motion of the linear position encoder 2510 and sensor 2590. The linear position encoder 2510 may be connected to the linear actuator by a connecting means 2582, such as a rod or shaft. The linear position encoder 2510 may be connected to the sensor 2590 by a connecting means 2592, such as a rod or shaft. A position sensor head 2520 is located to measure the magnetic field produced by magnetic elements disposed on the linear position encoder. In some cases, a mechanical linkage, such as a lever arm, may be utilized to multiply the change in position of the linear position encoder for an associated movement of the sensor. The linear position sensor may have a sensitivity that allows a change in position on the order of hundreds of nanometers to be resolved, such as a position change of 500 nm.

Figure 26:
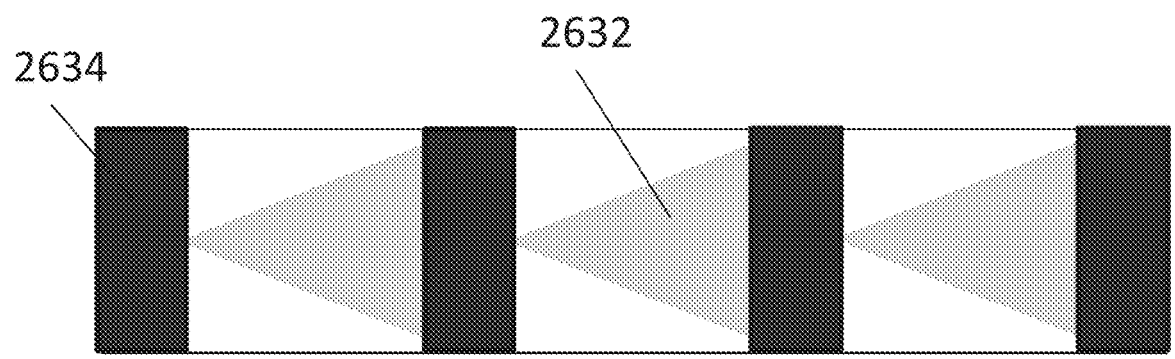
FIG. 26 is a schematic illustrating a magnetic element arrangement of a position encoder according to one embodiment.

The magnetic elements may be arranged on the linear or rotary position encoder in any appropriate configuration. As shown in FIG. 26, the magnetic elements may include both uniform coarse magnetic elements 2634 and tapered fine magnetic elements 2632. The uniform coarse magnetic elements 2634 may have an influence on the local magnetic field that is at least two orders of magnitude greater than the maximum influence of the tapered fine magnetic elements 2634. The coarse magnetic elements 2634 may be formed on the position encoder by any suitable process. According to one embodiment, a polymer loaded with magnetic material may be utilized to form the uniform coarse magnetic elements. The amount of magnetic material that may be included in the coarse magnetic elements is limited by potential interference with other elements in the system.

The tapered fine magnetic elements may be formed by any suitable process on the position encoder. According to one embodiment, a polymer loaded with magnetic material may be utilized to form the tapered fine magnetic elements. The loading of the magnetic material in the polymer may be increased to produce a magnetic field gradient from a first end of the tapered fine magnetic element to a second end of the tapered fine magnetic element. Alternatively, the geometric size of the tapered fine magnetic element may be increased to create the desired magnetic field gradient. A magnetic field gradient of the tapered fine magnetic element may be about 10 nT/mm. The tapered fine magnetic elements 2632 as shown in FIG. 26 allow positions between the coarse magnetic elements 2634 to be accurately resolved. The position encoder on which the magnetic elements are disposed may be formed from any appropriate material, such as a ceramic, glass, polymer, or non-magnetic metal material.

The size of the magnetic elements is limited by manufacturing capabilities. The magnetic elements on the position encoder may have geometric features on the order of nanometers, such as about 5 nm.

Figure 27:
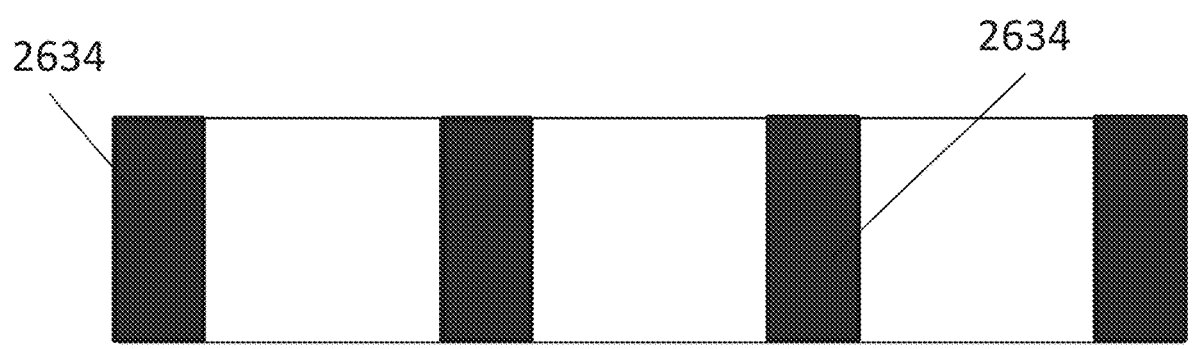
FIG. 27 is a schematic illustrating a magnetic element arrangement of a position encoder according to another embodiment.
Figure 28:
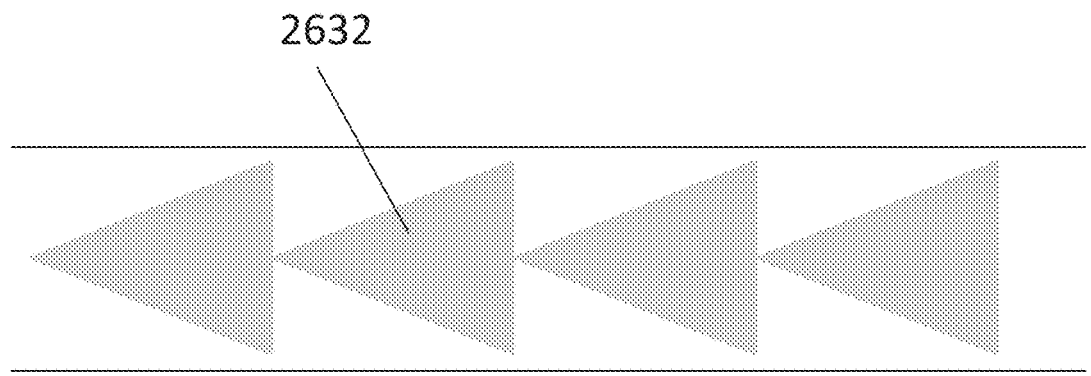
FIG. 28 is a schematic illustrating a magnetic element arrangement of a position encoder according to another embodiment.

FIG. 27 depicts an alternate magnetic element arrangement that may be employed when the additional precision provided by the tapered fine magnetic elements is not required. The magnetic element arrangement of FIG. 27 includes only coarse magnetic elements 2634. FIG. 13 depicts a magnetic element arrangement that does not include coarse magnetic elements. A similar effect to the coarse magnetic elements 2634 may be achieved by utilizing the transitions between the maximum of the tapered fine magnetic elements 2632 and the minimum of the adjacent tapered fine magnetic elements as indicators in much the same way that the coarse magnetic elements shown in FIGS. 26 and 27 indicate a discrete change in position. While FIGS. 26-18 depict the magnetic element arrangements in linear form, similar magnetic element arrangements may be applied to a rotary position encoder.

According to an alternative embodiment, a single tapered magnetic element may be employed. Such an arrangement may be especially suitable for an application where only a small position range is required, as for a larger position range the increase in magnetic field with the increasing gradient of the magnetic element may interfere with other components of the position sensor system. The use of a single tapered magnetic element may allow a position to be determined without first initializing the position sensor by setting the position encoder to a known position. The ability of the magnetic field sensor to resolve a magnetic field vector may allow a single magnetic field sensor to be employed in the position sensor head when a single tapered fine magnetic element is utilized on the position encoder.

Figure 29:
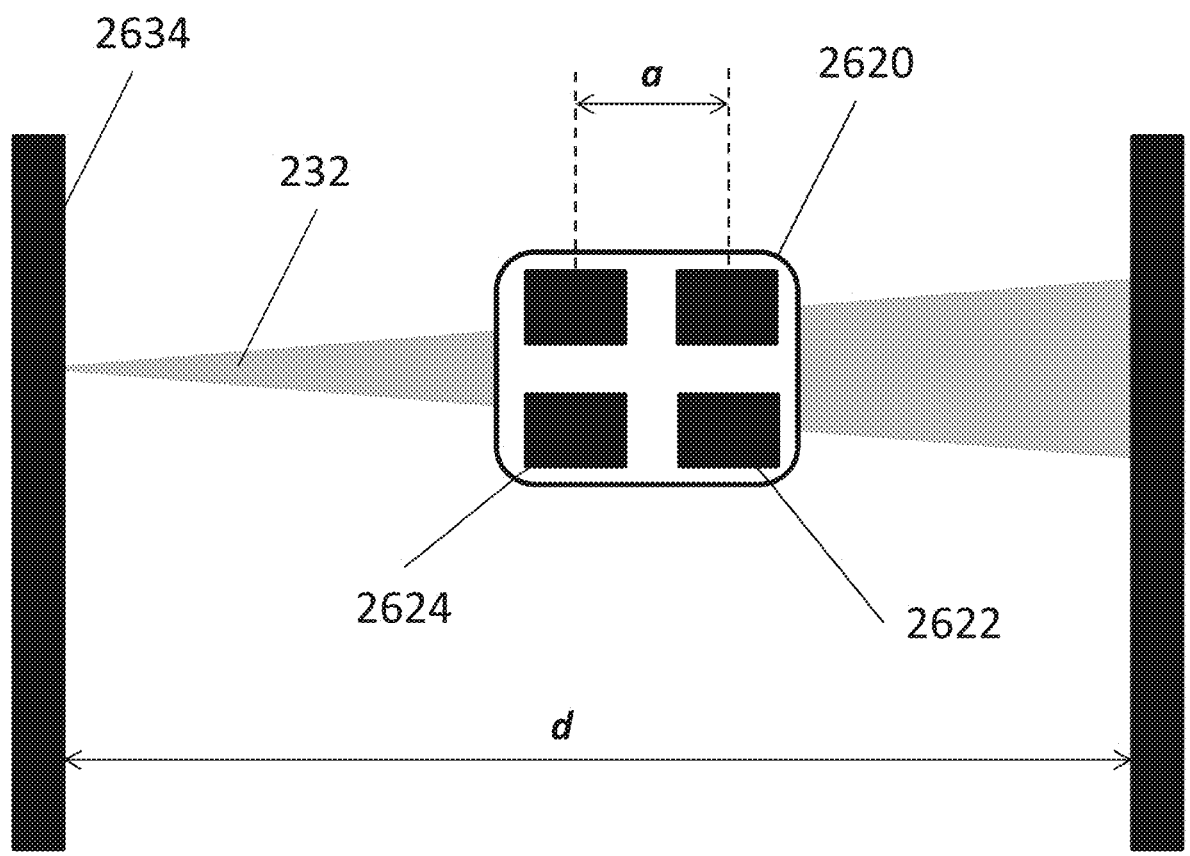
FIG. 29 is a schematic illustrating the relationship of a position sensor head and the magnetic elements of a position encoder.

The position sensor head 2620 may include a plurality of magnetic field sensors, as shown in FIG. 29. For magnetic element arrangements including more than one element, at least two magnetic field sensors 2624 and 2622 may be utilized in the position head sensor. The magnetic field sensors may be separated by a distance, a. The distance, a, between the magnetic sensors 2622 and 2624 may be less than the distance, d, between the coarse magnetic elements 2634. According to one embodiment, the relationship between the spacing of the magnetic field sensors and the spacing of the coarse magnetic elements may be 0.1 d<a<d. As shown in FIG. 29, the position sensor head 2620 may include a third and fourth magnetic field sensor. The magnetic field sensors in the position sensor head may be DNV magnetic field sensors of the type described above.

Figure 30:
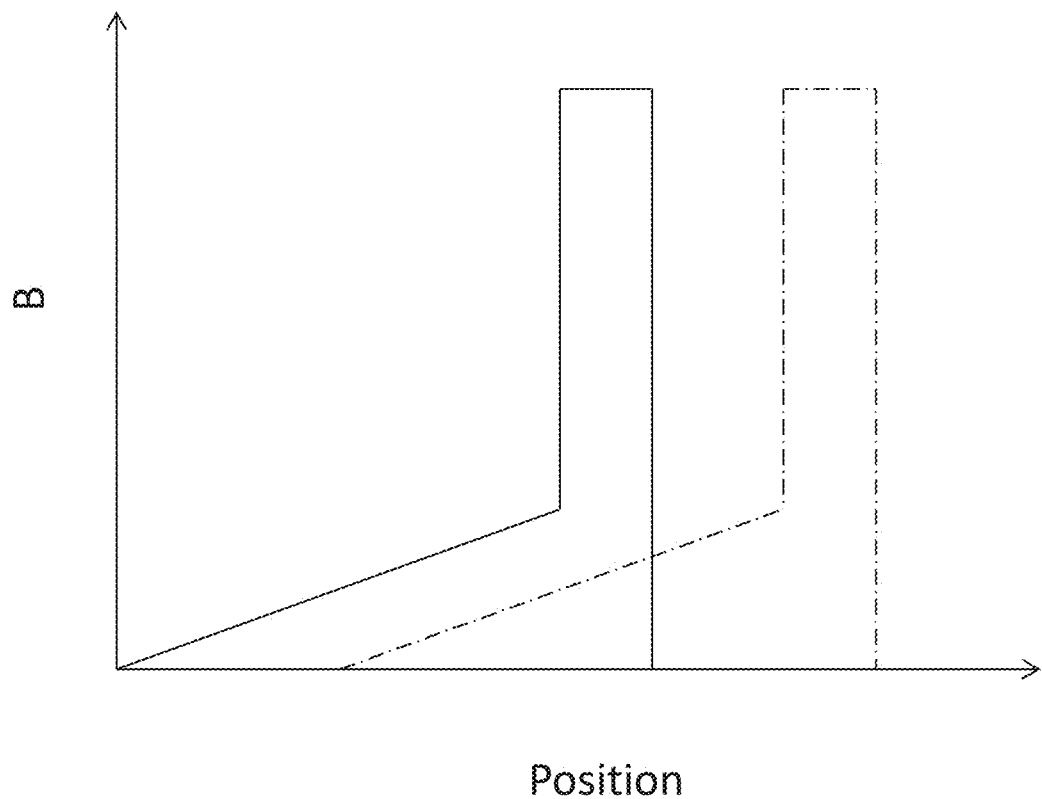
FIG. 30 is a graph of measured magnetic field intensity attributable to magnetic elements of a position encoder for a first magnetic field sensor and a second magnetic field sensor of a position sensor head.

The magnetic field sensor arrangement in the position sensor head 2620 depicted in FIG. 29 allows the direction of movement of the position encoder to be determined. As shown in FIG. 30, the spacing between the magnetic field sensors 2624 and 2622 produces a delayed response to the magnetic field elements as the position encoder moves. The difference in measured magnetic field for each magnetic field sensor allows a direction of the movement of the position encoder to be determined, as for any given position of the position encoder a different output magnetic field will be measured by each magnetic field sensor. The increasing portion of the plots in FIG. 30 is produced by the tapered fine magnetic element and the square peak is produced by the coarse magnetic element. These measured magnetic fields may be utilized to determine the change in position of the position encoder, and thereby the sensor connected to the position encoder.

Figure 31:
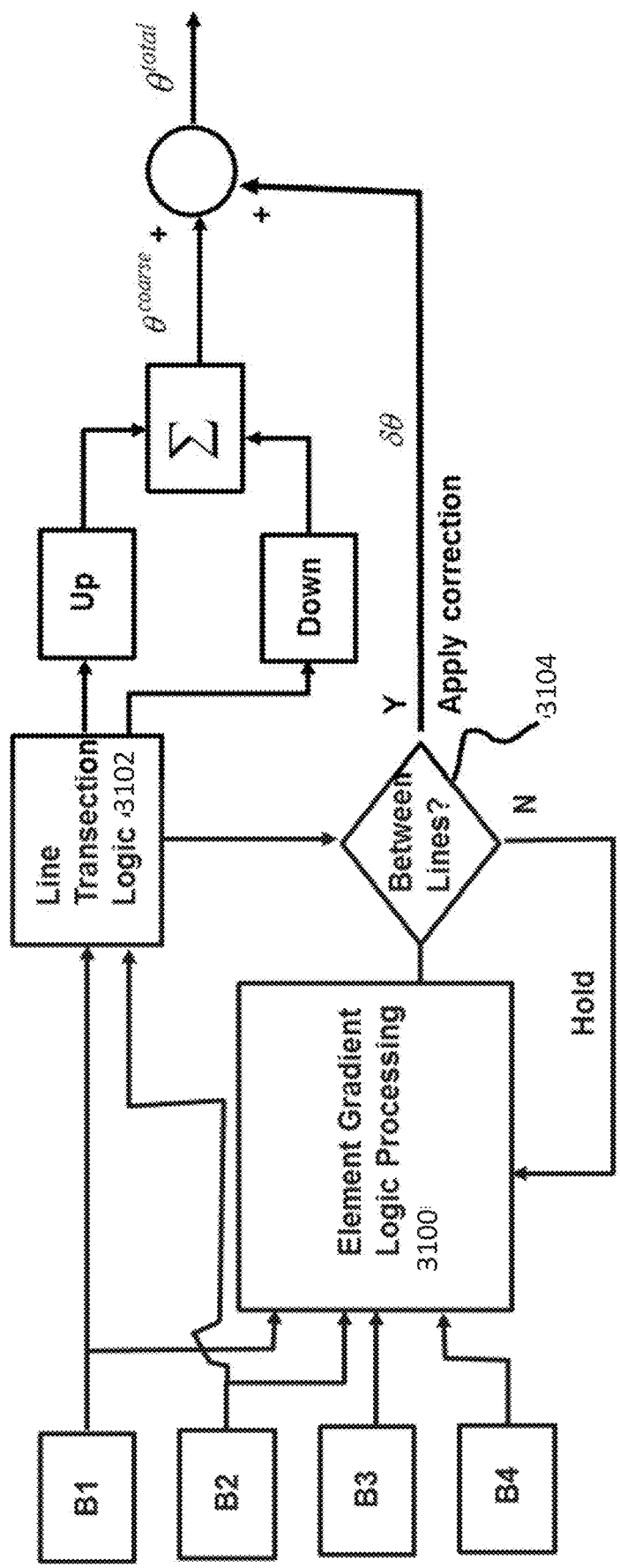
FIG. 31 is a flow chart illustrating the process of determining a position utilizing a position sensor system according to one embodiment.

The controller of the position sensor system may be programmed to determine the position of position encoder, and thereby the sensor connected thereto, utilizing the output from the magnetic field sensors. As shown in FIG. 31, the controller may include a line transection logic 402 function that determines when the coarse magnetic elements have passed the magnetic sensor. The output from two magnetic field sensors B1 and B2 may be utilized to determine the direction of the position change based on the order in which a coarse magnetic element is encountered by the magnetic field sensors, and to count the number of coarse magnetic elements measured by the magnetic field sensors. Each coarse magnetic element adds a known amount of position change due to the known spacing between the coarse magnetic elements on the position encoder. An element gradient logic processing function 400 is programmed in the controller to determine the position between coarse magnetic elements based on the magnetic field signal produced by the tapered fine magnetic elements located between the coarse magnetic elements. As shown in FIG. 31, the element gradient logic processing 400 is utilized only when the line transection logic determines that the position is between coarse magnetic elements, or lines. In the case that the position is determined to be between coarse magnetic elements, a position correction, δθ, is calculated based on the magnetic field associated with the tapered fine magnetic elements. The position correction is then added to the sum of the position change calculated from the number of coarse magnetic elements that were counted. A final position may be calculated by adding the calculated position change to a starting position of the position encoder. The logic processing in the controller may be conducted by analog or digital circuits.

The position sensor may be employed in a method for controlling the position of the position encoder. The method includes determining a movement direction required to reach a desired position, and activating the actuator to produce the desired movement. The position sensor is employed to monitor the change in position of the position encoder, and determine when to deactivate the actuator and stop the change in position. The change in position may be stopped once the desired position is reached. The method may additionally include initializing the position sensor system by moving the position encoder to a known starting point. The end position of the position encoder may be determined after the deactivation of the actuator, and the end position may be stored in a memory of the position sensor controller as a starting position for future movement.

The ability of the position sensor system to resolve positions between the coarse magnetic elements of the position encoder provides many practical benefits. For example, the position of the position encoder, and associated sensor, may be known with more precision while reducing the size, weight and power requirements of the position sensor system. Additionally, position control systems that offer resolution of discrete position movements can result in dithering when a desired position is between two discrete position values. Dithering can result in unwanted vibration and overheating of the actuator as the control system repeatedly tries to reach the desired position.

The characteristics of the position sensor system described above make it especially suitable for applications where precision, size, weight, and power requirements are important considerations. The position sensor system is well suited for astronautic applications, such as on space vehicles. The position sensor system is also applicable to robot arms, 3-d mills, machine tools, and X-Y tables.

The position sensor system may be employed to control the position of a variety of sensors and other devices. Non-limiting examples of sensors that could be controlled with the position sensor system are optical sensors.

Communication Via a Magnio

Radio waves can be used as a carrier for information. Thus, a transmitter can modulate radio waves at one location, and a receiver at another location can detect the modulated radio waves and demodulate the signals to receive the information. Many different methods can be used to transmit information via radio waves. However, all such methods use radio waves as a carrier for the information being transmitted.

However, radio waves are not well suited for all communication methods. For example, radio waves can be greatly attenuated by some materials. For example, radio waves do not generally travel well through water. Thus, communication through water can be difficult using radio waves. Similarly, radio waves can be greatly attenuated by the earth. Thus, wireless communication through the earth, for example for coal or other mines, can be difficult. It is often difficult to communicate wirelessly via radio waves from a metal enclosure. The strength of a radio wave signal can also be reduced as the radio wave passes through materials such as walls, trees, or other obstacles. Additionally, communication via radio waves is widely used and understood. Thus, secret communication using radio waves requires complex methods and devices to maintain the secrecy of the information.

According to some embodiments described herein, wireless communication is achieved without using radio waves as a carrier for information. Rather, modulated magnetic fields can be used to transmit information. For example, a transmitter can include a coil or inductor. When current passes through the coil, a magnetic field is generated around the coil. The current that passes through the coil can be modulated, thereby modulating the magnetic field. Accordingly, information converted into a modulated electrical signal (e.g., the modulated current through the coil) can be used to transfer the information into a magnetic field. A magnetometer can be used to monitor the magnetic field. The modulated magnetic field can, therefore, be converted into traditional electrical systems (e.g., using current to transfer information). Thus, a communications signal can be converted into a magnetic field and a remote receiver (e.g., a magnetometer) can be used to retrieve the communication from the modulated magnetic field.

A diamond with a nitrogen vacancy (DNV) can be used to measure a magnetic field. DNV sensors generally have a quick response to magnetic fields, consume little power, and are accurate. Diamonds can be manufactured with nitrogen vacancy (NV) centers in the lattice structure of the diamond. When the NV centers are excited by light, for example green light, and microwave radiation, the NV centers emit light of a different frequency than the excitation light. For example, green light can be used to excite the NV centers, and red light can be emitted from the NV centers. When a magnetic field is applied to the NV centers, the frequency of the light emitted from the NV centers changes. Additionally, when the magnetic field is applied to the NV centers, the frequency of the microwaves at which the NV centers are excited changes. Thus, by shining a green light (or any other suitable color) through a DNV and monitoring the light emitted from the DNV and the frequencies of microwave radiation that excite the NV centers, a magnetic field can be monitored.

NV centers in a diamond are oriented in one of four spin states. Each spin state can be in a positive direction or a negative direction. The NV centers of one spin state do not respond the same to a magnetic field as the NV centers of another spin state. A magnetic field vector has a magnitude and a direction. Depending upon the direction of the magnetic field at the diamond (and the NV centers), some of the NV centers will be excited by the magnetic field more than others based on the spin state of the NV centers.

Figure 32A:
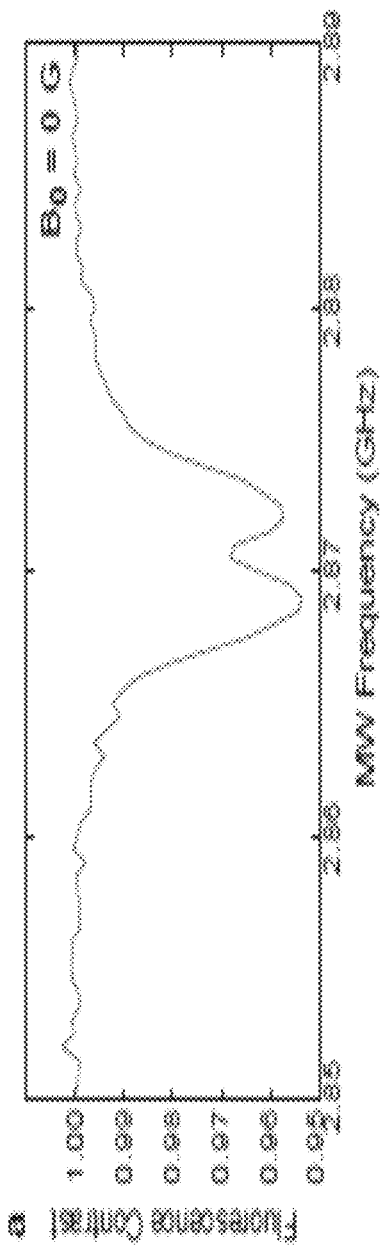
FIGS. 32A and 32B are graphs illustrating the frequency response of a DNV sensor in accordance with an illustrative embodiment.
Figure 32B:
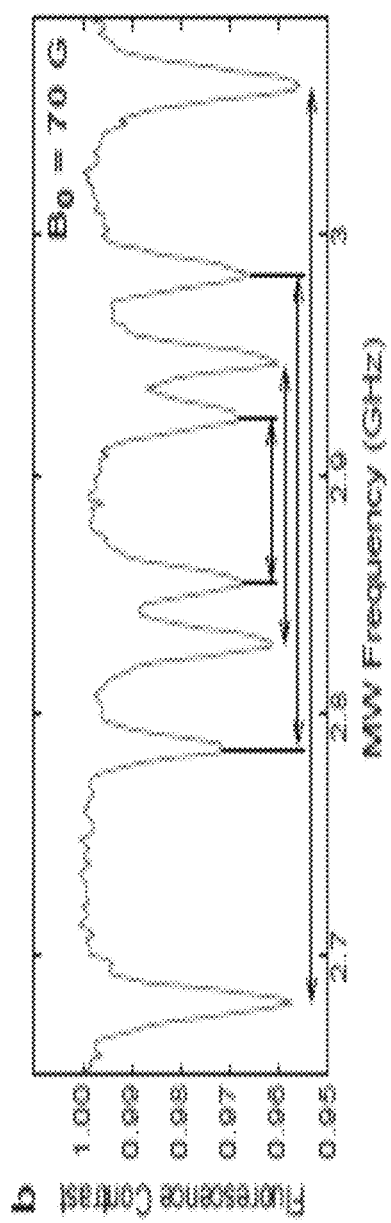

FIGS. 32A and 32B are graphs illustrating the frequency response of a DNV sensor in accordance with an illustrative embodiment. FIGS. 32A and 32B are meant to be illustrative only and not meant to be limiting. FIGS. 32A and 32B plot the frequency of the microwaves applied to a DNV sensor on the x-axis versus the amount of light of a particular frequency (e.g., red) emitted from the diamond. FIG. 32A is the frequency response of the DNV sensor with no magnetic field applied to the diamond, and FIG. 32B is the frequency response of the DNV sensor with a seventy gauss (G) magnetic field applied to the diamond.

As shown in FIG. 32A, when no magnetic field is applied to the DNV sensor, there are two notches in the frequency response. With no magnetic field applied to the DNV sensor, the spin states are not resolvable. That is, with no magnetic field, the NV centers with various spin states are equally excited and emit light of the same frequency. The two notches shown in FIG. 32A are the result of the positive and negative spin directions. The frequency of the two notches is the axial zero field splitting parameter.

When a magnetic field is applied to the DNV sensor, the spin states become resolvable in the frequency response. Depending upon the excitation by the magnetic field of NV centers of a particular spin state, the notches corresponding to the positive and negative directions separate on the frequency response graph. As shown in FIG. 32B, when a magnetic field is applied to the DNV sensor, eight notches appear on the graph. The eight notches are four pairs of corresponding notches. For each pair of notches, one notch corresponds to a positive spin state and one notch corresponds to a negative spin state. Each pair of notches corresponds to one of the four spin states of the NV centers. The amount by which the pairs of notches deviate from the axial zero field splitting parameter is dependent upon how strongly the magnetic field excites the NV centers of the corresponding spin states.

As mentioned above, the magnetic field at a point can be characterized with a magnitude and a direction. By varying the magnitude of the magnetic field, all of the NV centers will be similarly affected. Using the graph of FIG. 32A as an example, the ratio of the distance from 2.87 GHz of one pair to another will remain the same when the magnitude of the magnetic field is altered. As the magnitude is increased, each of the notch pairs will move away from 2.87 GHz at a constant rate, although each pair will move at a different rate than the other pairs.

When the direction of the magnetic field is altered, however, the pairs of notches do not move in a similar manner to one another. FIG. 33A is a diagram of NV center spin states in accordance with an illustrative embodiment. FIG. 33A conceptually illustrates the four spin states of the NV centers. The spin states are labeled NV A, NV B, NV C, and NV D. Vector 3301 is a representation of a first magnetic field vector with respect to the spin states, and Vector 3302 is a representation of a second magnetic field vector with respect to the spin states. Vector 3301 and vector 3302 have the same magnitude, but differ in direction. Accordingly, based on the change in direction, the various spin states will be affected differently depending upon the direction of the spin states.

Figure 33B:
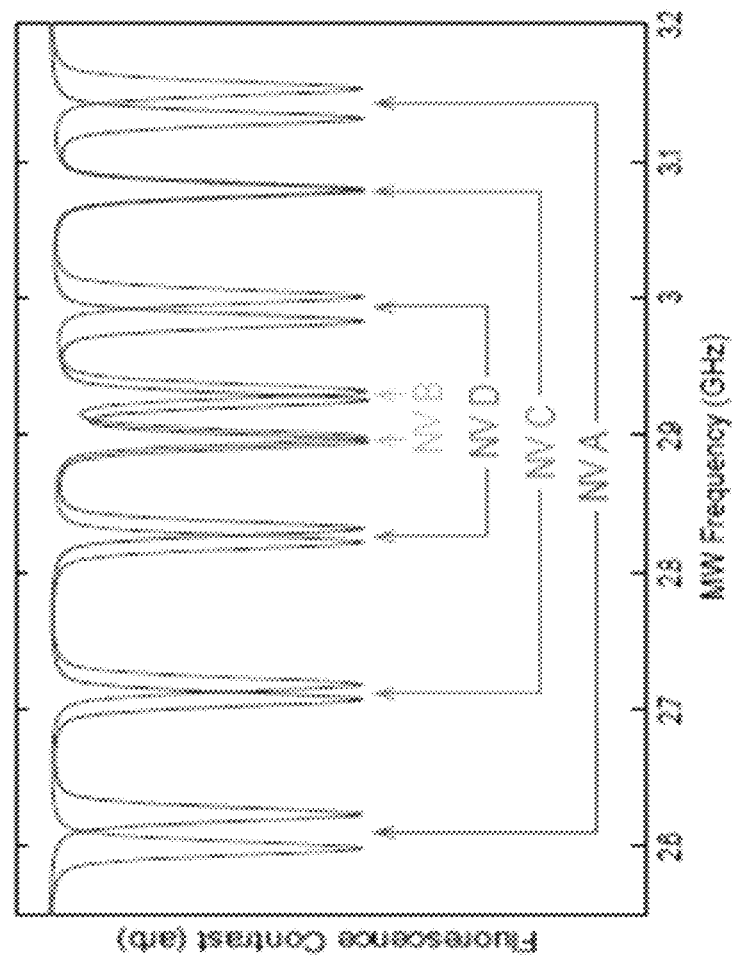
FIG. 33B is a graph illustrating the frequency response of a DNV sensor in response to a changed magnetic field in accordance with an illustrative embodiment.
Figure 33A:
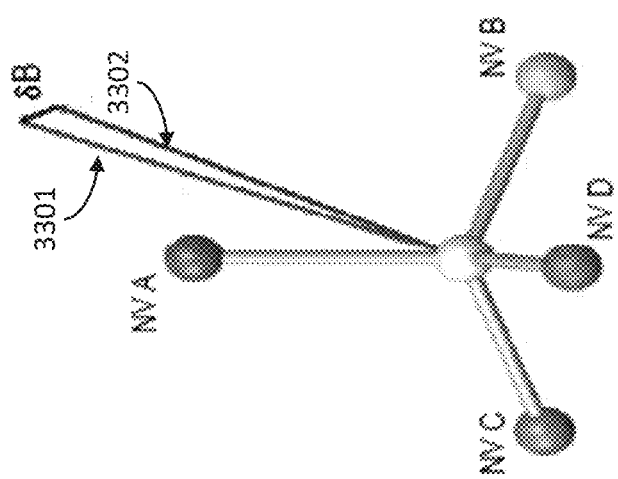
FIG. 33A is a diagram of NV center spin states in accordance with an illustrative embodiment.

FIG. 33B is a graph illustrating the frequency response of a DNV sensor in response to a changed magnetic field in accordance with an illustrative embodiment. The frequency response graph illustrates the frequency response of the DNV sensor from the magnetic field corresponding to vector 3301 and to vector 3302. As shown in FIG. 33B, the notches corresponding to the NV A and NV D spin states moved closer to the axial zero field splitting parameter from vector 3301 to vector 3302, the negative (e.g., lower frequency notch) notch of the NV C spin state moved away from the axial zero field splitting parameter, the positive (e.g., high frequency notch) of the NV C spin state stayed essentially the same, and the notches corresponding to the NV B spin state increased in frequency (e.g., moved to the right in the graph). Thus, by monitoring the changes in frequency response of the notches, the DNV sensor can determine the direction of the magnetic field.

Additionally, magnetic fields of different directions can be modulated simultaneously and each of the modulations can be differentiated or identified by the DNV sensor. For example, a magnetic field in the direction of NV A can be modulated with a first pattern, a magnetic field in the direction of NV B can be modulated with a second pattern, a magnetic field in the direction of NV C can be modulated with a third pattern, and a magnetic field in the direction of NV D can be modulated with a fourth pattern. The movement of the notches in the frequency response corresponding to the various spin states can be monitored to determine each of the four patterns.

However, in some embodiments, the direction of the magnetic field corresponding to the various spin states of a DNV sensor of a receiver may not be known by the transmitter. In such embodiments, by monitoring at least three of the spin states, messages transmitted on two magnetic fields that are orthogonal to one another can be deciphered. Similarly, by monitoring the frequency response of the four spin states, messages transmitted on three magnetic fields that are orthogonal to one another can be deciphered. Thus, in some embodiments, two or three independent signals can be transmitted simultaneously to a receiver that receives and deciphers the two or three signals. Such embodiments can be a multiple-input multiple-output (MIMO) system. Diversity in the polarization of the magnetic field channels provides a full rank channel matrix even through traditionally keyhole channels. In an illustrative embodiment, a full rank channel matrix allows MIMO techniques to leverage all degrees of freedom (e.g., three degrees of polarization). Using a magnetic field to transmit information circumvents the keyhole effect that propagating a radio frequency field can have.

Figure 34:
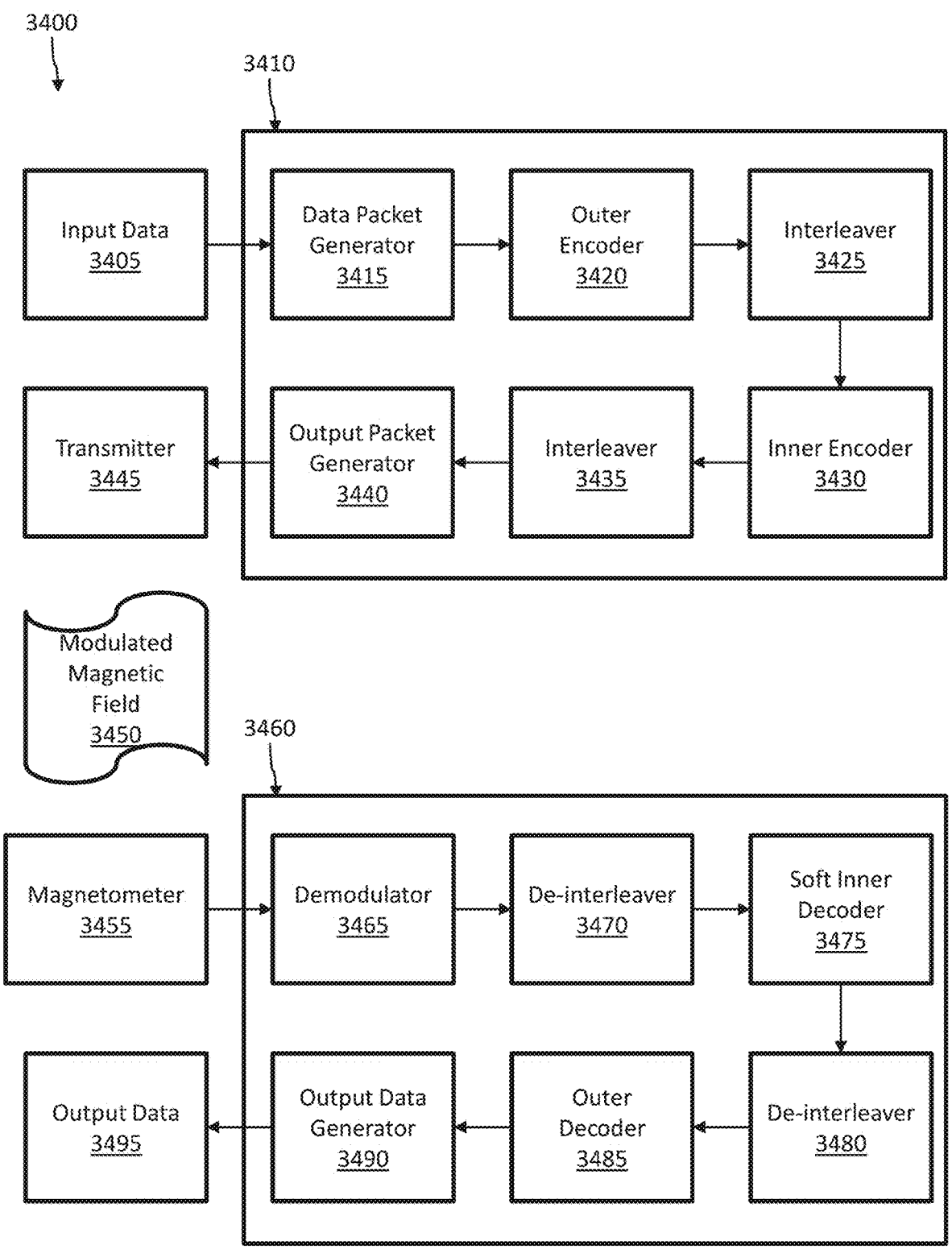
FIG. 34 is a block diagram of a magnetic communication system in accordance with an illustrative embodiment.

FIG. 34 is a block diagram of a magnetic communication system in accordance with an illustrative embodiment. An illustrative magnio system 3400 includes input data 3405, a 3410, a transmitter 3445, a modulated magnetic field 3450, a magnetometer 3455, a magnio receiver 3460, and output data 3495. In alternative embodiments, additional, fewer, and/or different elements may be used.

In an illustrative embodiment, input data 3405 is input into the magnio system 3400, transmitted wirelessly, and the output data 3495 is generated at a location remote from the generation of the input data 3405. In an illustrative embodiment, the input data 3405 and the output data 3495 contain the same information.

In an illustrative embodiment, input data 3405 is sent to the magnio transmitter 3410. The magnio transmitter 3410 can prepare the information received in the input data 3405 for transmission. For example, the magnio transmitter 3410 can encode or encrypt the information in the input data 3405. The magnio transmitter 3410 can send the information to the transmitter 3445.

The transmitter 3445 is configured to transmit the information received from the magnio transmitter 3410 via one or more magnetic fields. The transmitter 3445 can be configured to transmit the information on one, two, three, or four magnetic fields. That is, the transmitter 3445 can transmit information via a magnetic field oriented in a first direction, transmit information via a magnetic field oriented in a second direction, transmit information via a magnetic field oriented in a third direction, and/or transmit information via a magnetic field oriented in a fourth direction. In some embodiments in which the transmitter 3445 transmits information via two or three magnetic fields, the magnetic fields can be orthogonal to one another. In alternative embodiments, the magnetic fields are not orthogonal to one another.

The transmitter 3445 can be any suitable device configured to create a modulated magnetic field. For example, the transmitter 3445 can include one or more coils. Each coil can be a conductor wound around a central axis. For example, in embodiments in which the information is transmitted via three magnetic fields, the transmitter 3445 can include three coils. The central axis of each coil can be orthogonal to the central axis of the other coils.

The transmitter 3445 generates the modulated magnetic field 3450. The magnetometer 3455 can detect the modulated magnetic field 3450. The magnetometer 3455 can be located remotely from the transmitter 3445. For example, with a current of about ten Amperes through a coil (e.g., the transmitter) and with a magnetometer magnetometer 3455 with a sensitivity of about one hundred nano-Tesla, a message can be sent, received, and recovered in full with several meters between the transmitter and receiver and with the magnetometer magnetometer 3455 inside of a Faraday cage. The magnetometer 3455 can be configured to measure the modulated magnetic field 3450 along three or four directions. As discussed above, a magnetometer 3455 using a DNV sensor can measure the magnetic field along four directions associated with four spin states. The magnetometer 3455 can transmit information, such as frequency response information, to the magnio receiver 3460.

The magnio receiver 3460 can analyze the information received from the magnetometer 3455 and decipher the information in the signals. The magnio receiver 3460 can reconstitute the information contained in the input data 3405 to produce the output data 3495.

In an illustrative embodiment, the magnio transmitter 3410 includes a data packet generator 3415, an outer encoder 3420, an interleaver 3425, an inner encoder 34340, an interleaver 34345, and an output packet generator 3440. In alternative embodiments, additional, fewer, and/or different elements may be used. The various components of the magnio transmitter 310 are illustrated in FIG. 34 as individual components and are meant to be illustrative only. However, in alternative embodiments, the various components may be combined. Additionally, the use of arrows is not meant to be limiting with respect to the order or flow of operations or information. Any of the components of the magnio transmitter 3410 can be implemented using hardware and/or software.

The input data 3405 can be sent to the data packet generator 3415. In an illustrative embodiment, the input data 3405 is a series or stream of bits. The data packet generator 3415 can break up the stream of bits into packets of information. The packets can be any suitable size. In an illustrative embodiment, the data packet generator 3415 includes appending a header to the packets that includes transmission management information. In an illustrative embodiment the header can include information used for error detection, such as a checksum. Any suitable header may be used. In some embodiments, the input data 3405 is not broken into packets.

The stream of data generated by the data packet generator 3415 can be sent to the outer encoder 3420. The outer encoder 3420 can encrypt or encode the stream using any suitable cypher or code. Any suitable type of encryption can be used such as symmetric key encryption. In an illustrative embodiment, the encryption key is stored on memory associated with the magnio transmitter 3410. In an illustrative embodiment, the magnio transmitter 3410 may not include the outer encoder 3420. For example, the messages may not be encrypted. In an illustrative embodiment, the outer encoder 3420 separates the stream into multiple channels. In an illustrative embodiment, the outer encoder outer encoder 3420 performs forward error correction (FEC). In some embodiments, the forward error correction dramatically increases the reliability of transmissions for a given power level.

In an illustrative embodiment, the encoded stream from the outer encoder 3420 is sent to the interleaver 3425. In an illustrative embodiment, the interleaver 3425 interleaves bits within each packet of the stream of data. In such an embodiment, each packet has the same bits, but the bits are shuffled according to a predetermined pattern. Any suitable interleaving method can be used. In an alternative embodiment, the packets are interleaved. In such an embodiment, the packets are shuffled according to a predetermined pattern. In some embodiments, the magnio transmitter 3410 may not include the interleaver 3425.

In some embodiments, interleaving data can be used to prevent loss of a sequence of data. For example, if a stream of bits are in sequential order and there is a communication loss during a portion of the stream, there is a relatively large gap in the information corresponding to the lost bits. However, if the bits were interleaved (e.g., shuffled), once the stream is de-interleaved (e.g., unshuffled) at the receiver, the lost bits are not grouped together but are spread across the sequential bits. In some instances, if the lost bits are spread across the message, error correction can be more successful in determining what the lost bits were supposed to be.

In an illustrative embodiment, the interleaved stream from the interleaver 3425 is sent to the inner encoder 3430. The inner encoder 3430 can encrypt or encode the stream using any suitable cypher or code. Any suitable type of encryption can be used such as symmetric key encryption. In an illustrative embodiment, the encryption key is stored on memory associated with the magnio transmitter 3410. In an illustrative embodiment, the magnio transmitter 3410 may not include the inner encoder 3430. In an illustrative embodiment, the inner encoder 3430 and the outer encoder 3420 perform different functions. For example, the inner encoder 3430 can use a deep convolutional code and can perform most of the forward error correction, and the outer encoder can be used to correct residual errors and can use a different coding technique from the inner encoder 3430 (e.g., a block-parity based encoding technique).

In an illustrative embodiment, the encoded stream from the inner encoder 3430 is sent to the interleaver 3435. In an illustrative embodiment, the interleaver 3435 interleaves bits within each packet of the stream of data. In such an embodiment, each packet has the same bits, but the bits are shuffled according to a predetermined pattern. Any suitable interleaving method can be used. In an alternative embodiment, the packets are interleaved. In such an embodiments, the packets are shuffled according to a predetermined pattern. In an illustrative embodiment, interleaving the data spreads out burst-like errors across the signal, thereby facilitating the decoding of the message. In some embodiment, the magnio transmitter 3410 may not include the interleaver 3435.

In an illustrative embodiment, the interleaved stream from the interleaver 3435 is sent to the output packet generator 3440. The output packet generator 3440 can generate the packets that will be transmitted. For example, the output packet generator 3440 may append a header to the packets that includes transmission management information. In an illustrative embodiment the header can include information used for error detection, such as a checksum. Any suitable header may be used.

In an illustrative embodiment, the output packet generator 3440 appends a synchronization sequence to each of the packets. For example, a synchronization sequence can be added to the beginning of each packet. The packets can be transmitted on multiple channels. In such an embodiment, each channel is associated with a unique synchronization sequence. The synchronization sequence can be used to decipher the channels from one another, as is discussed in greater detail below with regard to the magnio receiver 3460.

In an illustrative embodiment, the output packet generator 3440 modulates the waveform to be transmitted. Any suitable modulation can be used. In an illustrative embodiment, the waveform is modulated digitally. In some embodiments, minimum shift keying can be used to modulate the waveform. For example, non-differential minimum shift key can be used. In an illustrative embodiment, the waveform has a continuous phase. That is, the waveform does not have phase discontinuities. In an illustrative embodiment, the waveform is sinusoidal in nature.

In an illustrative embodiment, the modulated waveform is sent to the transmitter 3445. In an illustrative embodiment, multiple modulated waveforms are sent to the transmitter 3445. As mentioned above, two, three, or four signals can be transmitted simultaneously via magnetic fields with different directions. In an illustrative embodiment, three modulated waveforms are sent to the transmitter 3445. Each of the waveforms can be used to modulate a magnetic field, and each of the magnetic fields can be orthogonal to one another.

The transmitter 3445 can use the received waveforms to produce the modulated magnetic field 3450. The modulated magnetic field 3450 can be a combination of multiple magnetic fields of different directions. The frequency used to modulate the modulated magnetic field 3450 can be any suitable frequency. In an illustrative embodiment, the carrier frequency of the modulated magnetic field 3450 can be 10 kHz. In alternative embodiments, the carrier frequency of the modulated magnetic field 3450 can be less than or greater than 10 kHz. In some embodiments, the carrier frequency can be modulated to plus or minus the carrier frequency. That is, using the example in which the carrier frequency is 10 kHz, the carrier frequency can be modulated down to 0 Hz and up to 20 kHz. In alternative embodiments, any suitable frequency band can be used.

Figure 35B:
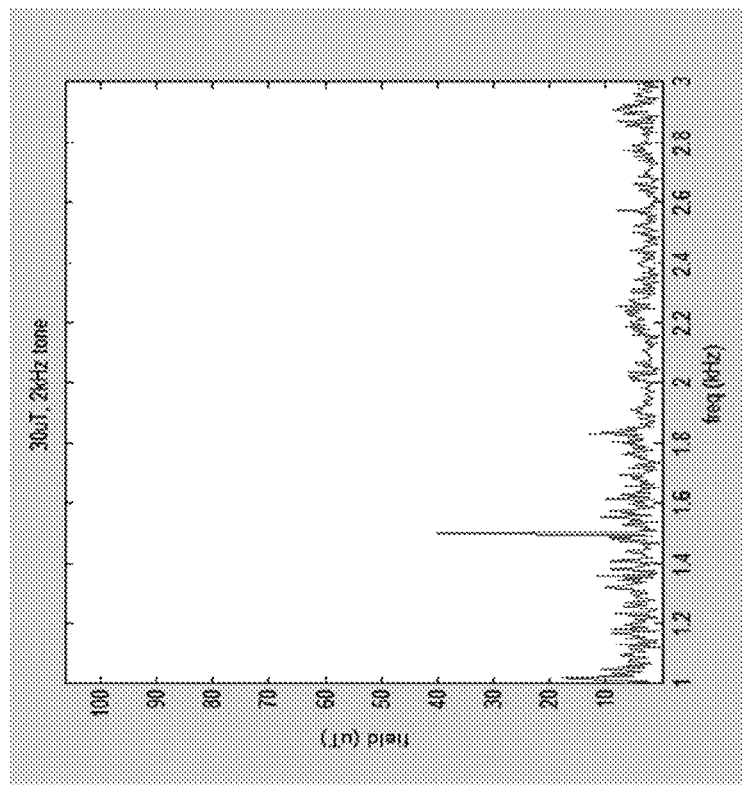
FIGS. 35A and 35B show the strength of a magnetic field versus frequency in accordance with an illustrative embodiment.
Figure 35A:
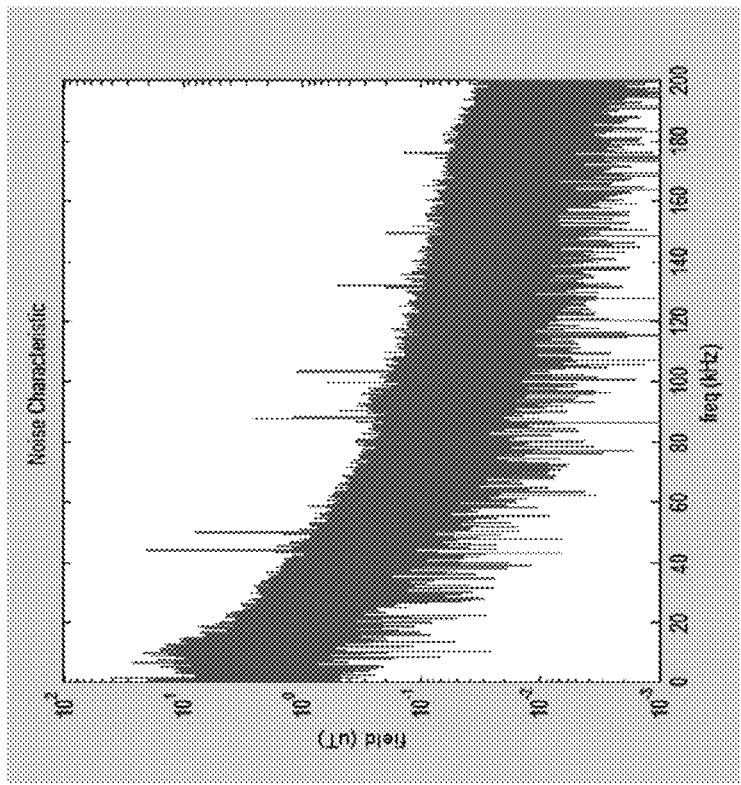

FIGS. 35A and 35B show the strength of a magnetic field versus frequency in accordance with an illustrative embodiment. FIGS. 35A and 35B are meant to be illustrative only and not meant to be limiting. In some instances, the magnetic spectrum is relatively noisy. As shown in FIG. 35A, the noise over a large band (e.g., 0-200 kHz) is relatively high. Thus, communicating over such a large band may be difficult. FIG. 35B illustrates the noise over a smaller band (e.g., 1-3 kHz). As shown in FIG. 35B, the noise over a smaller band is relatively low. Thus, modulating the magnetic field across a smaller band of frequencies can be less noisy and more effective. In an illustrative embodiment, the magnio transmitter 3410 can monitor the magnetic field and determine a suitable frequency to modulate the magnetic fields to reduce noise. That is, the magnio transmitter 3410 can find a frequency that has a high signal to noise ratio. In an illustrative embodiment, the magnio transmitter 3410 determines a frequency band that has noise that is below a predetermined threshold.

In an illustrative embodiment, the magnio receiver 3460 includes the demodulator 3465, the de-interleaver 3470, the soft inner decoder 3475, the de-interleaver 3480, the outer decoder 3485, and the output data generator 3490. In alternative embodiments, additional, fewer, and/or different elements may be used. For example, the magnio receiver 3460 can include the magnetometer 3455 in some embodiments. The various components of the magnio receiver 3460 are illustrated in FIG. 34 as individual components and are meant to be illustrative only. However, in alternative embodiments, the various components may be combined.

Additionally, the use of arrows is not meant to be limiting with respect to the order or flow of operations or information. Any of the components of the magnio receiver 3460 can be implemented using hardware and/or software.

The magnetometer 3455 is configured to measure the modulated magnetic field 3450. In an illustrative embodiment, the magnetometer 3455 includes a DNV sensor. The magnetometer 3455 can monitor the modulated magnetic field 3450 in up to four directions. As illustrated in FIG. 2A, the magnetometer 3455 can be configured to measure the magnetometer 3455 in one or more of four directions that are tetrahedronally arranged. As mentioned above, the magnetometer 3455 can monitor n+1 directions where n is the number of channels that the transmitter 3445 transmits on. For example, the transmitter 3445 can transmit on three channels, and the magnetometer 3455 can monitor four directions. In an alternative embodiment, the transmitter 3445 can transmit via the same number of channels (e.g., four) as directions that the magnetometer 3455 monitors.

The magnetometer 3455 can send information regarding the modulated magnetic field 3450 to the demodulator 3465. The demodulator 3465 can analyze the received information and determine the direction of the magnetic fields that were used to create the modulated magnetic field 3450. That is, the demodulator 3465 can determine the directions of the channels that the transmitter 3445 transmitted on. As mentioned above, the transmitter 3445 can transmit multiple streams of data, and each stream of data is transmitted on one channel. Each of the streams of data can be preceded by a unique synchronization sequence. In an illustrative embodiment, the synchronization sequence includes 1023 bits. In alternative embodiments, the synchronization sequence includes more than or fewer than 1023 bits. Each of the streams can be transmitted simultaneously such that each of the channels are time-aligned with one another. The demodulator 3465 can monitor the magnetic field in multiple directions simultaneously. Based on the synchronization sequence, which is known to the magnio receiver 3460, the demodulator 3465 can determine the directions corresponding to the channels of the transmitter 3445. When the streams of synchronization sequences are time-aligned, the demodulator 3465 can monitor the modulated magnetic field 3450 to determine how the multiple channels mixed. Once the demodulator 3465 determines how the various channels are mixed, the channels can be demodulated.

For example, the transmitter 3445 transmits on three channels, with each channel corresponding to an orthogonal direction. Each channel is used to transmit a stream of information. For purposes of the example, the channels are named "channel A," "channel B," and "channel C." The magnetometer 3455 monitors the modulated magnetic field 3450 in four directions. The demodulator 3465 can monitor for three signals in orthogonal directions. For purposes of the example, the signals can be named "signal 1," "signal 2," and "signal 3." Each of the signals can contain a unique, predetermined synchronization sequence. The demodulator 3465 can monitor the modulated magnetic field 3450 for the signals to be transmitted on the channels. There is a finite number of possible combinations that the signals can be received at the magnetometer 3455. For example, signal 1 can be transmitted in a direction corresponding to channel A, signal 2 can be transmitted in a direction corresponding to channel B, and signal 3 can be transmitted in a direction corresponding to channel C. In another example, signal 2 can be transmitted in a direction corresponding to channel A, signal 3 can be transmitted in a direction corresponding to channel B, and signal 1 can be transmitted in a direction corresponding to channel C, etc. The modulated magnetic field 3450 of the synchronization sequence for each of the possible combinations that the signals can be received at the magnetometer 3455 can be known by the demodulator 3465. The demodulator 3465 can monitor the output of the magnetometer 3455 for each of the possible combinations. Thus, when one of the possible combinations is recognized by the demodulator 3465, the demodulator 3465 can monitor for additional data in directions associated with the recognized combination. In another example, the transmitter 3445 transmits on two channels, and the magnetometer 3455 monitors the modulated magnetic field 3450 in three directions.

The demodulated signals (e.g., the received streams of data from each of the channels) is sent to the de-interleaver 3470. The de-interleaver 3470 can undo the interleaving of the interleaver 3435. The de-interleaved streams of data can be sent to the soft inner decoder 3475, which can undo the encoding of the inner encoder 3430. Any suitable decoding method can be used. For example, in an illustrative embodiment the inner encoder 3430 uses a three-way, soft-decision turbo decoding function. In an alternative embodiment, a two-way, soft-decision turbo decoding function may be used. For example, the expected cluster positions for signal levels are learned by the magnio receiver 3460 during the synchronization portion of the transmission. When the payload/data portion of the transmission is processed by the magnio receiver 3460, distances from all possible signal clusters to the observed signal value are computed for every bit position. The bits in each bit position are determined by combining the distances with state transition probabilities to find the best path through a "trellis." The path through the trellis can be used to determine the most likely bits that were communicated.

The decoded stream can be transmitted to the de-interleaver 3480. The de-interleaver 3480 can undo the interleaving of the interleaver 3425. The de-interleaved stream can be sent to the outer decoder 3485. In an illustrative embodiment, the outer decoder 3485 undoes the encoding of the outer encoder 3420. The unencoded stream of information can be sent to the output data generator 3490. In an illustrative embodiment, the output data generator 3490 undoes the packet generation of data packet generator 3415 to produce the output data 3495.

Figure 36:
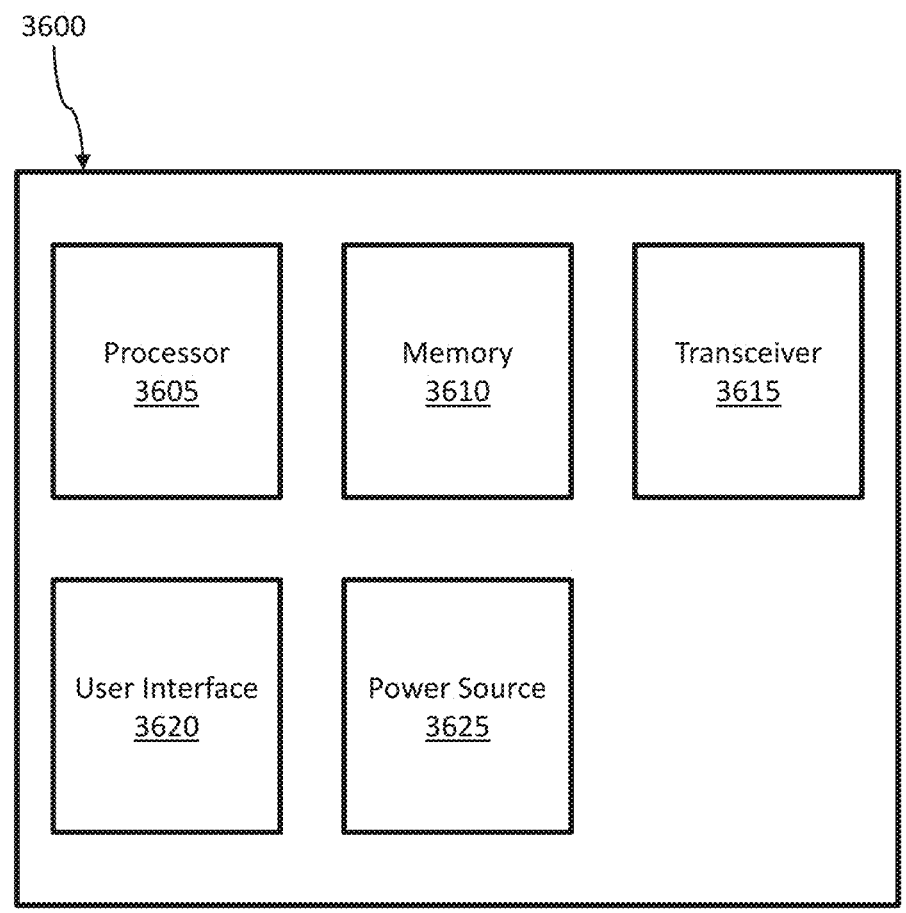
FIG. 36 is a block diagram of a computing device in accordance with an illustrative embodiment.

FIG. 36 is a block diagram of a computing device in accordance with an illustrative embodiment. An illustrative computing device 3600 includes a memory 3610, a processor 3605, a transceiver 3615, a user interface 3620, and a power source 3625. In alternative embodiments, additional, fewer, and/or different elements may be used. The computing device 3600 can be any suitable device described herein. For example, the computing device 3600 can be a desktop computer, a laptop computer, a smartphone, a specialized computing device, etc. The computing device 3600 can be used to implement one or more of the methods described herein.

In an illustrative embodiment, the memory 3610 is an electronic holding place or storage for information so that the information can be accessed by the processor 3605. The memory 3610 can include, but is not limited to, any type of random access memory (RAM), any type of read only memory (ROM), any type of flash memory, etc. such as magnetic storage devices (e.g., hard disk, floppy disk, magnetic strips, etc.), optical disks (e.g., compact disk (CD), digital versatile disk (DVD), etc.), smart cards, flash memory devices, etc. The computing device 3600 may have one or more computer-readable media that use the same or a different memory media technology. The computing device 3600 may have one or more drives that support the loading of a memory medium such as a CD, a DVD, a flash memory card, etc.

In an illustrative embodiment, the processor 3605 executes instructions. The instructions may be carried out by a special purpose computer, logic circuits, or hardware circuits. The processor 3605 may be implemented in hardware, firmware, software, or any combination thereof. The term "execution" is, for example, the process of running an application or the carrying out of the operation called for by an instruction. The instructions may be written using one or more programming language, scripting language, assembly language, etc. The processor 3605 executes an instruction, meaning that it performs the operations called for by that instruction. The processor 3605 operably couples with the user interface 3620, the transceiver 3615, the memory 3610, etc. to receive, to send, and to process information and to control the operations of the computing device 3600. The processor 3605 may retrieve a set of instructions from a permanent memory device such as a ROM device and copy the instructions in an executable form to a temporary memory device that is generally some form of RAM. An illustrative computing device 3600 may include a plurality of processors that use the same or a different processing technology. In an illustrative embodiment, the instructions may be stored in memory 3610.

In an illustrative embodiment, the transceiver 3615 is configured to receive and/or transmit information. In some embodiments, the transceiver 3615 communicates information via a wired connection, such as an Ethernet connection, one or more twisted pair wires, coaxial cables, fiber optic cables, etc. In some embodiments, the transceiver 3615 communicates information via a wireless connection using microwaves, infrared waves, radio waves, spread spectrum technologies, satellites, etc. The transceiver 3615 can be configured to communicate with another device using cellular networks, local area networks, wide area networks, the Internet, etc. In some embodiments, one or more of the elements of the computing device 3600 communicate via wired or wireless communications. In some embodiments, the transceiver 3615 provides an interface for presenting information from the computing device 3600 to external systems, users, or memory. For example, the transceiver 3615 may include an interface to a display, a printer, a speaker, etc. In an illustrative embodiment, the transceiver 3615 may also include alarm/indicator lights, a network interface, a disk drive, a computer memory device, etc. In an illustrative embodiment, the transceiver 3615 can receive information from external systems, users, memory, etc.

In an illustrative embodiment, the user interface 3620 is configured to receive and/or provide information from/to a user. The user interface 3620 can be any suitable user interface. The user interface 3620 can be an interface for receiving user input and/or machine instructions for entry into the computing device 3600. The user interface 3620 may use various input technologies including, but not limited to, a keyboard, a stylus and/or touch screen, a mouse, a track ball, a keypad, a microphone, voice recognition, motion recognition, disk drives, remote controllers, input ports, one or more buttons, dials, joysticks, etc. to allow an external source, such as a user, to enter information into the computing device 3600. The user interface 3620 can be used to navigate menus, adjust options, adjust settings, adjust display, etc.

The user interface 3620 can be configured to provide an interface for presenting information from the computing device 3600 to external systems, users, memory, etc. For example, the user interface 3620 can include an interface for a display, a printer, a speaker, alarm/indicator lights, a network interface, a disk drive, a computer memory device, etc. The user interface 3620 can include a color display, a cathode-ray tube (CRT), a liquid crystal display (LCD), a plasma display, an organic light-emitting diode (OLED) display, etc.

In an illustrative embodiment, the power source 36236 is configured to provide electrical power to one or more elements of the computing device 3600. In some embodiments, the power source 3625 includes an alternating power source, such as available line voltage (e.g., 120 Volts alternating current at 60 Hertz in the United States). The power source 3625 can include one or more transformers, rectifiers, etc. to convert electrical power into power useable by the one or more elements of the computing device 3600, such as 1.5 Volts, 8 Volts, 12 Volts, 24 Volts, etc. The power source 3625 can include one or more batteries.

Figure 37:
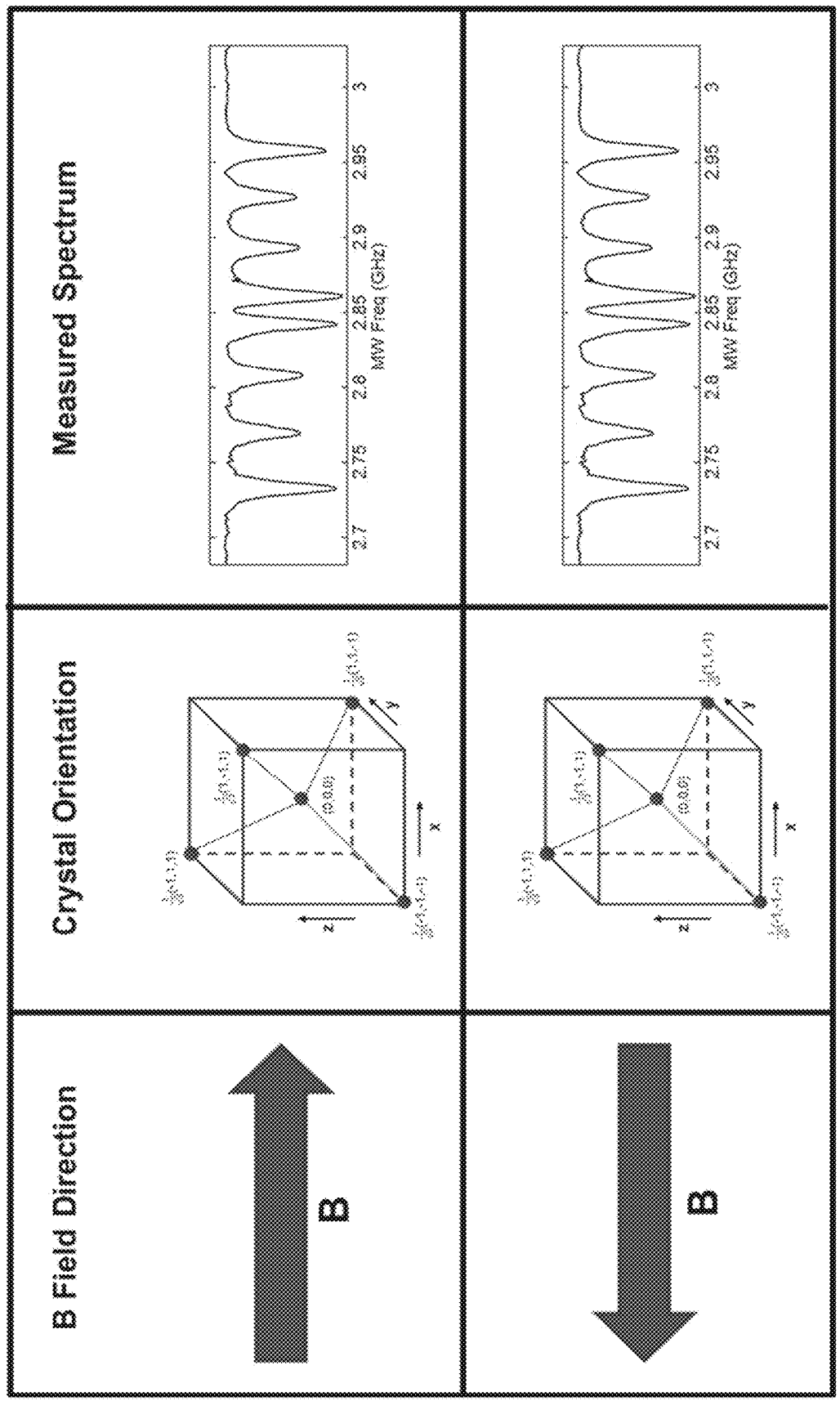
FIG. 37 is graphs illustrating the fluorescence as a function of applied RF frequency of four different NV center orientations for a magnetic field applied in opposite directions to the NV center diamond material.

Method for Resolving Natural Sensor Ambiguity for DNV Direction Finding Applications Natural Ambiguity of NV Center Magnetic Sensor System The NV center magnetic sensor that operates as described above is capable of resolving a magnetic field to an unsigned vector. As shown in FIG. 37, due to the symmetry of the peaks for the ms=−1 and the ms=+1 spin states around the zero splitting photon energy the structure of the DNV material produces a measured fluorescence spectrum as a function of RF frequency that is the same for a positive and a negative magnetic field acting on the DNV material. The symmetry of the fluorescence spectra makes the assignment of a sign to the calculated magnetic field vector unreliable. The natural ambiguity introduced to the magnetic field sensor is undesirable in some applications, such as magnetic field based direction sensing.

In some circumstances, real world conditions allow the intelligent assignment of a sign to the unsigned magnetic field vector determined from the fluorescence spectra described above. If a known bias field is used that is much larger than the signal of interest, the sign of the magnetic field vector may be determine by whether the total magnetic field, cumulative of the bias field and the signal of interest, increases or decreases. If the magnetic sensor is employed to detect submarines from a surface ship, assigning the calculated magnetic field vector a sign that would place a detected submarine above the surface ship would be nonsensical. Alternatively, where the sign of the vector is not important a sign can be arbitrarily assigned to the unsigned vector.

It is possible to unambiguously determine a magnetic field vector with a DNV magnetic field sensor. The method of determining the signed magnetic field vector may be performed with a DNV magnetic field sensor of the type shown in FIG. 6 and described above. In general, the recovery of the vector may be achieved as described in U.S. application Ser. No. 15/003,718, filed Jan. 21, 2016, titled "APPARATUS AND METHOD FOR RECOVERY OF THREE DIMENSIONAL MAGNETIC FIELD FROM A MAGNETIC DETECTION SYSTEM", which issued as U.S. Pat. No. 9,541,610 on Jan. 10, 2017, and is incorporated by reference herein in its entirety.

As shown in FIG. 2, the energy levels of the ms=−1 and the ms=+1 spin states are different. For this reason, the relaxation times from the excited triplet states (3E) to the excited intermediate singlet state (A) for electrons with the ms=−1 and the ms=+1 spin states are not the same. The difference in relaxation times for electrons of ms=−1 and the ms=+1 spin states is on the order of picoseconds or nanoseconds. It is possible to measure the difference in relaxation times for the electrons with the ms=−1 and the ms=+1 spin states by utilizing pulsed RF excitation such that the inequality in the relaxation times accumulates over a large number of electron cycles, producing a difference in observed relaxation times on the order of microseconds.

As described above, the application of RF excitation to the DNV material produces a decrease in fluorescence intensity at the resonant RF frequencies for the ms=−1 and the ms=+1 spin states. For this reason, at RF frequencies that excite electrons to the ms=−1 and the ms=+1 spin states, an equilibrium fluorescence intensity will be lower than the equilibrium fluorescence intensity in the absence of the applied RF excitation. The time it takes to transition from the equilibrium fluorescence intensity in the absence of RF excitation to the equilibrium fluorescence intensity with the application of RF excitation may be employed to calculate an "equilibration time."

Figure 40:
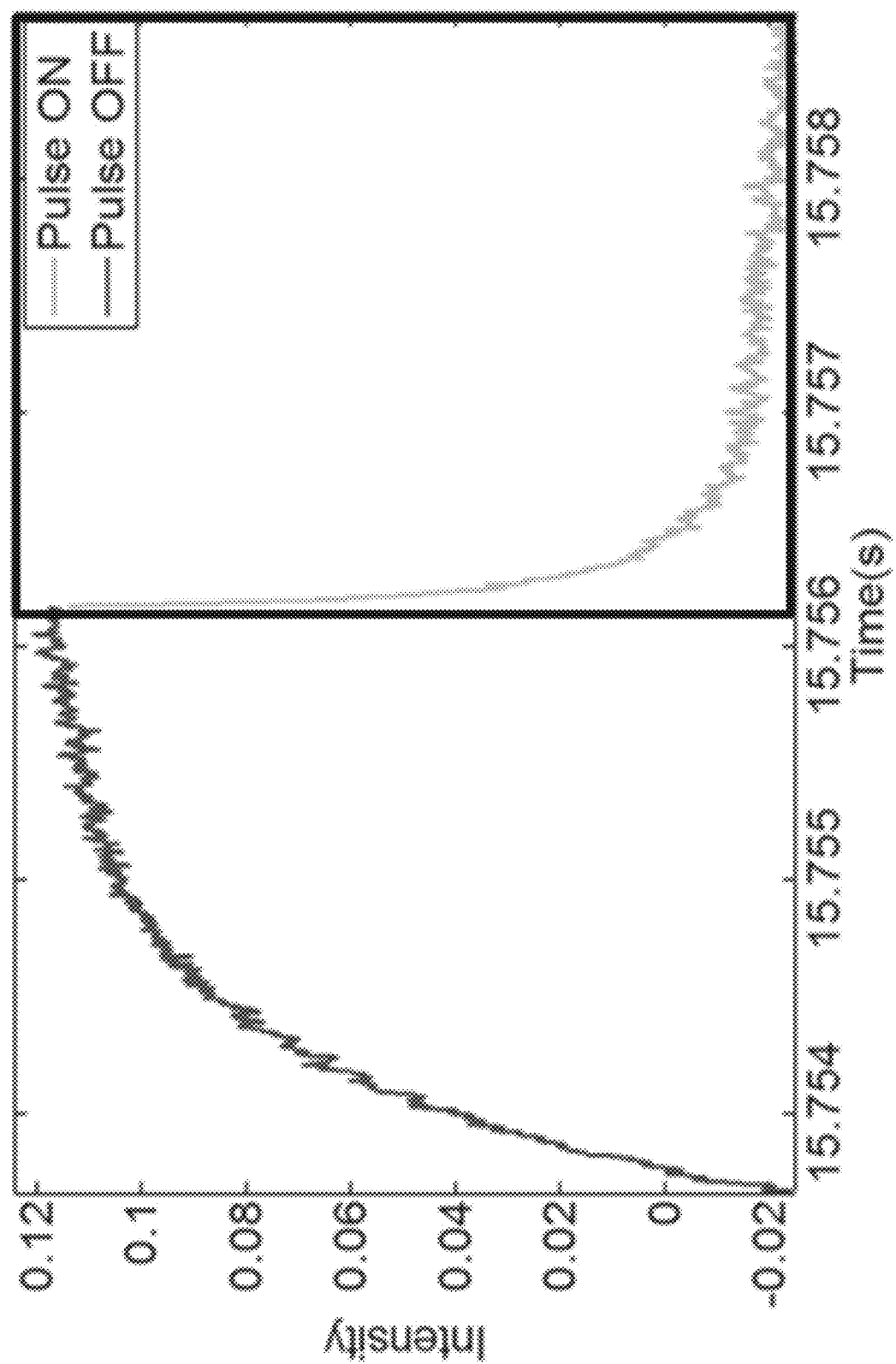
FIG. 40 is a graph illustrating the fluorescence intensity as a function of time for a NV center diamond material for a pulse of RF excitation.
Figure 41:
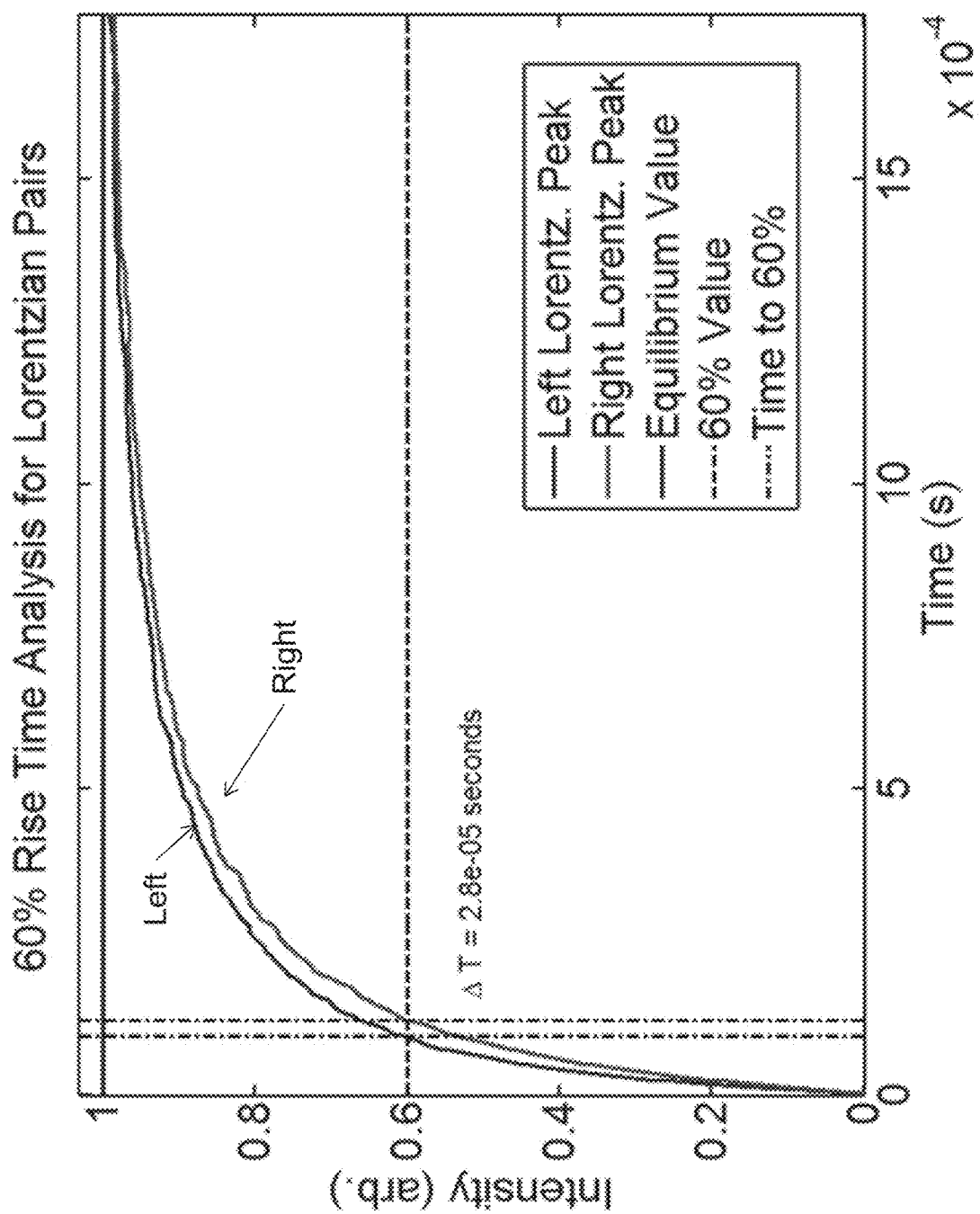
FIG. 41 is a graph illustrating the normalized fluorescence intensity as a function of time for a pair of Lorentzian peaks of a NV center diamond material.

An "equilibration time" as utilized herein refers to the time between the start of an RF excitation pulse and when a predetermined percentage of the equilibrium fluorescence intensity is achieved. The predetermined amount of the equilibrium fluorescence at which the equilibration time is calculated may be about 20% to about 80% of the equilibrium fluorescence, such as about 30%, 40%, 50%, 60%, or 70% of the equilibrium fluorescence. The equilibration time as shown in FIGS. 38, 40 and 41 is actually a decay time, as the fluorescence intensity is actually decreasing in the presence of the RF excitation, but has been inverted for the sake of clarity.

Figure 38:
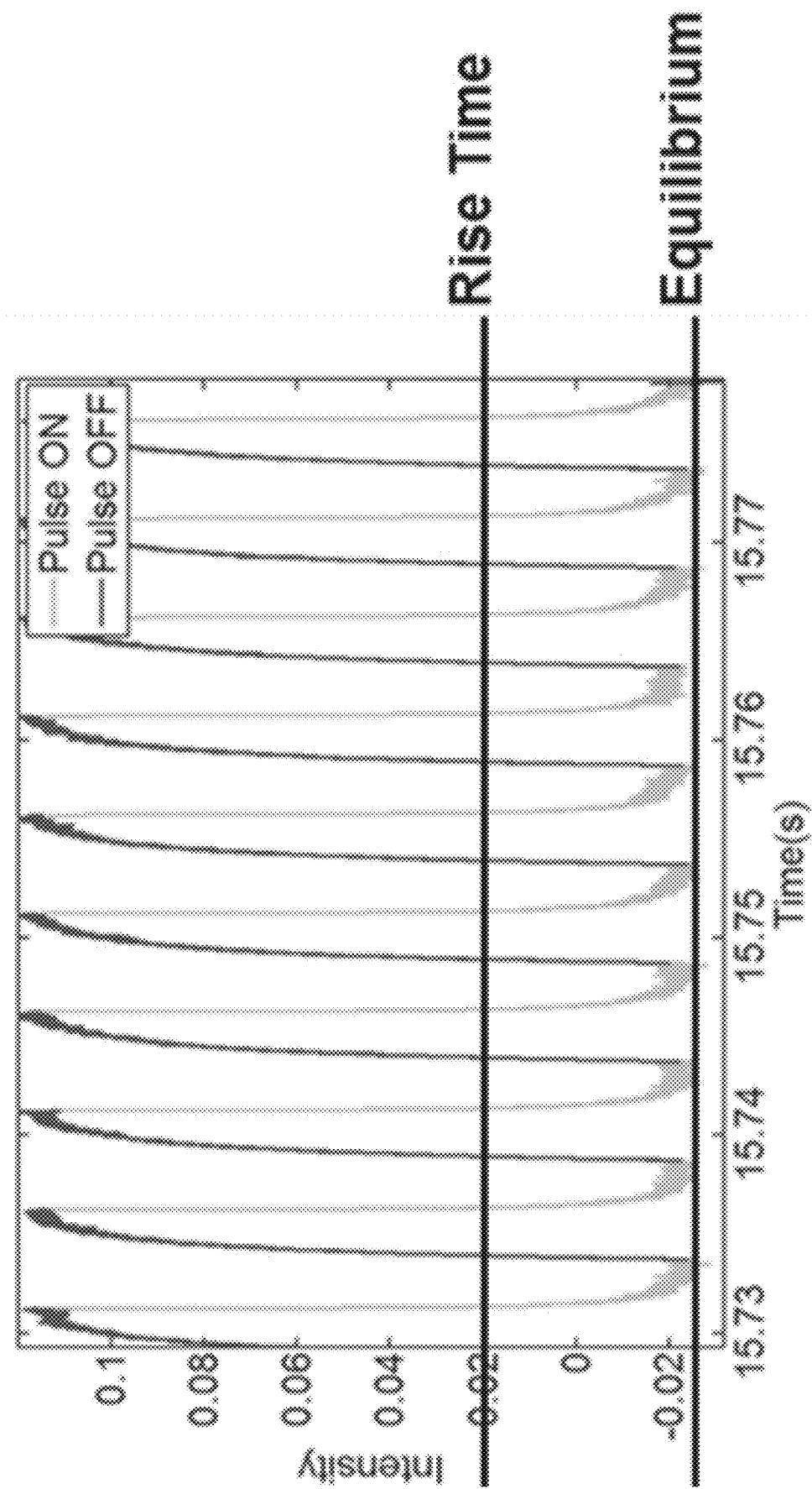
FIG. 38 is a graph illustrating the fluorescence intensity as a function of time for a NV center diamond material with a pulsed RF excitation.

A shown in FIG. 38, the fluorescence intensity of the DNV material varies with the application of a pulsed RF excitation source. When the RF pulse is in the "on" state, the electrons decay through a non-fluorescent path and a relatively dark equilibrium fluorescence is achieved. The absence of the RF excitation, when the pulse is in the "off" state, results in a relatively bright equilibrium fluorescence. The transition between the two fluorescence equilibrium states is not instantaneous, and the measurement of the equilibration time at a predetermined value of fluorescence intensity provides a repeatable indication of the relaxation time for the electrons at the RF excitation frequency.

Figure 39:
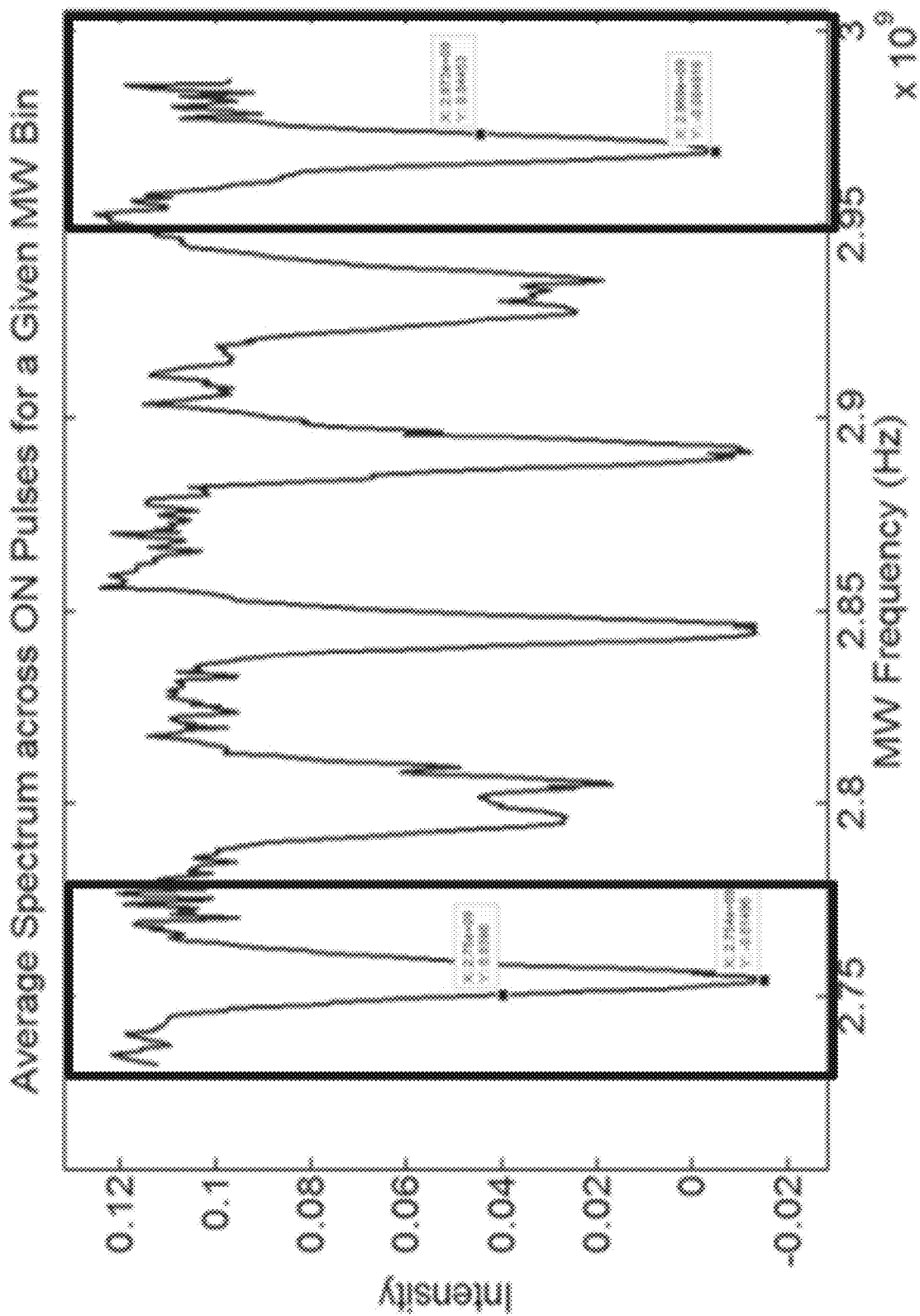
FIG. 39 is a graph illustrating the fluorescence as a function of applied RF frequency of four different NV center orientations for a magnetic field applied in opposite directions to the NV center diamond material, with a Lorentzian pair being identified in the graph.

The difference in the relaxation time between the electrons of the ms=−1 and the ms=+1 spin states may be measured due to the different RF excitation resonant frequencies for each spin state. As shown in FIG. 39, a fluorescence intensity spectra of the DNV material measured as a function of RF excitation frequency includes four Lorentzian pairs, one pair for each crystallographic plane of the DNV material. The peaks in a Lorentzian pair correspond to a ms=−1 and a ms=+1 spin state. By evaluating the equilibration time for each peak in a Lorentzian pair, the peak which corresponds to the higher energy state may be identified. The higher energy peak provides a reliable indication of the sign of the magnetic field vector.

The Lorentzian pair of the fluorescence spectra which are located furthest from the zero splitting energy may be selected to calculate the equilibration time. These peaks include the least signal interference and noise, allowing a more reliable measurement. The preferred Lorentzian pair is boxed in FIG. 39.

A plot of the fluorescence intensity for a single RF pulse as a function of time is shown in FIG. 40. The frequency of the pulsed RF excitation is selected to be the maximum value for each peak in the Lorentzian pair. The other conditions for the measurement of an equilibration time for each peak in the Lorentzian pair are held constant. As shown in FIG. 41, the peaks of the Lorentzian pair have an equilibration time when calculated to 60% of the equilibrium intensity value that is distinguishable. The RF pulse duration may be set such that the desired percentage of the equilibrium fluorescence intensity is achieved for each "on" portion of the pulse, and the full "bright" equilibrium intensity is achieved during the "off" portion of the pulse.

The equilibrium fluorescence intensity under the application of the RF excitation may be set by any appropriate method. According to some embodiments, the RF excitation may be maintained until the intensity becomes constant, and the constant intensity may be considered the equilibrium intensity value utilized to calculate the equilibration time. Alternatively, the equilibrium intensity may be set to the intensity at the end of an RF excitation pulse. According to other embodiments, a decay constant may be calculated based on the measured fluorescence intensity and a theoretical data fit employed to determine the equilibrium intensity value.

The peak in the Lorentzian pair that exhibits the higher measured equilibration time is associated with the higher energy level electron spin state. For this reason, the peak of the Lorentzian pair with the longer equilibration time is assigned the ms=+1 spin state, and the other peak in the Lorentzian pair is assigned the ms=−1 spin state. The signs of the peaks in the other Lorentzian pairs in the fluorescence spectra of the DNV material as a function of RF frequency may then be assigned, and the signed magnetic field vector calculated.

Figure 42:
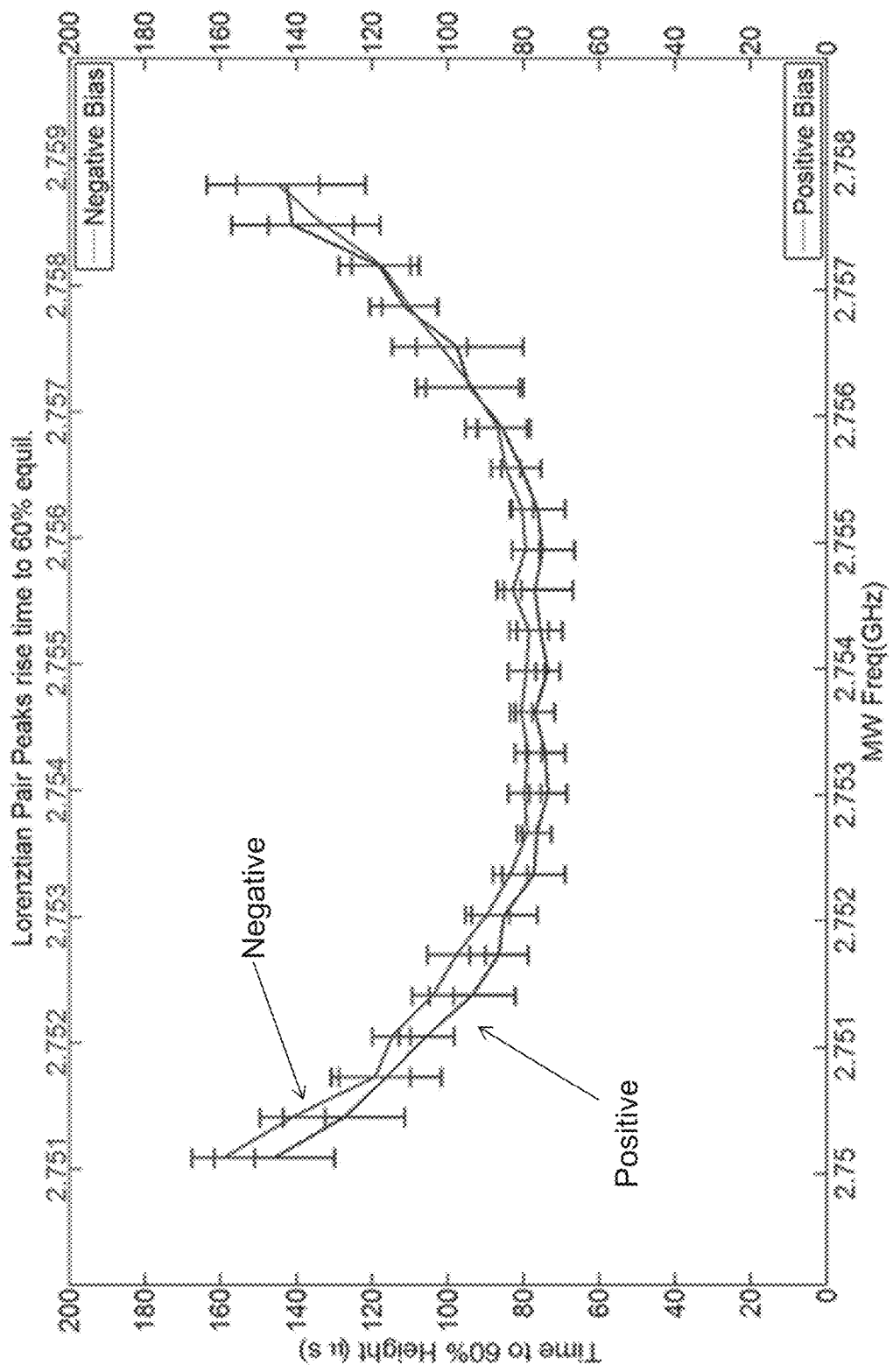
FIG. 42 is a graph illustrating the time to 60% of the equilibrium fluorescence as a function of RF frequency for a negative and positive magnetic bias field applied to a NV center diamond material.

To demonstrate that the equilibration time of each peak in a Lorentzian pair does indeed vary with magnetic field direction, the equilibration time for a single peak in a Lorentzian pair was measured under both a positive and a negative magnetic bias field which were otherwise equivalent. As shown in FIG. 42, a real and measurable difference in equilibration time was observed between the opposite bias fields.

The method of determining a sign of a magnetic field vector with a DNV magnetic sensor described herein may be performed with the DNV magnetic field sensor shown in FIG. 6. No additional hardware is required.

The controller of the magnetic field sensor may be programmed to determine the location of peaks in a fluorescence spectra of a DNV material as a function of RF frequency. The equilibration time for the peaks of a Lorentzian pair located the furthest from the zero field energy may then be calculated. The controller may be programmed to provide a pulsed RF excitation energy by controlling a RF excitation source and also control an optical excitation source to excite the DNV material with continuous wave optical excitation. The resulting optical signal received at the optical detector may be analyzed by the controller to determine the equilibration time associated with each peak in the manner described above. The controller may be programmed to assign a sign to each peak based on the measured equilibration time. The peak with the greater measured equilibration time may be assigned the ms=+1 spin state.

The method of assigning a sign to a magnetic field vector described above may also be applied to magnetic field sensors based on magneto-optical defect center materials other than DNV.

The DNV magnetic field sensor described herein that produces a signed magnetic field vector may be especially useful in applications in which the direction of a measured magnetic field is important. For example, the DNV magnetic field sensor may be employed in magnetic field based navigation or positioning systems.

Hydrophone

FIGS. 43A and 43B are diagrams illustrating hydrophone systems in accordance with illustrative embodiments. An illustrative system 4300 includes a hull 4305 and a magnetometer 4310. In alternative embodiments, additional, fewer, or different elements can be used. For example, an acoustic transmitter can be used to generate one or more acoustic signals. In the embodiments in which a transmitter is not used, the system 4300 can be used as a passive sonar system. For example, the system 4300 can be used to detect sounds created by something other than a transmitter (e.g., a ship, a boat, an engine, a mammal, ice movement, etc.).

In an illustrative embodiment, the hull 4305 is the hull of a vessel such as a ship or a boat. The hull 4305 can be any suitable material, such as steel or painted steel. In alternative embodiments, the magnetometer 4310 is installed in alternative structures such as a bulk head or a buoy.

As illustrated in FIG. 43A, the magnetometer 4310 can be located within the 4305. In the embodiment, the magnetometer 4310 is located at the outer surface of the hull 4305. In alternative embodiments, the magnetometer 4310 can be located at any suitable location. For example, magnetometer 4310 can be located near the middle of the hull 4305, at an inner surface of the hull 4305, or on an inner or outer surface of the hull 4305.

In an illustrative embodiment, the magnetometer 4310 is a magnetometer with a diamond with NV centers. In an illustrative embodiment, the magnetometer 4310 has a sensitivity of about 0.1 micro Tesla. In alternative embodiments, the magnetometer 4310 has a sensitivity of greater than or less than 0.1 micro Tesla.

In the embodiment illustrated in FIG. 43A, sound waves 4315 propagate through a fluid with dissolved ions, such as sea water. As the sound waves 4315 move the ions in the fluid, the ions create a magnetic field. For example, as the ions move within the magnetic field of the Earth, the ions create a magnetic field that is detectable by the magnetometer 4310. In another embodiment, a magnetic field source such as a permanent magnet or an electromagnet can be used. The movement of the ions with respect to the source of the magnetic field (e.g., the Earth) creates the magnetic field detectable by the magnetometer 4310.

In an illustrative embodiment, the sound waves 4315 travel through sea water. The density of dissolved ions in the fluid near the magnetometer 4310 depends on the location in the sea that the magnetometer 4310 is. For example, some locations have a lower density of dissolved ions than others. The higher the density of the dissolved ions, the greater the combined magnetic field created by the movement of the ions. In an illustrative embodiment, the strength of the combined magnetic field can be used to determine the density of the dissolved ions (e.g., the salinity of the sea water).

In an illustrative embodiment, the hull 4305 is the hull of a ship that travels through the sea water. As noted above, the movement of the ions relative to the source magnetic field can be measured by the magnetometer 4310. Thus, the magnetometer 4310 can be used to detect and measure the sound waves 4315 as the magnetometer 4310 moves through the sea water and as the magnetometer 4310 is stationary in the sea water.

In an illustrative embodiment, the magnetometer 4310 can measure the magnetic field caused by the moving ions in any suitable direction. For example, the magnetometer 4310 can measure the magnetic field caused by the movement of the ions when the sound waves 4315 is perpendicular to the hull 4305 or any other suitable angle. In some embodiments, the magnetometer 4310 measures the magnetic field caused by the movement of ions caused by sound waves 4315 that are parallel to the surface of the hull 4305.

An illustrative system 4350 includes the hull 4305 and an array of magnetometers 4355. In alternative embodiments, additional, fewer, and/or different elements can be used. For example, although FIG. 43B illustrates four magnetometers 4355 are used. In alternative embodiments, the system 4350 can include fewer than four magnetometers 4355 or more than magnetometers 4355. The array of the magnetometers 4355 can be used to increase the sensitivity of the hydrophone. For example, by using multiple magnetometers 4355, the hydrophone has multiple measurement points.

The array of magnetometers 4355 can be arranged in any suitable manner. For example, the magnetometers 4355 can be arranged in a line. In another example, the magnetometers 4355 can be arranged in a circle, in concentric circles, in a grid, etc. The array of magnetometers 4355 can be uniformly arranged (e.g., the same distance from one another) or non-uniformly arranged. The array of magnetometers 4355 can be used to determine the direction from which the sound waves 4315 travel. For example, the sound waves 4315 can cause ions near one the bottom magnetometer of the magnetometers 4355 of the embodiment illustrated in the system 4350 to create a magnetic field before the sound waves 4315 cause ions near the top magnetometer of the magnetometers 4355. Thus, it can be determined that the sound waves 4315 travels from the bottom to the top of FIG. 43B.

In an illustrative embodiment, the magnetometer 4310 or the magnetometers 4355 can determine the angle that the sound waves 4315 travel relative to the magnetometer 4310 based on the direction of the magnetic field caused by the movement of the ions. For example, individual magnetometers of the magnetometers 4355 can each be configured to measure the magnetic field of the ions in a different direction. Principles of beamforming can be used to determine the direction of the magnetic field. In alternative embodiments, any suitable magnetometer 4310 or magnetometers 4355 can be used to determine the direction of the magnetic field and/or the direction of the acoustic signal.

Magnetic Navigation Methods and Systems Utilizing Power Grid and Communication Network In some embodiments, methods and configurations are disclosed for diamond nitrogen-vacancy (DNV) magnetic navigation via power transmission and distribution lines. The characteristic magnetic signature of human infrastructure provides context for navigation. For example, power lines, which have characteristic magnetic signatures, can serve as roads and highways for mobile platforms (e.g., UASs). Travel in relatively close proximity to power lines may allow stealthy transit, may provide the potential for powering the mobile platform itself, and may permit point-to-point navigation both over long distances and local routes.

Some implementations can include one or more magnetic sensors, a magnetic navigation database, and a feedback loop that controls the UAS position and orientation. DNV magnetic sensors and related systems and methods may provide high sensitivity magnetic field measurements. The DNV magnetic systems and methods can also be low cost, space, weight, and power (C-SWAP) and benefit from a fast settling time. The DNV magnetic field measurements may allow UAS systems to align themselves with the power lines, and to rapidly move along the power-line infrastructure routes. The subject solution can enable navigation in poor visibility conditions and/or in GPS-denied environments. Such magnetic navigation allows for UAS operation in close proximity to power lines facilitating stealthy transit. DNV-based magnetic systems and methods can be approximately 100 times smaller than conventional systems and can have a reaction time that that is approximately 100,000 times faster than other systems.

Figure 44:
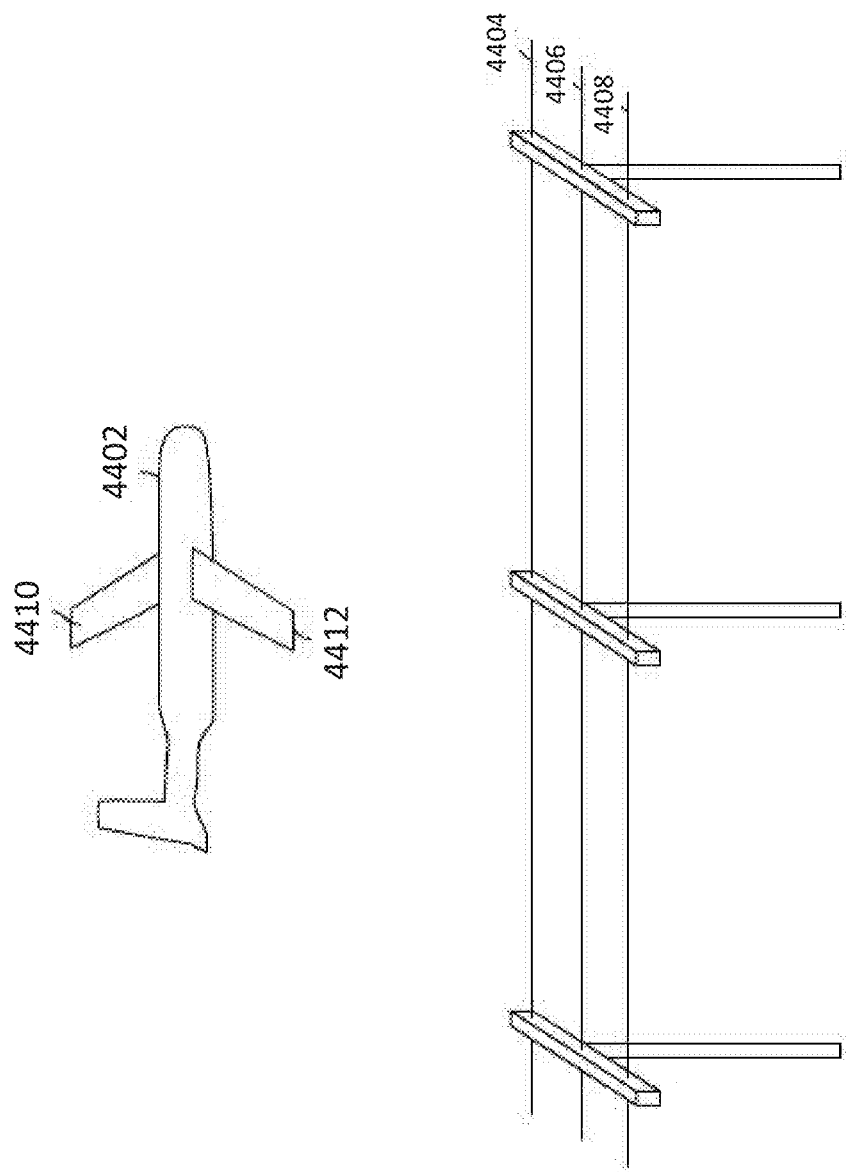
FIG. 44 illustrates a low altitude flying object in accordance with some illustrative implementations.
Figure 45A:
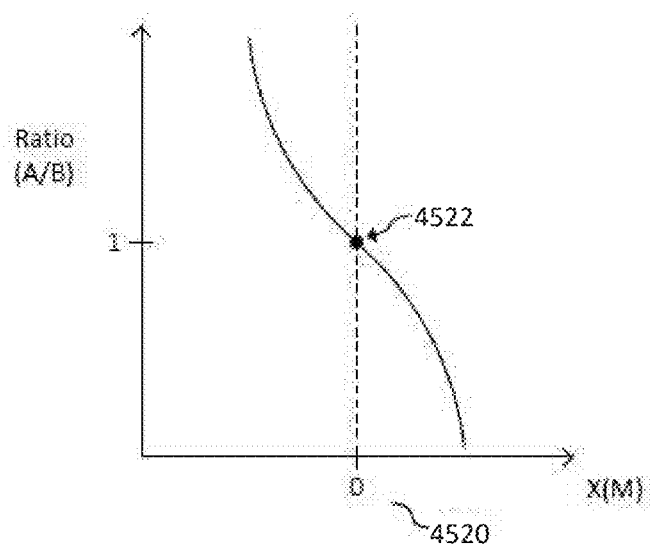
FIG. 45A illustrates a ratio of signal strength of two magnetic sensors, A and B, attached to wings of the UAS as a function of distance, x, from a center line of a power in accordance with some illustrative implementations.

FIG. 44 is a diagram illustrating an example of UAS 4402 navigation along power lines 4404, 4406, and 4408, according to some implementations of the subject technology. The UAS 4402 can exploit the distinct magnetic signatures of power lines for navigation such that the power lines can serve as roads and highways for the UAS 4402 without the need for detailed a priori knowledge of the route magnetic characteristics. As shown in FIG. 45A, a ratio of signal strength of two magnetic sensors, A and B (4410 and 4412 in FIG. 44), attached to wings of the UAS 4402, varies as a function of distance, x, from a center line of an example three-line power transmission line structure 4404, 4406, and 4408. When the ratio is near 1, point 4522, the UAS 4402 is centered over the power transmission line structure, x=0 at point 4520.

Figure 45B:
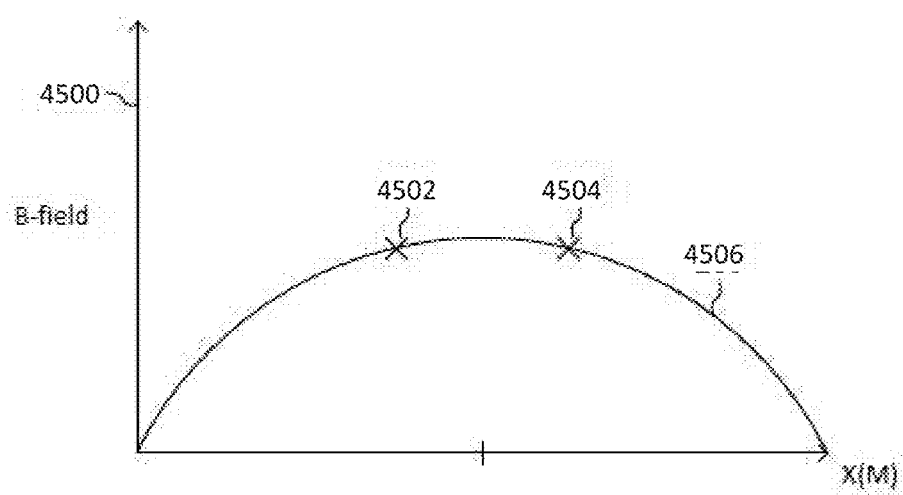
FIG. 45B illustrates a composite magnetic field (B-filed) in accordance with some illustrative implementations.

A composite magnetic field (B-field) 4506 from all (3) wires shown in FIG. 45B. This field is an illustration of the strength of the magnetic field measured by one or more magnetic sensors in the UAS. In this example, the peak of the field 4508 corresponds to the UAS 4402 being above the location of the middle line 4406. When the UAS 4402 has two magnetic sensors, the sensors would read strengths corresponding to points 4502 and 4504. A computing system on the UAS or remote from the UAS, can calculate combined readings. Not all of the depicted components may be required, however, and one or more implementations may include additional components not shown in the figure. Variations in the arrangement and type of the components may be made, and additional components, different components, or fewer components may be provided.

As an example of some implementations, a vehicle, such as a UAS, can include one or more navigation sensors, such as DNV sensors. The vehicle's mission could be to travel to an initial destination and possibly return to a final destination. Known navigation systems can be used to navigate the vehicle to an intermediate location. For example, a UAS can fly using GPS and/or human controlled navigation to the intermediate location. The UAS can then begin looking for the magnetic signature of a power source, such as power lines. To find a power line, the UAS can continually take measurements using the DNV sensors. The UAS can fly in a circle, straight line, curved pattern, etc. and monitor the recorded magnetic field. The magnetic field can be compared to known characteristics of power lines to identify if a power line is in the vicinity of the UAS. For example, the measured magnetic field can be compared with known magnetic field characteristics of power lines to identify the power line that is generating the measured magnetic field. In addition, information regarding the electrical infrastructure can be used in combination with the measured magnetic field to identify the current source. For example, a database regarding magnetic measurements from the area that were previously taken and recorded can be used to compare the current readings to help determine the UAS's location.

In some implementations, once the UAS identifies a power line the UAS positions itself at a known elevation and position relative to the power line. For example, as the UAS flies over a power line, the magnetic field will reach a maximum value and then begin to decrease as the UAS moves away from the power line. After one sweep of a known distance, the UAS can return to where the magnetic field was the strongest. Based upon known characteristics of power lines and the magnetic readings, the UAS can determine the type of power line.

Once the current source has been identified, the UAS can change its elevation until the magnetic field is a known value that corresponds with an elevation above the identified power line. For example, as shown in FIG. 6, a magnetic field strength can be used to determine an elevation above the current source. The UAS can also use the measured magnetic field to position itself offset from directly above the power line. For example, once the UAS is positioned above the current source, the UAS can move laterally to an offset position from the current source. For example, the UAS can move to be 10 kilometers to the left or right of the current source.

The UAS can be programmed, via a computer 306, with a flight path. In some implementations, once the UAS establishes its position, the UAS can use a flight path to reach its destination. In some implementations, the magnetic field generated by the transmission line is perpendicular to the transmission line. In some implementations, the vehicle will fly perpendicular to the detected magnetic field. In one example, the UAS can follow the detected power line to its destination. In this example, the UAS will attempt to keep the detected magnetic field to be close to the original magnetic field value. To do this, the UAS can change elevation or move laterally to stay in its position relative to the power line. For example, a power line that is rising in elevation would cause the detected magnetic field to increase in strength as the distance between the UAS and power line decreased. The navigation system of the UAS can detect this increased magnetic strength and increase the elevation of the UAS. In addition, on board instruments can provide an indication of the elevation of the UAS. The navigation system can also move the UAS laterally to the keep the UAS in the proper position relative to the power lines.

The magnetic field can become weaker or stronger, as the UAS drifts from its position of the transmission line. As the change in the magnetic field is detected, the navigation system can make the appropriate correction. For a UAS that only has a single DNV sensor, when the magnetic field had decreased by more than a predetermined amount the navigation system can make corrections. For example, the UAS can have an error budget such that the UAS will attempt to correct its course if the measured error is greater than the error budget. If the magnetic field has decreased, the navigation system can instruct the UAS to move to the left. The navigation system can continually monitor the magnetic field to see if moving to the left corrected the error. If the magnetic field further decreased, the navigation system can instruct the UAS to fly to the right to its original position relative to the current source and then move further to the right. If the magnetic field decreased in strength, the navigation system can deduce that the UAS needs to decrease its altitude to increase the magnetic field. In this example, the UAS would originally be flying directly over the current source, but the distance between the current source and the UAS has increased due to the current source being at a lower elevation. Using this feedback loop of the magnetic field, the navigation system can keep the UAS centered or at an offset of the current source. The same analysis can be done when the magnetic field increases in strength. The navigation can maneuver until the measured magnetic field is within the proper range such that the UAS in within the flight path.

The UAS can also use the vector measurements from one or more DNV sensors to determine course corrections. The readings from the DNV sensor are vectors that indicate the direction of the sensed magnetic field. Once the UAS knows the location of the power line, as the magnitude of the sensed magnetic field decreases, the vector can provide an indication of the direction the UAS should move to correct its course. For example, the strength of the magnetic field can be reduced by a threshold amount from its ideal location. The magnetic vector of this field can be used to indicate the direction the UAS should correct to increase the strength of the magnetic field. In other words, the magnetic field indicates the direction of the field and the UAS can use this direction to determine the correct direction needed to increase the strength of the magnetic field, which could correct the UAS flight path to be back over the transmission wire.

Using multiple sensors on a single vehicle can reduce the amount of maneuvering that is needed or eliminate the maneuvering all together. Using the measured magnetic field from each of the multiple sensors, the navigation system can determine if the UAS needs to correct its course by moving left, right, up, or down. For example, if both DNV sensors are reading a stronger field, the navigation system can direct the UAS to increase its altitude. As another example if the left sensor is stronger than expected but the right sensor is weaker than expected, the navigation system can move the UAS to the left.

In addition to the current readings from the one or more sensors, a recent history of readings can also be used by the navigation system to identify how to correct the UAS course. For example, if the right sensor had a brief increase in strength and then a decrease, while the left sensor had a decrease, the navigation system can determine that the UAS has moved to far to the left of the flight path and could correct the position of the UAS accordingly.

Figure 46:
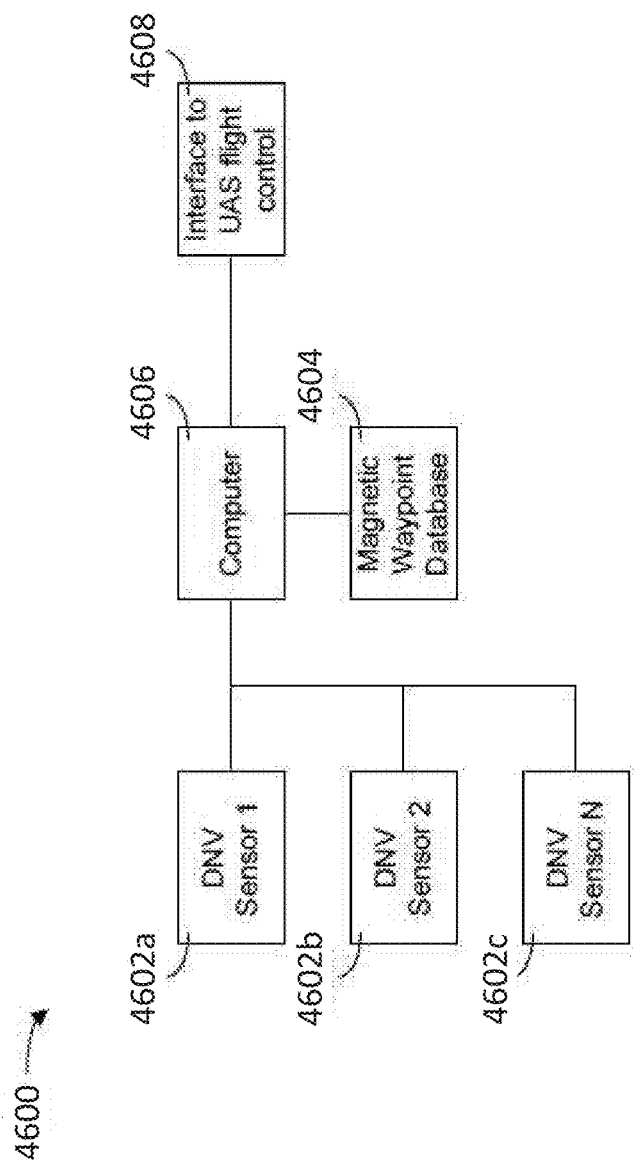
FIG. 46 illustrates a high-level block diagram of an example UAS navigation system in accordance with some illustrative implementations.

FIG. 46 illustrates a high-level block diagram of an example UAS navigation system 4600, according to some implementations of the subject technology. In some implementations, the UAS navigation system of the subject technology includes a number of DNV sensors 4602a, 4602b, and 4602c, a navigation database 4604, and a feedback loop that controls the UAS position and orientation. In other implementations, a vehicle can contain a navigation control that is used to navigate the vehicle. For example, the navigation control can change the vehicle's direction, elevation, speed, etc. The DNV magnetic sensors 4602a-4602c have high sensitivity to magnetic fields, low C-SWAP and a fast settling time. The DNV magnetic field measurements allow the UAS to align itself with the power lines, via its characteristic magnetic field signature, and to rapidly move along power-line routes. Not all of the depicted components may be required, however, and one or more implementations may include additional components not shown in the figure. Variations in the arrangement and type of the components may be made, and additional components, different components, or fewer components may be provided.

Figure 47:
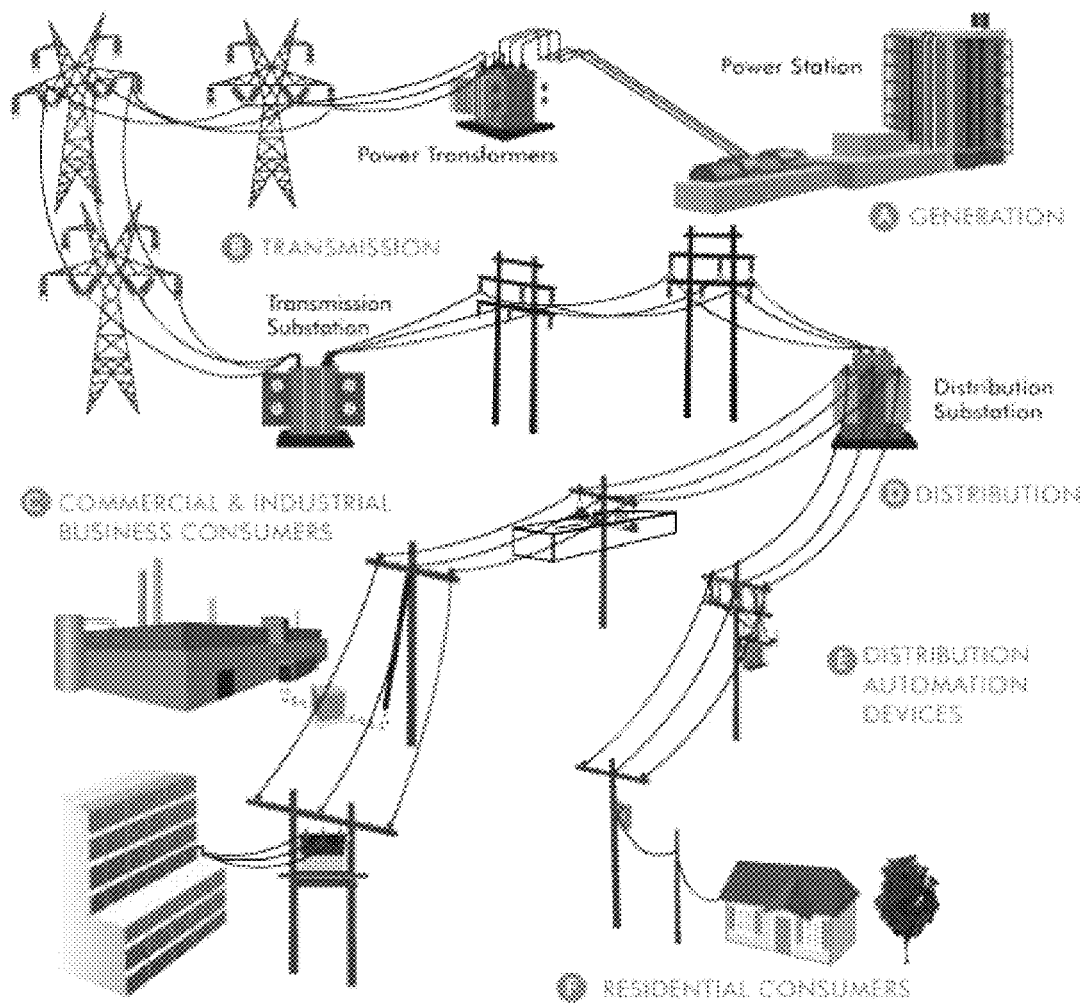
FIG. 47 illustrates an example of a power line infrastructure.

FIG. 47 illustrates an example of a power line infrastructure. It is known that widespread power line infrastructures, such as shown in FIG. 47, connect cities, critical power system elements, homes and businesses. The infrastructure may include overhead and buried power distribution lines, transmission lines, railway catenary and 3rd rail power lines and underwater cables. Each element has a unique electromagnetic and spatial signature. It is understood that, unlike electric fields, the magnetic signature is minimally impacted by man-made structures and electrical shielding. It is understood that specific elements of the infrastructure will have distinct magnetic and spatial signatures and that discontinuities, cable droop, power consumption and other factors will create variations in magnetic signatures that can also be leveraged for navigation.

Figure 48A:
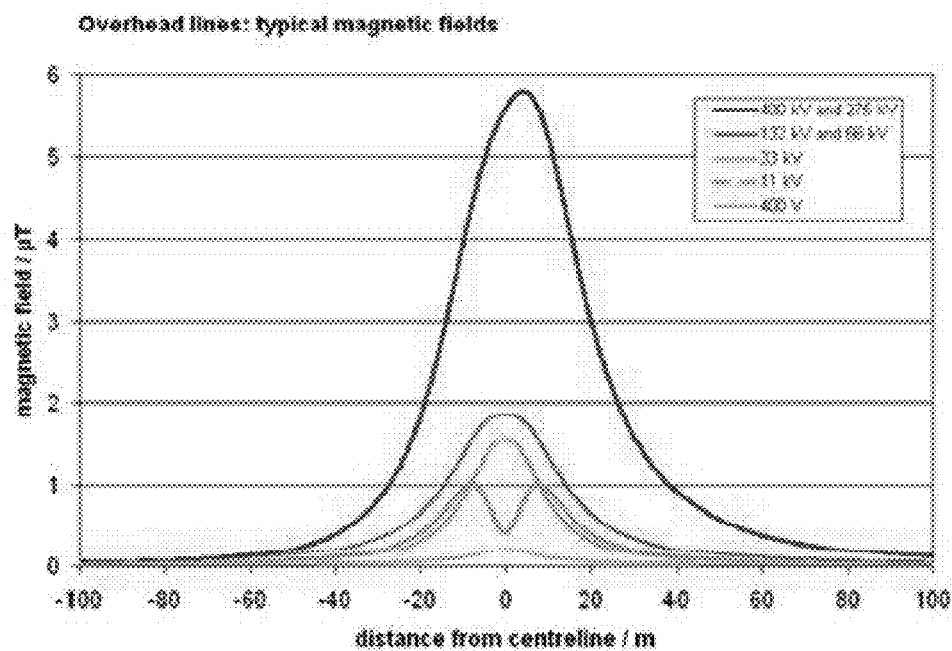
FIGS. 48A and 48B illustrate examples of magnetic field distribution for overhead power lines and underground power cables.
Figure 48B:
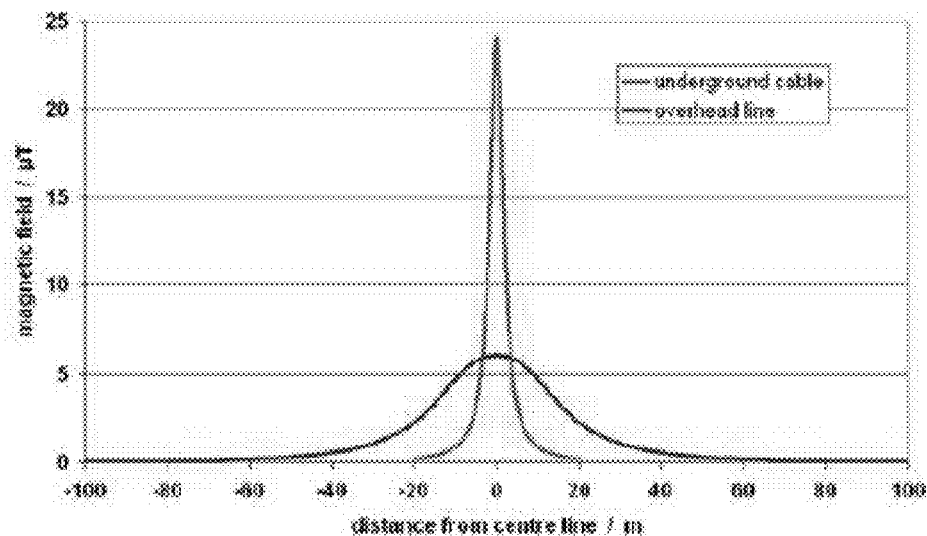

FIGS. 48A and 48B illustrate examples of magnetic field distribution for overhead power lines and underground power cables. Both above-ground and buried power cables emit magnetic fields, which unlike electrical fields are not easily blocked or shielded. Natural Earth and other man-made magnetic field sources can provide rough values of absolute location. However, the sensitive magnetic sensors described here can locate strong man-made magnetic sources, such as power lines, at substantial distances. As the UAS moves, the measurements can be used to reveal the spatial structure of the magnetic source (point source, line source, etc.) and thus identify the power line as such. In addition, once detected the UAS can guide itself to the power line via its magnetic strength. Once the power line is located its structure is determined, and the power line route is followed and its characteristics are compared to magnetic way points to determine absolute location. Fixed power lines can provide precision location reference as the location and relative position of poles and towers are known. A compact on-board database can provide reference signatures and location data for waypoints. Not all of the depicted components may be required, however, and one or more implementations may include additional components not shown in the figure. Variations in the arrangement and type of the components may be made, and additional components, different components, or fewer components may be provided.

Figure 49:
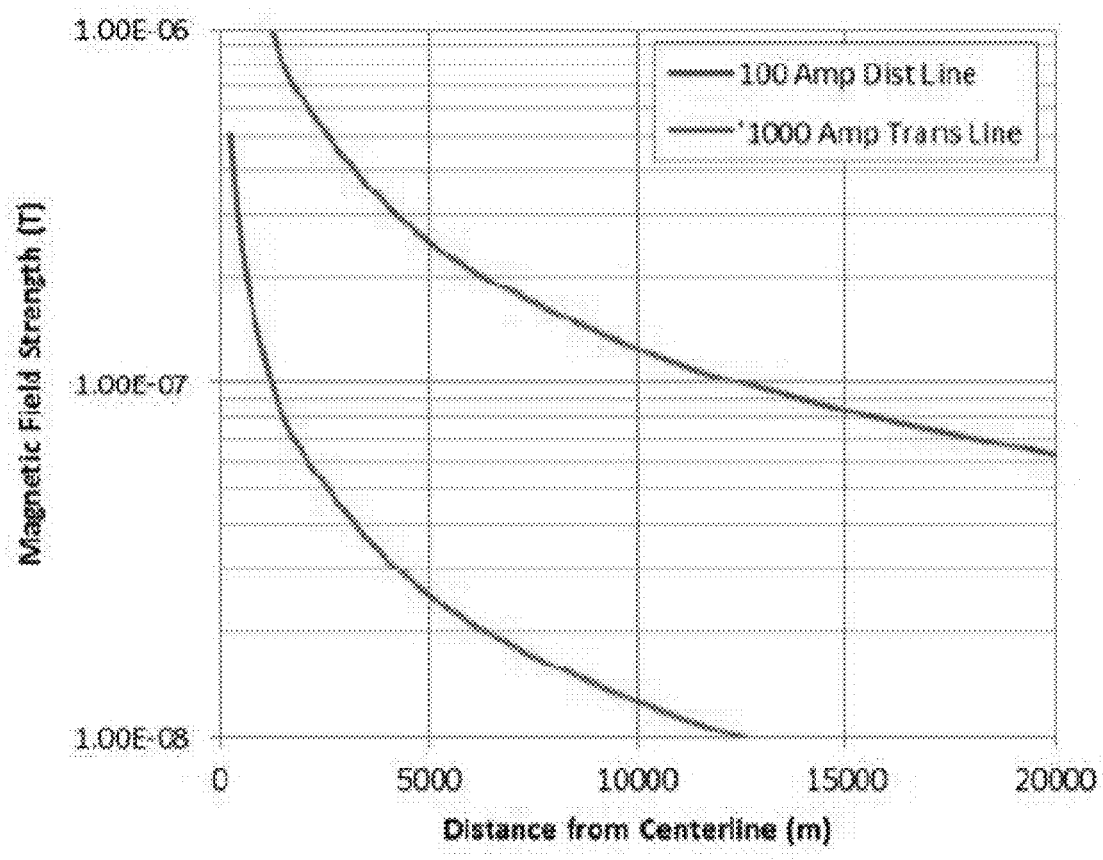
FIG. 49 illustrates examples of magnetic field strength of power lines as a function of distance from the centerline.

FIG. 49 illustrates examples of magnetic field strength of power lines as a function of distance from the centerline showing that even low current distribution lines can be detected to distances in excess of 10 km. Here it is understood that DNV sensors provide 0.01 uT sensitivity (1e-10 T), and modeling results indicates that high current transmission line (e.g. with 1000 A-4000 A) can be detected over many tens of km. These strong magnetic sources allow the UAS to guide itself to the power lines where it can then align itself using localized relative field strength and the characteristic patterns of the power-line configuration as described below.

Figure 50:
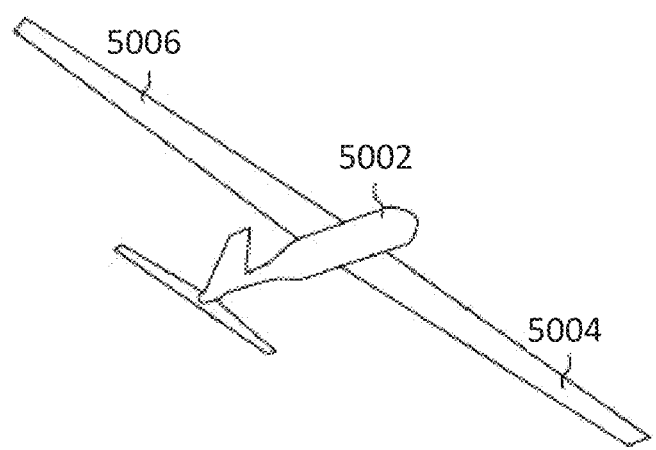
FIG. 50 illustrates an example of a UAS equipped with DNV sensors in accordance with some illustrative implementations.
Figure 51:
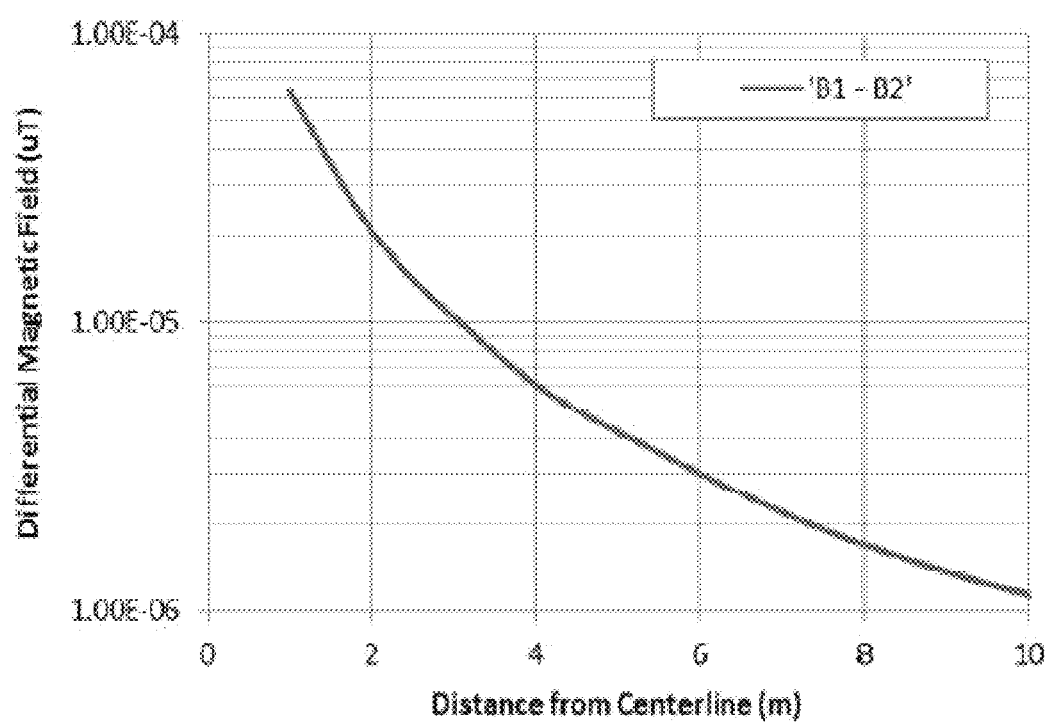
FIG. 51 illustrates a plot of a measured differential magnetic field sensed by the DNV sensors when in close proximity of the power lines in accordance with some illustrative implementations.

FIG. 50 illustrates an example of a UAS 5002 equipped with DNV sensors 5004 and 5006. FIG. 51 is a plot of a measured differential magnetic field sensed by the DNV sensors when in close proximity of the power lines. While power line detection can be performed with only a single DNV sensor precision alignment for complex wire configurations can be achieved using multiple arrayed sensors. For example, the differential signal can eliminate the influence of diurnal and seasonal variations in field strength. Not all of the depicted components may be required, however, and one or more implementations may include additional components not shown in the figure. Variations in the arrangement and type of the components may be made, and additional components, different components, or fewer components may be provided.

In various other implementations, a vehicle can also be used to inspect power transmission lines, power lines, and power utility equipment. For example, a vehicle can include one or more magnetic sensors, a magnetic waypoint database, and an interface to UAS flight control. The subject technology may leverage high sensitivity to magnetic fields of DNV magnetic sensors for magnetic field measurements. The DNV magnetic sensor can also be low cost, space, weight, and power (C-SWAP) and benefit from a fast settling time. The DNV magnetic field measurements allow UASs to align themselves with the power lines, and to rapidly move along power-line routes and navigate in poor visibility conditions and/or in GPS-denied environments. It is understood that DNV-based magnetic sensors are approximately 100 times smaller than conventional magnetic sensors and have a reaction time that that is approximately 100,000 times faster than sensors with similar sensitivity such as the EMDEX LLC Snap handheld magnetic field survey meter.

The fast settling time and low C-SWAP of the DNV sensor enables rapid measurement of detailed power line characteristics from low-C-SWAP UAS systems. In one or more implementations, power lines can be efficiently surveyed via small unmanned aerial vehicles (UAVs) on a routine basis over long distance, which can identify emerging problems and issues through automated field anomaly identification. In other implementations, a land based vehicle or submersible can be used to inspect power lines. Human inspectors are not required to perform the initial inspections. The inspections of the subject technology are quantitative, and thus are not subject to human interpretation as remote video solutions may be.

Figure 52:
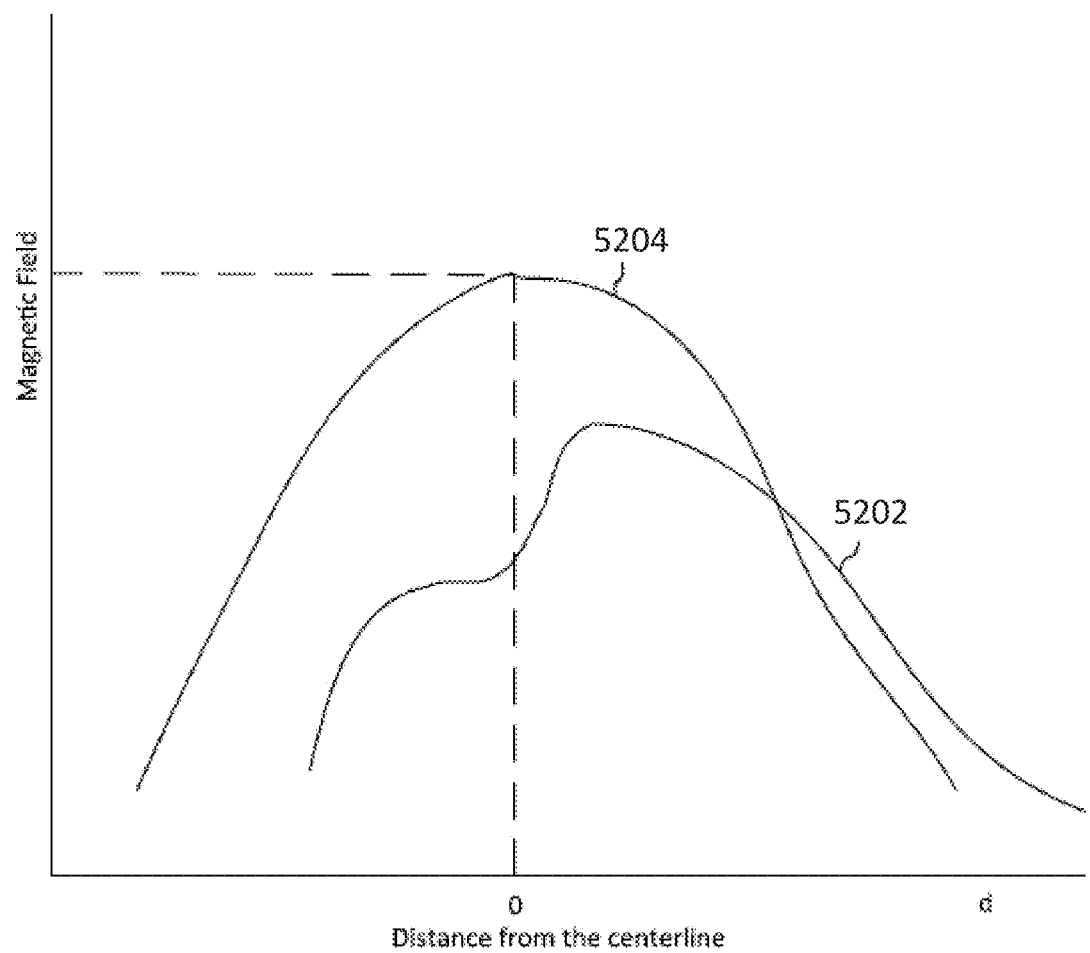
FIG. 52 illustrates an example of a measured magnetic field distribution for normal power lines and power lines with anomalies according to some implementations.

FIG. 52 illustrates an example of a measured magnetic field distribution for power lines 904 and power lines with anomalies 902 according to some implementations. The peak value of the measured magnetic field distribution, for the normal power lines, is in the vicinity of the centerline (e.g., d=0). The inspection method of the subject technology is a high-speed anomaly mapping technique that can be employed for single and multi-wire transmission systems. The subject solution can take advantage of existing software modeling tools for analyzing the inspection data. In one or more implementations, the data form a normal set of power lines may be used as a comparison reference for data resulting from inspection of other power lines (e.g., with anomalies or defects). Damage to wires and support structure alters the nominal magnetic field characteristics and is detected by comparison with nominal magnetic field characteristics of the normal set of power lines. It is understood that the magnetic field measurement is minimally impacted by other structures such as buildings, trees, and the like. Accordingly, the measured magnetic field can be compared to the data from the normal set of power lines and the measured magnetic field's magnitude and if different by a predetermined threshold the existence of the anomaly can be indicated. In addition, the vector reading between the difference data can also be compared and used to determine the existence of anomaly.

Mapping and Monitoring of Hydraulic Fracture Using Vector Magnetometers

The present disclosure is directed, in part, to mapping and monitoring of hydraulic fractures using vector magnetometers. Magnetic images are capture at various phases of the hydraulic fracturing operation (also referred to as "fracking"), which include padding and injection of fracking (frac) fluid and proppant, as described in more detail herein. The subject technology allows monitoring and adjustment of the fracking operation by providing a map of the distribution of the frac fluid and proppant in various stages.

The disclosed solution can be used in conjunction with micro-seismic monitoring. Micro-seismic monitoring is very challenging due to the fact that initial times for the shear fracture events are unknown, which results in large uncertainty in the depth migration problem of seismic processing. Other limiting factors include observation of only shear fractures, and the fact that fracture events themselves don't indicate whether or not the induced fracture was effectively propped open subsequent to removal of pressurized frac fluid.

The subject solution provides indication of proppant penetration into the fracture network during and subsequent to the frac process, which is the key to better controlling the overall fracking process. Fracking is typically a multiple stage or zonal process per each well. The disclosed solution also enables adapting initial frac plan to evolving conditions.

Figure 53A:
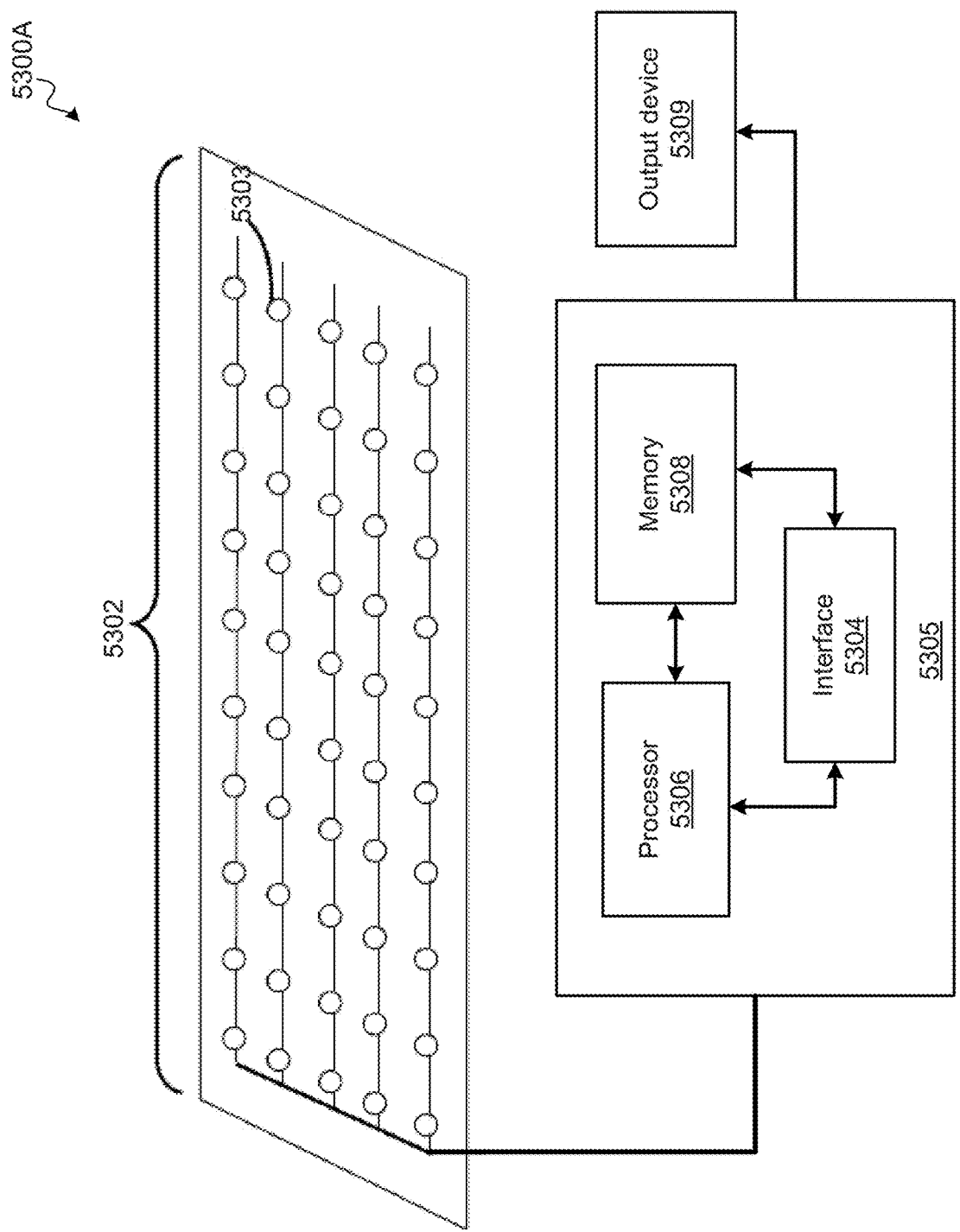
FIGS. 53A-53B are diagrams illustrating examples of a high-level architecture of a system for mapping and monitoring of hydraulic fracture and an environment where the system operates, according to certain embodiments.
Figure 53B:
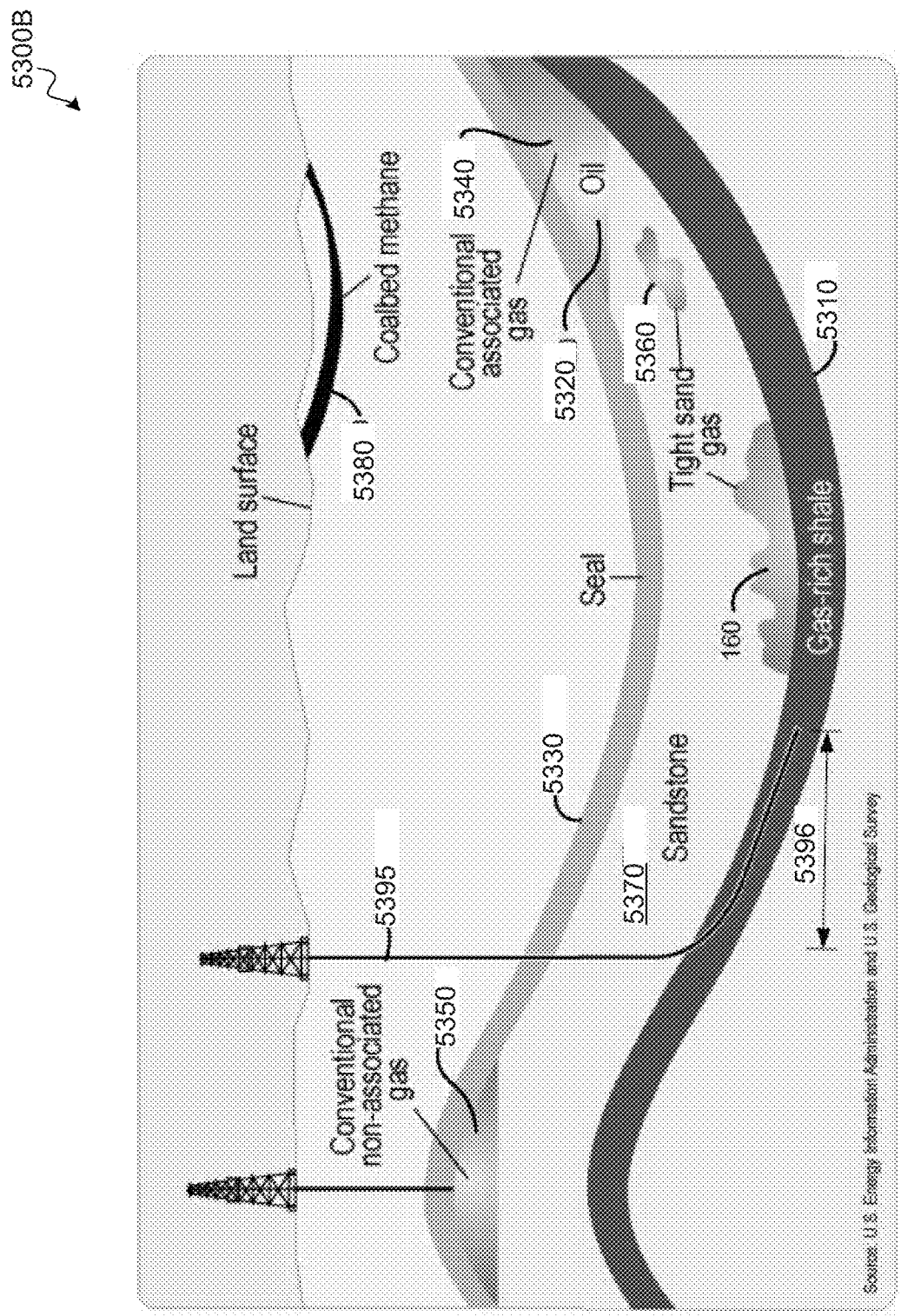

FIGS. 53A-53B are diagrams illustrating examples of a high-level architecture of a system 5300A for mapping and monitoring of hydraulic fracture and an environment 5300B where the system operates, according to certain embodiments. The system 5300A includes a sensor array 5302 including multiple sensors 5303, an analyzer 5305, and an output device 5309. Each sensor 5303 includes at least a magnetometer communicatively coupled to the analyzer 5305. The analyzer 5305 includes one or more processors 5306, memory 5308 and an interface 5304. Each sensor may communicate data signal to the analyzer 5305. The communication between the sensors and the analyzer 5305 may be wired, optical, or wireless communication. The analyzer 5305 may communicate with the sensors 5303 individually or with the sensor array 5302 through the interface 5304 to receive sensor data. The analyzer 5305 may store the sensor data received from the sensors 5303 or the sensor array 5302 to the memory 5308. The stored data may be accessed by processor(s) 5306 for processing the data subsequent to the sensors storing their respective data. The processor(s) 5306 may be configured to receive executable instructions for processing the data according to the constrained geophysical processing described herein. The signals produced by the sensor array 5302 may include magnetic imaging data for generation of a magnetic profile of a region defined by the well which is intended to be processed using hydraulic fracturing. Each magnetometer sensor 5303 may save its vector field measurement every few minutes throughout the entire fracking process. All saved data is time tagged by some simple means such as a common clock or a trigger for later processing of the data.

The memory 5308 is in communication with processor 5306 and the interface 5304. Memory 5308 may store information, such as the sensor array 5302 signals received by the analyzer 5305. Further, memory 5308 may store magnetic images or signals that have been received from sensor array 5302 and further processed by processor(s) 5306. The interface 5304 communicates data from the analyzer 5305 to an output device 5309. The output device 5309 may be any device or apparatus that can communicate information about the processed signals received from sensor array 5302. For example, the output device 5309 may be a display configured to display a graphical depiction of a well site, including a mapping of an induced fracture network produced during hydraulic fracturing. In some aspects, the output 5717 may be a printing device providing information (e.g. reports) relating to a hydraulic fracturing operation.

In one or more implementations, the sensors 5303 are arranged in a sensor array 5302 and communicatively connected to analyzer 5305. The sensors 5303 may include a magnetometer for measuring a magnetic field in the proximity of the sensor 5303, which is communicated to the analyzer 5305. The magnetic fields measured by sensor array 5302 may be related to a well being processed using hydraulic fracturing. The magnetic field measured by the sensors 5303 may include magnetic fluences relating to the Earth's magnetic field, as well as remnant magnetism in the rock formation and magnetic properties of the well apparatus itself, such as the well casing. As the well is fractured by injecting fluid and proppants into the well bore at selected stages along the bore, the magnetic field in the region of the hydraulic fluids and proppants affect the surrounding magnetic fields that are subsequently measured by the sensors 5303. As hydraulic fracturing proceeds in the well, subsequent magnetic images are captured by the sensor array 5302 and communicated to the analyzer 5305. The received magnetic images are processed by processor(s) 5306 to determine changes in the magnetic profile between successive magnetic images captured by the sensor array 5302. The changes are processed to map the distribution of frac fluid and proppant in the well, which are indicative of the induce fracture network into which the fluid and proppant has flowed during hydraulic fracturing.

FIG. 53B shows the environment 5300B, which is representation of the geology of natural gas resources. The growth of natural gas reserves and production from shale formations has sparked interest in the nation's natural gas resources. The diagram in FIG. 53B shows the geologic nature of most major sources of natural gas in the United States in schematic form. Gas rich shale 110 is the source rock for many natural gas resources, but until recently, has not been a focus for production. Horizontal drilling and hydraulic fracturing have made shale gas an economically viable alternative to conventional gas resources. Conventional gas accumulations 5340, 5350, or plays, occur when gas migrates from gas-rich shale into an overlying sandstone formation, and then becomes trapped by an overlying impermeable formation, called the seal 5330. Associated gas 5340 accumulates in conjunction with oil 5320, while non-associated gas 5350 does not accumulate with oil. Tight sand gas accumulations 5360 occur when gas migrates from a source rock into a sandstone formation 5370, but is limited in its ability to migrate upward due to reduced permeability in the sandstone. Finally, coal bed methane 5380 does not originate from shale, but is generated during the transformation of organic material to coal.

Conventional gas accumulations 5340, 5350 may be accessed via horizontal drilling techniques in which the well bore is substantially vertical. To access non-conventional plays such as gas-rich shale formations 5310, horizontal drilling techniques in which the well bore 5395 extends substantially horizontally 5396 may be needed. Generally, the permeability of unconventional reservoirs is too low for production, thus requiring directional drilling and well stimulation. For example, the permeability of a typical shale formation may be on the order of $10^{-9}$ Darcy. Tight sand formations may have permeability of about $10^{-6}$ Darcy. In contrast, a conventional play may have permeability of $10^{-2}$ Darcy.

Figure 54:
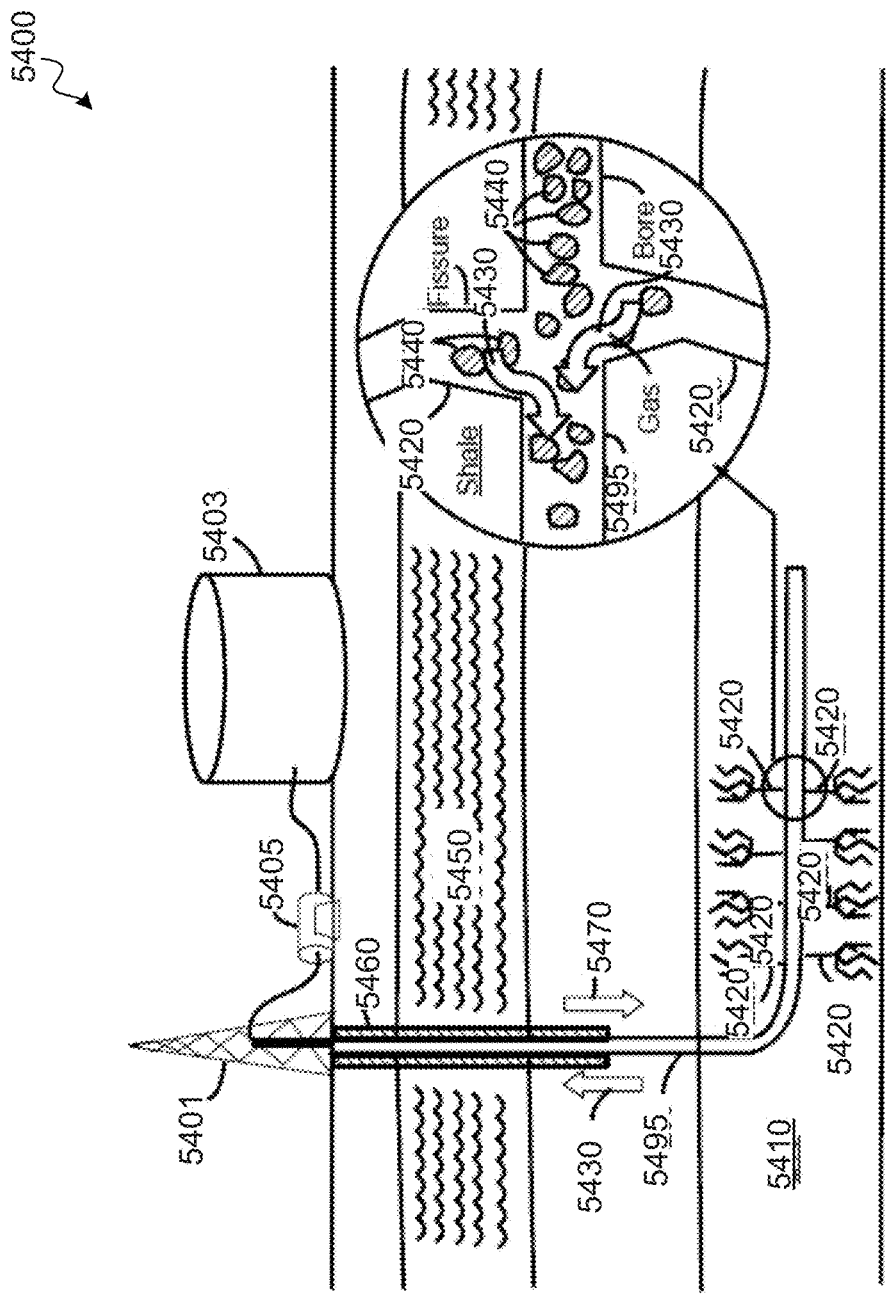
FIG. 54 is a high-level diagram illustrating an example of implementation of hydraulic fracturing of a well to release gas reserves, according to certain embodiments.

FIG. 54 is a high-level diagram illustrating an example of implementation of hydraulic fracturing of a well to release gas reserves, according to certain embodiments. A well head 5401 is installed at ground level and attached to a water supply from a storage container 5402 via a pump 5402. The pump provides a frac fluid at a sufficient pressure in the well bore 5480 to produce fracturing of the underlying shale layer 5410. Natural gas trapped within the natural fissures 5420 in the shale layer 5410 are released as the newly formed fractures expand existing fissures while creating newly induced fractures and pathways through the remaining shale formation 5410.

Shale is a finely grained sedimentary form of rock. Spaces between the grains are typically very small. As natural gas is formed, some of the gas becomes trapped within these small spaces. Using conventional mining and drilling techniques these trapped resources are difficult to access. Despite the resource richness of these sources, the production from wells in these types of formations has proven to be economically infeasible. Yet despite the inability to access the trapped gas due to the high impermeability of the shale, the shale contains a high volume of pore space that may contain substantial amounts of gas collected over long geological timeframes. Hydraulic fracturing provides access to this pore space, allowing the trapped gas 5430 migrate toward the well bore 5480 and be collected at the well head 5401.

Frac fluid is stored near the well head 5401 in storage container 5402. The frac fluid is provided to the well bore 5480 under pressure provided by the pump 5402. The frac fluid is primarily water, but other additives or chemicals may be added to the frac fluid. For example, water pumped into the shale layer 5410 at pressure, creates new fractures in the grains of the shale formation. When the pressure is relieved, such as by turning off the pump 5402, the newly formed cracks in the shale tend to reclose under the pressure caused by the mass of the overlying layers. To maintain the openings created by the hydraulic pressure, a substance called a proppant 5440 is added to the frac fluid. The proppant 5440 props open the newly formed cracks 5420 to allow the trapped natural gas 5430 to migrate toward the well bore 5480. The proppant 5440 typically includes sand, which has a compressibility sufficient to maintain the openings in the shale, while providing enough permeability to allow the migration of the natural gas within the shale formation. While frac sand is a commonly used proppant, other materials, for example, aluminum beads, ceramic beads, sintered bauxite and other materials may be used, provided the material is crush-resistant and provides adequate permeability.

Other materials or chemicals may be added to frac fluid to provide additional functionality. For example, thickening agents may be added to the frac fluid to form a gel, which is effective at carrying the proppant particles deep into the rock formation. Other chemicals may be added to reduce friction, maintain rock debris from the fracking process in suspension for ease of removal, prevent corrosion of equipment, kill bacteria, control pH, as well as perform other functions.

The frac fluid is introduced to the well bore 5480 under pressure (as indicated by arrow 5470) and enters the natural fissures 5420 located within the shale layer 5410. Hydrostatic pressure builds in the shale until the pressure creates force which exceeds the tensile strength of the shale grains causing the grains to fracture and split. The entire well bore 5480 does not need to be pressurized. Plugs may be placed beyond the regions of shale being targeted for fracturing to produce the desired pressure within a targeted region or stage.

The well bore 5480 may extend from the surface for thousands of feet to reach the shale layer 5410 below. Overlying layers, include the aquifer 5450 which may provide the water supply for the area surrounding the well 5400. To protect the water supply from contamination, the well bore 5480 is lined with a steel casing 5460. The space between the outside of the steel casing 5460 and the walls of the well bore 5480 are then filled with concrete to a depth greater than the aquifer 5450. As the well bore 5480 approaches the depth containing the gas-rich shale formation 5410, the well bore 5480 is angled to a horizontal or nearly horizontal direction to run longitudinally through the shale formation 5410. As the pressurized frac fluid is applied to the shale layer 5410 the existing fissures 5420 are expanded and newly formed fractures are created. As shown in detail in the inset of FIG. 54, the frac fluid and proppant 5440 enter the existing fissures 5420 and create new fissures. Proppant particles 5440 contained in the frac fluid hold the fissures open and provide permeability for gas 5430 located within the fissures to migrate through the frac fluid and proppant particles to the well bore 5480 and back to the surface.

During production of a non-conventional play, a horizontal pay zone extending about 4,000 feet through the pay zone may be established. Fracturing is performed along the horizontal pay zone in typically uniform stages extending about 400 feet. For a typical fractured well, 10-20 million square feet of additional surface area is created by the fractures. The fracking is performed beginning at the toe or end of the well, and processed stage by stage back toward the well opening. Fracking a typical well requires about 2.5 million pounds of proppant and about 4-6 million gallons of frac fluid. The fracturing process seeks to push proppant radially out from the well bore into the formation up to 1,000 feet. Ideally, fractures create sheet-like openings that extend orthogonally to the direction of the well bore. To this end, wells are typically drilled based on prior knowledge of the in situ stress state of the rock formation. Spacing for the fracturing stages are selected based, at least in part, on the anticipated induced fracture and empirically determined flow rates into the fracture network to ensure that production is commensurate with the intended 20-30 year life expectancy of a typical well installation. A production field may contain a number of wells configured as described above. The wells are spaced according to the corresponding designed pay zone of each well. The use of hydraulic fracturing is intended to maximize the stimulated rock volume (SRV) per dollar cost of production.

Experience has shown, however, that induced fractures define complicated networks of fractures rather than the ideal sheet-like openings. Accordingly, mapping the occurrence and location of actual fractures becomes valuable in determining the effectiveness of the current operations, and provides insight into future actions to maximize production efficiency of the well. Factors that create uncertainty in the hydraulic fracturing process include the loss of frac fluid and proppants to pre-existing or natural fractures which may open further during the fracking process. Injected fluid and proppant is accommodated, (e.g., space/volume become available) by the compliance of the surrounding rock which becomes compressed, and thereby alters the rock's stress state. This changes the stress field from one stage's fracture to the next. This results in added uncertainty as to the final placement of proppants to maintain openings formed by the fracking after the hydraulic pressure is removed.

Mapping induced fractures caused by hydraulic fracturing allows for greater production and maximized stimulated reservoir volume (SRV). In addition, concerns expressed over the process of fracking, including the proliferation of the fracking materials into the environment, may require accurate mapping of induced fractures and the introduction of frac fluids and proppants to those fractures to meet further regulatory requirements designed to control and regulate impact to the environment caused by hydraulic fracturing.

Presently, attempts at mapping fractures include passive micro-seismic monitoring. In micro-seismic monitoring, a passive array of seismic sensors is arranged at the surface overlying the fractured pay zone, or the sensors may be placed down hole in the fracked well or in a nearby observation well. The seismic sensors are configured to detect shear pops that occur when an induced tensile crack intersects with a natural fracture which emits a popping type of impulse. The impulses are converted to signals which are processed to determine the source of the impulse. Micro-seismic monitoring is passive. That is, no active seismic signal is generated and used to create returned signals. The sensors merely monitor the surroundings for seismic activity if and when such activity occurs. Since it not known when a fracture may be induced by the hydraulic pressure, or where such fractures may occur, there is considerable uncertainty in seismic monitoring. This uncertainty is compounded by the very low energy seismic signals which must be detected. Further, seismic monitoring does not provide insight as to the effective placement of proppants, as the impulses used to generate signals occur at the initiation of an induced fracture and do not indicate if the fractures were successfully propped open, or reclosed after the initial fracture. Therefore, it is difficult to verify that the mapping information generated is reliable. The subject solution may be used alone or in cooperation with existing techniques including micro-seismic monitoring.

According to one or more implementations, an array of sensors is placed on or near the surface of a well or active pay zone. The array of sensors includes at least a magnetometer sensor for measuring a magnetic field around the sensor. In an alternative embodiment, one or more of the magnetometer sensors may be placed down hole in the well, although this is not a requirement and a system may be embodied using solely surface arrays. The environment around the well has a magnetic signature that may be measured by the sensor array. For example, the Earth's magnetic field will influence the overall magnetic signature in the area of the well. Additionally, remnant sources of magnetic fields, such as the host rock or intrusions of magnetite further influence the magnetic field sensed by the array of magnetometer sensors. Further, as the well casing is driven down in the well bore, the well casing tends to become magnetized, thereby affecting the magnetic field measured at the magnetometer sensor array.

According to an embodiment, a process includes placing an array of sensors proximate to a well pay zone. Prior to introducing any frac fluid for hydraulic fracturing, a baseline magnetic profile is established by measuring the magnetic signature prior to any hydraulic fracturing being performed. The baseline magnetic signature includes the Earth's magnetic field, remnant sources of magnetism in the earth and the magnetic field which is associated with the well casing. The magnetometer sensor may be based on a diamond nitrogen vacancy (DNV) sensor. A DNV sensor includes a synthetic diamond substrate which is created having intentional impurities introduced into the carbon lattice structure of the diamond. Nitrogen atoms replace the carbon atoms at varying locations in the lattice, thereby creating vacancies which contain electrons. The electrons have various spin states which may be measured. The spin states are sensitive to the surrounding magnetic environment. As the magnetic environment changes, the spin states of the electrons change and the difference in spin may be correlated to the corresponding change in the magnetic environment. Magnetometers based on DNV technologies are very sensitive and can detect small changes in magnetic fields in a sensor which is considerably smaller than other technologies. For example, a typical conventional magnetometer capable of detecting small changes in the magnetic profile of a well's pay zone may require a sensor which is the size of a small van. In contrast, a DNV based magnetometer may be embodied in a sensor the size of a cellular telephone or smaller. Thus, a number of small, very sensitive magnetometers can be carried on site and arranged in an array about the surface in the area defining the well pay zone.

Figure 55A:
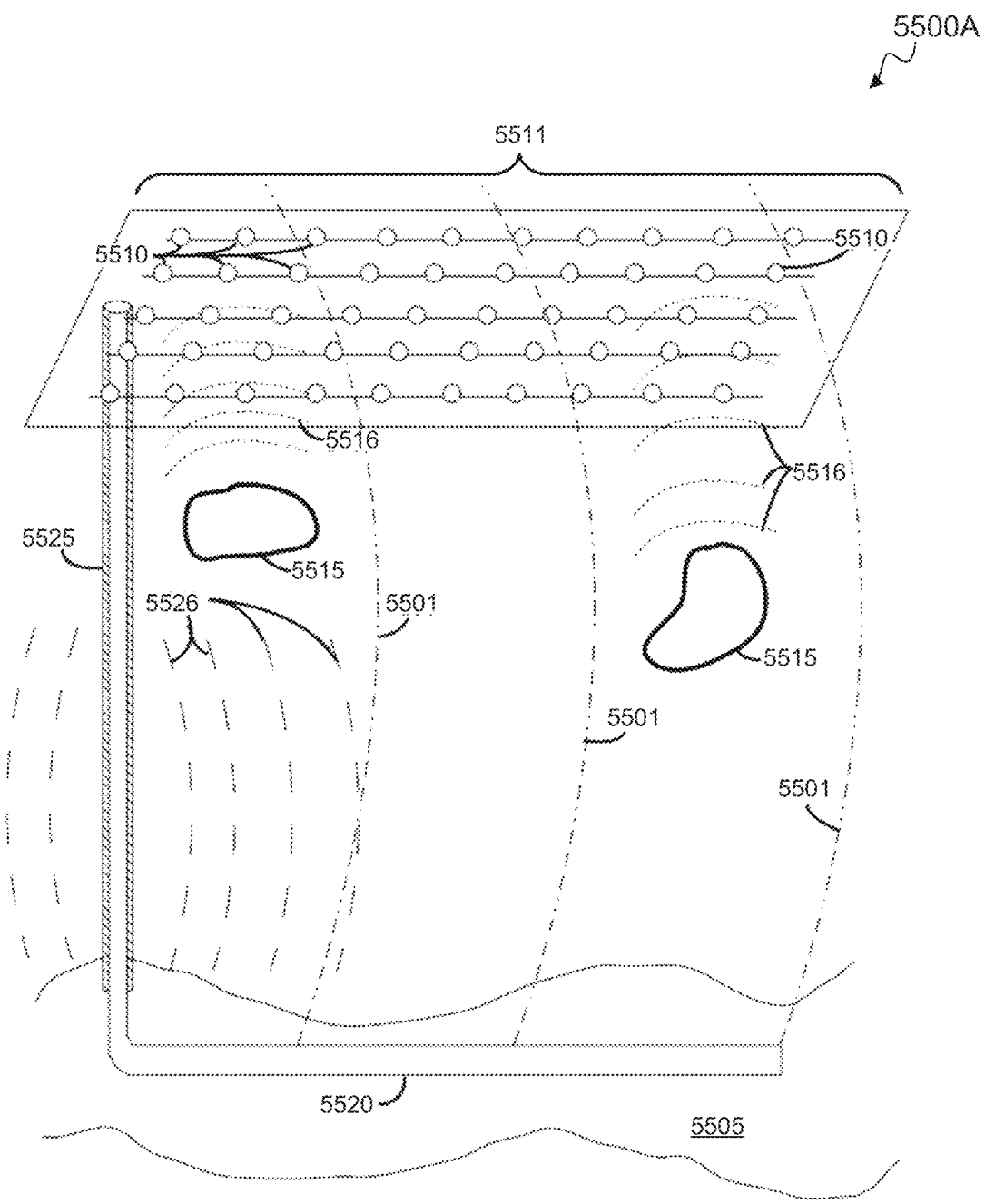
FIG. 55A is a diagram illustrating an example background magnetic signature of a well, according to certain embodiments.

FIG. 55A is a diagram illustrating an example background magnetic signature 5500A of a well, according to certain embodiments. A well may include a bore 320 that is drilled vertically from the surface to a desired depth, at which point the bore 320 is extended horizontally along the pay zone. A well casing 5525 is inserted into the bore to insulate the well bore 320 from the surrounding rock formation and to prevent introduction of mining materials into the surrounding rock near the surface. As the well casing 5525 is driven into the rock formation, the casing tends to become magnetized and form the magnetic field 5526. The surrounding rock formation contains naturally occurring remnant magnetism 5516 which may be in the host rock or intrusions of other materials such as magnetite 5515. In addition, the Earth has its own global magnetic field 5501 that extends through the area defined by the well and its pay zone.

Figure 55B:
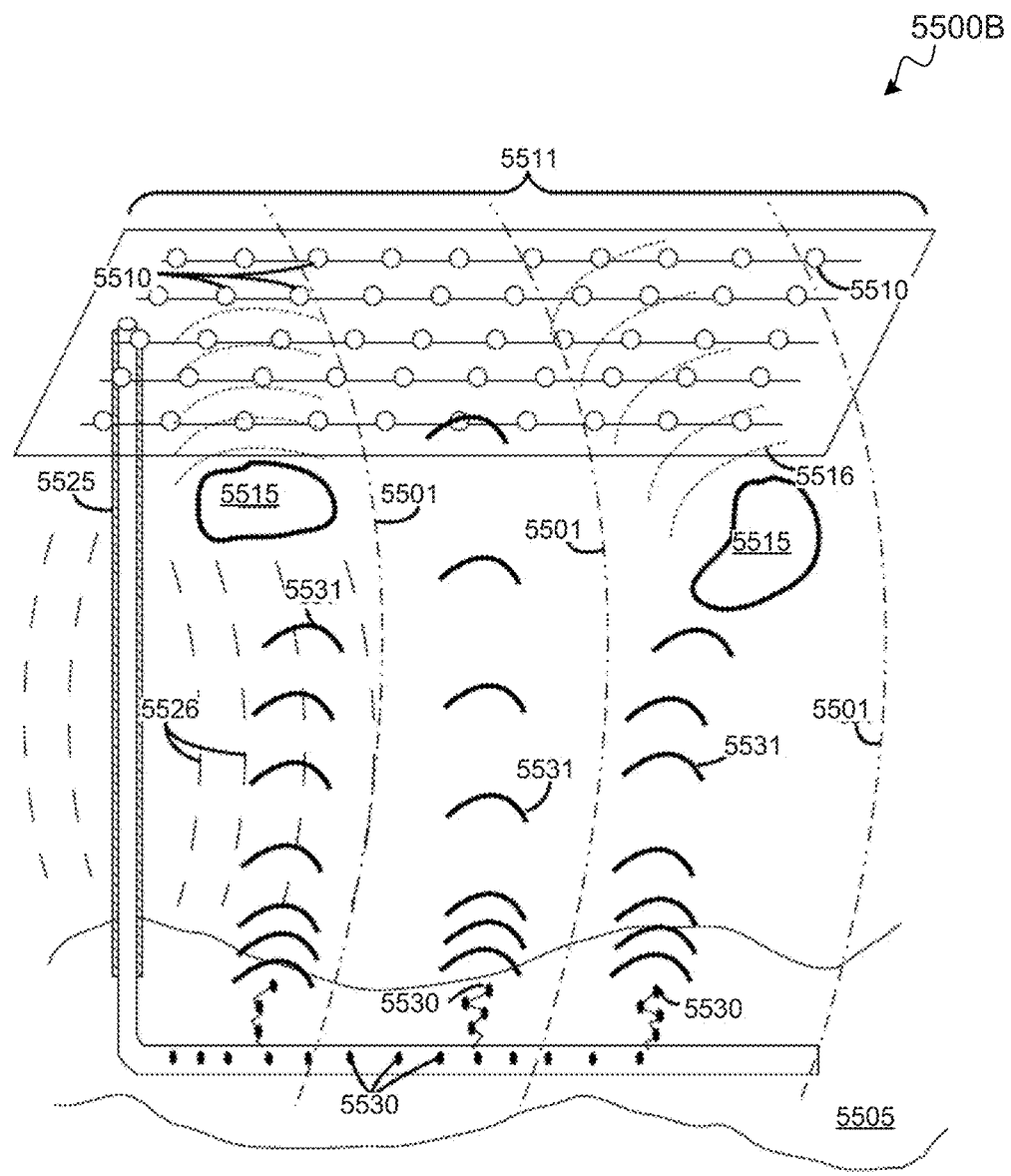
FIG. 55B is a diagram illustrating an example implementation of a mapping system for hydraulic fracturing of the well shown in FIG. 3A, according to certain embodiments.

FIG. 55B is a diagram illustrating an example implementation of a mapping system 5500B for hydraulic fracturing of the well shown in FIG. 55A, according to certain embodiments. The mapping system 5500B includes the sensor array 5511 including magnetometer sensors 5510 arranged on the surface in an area defining the pay zone of the well. According to some aspects, a one-to-one placement of magnetometers with geophones (e.g., for concurrent micro-seismic mapping) at the surface may be used. This configuration provides a wide aperture and allows for triangulating locations. The addition of magnetometer data requires minimal modification to procedures already established for micro-seismic techniques. Where the well is cased, monitoring the opened holes may involve introducing sensors at a subsurface level. Downhole placements of sensors may also be used to provide much stronger signals.

The sum of the magnetic fields created by the Earth's magnetic field 5501, the remnant magnetism in the host rock 5515, and additional magnetic influence of the mining materials, such as the well casing 5526, define a baseline magnetic field of the well region which is measured by the array of magnetometers at the surface before any introduction of fracking material into the well bore 5520. Frac fluid is introduced at high pressure to the well bore opening and the well bore 5520 is filled with the fluid through the bore 5520 to the toe of the well which initiates fractures in the rock. The fluid introduced prior to introducing proppant and other additives to the fluid is called padding. A typical well may receive millions of gallons of frac fluid in addition to millions of pounds of proppant 5530. This large additional mass is received by the surrounding formation and may affect the surrounding magnetic signature. For this reason, the sensor array 5511 may be configured to measure the baseline magnetic signature of the well adjusted for the additional mass provided by the padding fluid and proppant 5530.

After the baseline magnetic signature has been measured, introduction of additional frac fluid and proppant 5530 to the well may begin. The fluid is provided to the well in stages. A typical 4,000 foot horizontal pay zone may be hydraulically fractured in stages of about 400 feet at a time. In some aspects, the first stage is the length of the well bore 5520 closest to the toe. Subsequent stages are processed sequentially, working from the toe back to the well opening. As the frac fluid is introduced to a new stage, the sensor array 5511 measures the magnetic signature of the well pay zone region. The addition of the fluid causes hydraulic fracturing of the rock 5505 surrounding the horizontal well bore in the area of the stage presently being processed. Changes from the baseline measured magnetic signature indicate the presence of the additional fluid and proppant 5530 as it extends into the new induced fractures caused by the pressurized fluid. The changes may be monitored as subsequent stages are processed, with incremental changes in the measured magnetic signature being analyzed to provide insight into the progress and location of the newly formed fracture network.

To augment the information received at the sensor array as each stage is processed, the frac fluid and/or the proppant 5530 may be treated or infused with a magnetically susceptible material. For example, small ferrite particles may be added to the proppant particles 5530. The ferrite particles have a greater effect on the overall magnetic signature of the area to which they are introduced due to their magnetic susceptibility. According to some implementations, the proppant 5530 is mixed with a magnetically susceptible material. In other implementations, the frac fluid may be mixed with the magnetically susceptible material, or both the fluid and the proppant 5530 may be treated with the magnetically susceptible material. The differential magnetic signature is determined based on measuring the magnetic signature with the magnetometer sensor array after the magnetically susceptible proppant or fluid is added to a processing stage, and compared with the previous measured magnetic signatures measured prior to the addition of the proppant or fluid.

When adding a magnetic susceptible material to the frac fluid or the proppant 5530, the material is selected such that the addition of the material does not substantially increase the weight of the proppant of fluid. Along the horizontal pay zone, fractures in the rock extend in varying directions in a web-like manner radially from the horizontal well bore. Therefore, as the well is hydraulically fractured, the frac fluid and proppant 5530 must flow from the well bore in all radial directions, including upward against the force of gravity. If the added magnetically susceptible material adds too much weight to the fluid or the proppant 5530, the heavier material will tend to settle due to gravity and not flow into the upward regions of the surrounding rock formation.

A sequence of changes in the passive magnetic images captured by the magnetometer sensors during the fracking process are used to determine the proppant placement. The frac fluid and/or the synthetic proppant may be doped with a magnetically susceptible material. Monitoring of the hydraulic fracturing process continues as multiple magnetic images are captured throughout the proppant injection phase. The background or baseline magnetic profile is removed from the images formed throughout the propping phase. Constrained geophysical processing of the resulting group of magnetic images provides information about the distributions of fluid and proppant.

Figure 56:
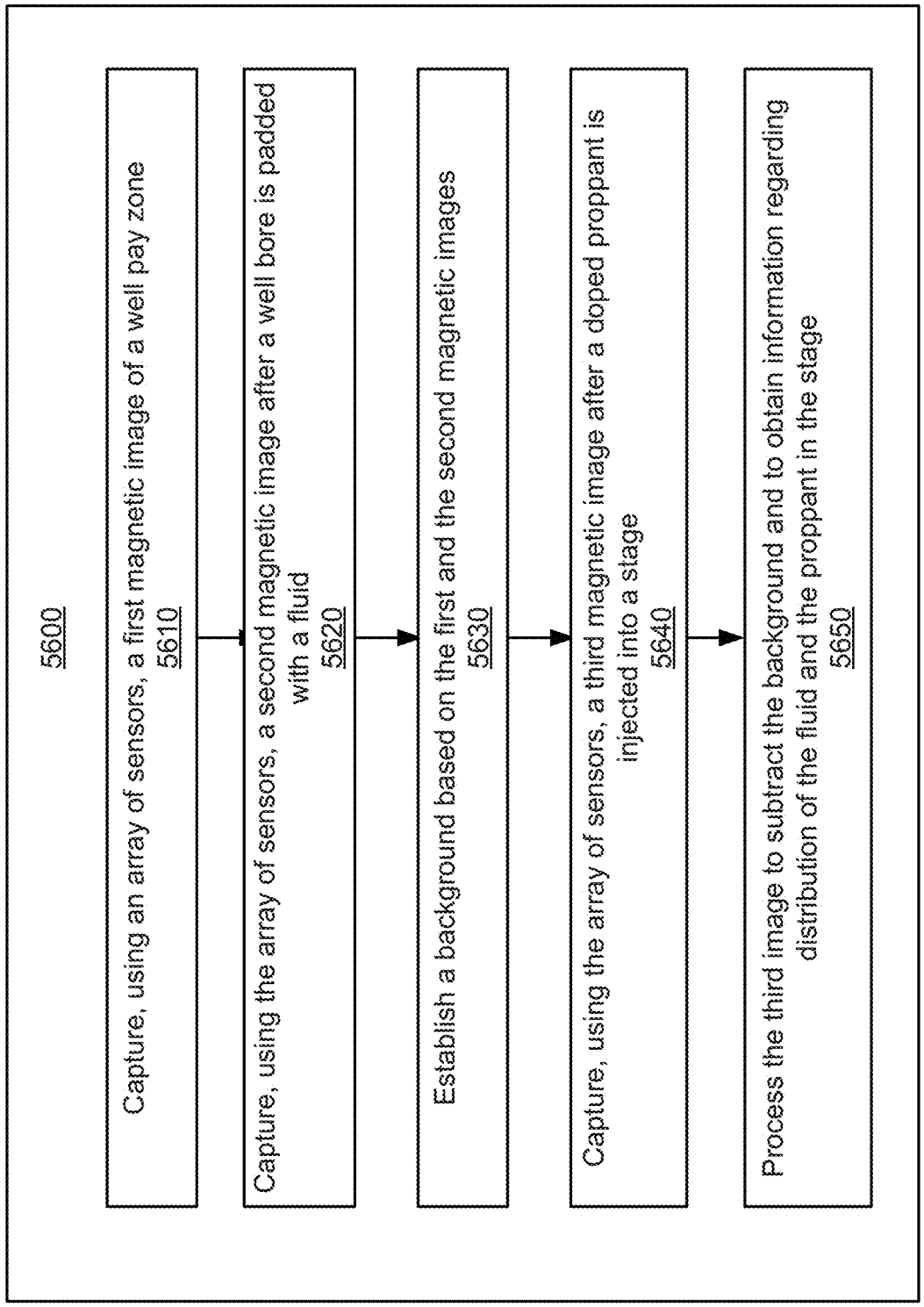
FIG. 56 is a diagram illustrating an example of a method for mapping and monitoring of hydraulic fracture, according to certain embodiments.

FIG. 56 is a diagram illustrating an example of a method 5600 for mapping and monitoring of hydraulic fracture, according to certain embodiments. According to the method 5600, using an array of sensors (e.g., 5302 of FIG. 53A or 5511 of FIG. 55A), a first magnetic image of a well pay zone (e.g., 5400 of FIG. 54) is captured (5610). Using the array of sensors, a second magnetic image is captured after a well bore (e.g., 5480 of FIG. 54) is padded with a fluid (5620). A background is established based on the first and the second magnetic images (5630). Using the array of sensors, a third magnetic image is captured after a doped proppant (e.g., 5440 of FIG. 54) is injected into a stage (e.g., 5420 of FIG. 54) (5640). The third image is processed to subtract the background and to obtain information regarding distribution of the fluid and the proppant in the stage (5650).

Figure 57:
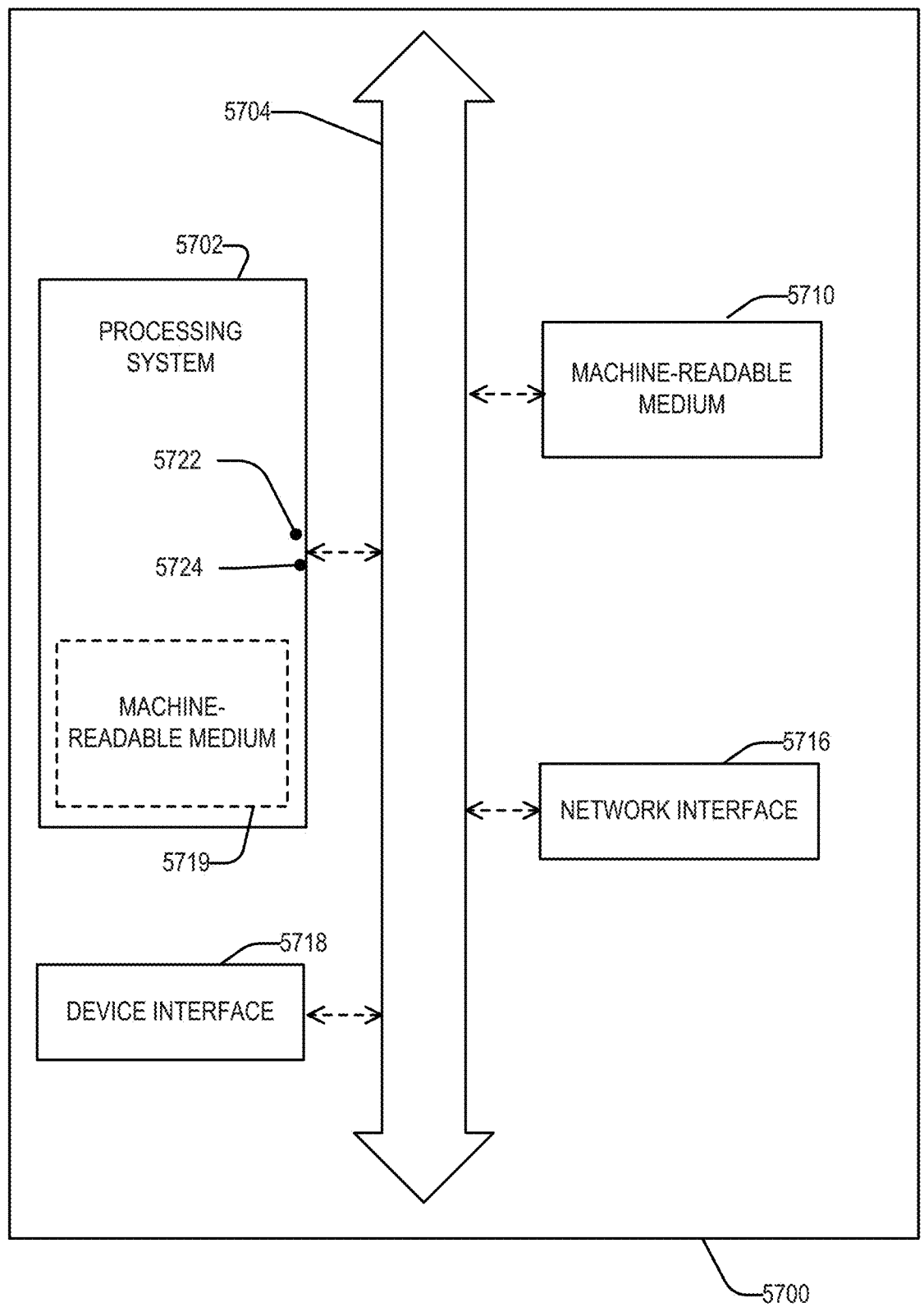
FIG. 57 is a diagram illustrating an example of a system for implementing some aspects of the subject technology.

FIG. 57 is a diagram illustrating an example of a system 5700 for implementing some aspects of the subject technology. The system 5700, for example, may be a system that the analyzer 5305 of FIG. 53A is implemented on or may perform the functionalities of the analyzer 5305 of FIG. 53A. In some implementations, the system 5700 may perform simulations described herein. The system 5700 includes a processing system 5702, which may include one or more processors or one or more processing systems. A processor can be one or more processors. The processing system 5702 may include a general-purpose processor or a specific-purpose processor for executing instructions and may further include a machine-readable medium 5719, such as a volatile or non-volatile memory, for storing data and/or instructions for software programs. The instructions, which may be stored in a machine-readable medium 5710 and/or 5719, may be executed by the processing system 5702 to control and manage access to the various networks, as well as provide other communication and processing functions. The instructions may also include instructions executed by the processing system 5702 for various user interface devices, such as a display 5712 and a keypad 5714. The processing system 5702 may include an input port 5722 and an output port 5724. Each of the input port 5722 and the output port 5724 may include one or more ports. The input port 5722 and the output port 5724 may be the same port (e.g., a bi-directional port) or may be different ports.

The processing system 5702 may be implemented using software, hardware, or a combination of both. By way of example, the processing system 5702 may be implemented with one or more processors. A processor may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable device that can perform calculations or other manipulations of information.

In one or more implementations, the transformation means (e.g., algorithms) and the signal processing of the subject technology may be performed by the processing system 5702. For example, the processing system 5702 may perform the functionality of the processor 5306 of FIG. 53A or other or computational functions or simulations described herein.

A machine-readable medium can be one or more machine-readable media. Software shall be construed broadly to mean instructions, data, or any combination thereof, whether referred to as software, firmware, middleware, microcode, hardware description language, or otherwise. Instructions may include code (e.g., in source code format, binary code format, executable code format, or any other suitable format of code).

Machine-readable media (e.g., 5719) may include storage integrated into a processing system such as might be the case with an ASIC. Machine-readable media (e.g., 5710) may also include storage external to a processing system, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device. Those skilled in the art recognizes how best to implement the described functionality for the processing system 5702. According to one aspect of the disclosure, a machine-readable medium is a computer-readable medium encoded or stored with instructions and is a computing element, which defines structural and functional interrelationships between the instructions and the rest of the system, which permit the instructions' functionality to be realized. Instructions may be executable, for example, by the processing system 5702 or one or more processors. Instructions can be, for example, a computer program including code for performing methods of the subject technology.

A network interface 5716 may be any type of interface to a network (e.g., an Internet network interface), and may reside between any of the components shown in FIG. 57 and coupled to the processor via the bus 5704.

A device interface 5718 may be any type of interface to a device and may reside between any of the components shown in FIG. 57. A device interface 5718 may, for example, be an interface to an external device that plugs into a port (e.g., USB port) of the system 5700.

Figure 58:
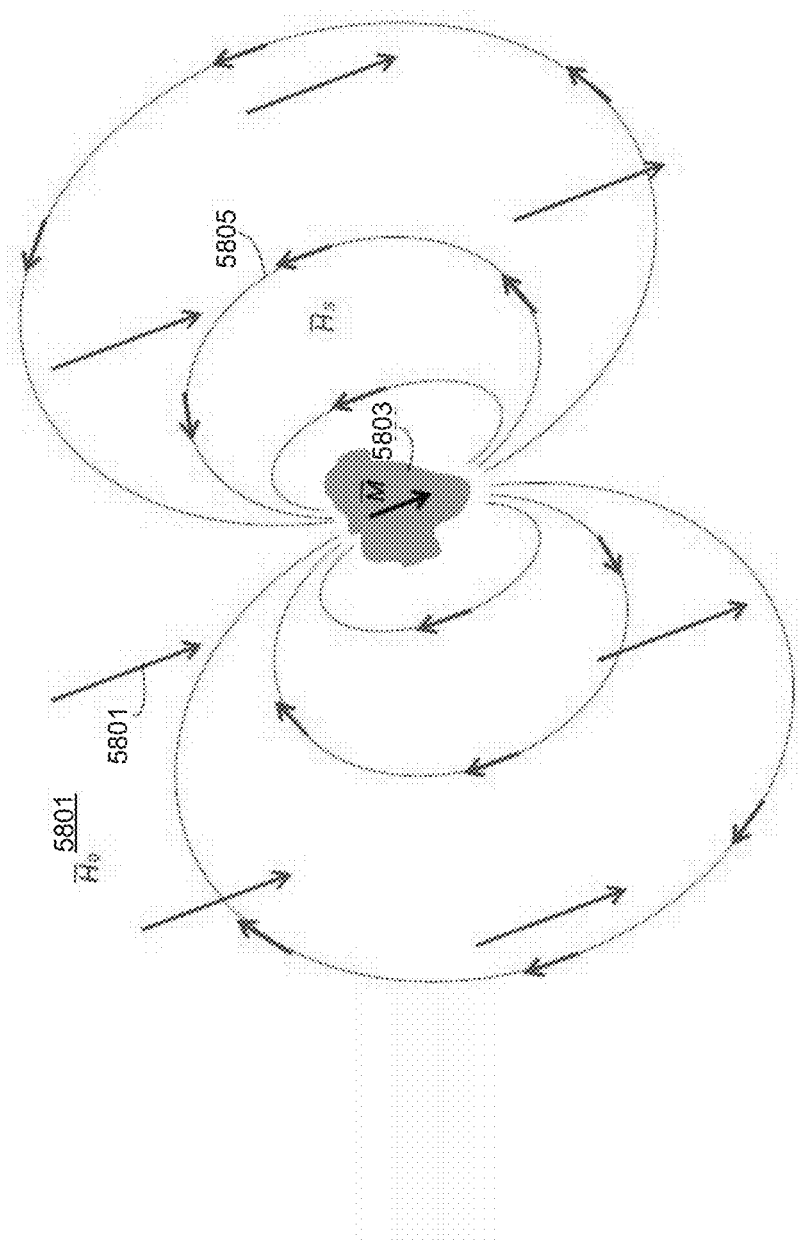
FIG. 58 is a diagram illustrating examples of primary and secondary magnetic fields in the presence of a doped proppant, according to certain embodiments.

FIG. 58 is a diagram illustrating examples of primary and secondary magnetic fields in the presence of a doped proppant, according to certain embodiments. According to an aspect of the disclosure, FIG. 58 depicts a scenario wherein proppant doped with magnetically susceptible matter 5803 (e.g. the dopant) becomes magnetized and aligns with an external magnetic field, $\vec{H}_0$ 5801. Such external magnetic field may consist of the Earth's natural (geomagnetic) field, as well as possibly that of the surrounding rocks having remnant magnetization, and a magnetized well casing. The external field 5801 is commonly/synonymously referred to as the primary, background, or inducing field, which may be represented as a vector quantity having strength or magnitude, and direction.

Magnetization is also represented as a vector quantity, and the magnetization of the volume of doped proppant 5803 depicted below is labeled $\overline{M}$. Upon becoming magnetized, the susceptible proppant 5803 gives rise to an induced or secondary field 5805, $\vec{H}_s$. The induced field 5805 is distinct from, but caused, by the primary field 5801. The total magnetic field is then determined as the superposition of the primary field 5801 and secondary field 5805. In the simplest case (e.g. isotropic), magnetization relates to the total field by a scalar-valued susceptibility $\chi$, according to:

$$\overline{M} = \chi \overline{H} = \chi(\overline{H}_0 + \overline{H}_s) \qquad \text{Eq. (1)}$$

In a non-limiting embodiment, a standard approximation may be made which assumes the primary field 5801 is significantly greater than the secondary field 5805. Thus, the system's calculation may be made according to $\overline{M} \approx \chi_0$ and wherein the magnetization is parallel to the primary field 5801 and is linearly proportional to it through the susceptibility at any given location.

Generally, the vector field at an observation or measurement point P due to a distribution of magnetized matter (e.g. doped proppant) within a source region $\Omega$ is given by:

$$\vec{H}(P) = \vec{H}_0(P) + \vec{H}_S(P) \qquad \text{Eq. (2)}$$
$$= \vec{H}_0(P) + \frac{1}{4\pi} \int \int \int_\Omega \overline{M}(\xi) \cdot \nabla \nabla \frac{1}{\rho(P,\xi)} d\Omega$$

Given the quantities as previously defined, and $\xi$ taking on all locations within the relevant source magnetic region. However, using the standard approximation this reduces to a model for the secondary field 8505 depending on the susceptibility distributed throughout the relevant (i.e., non-negligible magnetic source) domain:

$$\vec{H}_S(P) = \frac{1}{4\pi} \int\int_\Omega \int \chi(\xi)\vec{H}_0(\xi) \cdot \nabla\nabla \frac{1}{\rho(P,\xi)} d\Omega \qquad \text{Eq. (3)}$$

The magnetic source domain for an embodiment of the disclosure comprises the subsurface region surrounding the well that is being fracked, and extending outward from the well to a distance greater than the proppant would reasonably be expected to reach.

If the primary field 5801 existing prior to injecting any doped proppant or frac fluid is complicated by unknown but significant remnants, then Eq. (2) may be used and the magnetization vector may be solved. Alternatively, Eq. (3) may be used to solve for the scalar susceptibility distribution assuming the primary field vector is known throughout the domain of interest, which is taken to be Earth's geomagnetic background, and is well characterized. This approach may represent a simpler implementation.

Consistent with the assumptions stated above, the difference between DNV-based vector magnetic field measurements taken before and during the injection of doped proppant comprises a measure of the secondary field 5805 modeled by Eq. (3) above, induced throughout the fracking process.

According to an aspect of the subject solution, the subsurface domain $\Omega$ surrounding the well is subdivided into many model "cells" that are right rectangular prisms of uniform size (other geometric shapes can be used but it is much less common). The unknown susceptibility of the material region associated with each model cell is taken to be constant. Cell sizes are chosen so that this approximation is reasonable, while also being large enough to keep the overall problem tractable (e.g. not too many cells), yet small enough to offer useful resolution (e.g. smooth variation) of the susceptibility being solved for.

After this discretization of the domain into many smaller discrete, uniform subdomain "cells," the susceptibilities for each cell being held constant can be removed from the volume integral and the integrals evaluated and arranged in a coefficient matrix (G) which multiplies the unknown susceptibilities (m) of each cell to compute secondary field values (d) that are expected to match the measured values. This forward model comprises a simple matrix-vector multiplication stated as:

$$d = Gm \qquad \text{Eq. (4)}$$

The influence coefficient (G) maps the susceptibility values of all cells in the modeled domain to magnetic field values at each measurement point. As there are many more cells in the model than there are measurement locations, this problem is severely underdetermined and has no unique solution (e.g. it has an infinite number of solutions). This is typical of geophysical inversion problems.

Regularized inversion provides a solution to this dilemma and is a mainstay of geophysics, wherein additional constraints are introduced to yield uniqueness and enable solving for the many unknowns. Types of constraints vary widely, ranging from totally artificial and mathematically contrived, to constraints that are very much physics-based and well applied to certain problems.

A general formulation that encapsulates most of these approaches comprises the simultaneous minimization of data misfit and constraint violation. Data misfit is the difference between measured data and modeled data reconstructed by the forward model of Equation (4) for a specified set of cell susceptibilities. This can be written as a scalar, two-term performance index or cost function:

$$\phi(m) = \phi_d(m) + \gamma\phi_m(m) \qquad \text{Eq. (5)}$$

where $\varphi_d$ represents the data misfit term that takes on large values when a specified set of susceptibilities poorly reconstructs (via the forward model of Eq. (4)) the measured magnetic field values, and small values when the data is well matched. A quadratic form is common:

$$\phi_d(m) = (\tilde{d}-d)^T R^{-1}(\tilde{d}-d) \qquad \text{Eq. (6)}$$

where the tilde (~) annotation indicates actual measured data and square matrix (R) is the measurement error covariance matrix associated with the data. Accordingly, individual data entries known to be very accurate may require being very closely matched by the reconstruction. Otherwise their mismatch produces large penalties.

The term $\varphi_m$ is a model adjustment term that embodies problem constraints that give uniqueness to the problem while also providing physical insight to the problem being solved. A simple example for this term is one that takes on large values for specified susceptibilities that differ greatly from a-priori values (note the a-priori values are often zero, which for a hydraulic fracturing application implies no proppant is pushed into the geologic subdomain corresponding to a cell of the forward model). A simple quadratic form for this term is:

$$\phi_m(m) = (m_0-m)^T W(m_0-m) \qquad \text{Eq. (7)}$$

where $m_0$ comprises the a-priori susceptibilities of the cells one intends to keep the solution near, and the square matrix (W) reflects the possibly differential importance or preference of keeping certain cell values closer to their a-priori values than others. The non-diagonal entries of W may be represented as zero entries, wherein W is diagonal and hence symmetric. Diagonal entries of W are all positive-valued.

Returning to the overall performance index of Eq. (5), the second (model adjustment) term is weighted by a scalar ($\gamma$) to achieve a balance between the two terms. For example, ($\gamma$) is typically heuristically adjusted so the overall performance index is evenly apportioned between the data misfit and model adjustment terms.

Susceptibilities are then solved for the quadratic case as:

$$m = (G^T R^{-1} G + \gamma W)^{-1}(G^T R^{-1}\tilde{d} + \gamma W m_0) \qquad \text{Eq. (8)}$$

The above described solutions provide the benefit of being easy to solve. The model adjustment term may encapsulate the following constraints, which may be particularly useful for embodiments according to this specification: (1) The well geometry is known a-priori, so model cells outside the fracked stage and potentially its neighboring stages are unlikely to have significant changes in their susceptibility; (2) the total amount of susceptible matter pumped down the well is known and must be matched by the recovered model; (3) alternatively to the quadratic adjustment term of Eq. (7) allowing small adjustment of all susceptibilities, a so-called focused inversion may be implemented wherein only susceptibilities of a subset (e.g. minimum) number of model cells are allowed to change during the solution.

The geophysical inversion calculations may be implemented in hardware, software or a combination of hardware and software, for example by the processing system 5702 of FIG. 57. A general purpose computer processor (e.g., 5702 or processor 5306 of FIG. 53A) for receiving magnetic and/or micro-seismic signals may be configured to receive and execute computer readable instructions. The instructions may be stored on a computer readable medium in communication with the processor. One or more processors may be used for calculation some or all of the magnetic and/or micro-seismic signals according to a non-limiting embodiment of the present disclosure.

Energy Efficient Controlled Magnetic Field Generator Circuit

The present disclosure is directed, in part, to an energy efficient controlled magnetic field generator circuit. The subject technology uses a coil electromagnet to establish a variable magnetic field that reaches out a significant distance. This subject solution transfers energy between energy storage devices (e.g., inductors and capacitors) using a switching scheme that enables the control of the ramp rate and duration of each cycle of the magnetic field waveform. The ramp rate is the rate of change of the magnetic field, and by varying the ramp rate, among other things, a triangle wave of selectable amplitude, can be created. The subject technology provides a family of circuits that can accomplish the energy transfer with substantially low energy consumption. Ideally, the disclosed circuits use no energy if lossless devices such as switches, capacitors, and inductors were used. In practice, no device is perfectly lossless, so the circuits do draw energy. However, the energy consumption of the disclosed circuits is substantially low compared to the generated magnetic field strength.

Traditionally, an efficient approach to generate a magnetic field is using a series LC resonators circuit that generates a sinusoidal waveform. There are techniques for varying the average amplitude and/or frequency of the resonance. These techniques are not single-cycle control techniques. It is understood that resonant LC circuits that work with many cycles of the waveform to deliver information have a lower rate of information delivery. By being able to modulate each cycle of the waveform, more bits per second can be delivered. In addition, by achieving the control through ramp rate control, the waveform can have a triangle shape which can have higher amplitude, and more importantly, a higher L2-norm than a sine wave with the same peak slope. The peak slope corresponds to the maximum voltage that the circuit can tolerate. The triangular waveform can achieve a higher signal-to-noise ratio (SNR) for a given maximum voltage in the drive circuit. For sensing applications (e.g., magnetic ping), single cycle control can perform identification with a shorter signal duration, requiring higher sophistication and cost on the part of the adversary to cancel, and also allowing a shorter duty cycle and thus more stealth and energy efficiency.

FIGS. 59A through 59F are diagrams illustrating examples of a magnetic waveform generator circuit 5900A, a corresponding timing diagram 5900B, and various operational phases 5900C through 5900F of the magnetic waveform generator circuit, according to certain embodiments. The magnetic waveform generator circuit 5900A (hereinafter "circuit 5900A") includes a first switch S1 coupled between a first node 5902 (hereinafter "node5902") and a second node 5904 (hereinafter "node5904"), a second switch S2 coupled between node 5902 and a third node 5906 (hereinafter "node5906"), a first rectifier element D1 coupled in parallel to the switch S2, and a second rectifier element D2 coupled in parallel to the switch S1. The circuit 5900A further includes an inductor L coupled between node 5902 and a fourth node 5908 (hereinafter "node5908"), a first capacitors C1 coupled between nodes 5904 and 5908, and a second capacitors C2 coupled between nodes 5908 and 5906. Node 5908 is coupled to ground potential and capacitors C1 and C2 are precharged to +Vp (e.g., 100V) and −Vp (e.g., −100V).

In one or more implementations, the switches S1 and S2 can be implemented with semiconductor switches such as transistors (e.g., bipolar junction transistor (BJT), field-effect transistor (FET)) or other types of switches). The rectifier elements D1 and D2 can be semiconductor diodes (e.g., silicon diodes) or other rectifier elements. The inductor L is a magnetic coil of the magnetic waveform generator and can have an inductance value of the order of hundreds of micro-Henry (µH), for example, 300 µH, and capacitance values of the capacitors C1 and C2 can be of the order of hundreds of micro-farad (µF). The circuit 5900A can generate a current i in the in inductor L that has an optimized waveform, for example, a triangular waveform, by controlling the switches S1 and S2, as shown in the timing diagram 5900B of FIG. 59B.

Figure 59B:
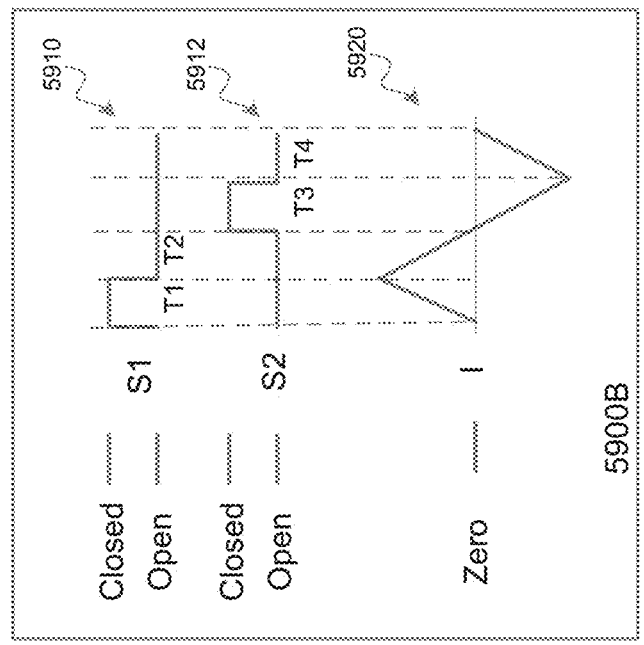
FIGS. 59A through 59F are diagrams illustrating examples of a magnetic waveform generator circuit, a corresponding timing diagram, and various operational phases of the magnetic waveform generator circuit, according to certain embodiments.
Figure 59A:
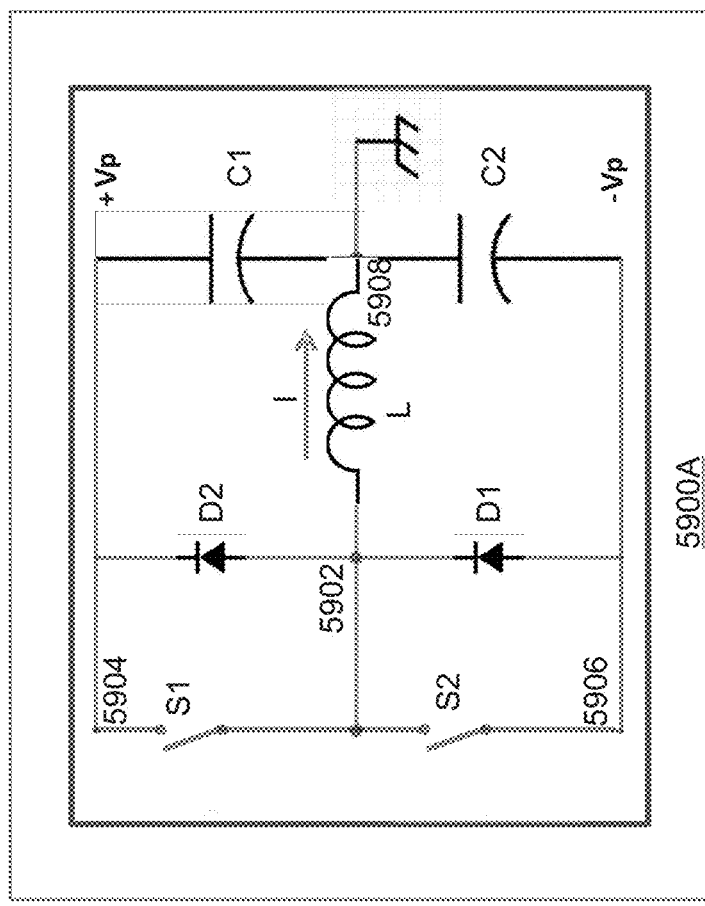

The timing diagram 5900B includes control pulses 5910 and 5912 applied to the switches S1 and S2, and a triangular waveform 5920 for the current i of the inductor L of FIG. 59A. During a time period T1, switch S1 is closed and switch S2 is open. During a time period T2, both switches S1 and S2 are open, and during a time period T3, switch S1 is open and switch S2 is closed, and during a time period T4, both switches S1 and S2 are open again. The four phases of switches S1 and S2 can cause the current i of the inductor L run through the ramp-up and ramp-down cycles to create a full cycle of the triangular waveform 5920. More detailed operational descriptions of the circuit 5900A are provided below with respect to FIGS. 59C through 59F.

Figure 59C:
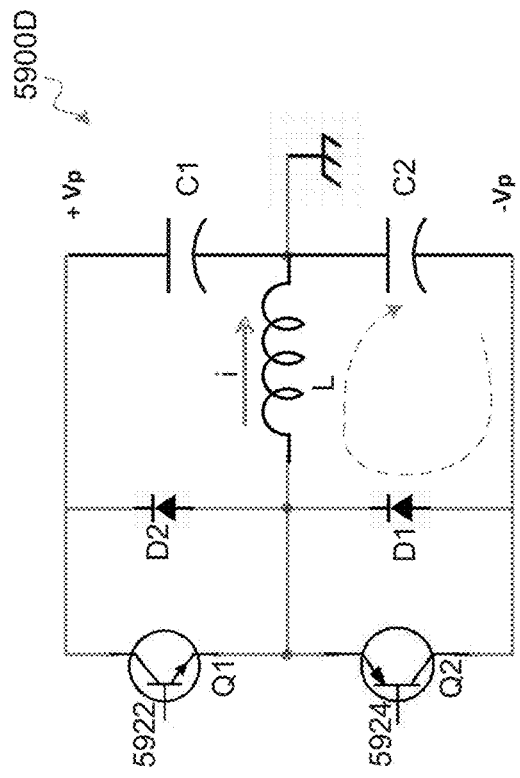

The operational phase 5900C shown in FIG. 59C depicts the operation of the circuit 5900A of FIG. 59A during the time period T1 of FIG. 59B. Transistors Q1 (e.g., an NPN transistor) and Q2 (e.g., a PNP transistor) are example implementations of the switches S1 and S2 of FIG. 59A. During the operational phase 5900C, the transistor Q1 is on and the transistor Q2 is off, and diodes D1 and D2 are both reverse biased by the initial voltage (e.g., 5900V) of the capacitors C1 and C2. The capacitor C1 discharges through the transistor Q1 and the inductor L, thereby passing a positive up-ramping (increasing) current i in the inductor L, which forms the first quarter cycle, corresponding to the time period T1, of the triangular waveform 5920 of FIG. 59B. In practice, the current i ramps up in a manner which can be closely approximated with a linear ramp when the capacitor sizing and switch closure interval are such that the capacitor voltage remains nearly constant during discharging or recharging intervals.

Figure 59D:
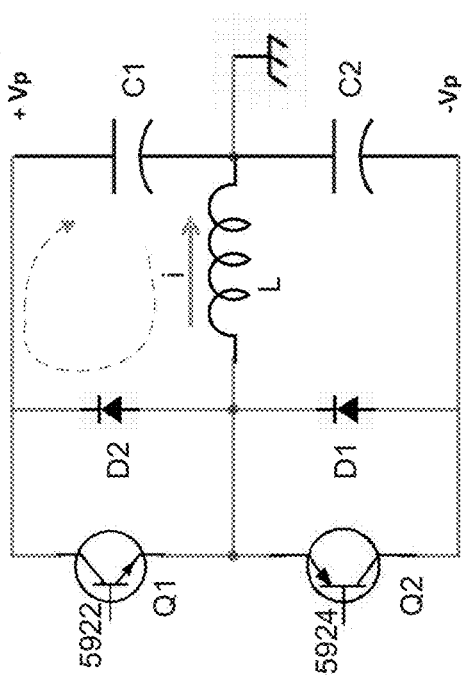

The operational phase 5900D shown in FIG. 59D depicts the operation of the circuit 5900A of FIG. 59A during the time period T2 of FIG. 59B. During the operational phase 5900D, both transistors Q1 and Q2 and diode D2 are off. The stored energy in the inductor L during the phase 5900C, is delivered to capacitor C2 and charges this capacitor through the diode D1 and the inductor L, thereby passing a positive down-ramping (decreasing) current i in the inductor L, which forms the second quarter cycle, corresponding to the time period T2, of the triangular waveform 5920 of FIG. 59B.

Figure 59E:
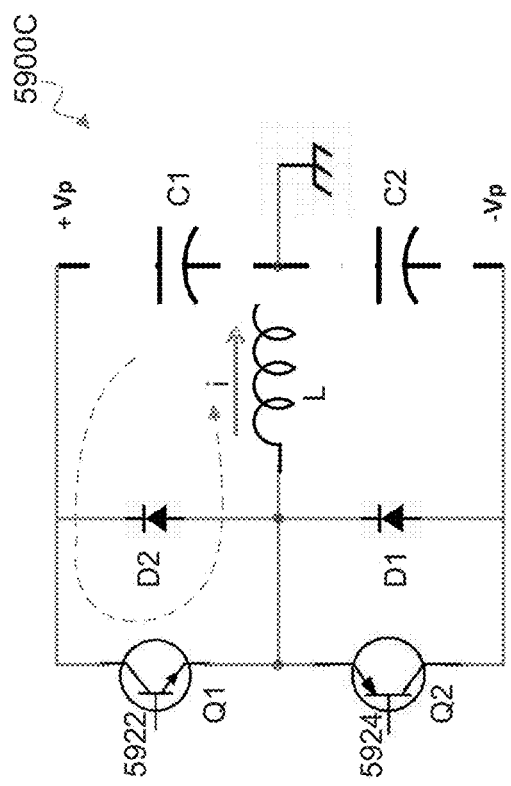

The operational phase 5900E shown in FIG. 59E depicts the operation of the circuit 5900A of FIG. 59A during the time period T3 of FIG. 59B. During the operational phase 5900E, the transistors Q2 is on and the transistor Q1 and both diodes D1 and D2 are off. During this phase, capacitor C2 discharges through the transistor Q2 and the inductor L and induces a negative increasing current in the inductor L, which continues the down-ramping leg of the triangular waveform 5920 until the end of period T3.

Figure 59F:
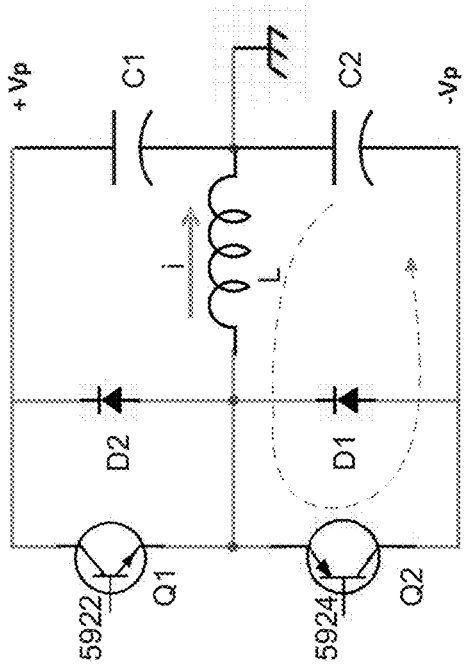

The operational phase 5900F shown in FIG. 59F depicts the operation of the circuit 5900A of FIG. 59A during the time period T4 of FIG. 59B. During the operational phase 5900F, both transistors Q1 and Q2 and diode D1 are off, and the capacitor C1 is charged through diode D2 and the inductor L. The current i of the inductor L is negative and decreasing and reaches zero as the capacitor C1 is charged nearly to its initial voltage. In the circuits 5900A and 5900C through 5900F, the drive circuitry, protection circuitry, power supplies, and internal resistors (e.g., for the inductor L) are not shown for simplicity. With ideal lossless circuit elements, at the completion of the four switching periods (T1 through T4), the capacitors would have exactly the same voltage as they had at the beginning of the four periods. However, because of internal resistors and non-ideal switches and rectifiers, there is some energy loss, with the result that the capacitors do not have exactly their original voltage after the sequence of four switching periods. To compensate for this energy loss, some means of recharging (e.g., a trickle charge or a rapid charge with the inductor disengaged) the capacitors can be employed to prevent any operation failure due to the non-idealities. The effect of this deviation from the ideal straight line in the triangular waveform may be compensated for by using, in the receiver, a demodulator that is matched with the non-ideal waveform.

Figure 60A:
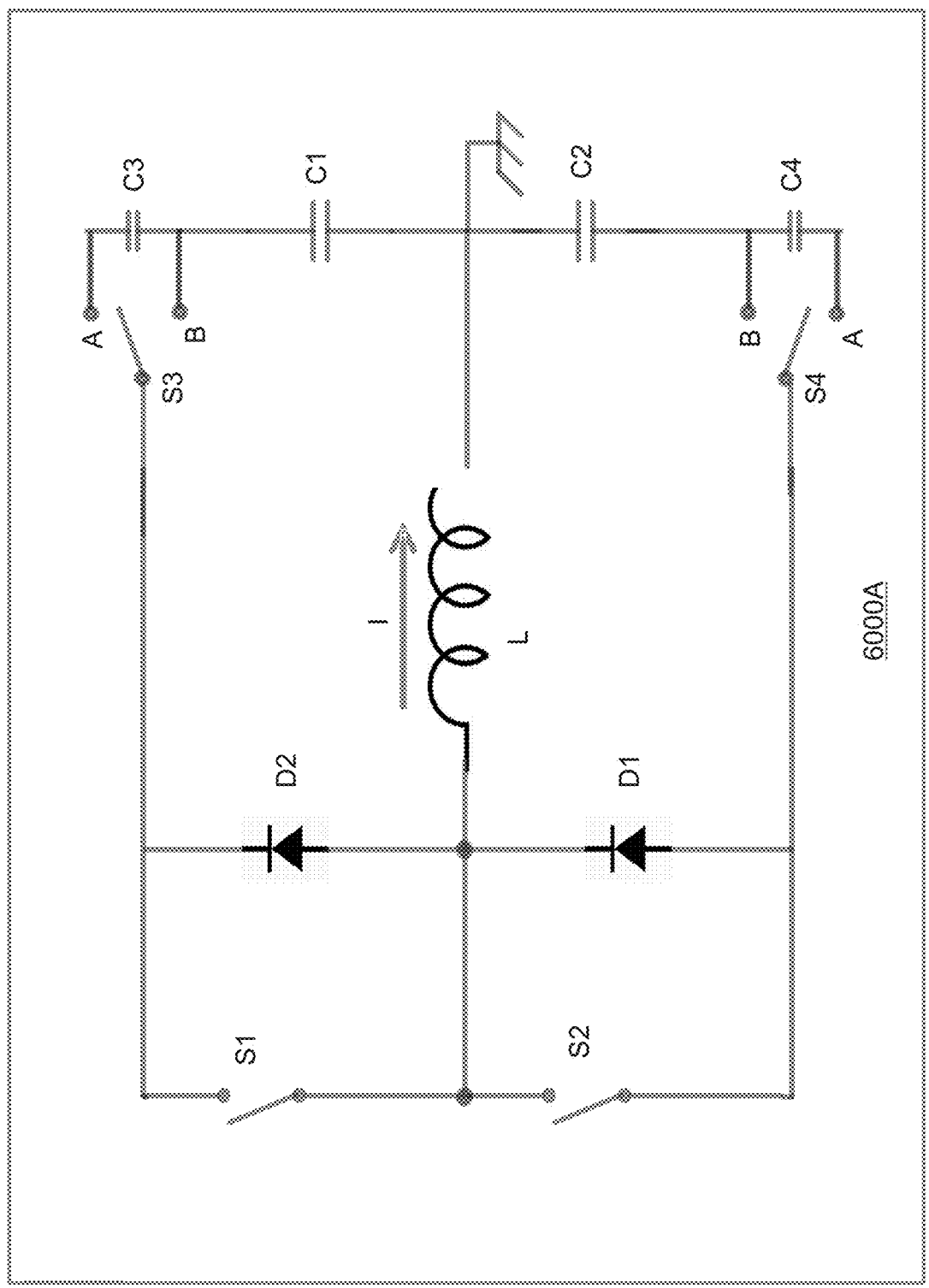
FIGS. 60A-60B are diagrams illustrating examples of a magnetic waveform generator circuit with amplitude modulation capability and corresponding timing diagrams, according to certain embodiments.
Figure 60B:
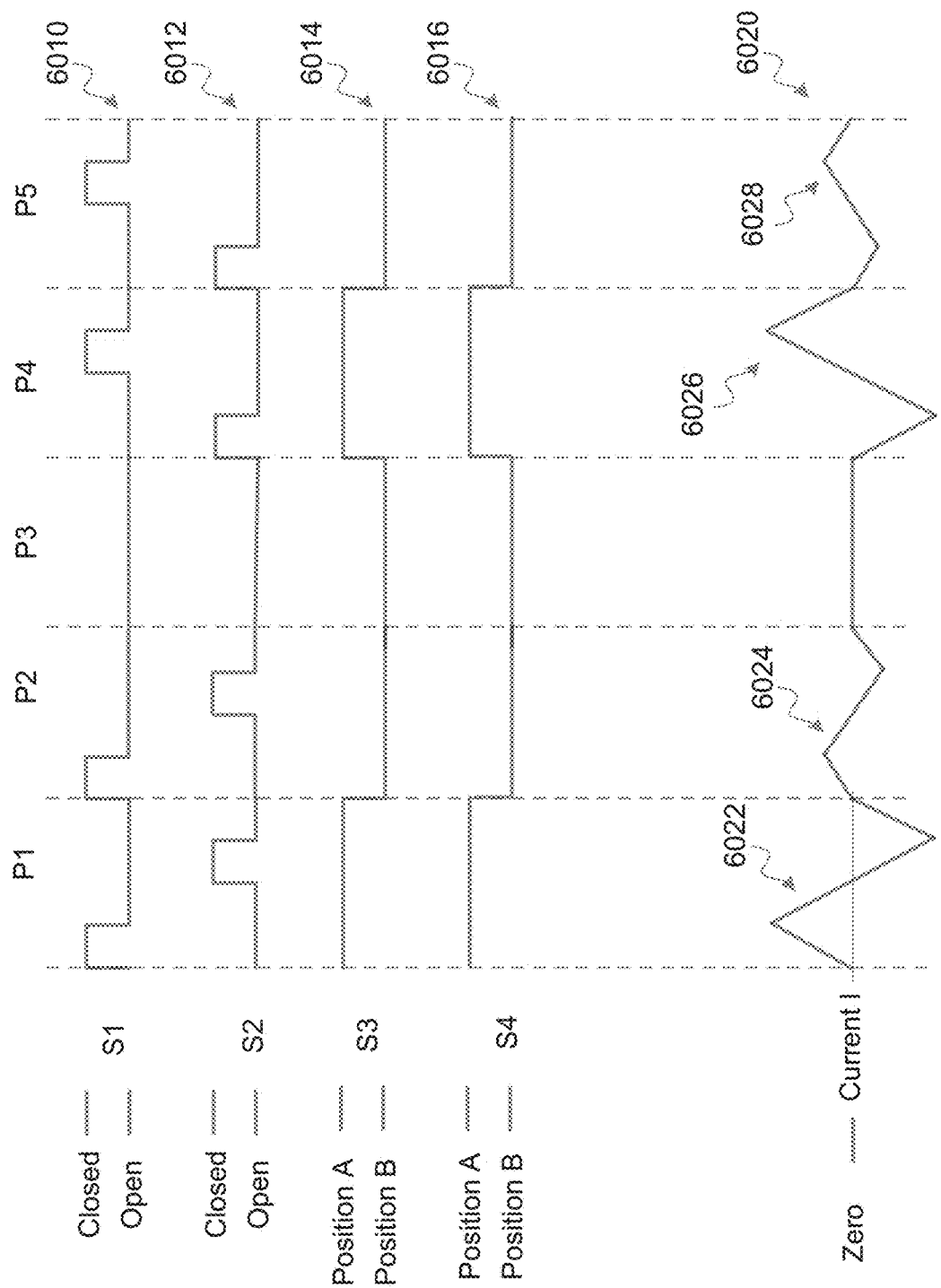

FIGS. 60A-60B are diagrams illustrating examples of a magnetic waveform generator circuit 6000A with amplitude modulation capability and corresponding timing diagrams 6010, 6012, 6014, 6016, and 6020, according to certain embodiments. The magnetic waveform generator circuit 6000A is similar to the circuit 5900A of FIG. 59A, except for the additional switches S3 and S4 and capacitors C3 and C4. The addition of the switches S3 and S4 and capacitors C3 and C4 enable circuit 6000A to generate a current i in the inductor L with a triangular waveform that can be amplitude modulated. The switches S3 and S4 are dipole switches that can be set to be connecting at either of two positions A or B. When set to be at position A, the switches S3 and S4, allow the capacitors C3 and C4 to be connected in series with the capacitors C1 and C2, respectively. When switches S3 and S4 are set to be connecting at position B, the circuit 6000 becomes similar and operates similarly to the circuit 5900A. The switches S3 and S4 can be implemented as semiconductor dipole switches using known transistor or diode switch circuitry.

When the switches S3 and S4 are set to be connecting at position A, as mentioned above, capacitors C3 and C4 are connected in series with capacitors C1 and C2 to provide a higher voltage for driving the current i through the inductor L, which can form the high current amplitude of the amplitude modulated waveform, as shown in the timing diagram 6020 of FIG. 60B. In the circuit 6000A, the drive circuitry, protection circuitry, power supplies, and internal resistors (e.g., for the inductor L) are not shown for simplicity.

The timing diagrams 6010, 6012, 6014, 6016 shown in FIG. 60B are control pulses applied to switches S1 through S4. The timing diagrams are shown for five consecutive cycles (e.g., periods) P1 P2 . . . P5. During the first cycle P1, switches S1 and S2 are toggled as explained with respect to phases 5900C through 5900F of FIGS. 59C through 1F, and the switches S3 and S4 are set at position A, to allow capacitors C3 and C4 be connected in series with the capacitors C1 and C2, thereby providing the high amplitude triangular waveform, as shown by waveform 6022. The amplitude of the triangular waveform may be reduced by removing the capacitors C3 and C4 from the circuit 6000A, thereby providing smaller voltage to drive the inductor current through the inductor L. This is done at cycle P2, where the switches S3 and S4 are both set to position B and switches S1 and S2 go through the phases to generate a triangular waveform as explained above. The ratio of amplitudes of the waveforms 6022 and 6024 depend on the capacitance values of the capacitors C1, C2, C3, and C4. For example, if the capacitance values of the capacitors C1, C2, C3, and C4 are the same, the amplitude of the waveform 6024 would be half of the amplitude of the waveform 6022. Other amplitude ratios can be achieved by suitably selecting the capacitance values of the capacitors C1, C2, C3, and C4.

During the third cycle P3, switches S1 and S2 are open and switches S3 and S4 are set at position B, and the charged capacitors C1 have no path for driving current into the inductor L. Therefore, during cycle −P3, zero current passes through the inductor L. During this cycle, a recharge circuit (not shown for simplicity) can return the voltages of capacitors C1 and C2 to their desired level, correcting for resistive losses, without generating a current in the inductor L and therefore without affecting the magnetic field. During the cycles P4 and P5, the setting of switches S3 and S4 are the same as cycles P1 and P2, but the status of switches S1 and S2 in cycles P4 and P5 are reversed relative to cycles P1 and P2, respectively. As a consequence, the direction of currents in the inductor L are also reversed, resulting in waveforms 6026 and 6028, which have the same amplitudes as their respective waveforms 6022 and 6024, but with opposite polarities.

The waveforms 6022, 6024, 6026, and 6028 can be used to represent, for example, binary symbols 11, 10, 01, and 00 by a magnetic communications transmitter using the circuit 6000A as the magnetic field generator. The cycle P3, which has no signal, can be used as the OFF symbol to allow for calibration, synchronization, and background cancellation in the receiver side.

Figure 61A:
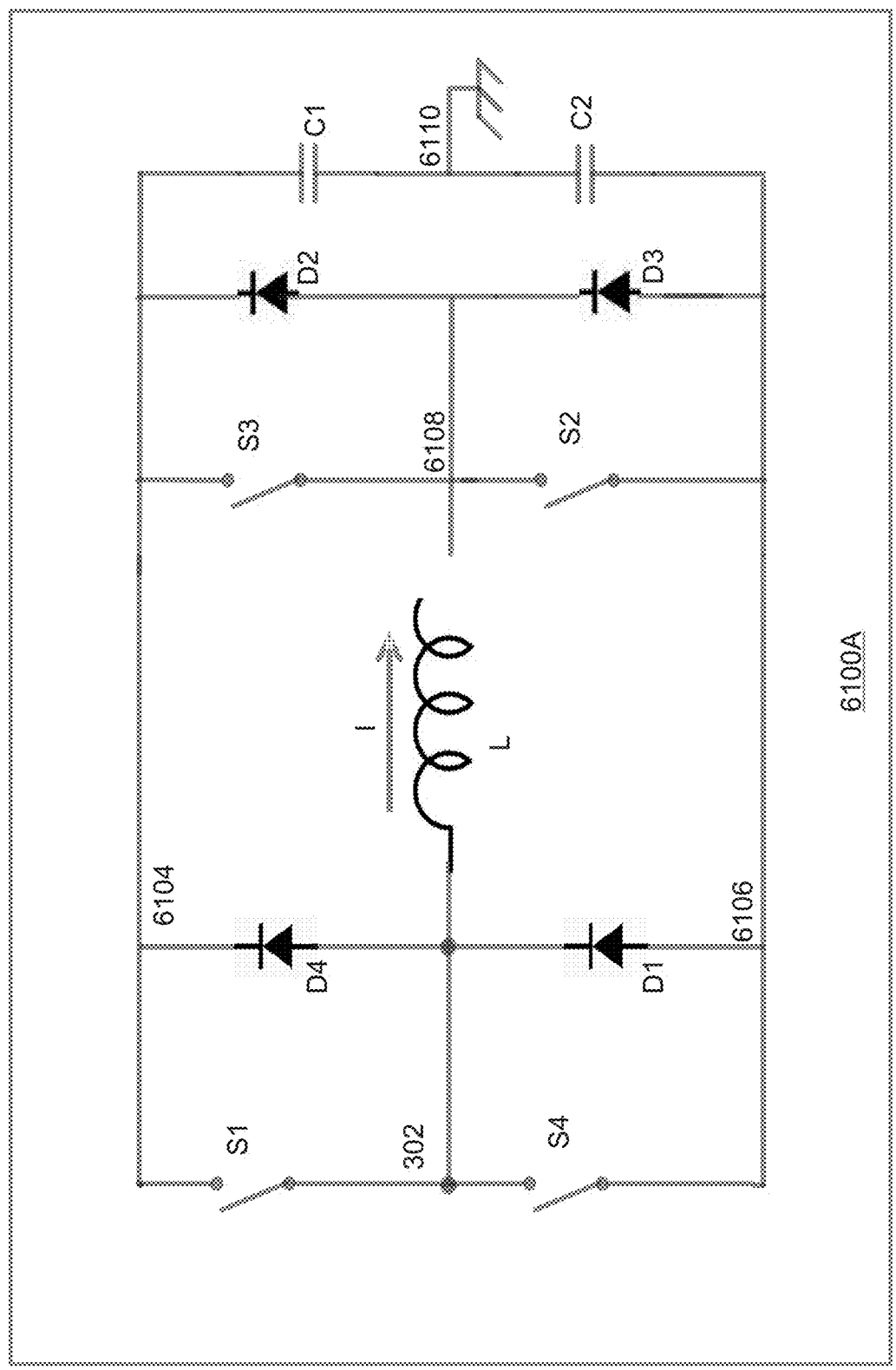
FIGS. 61A-61B are diagrams illustrating examples of an H-bridge magnetic waveform generator circuit and an H-bridge magnetic waveform generator circuit with amplitude modulation capability, according to certain embodiments.
Figure 61B:
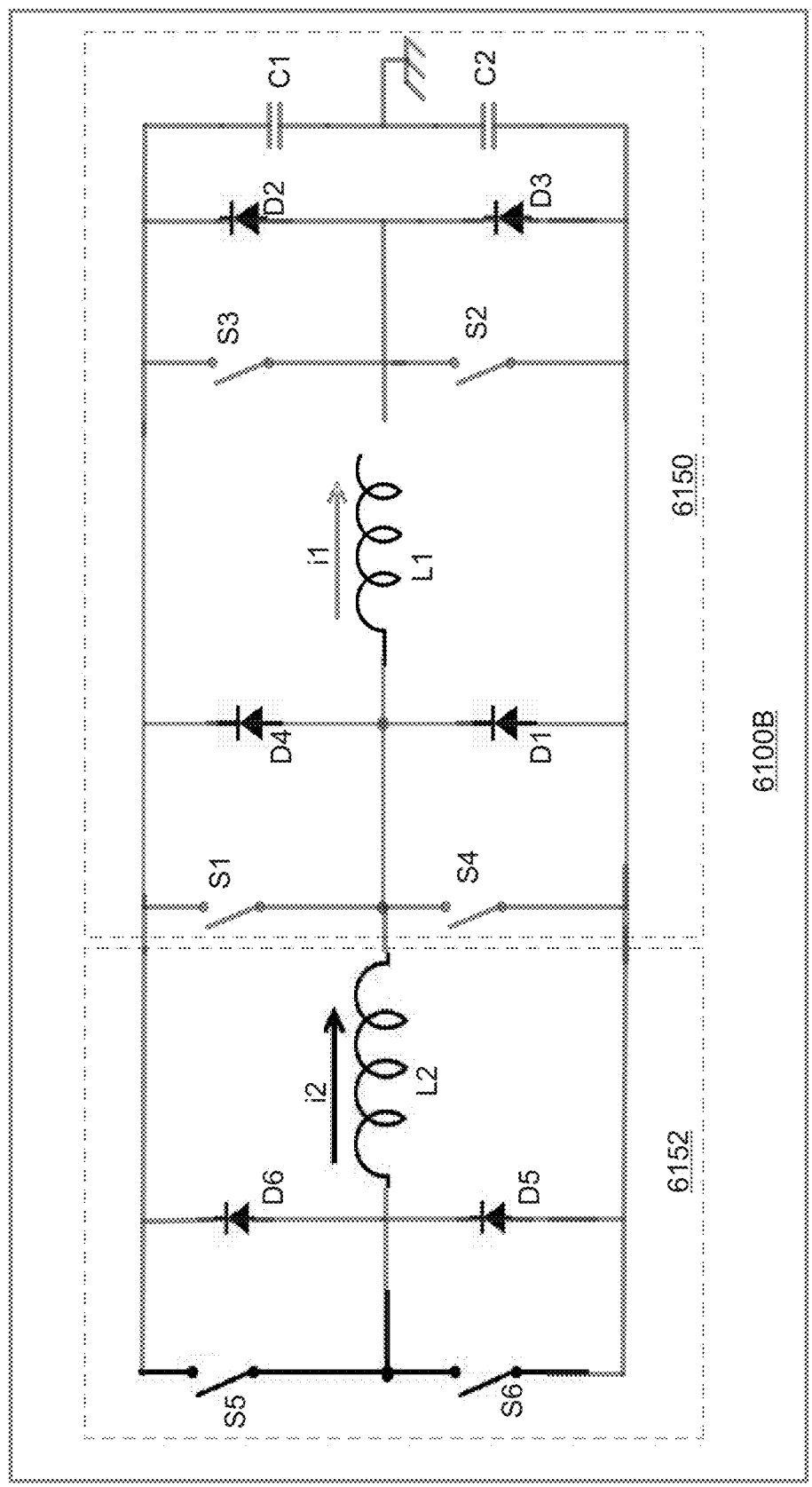

FIGS. 61A-61B are diagrams illustrating examples of an H-bridge magnetic waveform generator circuit 6100A and an H-bridge magnetic waveform generator circuit 6100B with amplitude modulation capability, according to certain embodiments. The bridge magnetic waveform generator circuit 6100A (hereinafter "circuit 6100A") is similar to circuit 5900A of FIG. 59A, except for the additional switches S3 and S2 and diodes D2 and D3 and the fact that node 6108 of the inductor L is not connected to the ground potential. The switch S3 is coupled between nodes 6104 and 6108, and switch S2 is coupled between nodes 6108 and 6106. Diodes D2 and D3 are coupled in parallel with switches S3 and S2, respectively. The capacitors C1 and C2 join at node 6110 that is coupled to ground potential. In the circuit 6100A, the drive circuitry, protection circuitry, power supplies, and internal resistors (e.g., for the inductor L) are not shown for simplicity. Switches S2 and S3 and diodes D2 and D3 can be implemented in the same semiconductor chip using transistor switches and semiconductor (e.g., silicon) diodes.

The configuration of circuit 6100A has the advantageous feature that allows using lower supply voltage values. For example, the capacitors C1 and C2 can each be precharged to 50V (instead of 100V for circuit 100A) and the circuit 6100A still provides the same amplitude triangular waveform for the current in the inductor L. The operation of the circuit 6100A includes four phases, during which status of switches S1, S2, S3, and S4 are controlled to be different to allow suitable paths for flow of current from or to the capacitors C1 and C2 through the inductor L.

During a first phase, switches S1 and S2 are closed and switches S3 and S4 are open, and diodes D1 and D2 are reverse biased. During the first phase, the capacitors C1 and C2 discharge to drive a positive increasing (up-ramping) current through the switches S1 and S2 and the inductor L. This current provides the first quarter-cycle of a triangular current waveform (e.g., 5920 of FIG. 59B). During a second phase, switches S1, S2, S3, and S4 are open, and diodes D1 and D2 are forward biased and conduct current. During this phase, the capacitors C1 and C2 recharge, which causes driving a positive decreasing (down-ramping) current through the diodes D1 and D2 into the inductor L. This current provides the second quarter-cycle of the triangular current waveform.

During a third phase, switches S3 and S4 are closed and switches S1 and S2 are open, and diodes D1 and D2 are reverse biased. During this phase, the capacitors C1 and C2 discharge to drive a negative (e.g., with revered direction) increasing amplitude current through the switches S3 and S4 and the inductor L. This current provides the third quarter-cycle of the triangular current waveform. During a fourth phase, switches S1, S2, S3, and S4 are open, and diodes D3 and D4 are forward biased and conduct current. During this phase, the capacitors C1 and C2 recharge and cause driving a negative decreasing current into the inductor L through diodes D3 and D4. This current provides the fourth quarter-cycle of the triangular current waveform. The circuit 6100A can be modified to provide amplitude modulation as discussed herein.

The H-bridge magnetic waveform generator circuit 6100B (hereinafter "circuit 6100B") shown in FIG. 61B has amplitude modulation capability. The circuit 6100B has a portion 6150 that is similar to the circuit 6100A and an additional portion 6152 including an inductor L2, diodes D5 and D6, and switches S5 and S6. Here, the inductor L2 does not create an external magnetic field at long distances as, for example, a toroidal inductor. Whereas the inductor L1 creates an external magnetic waveform as, for example, a magnetic coil. The operation of portion 6150 is also similar to the operation of circuit 6100A, as discussed above. The portion 6150 is used to generate a high (e.g., maximum)-amplitude triangular current waveform (e.g., 6022 of FIG. 60B), during the four phased as discussed above with respect to FIG. 61A. During these phases switches S5 and S6 are open. When generating a low-amplitude triangular current waveform (e.g., 6024 of FIG. 60B), the portion 6152 comes into the play and switches S5 and S6 are suitably opened or closed (while S1 and S4 are kept open) to allow driving currents in two different directions, as explained above, into series connected inductors L1 and L2. The series connection of inductors L1 and L2 increases the impedance in the path of the current and thereby decrease the amplitude of the current passing through the inductors L1 and L2. The ratio of amplitudes of the low-amplitude and high-amplitude waveforms depend on the inductance values of the inductors L1 and L2. For example, if the inductance values of the inductors L1 and L2 are the same, the amplitude of the low-amplitude waveform would be half of the amplitude of the high-amplitude waveform. Other amplitude ratios can be achieved by suitably selecting the inductance values of the inductors L1 and L2.

Figure 62:
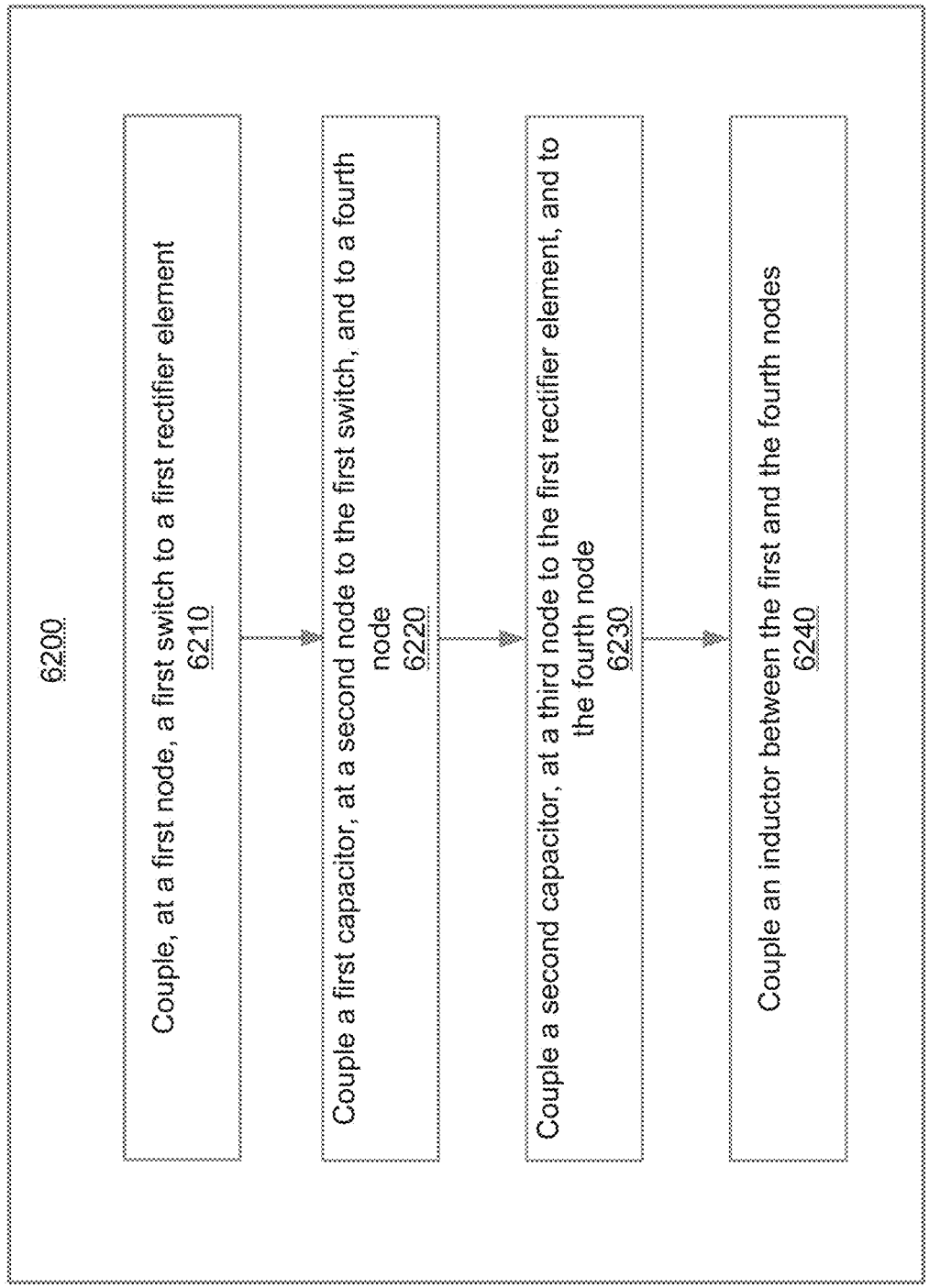
FIG. 62 is a diagram illustrating an example of a method for providing a magnetic waveform generator circuit, according to certain embodiments.

FIG. 62 is a diagram illustrating an example of a method 6200 for providing a magnetic waveform generator circuit, according to certain embodiments. According to the method 6200, a first switch (e.g., S1 of FIG. 59A) is coupled, at a first node (e.g., 5902 of FIG. 59A), to a first rectifier element (e.g., D1 of FIG. 59A) (6210). A first capacitor (e.g., C1 of FIG. 59A) is coupled, at a second node (e.g., 5904 of FIG. 59A) to the first switch, and to a fourth node (e.g., 5908 of FIG. 59A) (6220). A second capacitor may be coupled, at a third node (e.g., 5906 of FIG. 59A) to the first rectifier element, and to the forth node (6230). An inductor (e.g., L of FIG. 59A) may be coupled between the first and the fourth nodes (6240). The first switch is operable to be in an ON state during a first time period (e.g., T1 of FIG. 59B) and in an off state during a second time period (e.g., T2 of FIG. 59B). The first switch and the first rectifier element are configured to enable the inductor to generate, during the first and the second time periods, a magnetic field having a waveform resembling a positive half-cycle of a triangular waveform (e.g., 5920 of FIG. 59B).

In some implementations, a vehicle may need to avoid objects that are in their navigation path. For example, a ground vehicle may need to maneuver around people or objects, or a flying vehicle may need to avoid a building or power line equipment. In these implementations, the vehicle can be equipment with sensors that are used to locate the obstacles that are to be avoided. Systems such as a camera system, focal point array, radar, acoustic sensors, etc., can be used to identify obstacles in the vehicles path. The navigation system can then identify a course correction to avoid the identified obstacles.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A system for magnetic detection, comprising:
   a magneto-optical defect center sensor comprising:
      a magneto-optical defect center material comprising at least one magneto-optical defect center;
      a radio frequency (RF) excitation source configured to provide RF excitations at various frequencies to the magneto-optical defect material;
      an optical excitation source configured to provide optical excitation to the magneto-optical defect material;
      an optical detector configured to receive the emitted optical signal from the magneto-optical defect center material, wherein the emitted optical signal varies in intensity based responsiveness of the magneto-optical defect center material to the optical excitation with RF excitations at various frequencies;
   a controller configured to control the RF excitation source and the optical excitation source to provide a sequence of pulses to the magneto-optical defect center material at RF excitations at various frequencies;
   wherein the controller is further configured to detect variations in the emitted optical signal based on responsiveness of the magneto-optical defect center material to the optical excitation at an RF excitation; and
   wherein the controller is further configured to utilize RF excitations at various frequencies to detect vector variations in responsiveness of the magneto-optical defect center material.

2. The system of claim 1, wherein the magneto-optical defect center sensor is configured to detect the magnetic field as a vector.

3. The system of claim 1, wherein the magneto-optical defect center sensor is configured to detect the magnetic field in individual directions.

4. The system of claim 1, wherein the magneto-optical defect center sensor further comprises:
   a magnetic field generator comprising at least two magnetic field generators including a first magnetic field generator configured to generate a first magnetic field and a second magnetic field generator configured to generate a second magnetic field;
   wherein the controller is further configured to:
      modulate a first code packet and control the first magnetic field generator to apply a first time varying magnetic field at the magneto-optical defect center material based on the modulated first code packet, and
      modulate a second code packet and control the second magnetic field generator to apply a second time varying magnetic field at the magneto-optical defect center material based on the modulated second code packet, wherein the first code packet and the second code packet are binary sequences which have a low cross correlation with each other, and each of the binary sequences has a good autocorrelation.

5. The system of claim 4, wherein a direction of the first time varying magnetic field at the magneto-optical defect center material is different from a direction of the second time varying magnetic field at the magneto-optical defect center material.

6. The system of claim 5, wherein the magneto-optical defect center sensor further comprises a reflector positioned about the magneto-optical defect center material to reflect a portion of light emitted from the magneto-optical defect center material.

7. The system of claim 1, further comprising:
   a first magnetic field sensor that includes the magneto-optical defect center sensor,
   a second magnetic field sensor that includes a second magneto-optical defect center sensor, and
   a position encoder component comprising a magnetic region configured to produce a magnetic field gradient from a first end of the magnetic region to the second end of the magnetic region.

8. The system of claim 7, wherein the magnetic region comprises a ferromagnetic component.

9. The system of claim 7, wherein the magnetic region comprises a magnetic polymer.

10. The system of claim 7, further comprising a third magnetic field sensor and a fourth magnetic field sensor.

11. The system of claim 1, further comprising:
a vehicle that includes the magneto-optical defect center sensor, wherein the magneto-optical defect center sensor is configured to detect a magnetic vector or a magnetic field;
one or more electronic processors configured to:
receive the magnetic vector of the magnetic field from the magneto-optical defect center sensor; and
a navigation control configured to navigate the vehicle based upon the presence of the magnetic vector.

12. The system of claim 1, wherein the magneto-optical defect center material comprises a nitrogen vacancy (NV) diamond material comprising a plurality of NV centers.

13. A system for magnetic detection, comprising:
a magneto-optical defect center sensor comprising:
a magneto-optical defect center material comprising a plurality of magneto-optical defect centers;
a radio frequency (RF) excitation source configured to provide RF excitation at various frequencies to the magneto-optical defect center material;
an optical excitation source configured to provide optical excitation to the magneto-optical defect center material;
an optical detector configured to receive an optical signal emitted by the magneto-optical defect center material, wherein the optical signal varies in intensity based on responsiveness of the magneto-optical defect center material to the optical excitation with RF excitation at various frequencies;
a controller configured to detect the optical signal emitted by the magneto-optical defect center material, wherein the controller is further configured to utilize the multiple RF excitations at various frequencies to detect vector variations in responsiveness of the magneto-optical defect center material; and
an array of sensors comprising the magneto-optical defect center sensor, wherein the array is configured to capture a first magnetic image and a second magnetic image; and
a processor communicatively coupled to the array, wherein the processor is configured to:
determine a background image based on the first magnetic image and identify discrepancies to the second magnetic image.

14. The system of claim 13, wherein some sensors of the array are arranged on a surface area of a well pay zone, wherein some sensors of the array are positioned in locations within or near the well bore.

15. The system of claim 13, wherein the processor is further configured to determine the background by subtracting the first magnetic image from the second magnetic image, such background being used with further magnetic images.

16. The system of claim 13, wherein the discrepancies identify a ferromagnetic material.

17. The system of claim 13, wherein the magneto-optical defect center material comprises a nitrogen vacancy (NV) diamond material comprising a plurality of NV centers.

18. A system for magnetic detection, comprising:
a magneto-optical defect center sensor comprising:
a magneto-optical defect center means for generating an emitted optical signal comprising a plurality of magneto-optical defect centers;
a radio frequency (RF) excitation source configured to provide RF excitation at multiple frequencies to the magneto-optical defect center material;
an optical excitation source configured to provide optical excitation to the magneto-optical defect center material;
an optical detector configured to receive an optical signal emitted by the magneto-optical defect center means, wherein the optical signal is based on responsiveness of the magneto-optical defect center material to optical excitation and RF excitation at multiple frequencies; and,
a controller configured to detect the optical signal emitted by the magneto-optical defect center material, wherein the controller is further configured to utilize the RF excitation at multiple frequencies to detect vector variations in responsiveness of the magneto-optical defect center means.

19. The system of claim 18, further comprising a magnetic waveform generator circuit that comprising:
a first switch coupled to a first rectifier element at a first node;
a first capacitor coupled, at a second node to the first switch, and to a fourth node;
a second capacitor coupled, at a third node to the first rectifier element, and to the fourth node; and
an inductor coupled between the first and the fourth nodes,
wherein the magnetic waveform generator circuit is configured to enable the inductor to generate a first magnetic field having a waveform resembling a positive half-cycle of a triangular waveform; and
wherein the magneto-optical defect center sensor is configured to detect the first magnetic field.

20. The system of claim 18, wherein the magneto-optical defect center material comprises a nitrogen vacancy (NV) diamond material comprising a plurality of NV centers.

* * * * *